US012684689B2

(12) United States Patent
Diamond

(10) Patent No.: US 12,684,689 B2
(45) Date of Patent: Jul. 14, 2026

(54) TRANSPARENT PACKAGE FOR USE WITH PRINTED CIRCUIT BOARDS

(71) Applicant: Honeywell Federal Manufacturing & Technologies, LLC, Kansas City, MO (US)

(72) Inventor: Louis Diamond, Kansas City, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 590 days.

(21) Appl. No.: 17/858,336

(22) Filed: Jul. 6, 2022

(65) Prior Publication Data

US 2022/0377882 A1    Nov. 24, 2022

Related U.S. Application Data

(63) Continuation-in-part of application No. 17/579,974, filed on Jan. 20, 2022.

(Continued)

(51) Int. Cl.
H05K 1/02        (2006.01)
H05K 1/03        (2006.01)
(Continued)

(52) U.S. Cl.
CPC ......... H05K 1/0306 (2013.01); H05K 3/3436 (2013.01); H10W 90/155 (2026.01);
(Continued)

(58) Field of Classification Search
CPC .............. H01L 23/4951; H01L 21/563; H01L 2224/05583
See application file for complete search history.

(56) References Cited

U.S. PATENT DOCUMENTS 5,508,228 A * 4/1996 Nolan ............... H01L 23/49811
                                                                438/677
6,146,984 A * 11/2000 Leibovitz ................ H01L 24/11
                                                                257/E23.021

(Continued)

FOREIGN PATENT DOCUMENTS

JP        2001068514 A  *  3/2001
JP        2006032845 A      2/2006
JP        2010056429 A  *  3/2010

OTHER PUBLICATIONS

International Search Report and Written Opinion in related application No. PCT/IB2022/056547 mailed Oct. 26, 2022, 17 pages.

*Primary Examiner* — Daniel Luke
(74) *Attorney, Agent, or Firm* — Hovey Williams LLP

(57)        ABSTRACT

A blank package for mimicking an electronic component package comprises a body and a plurality of conductive pads. The body is formed from generally transparent electrically insulating material and has a top surface, a bottom surface, and a plurality of side surfaces. The bottom surface has a shape and dimensions that are similar to a bottom surface of the electronic component package. The conductive pads are formed from electrically conductive material and attached to the body, with each conductive pad corresponding to a successive one of the conductive pads of the electronic component package. Each conductive pad has features that are similar to features of the corresponding conductive pad of the electronic component package.

13 Claims, 80 Drawing Sheets

Related U.S. Application Data

(60) Provisional application No. 63/324,512, filed on Mar. 28, 2022, provisional application No. 63/191,194, filed on May 20, 2021.

(51) Int. Cl.
    *H05K 3/341*        (2026.01)
    *H10W 90/15*       (2026.01)

(52) U.S. Cl.
    CPC ................ *H05K 2201/0108* (2013.01); *H05K 2201/0338* (2013.01); *H05K 2201/0344* (2013.01); *H05K 2201/09418* (2013.01); *H05K 2201/10204* (2013.01); *H05K 2203/163* (2013.01)

(56) References Cited

U.S. PATENT DOCUMENTS

| | | | |
|---|---|---|---|
| 7,619,303 | B2 | 11/2009 | Bayan |
| 9,172,012 | B2 | 10/2015 | Andrews et al. |
| 11,145,578 | B2 | 10/2021 | Macheiner |
| 2009/0032924 | A1 | 2/2009 | Stark |
| 2013/0050227 | A1 | 2/2013 | Petersen et al. |
| 2020/0267880 | A1* | 8/2020 | Northrup ................ H01L 22/14 |

* cited by examiner

<u>100</u>

RECEIVE FUNCTIONAL ELECTRONIC COMPONENT PACKAGE SPECIFICATIONS INCLUDING BODY DIMENSIONS AND CONDUCTIVE PAD SIZES, SHAPES, AND LOCATIONS — 101

FORM A BODY OF THE BLANK PACKAGE FROM TRANSPARENT ELECTRICALLY INSULATING MATERIAL, WHEREIN THE BODY INCLUDES A BOTTOM SURFACE WITH THE SAME DIMENSIONS AS A BOTTOM SURFACE OF THE FUNCTIONAL COMPONENT PACKAGE — 102

FORM A PLURALITY OF CONDUCTIVE PADS ON THE BOTTOM SURFACE OF THE BODY, WHEREIN EACH CONDUCTIVE PAD HAS A SIZE, A SHAPE, A LOCATION WHICH IS THE SAME AS THE SIZE, SHAPE, AND LOCATION OF A CORRESPONDING CONDUCTIVE AND PAD ON THE FUNCTIONAL ELECTRONIC COMPONENT PACKAGE — 103

*Fig. 8.*

TOP VIEW

TOP VIEW

BOTTOM VIEW

BOTTOM VIEW

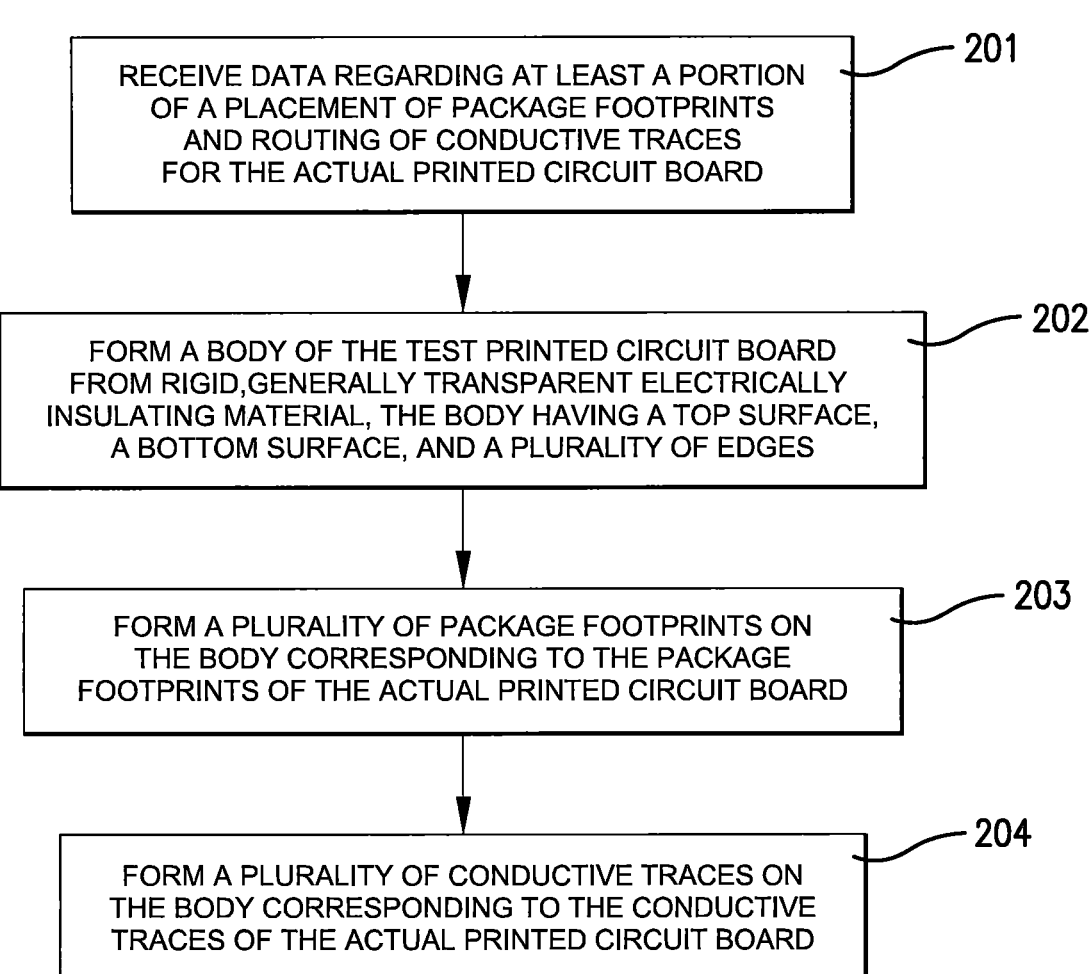

200

RECEIVE DATA REGARDING AT LEAST A PORTION OF A PLACEMENT OF PACKAGE FOOTPRINTS AND ROUTING OF CONDUCTIVE TRACES FOR THE ACTUAL PRINTED CIRCUIT BOARD — 201

FORM A BODY OF THE TEST PRINTED CIRCUIT BOARD FROM RIGID,GENERALLY TRANSPARENT ELECTRICALLY INSULATING MATERIAL, THE BODY HAVING A TOP SURFACE, A BOTTOM SURFACE, AND A PLURALITY OF EDGES — 202

FORM A PLURALITY OF PACKAGE FOOTPRINTS ON THE BODY CORRESPONDING TO THE PACKAGE FOOTPRINTS OF THE ACTUAL PRINTED CIRCUIT BOARD — 203

FORM A PLURALITY OF CONDUCTIVE TRACES ON THE BODY CORRESPONDING TO THE CONDUCTIVE TRACES OF THE ACTUAL PRINTED CIRCUIT BOARD — 204

RECEIVE FUNCTIONAL ELECTRONIC
COMPONENT PACKAGE SPECIFICATIONS                    501

FORM A BODY OF THE BLANK PACKAGE                    502

FORM A PLURALITY OF ADHESIVE PADS
ON A LOWER SURFACE OF THE BODY                      503

FORM A PLURALITY OF CONDUCTIVE
PADS FROM A LEAD FRAME                              504

FORM A LAMINATE STACK INCLUDING THE BODY,
THE ADHESIVE PADS, AND THE CONDUCTIVE PADS          505

600C

612

700

RECEIVE FUNCTIONAL ELECTRONIC COMPONENT PACKAGE SPECIFICATIONS    701

FORM A BODY OF THE BLANK PACKAGE    702

FORM A FIRST CONDUCTIVE PAD ON A FIRST END OF THE BODY AND A SECOND CONDUCTIVE PAD ON THE SECOND END OF THE BODY    703

800A 804,806,808

804,806,808

804,806,808

804,806,808

802

800A    802

804    804

806    806

808    808

804,806,808

804,806,808

800A

802

804,806,808

804,806,808

900

RECEIVE FUNCTIONAL ELECTRONIC
COMPONENT PACKAGE SPECIFICATIONS — 901

FORM A BODY OF THE BLANK PACKAGE — 902

FORM A PLURALITY OF CONDUCTIVE PADS
ON ONE OR MORE SURFACES OF THE BODY — 903

ATTACH A PLURALITY OF LEADS, EACH LEAD ATTACHED
TO A SUCCESSIVE ONE OF THE CONDUCTIVE PADS — 904

1000A

1000A

<u>1100</u>

RECEIVE FUNCTIONAL ELECTRONIC
COMPONENT PACKAGE SPECIFICATIONS ⎯1101

FORM A BODY OF THE BLANK PACKAGE ⎯1102

FORM A PLURALITY OF ADHESIVE PADS
ON AT LEAST ONE SURFACE OF THE BODY ⎯1103

FORM A PLURALITY OF LEADS
FROM A LEAD FRAME ⎯1104

FORM A LAMINATE STACK INCLUDING THE BODY,
THE ADHESIVE PADS, AND THE LEAD FRAME ⎯1105

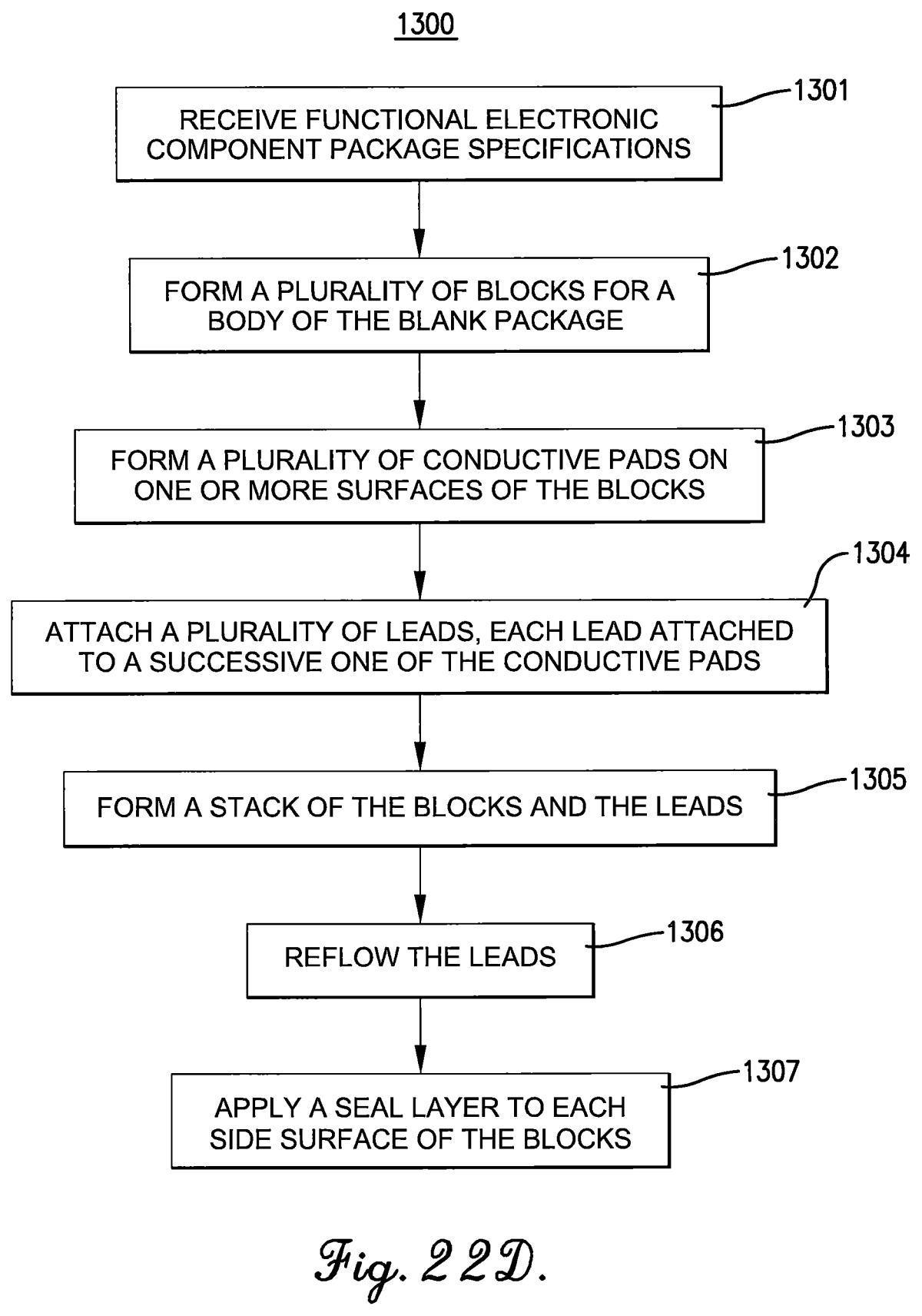

1300

RECEIVE FUNCTIONAL ELECTRONIC COMPONENT PACKAGE SPECIFICATIONS ——1301

FORM A PLURALITY OF BLOCKS FOR A BODY OF THE BLANK PACKAGE ——1302

FORM A PLURALITY OF CONDUCTIVE PADS ON ONE OR MORE SURFACES OF THE BLOCKS ——1303

ATTACH A PLURALITY OF LEADS, EACH LEAD ATTACHED TO A SUCCESSIVE ONE OF THE CONDUCTIVE PADS ——1304

FORM A STACK OF THE BLOCKS AND THE LEADS ——1305

REFLOW THE LEADS ——1306

APPLY A SEAL LAYER TO EACH SIDE SURFACE OF THE BLOCKS ——1307

*Fig. 22D.*

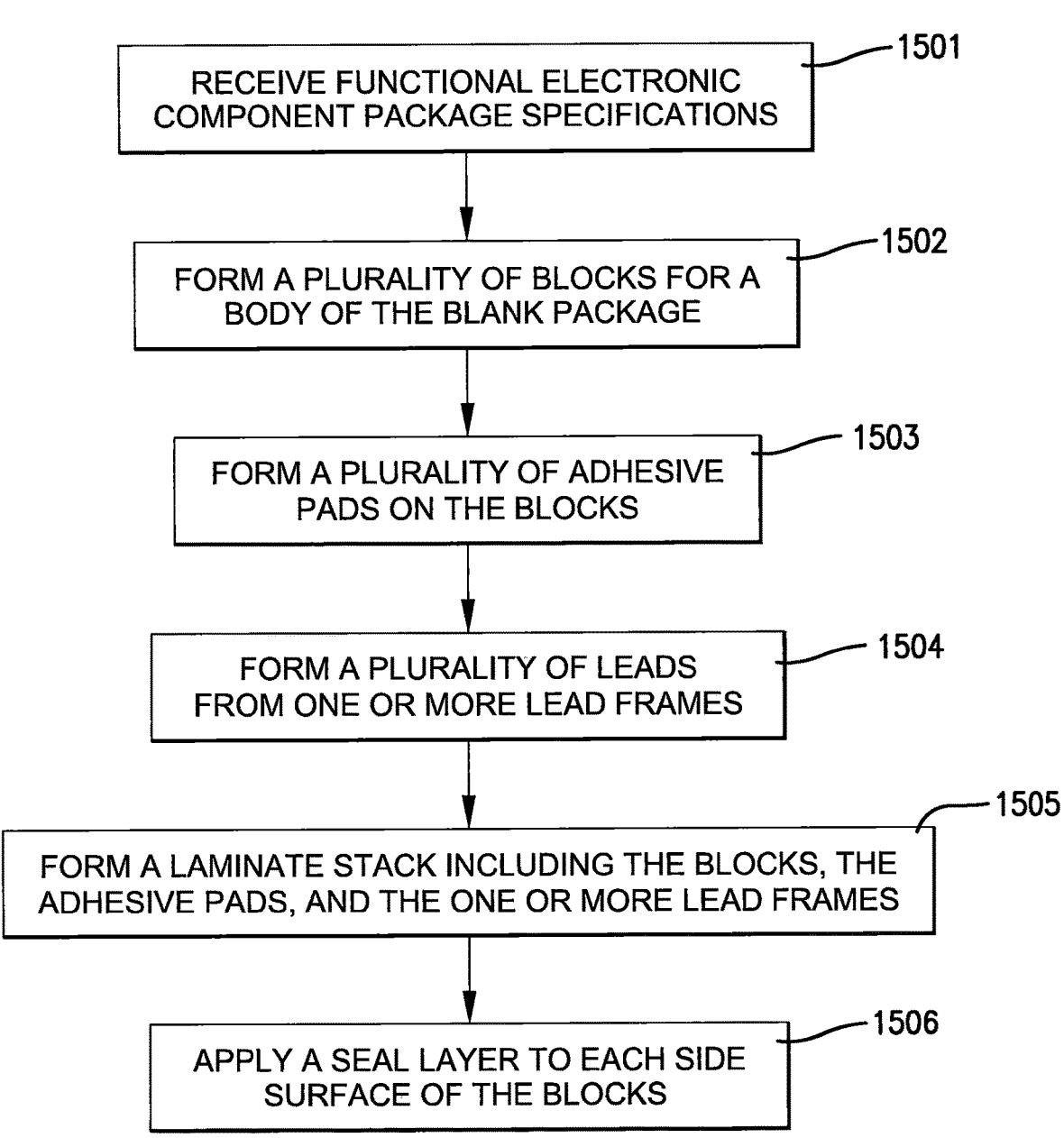

1500

RECEIVE FUNCTIONAL ELECTRONIC
COMPONENT PACKAGE SPECIFICATIONS ⌐1501

FORM A PLURALITY OF BLOCKS FOR A
BODY OF THE BLANK PACKAGE ⌐1502

FORM A PLURALITY OF ADHESIVE
PADS ON THE BLOCKS ⌐1503

FORM A PLURALITY OF LEADS
FROM ONE OR MORE LEAD FRAMES ⌐1504

FORM A LAMINATE STACK INCLUDING THE BLOCKS, THE
ADHESIVE PADS, AND THE ONE OR MORE LEAD FRAMES ⌐1505

APPLY A SEAL LAYER TO EACH SIDE
SURFACE OF THE BLOCKS ⌐1506

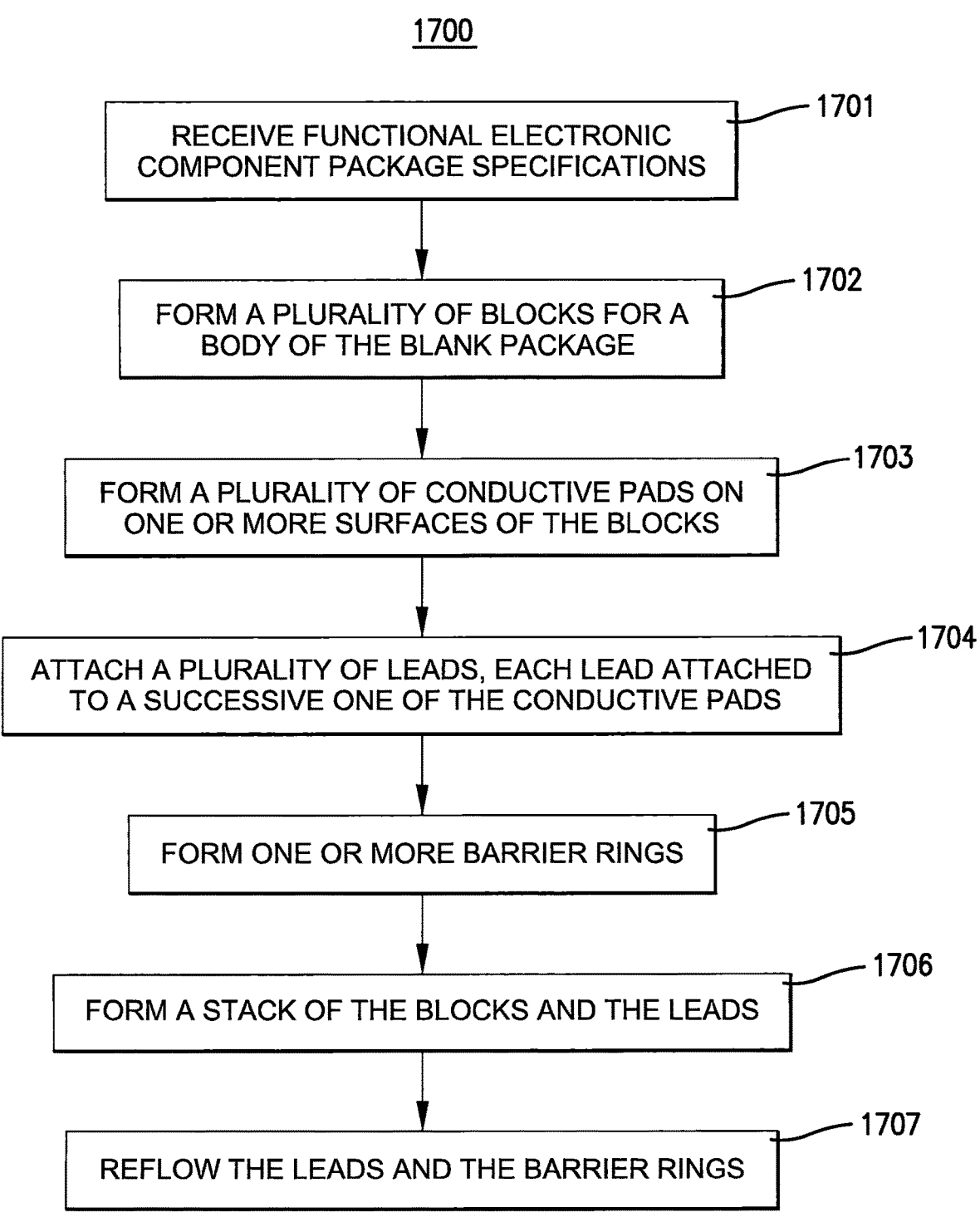

RECEIVE FUNCTIONAL ELECTRONIC COMPONENT PACKAGE SPECIFICATIONS — 1701

FORM A PLURALITY OF BLOCKS FOR A BODY OF THE BLANK PACKAGE — 1702

FORM A PLURALITY OF CONDUCTIVE PADS ON ONE OR MORE SURFACES OF THE BLOCKS — 1703

ATTACH A PLURALITY OF LEADS, EACH LEAD ATTACHED TO A SUCCESSIVE ONE OF THE CONDUCTIVE PADS — 1704

FORM ONE OR MORE BARRIER RINGS — 1705

FORM A STACK OF THE BLOCKS AND THE LEADS — 1706

REFLOW THE LEADS AND THE BARRIER RINGS — 1707

RECEIVE FUNCTIONAL ELECTRONIC
COMPONENT PACKAGE SPECIFICATIONS — 1901

FORM A PLURALITY OF BLOCKS FOR A
BODY OF THE BLANK PACKAGE — 1902

FORM A PLURALITY OF ADHESIVE
PADS ON THE BLOCKS — 1903

FORM ONE OR MORE SEAL
RINGS ON THE BLOCKS — 1904

FORM A PLURALITY OF LEADS FROM
ONE OR MORE LEAD FRAMES — 1905

FORM A LAMINATE STACK INCLUDING THE BLOCKS,
THE ADHESIVE PADS, THE SEAL RINGS, AND THE LEADS — 1906

2100

RECEIVE FUNCTIONAL ELECTRONIC COMPONENT PACKAGE SPECIFICATIONS — 2101

FORM A PLURALITY OF BLOCKS FOR A BODY OF THE BLANK PACKAGE — 2102

FORM ONE OR MORE BARRIER RINGS — 2103

ATTACH A PLURALITY OF LEADS TO THE BARRIER RINGS — 2104

FORM A STACK OF THE BLOCKS AND THE LEADS — 2105

REFLOW THE LEADS AND THE BARRIER RINGS — 2106

2200B

2206

*32B.*

2206

2208

2206

*32B.*

2206

2204

2202    2200B 2208A    2204A

2208B 2206    2206

2208C    2206    2206    2204B

2300

RECEIVE FUNCTIONAL ELECTRONIC
COMPONENT PACKAGE SPECIFICATIONS
— 2301

FORM A PLURALITY OF BLOCKS FOR A
BODY OF THE BLANK PACKAGE
— 2302

FORM ONE OR MORE SEAL
RINGS ON THE BLOCKS
— 2303

FORM A PLURALITY OF LEADS FROM
ONE OR MORE LEAD FRAMES
— 2304

FORM A LAMINATE STACK INCLUDING THE BLOCKS,
THE SEAL RINGS, AND THE LEADS
— 2305

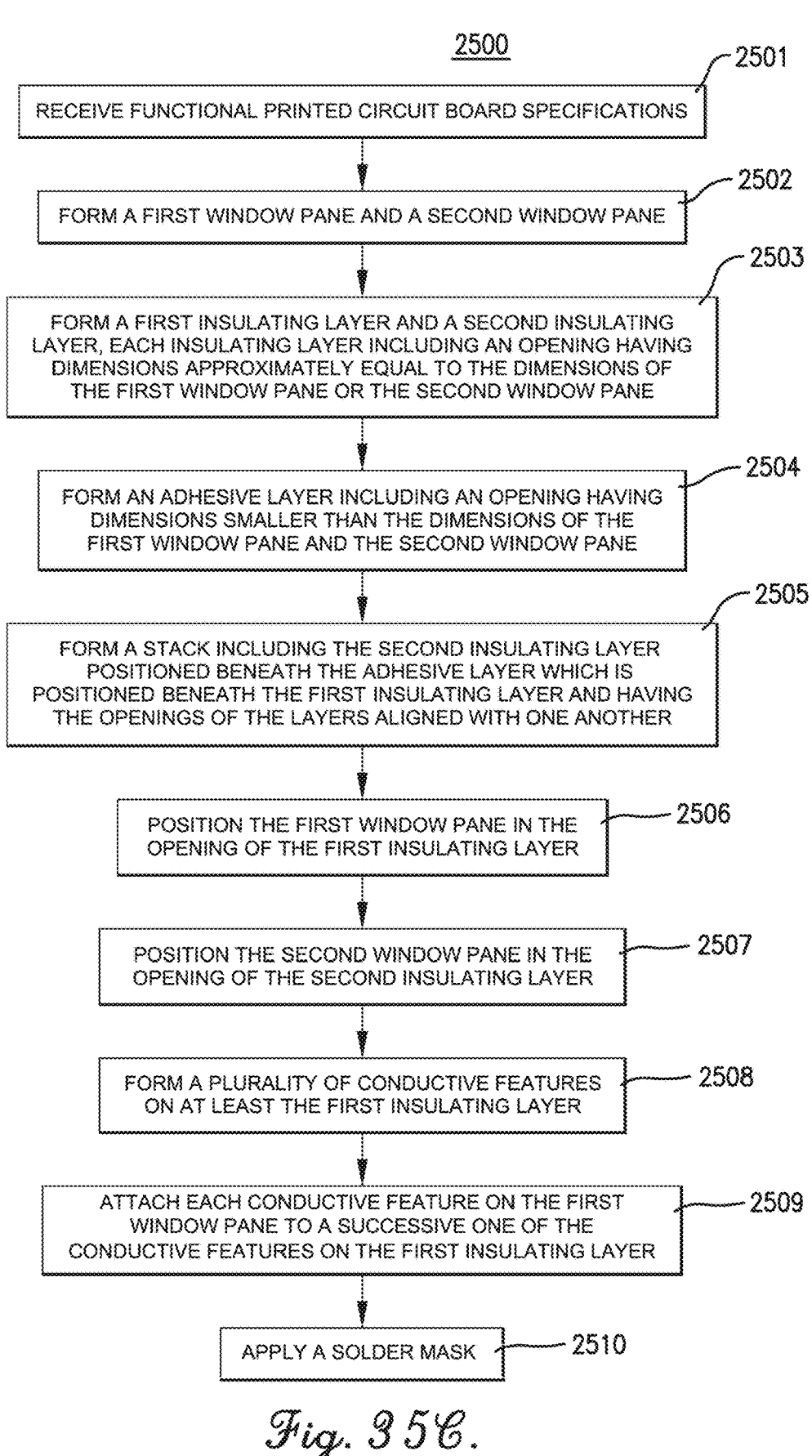

2500

RECEIVE FUNCTIONAL PRINTED CIRCUIT BOARD SPECIFICATIONS ⟋— 2501

FORM A FIRST WINDOW PANE AND A SECOND WINDOW PANE ⟋— 2502

FORM A FIRST INSULATING LAYER AND A SECOND INSULATING LAYER, EACH INSULATING LAYER INCLUDING AN OPENING HAVING DIMENSIONS APPROXIMATELY EQUAL TO THE DIMENSIONS OF THE FIRST WINDOW PANE OR THE SECOND WINDOW PANE ⟋— 2503

FORM AN ADHESIVE LAYER INCLUDING AN OPENING HAVING DIMENSIONS SMALLER THAN THE DIMENSIONS OF THE FIRST WINDOW PANE AND THE SECOND WINDOW PANE ⟋— 2504

FORM A STACK INCLUDING THE SECOND INSULATING LAYER POSITIONED BENEATH THE ADHESIVE LAYER WHICH IS POSITIONED BENEATH THE FIRST INSULATING LAYER AND HAVING THE OPENINGS OF THE LAYERS ALIGNED WITH ONE ANOTHER ⟋— 2505

POSITION THE FIRST WINDOW PANE IN THE OPENING OF THE FIRST INSULATING LAYER ⟍— 2506

POSITION THE SECOND WINDOW PANE IN THE OPENING OF THE SECOND INSULATING LAYER — 2507

FORM A PLURALITY OF CONDUCTIVE FEATURES ON AT LEAST THE FIRST INSULATING LAYER — 2508

ATTACH EACH CONDUCTIVE FEATURE ON THE FIRST WINDOW PANE TO A SUCCESSIVE ONE OF THE CONDUCTIVE FEATURES ON THE FIRST INSULATING LAYER ⟍— 2509

APPLY A SOLDER MASK ⟍— 2510

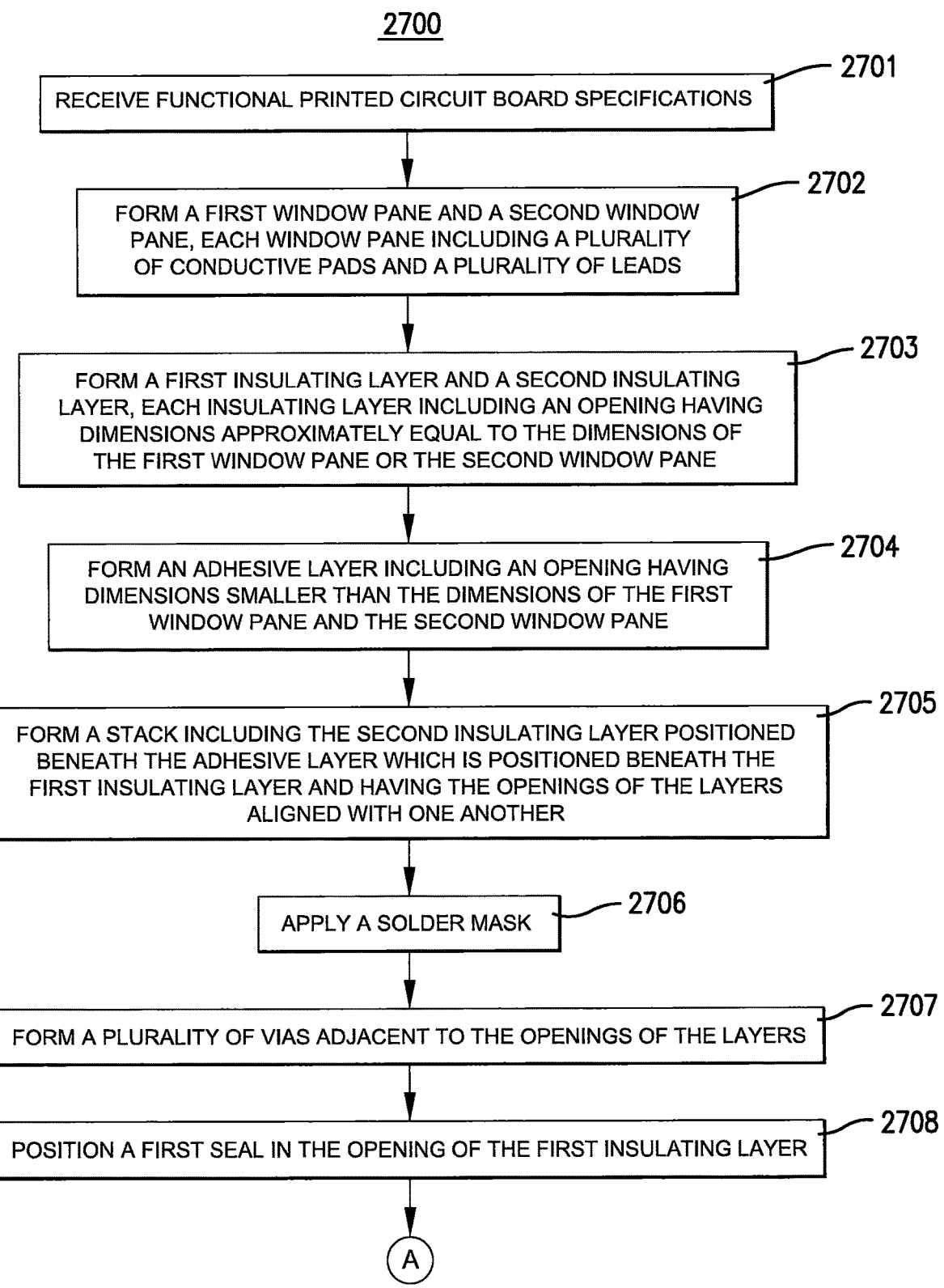

RECEIVE FUNCTIONAL PRINTED CIRCUIT BOARD SPECIFICATIONS — 2701

FORM A FIRST WINDOW PANE AND A SECOND WINDOW PANE, EACH WINDOW PANE INCLUDING A PLURALITY OF CONDUCTIVE PADS AND A PLURALITY OF LEADS — 2702

FORM A FIRST INSULATING LAYER AND A SECOND INSULATING LAYER, EACH INSULATING LAYER INCLUDING AN OPENING HAVING DIMENSIONS APPROXIMATELY EQUAL TO THE DIMENSIONS OF THE FIRST WINDOW PANE OR THE SECOND WINDOW PANE — 2703

FORM AN ADHESIVE LAYER INCLUDING AN OPENING HAVING DIMENSIONS SMALLER THAN THE DIMENSIONS OF THE FIRST WINDOW PANE AND THE SECOND WINDOW PANE — 2704

FORM A STACK INCLUDING THE SECOND INSULATING LAYER POSITIONED BENEATH THE ADHESIVE LAYER WHICH IS POSITIONED BENEATH THE FIRST INSULATING LAYER AND HAVING THE OPENINGS OF THE LAYERS ALIGNED WITH ONE ANOTHER — 2705

APPLY A SOLDER MASK — 2706

FORM A PLURALITY OF VIAS ADJACENT TO THE OPENINGS OF THE LAYERS — 2707

POSITION A FIRST SEAL IN THE OPENING OF THE FIRST INSULATING LAYER — 2708

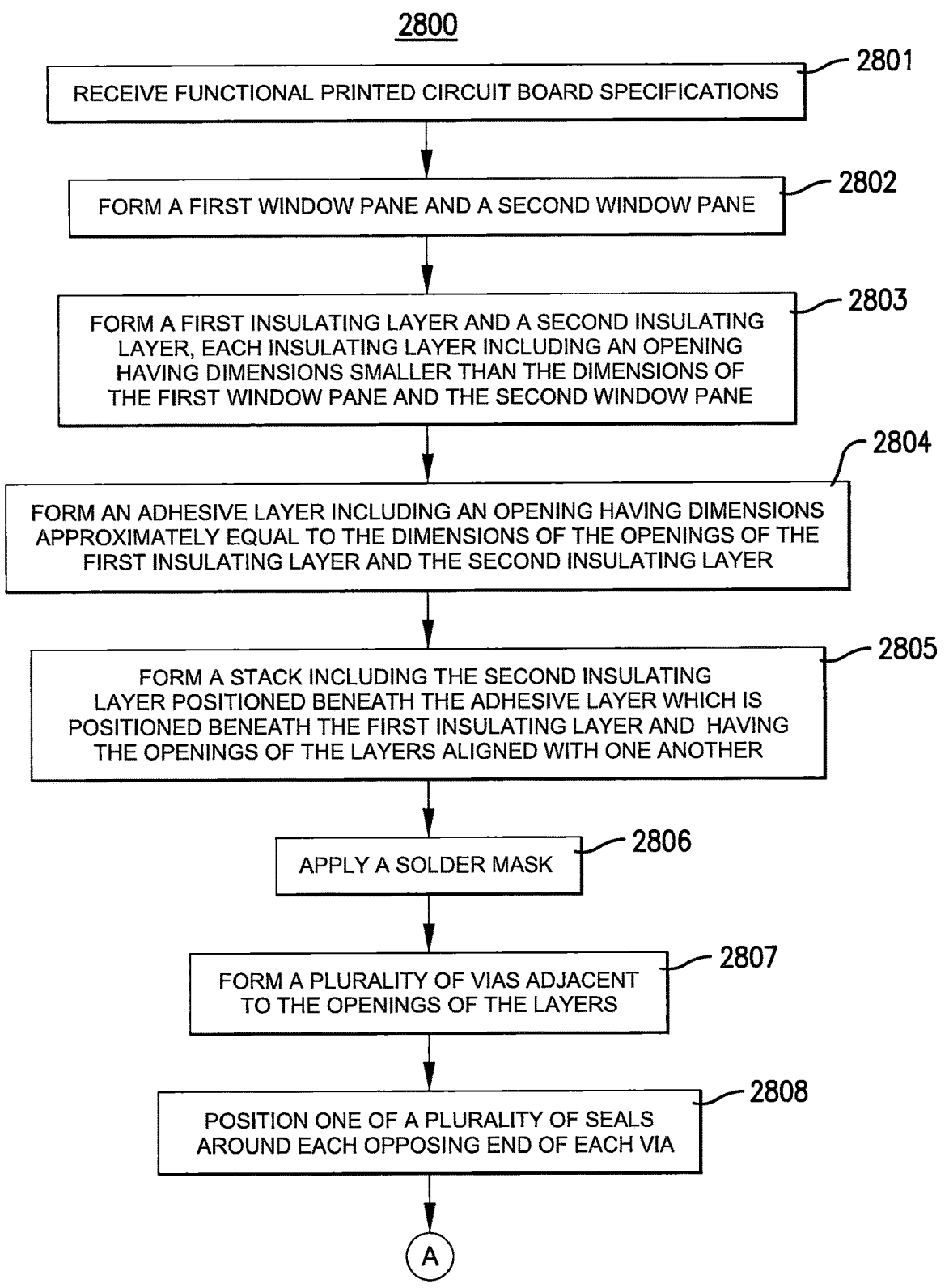

2800

2801 — RECEIVE FUNCTIONAL PRINTED CIRCUIT BOARD SPECIFICATIONS

2802 — FORM A FIRST WINDOW PANE AND A SECOND WINDOW PANE

2803 — FORM A FIRST INSULATING LAYER AND A SECOND INSULATING LAYER, EACH INSULATING LAYER INCLUDING AN OPENING HAVING DIMENSIONS SMALLER THAN THE DIMENSIONS OF THE FIRST WINDOW PANE AND THE SECOND WINDOW PANE

2804 — FORM AN ADHESIVE LAYER INCLUDING AN OPENING HAVING DIMENSIONS APPROXIMATELY EQUAL TO THE DIMENSIONS OF THE OPENINGS OF THE FIRST INSULATING LAYER AND THE SECOND INSULATING LAYER

2805 — FORM A STACK INCLUDING THE SECOND INSULATING LAYER POSITIONED BENEATH THE ADHESIVE LAYER WHICH IS POSITIONED BENEATH THE FIRST INSULATING LAYER AND HAVING THE OPENINGS OF THE LAYERS ALIGNED WITH ONE ANOTHER

2806 — APPLY A SOLDER MASK

2807 — FORM A PLURALITY OF VIAS ADJACENT TO THE OPENINGS OF THE LAYERS

2808 — POSITION ONE OF A PLURALITY OF SEALS AROUND EACH OPPOSING END OF EACH VIA

POSITION THE FIRST WINDOW PANE OVER THE
OPENING OF THE FIRST INSULATING LAYER

2810

POSITION THE SECOND WINDOW PANE OVER THE
OPENING OF THE SECOND INSULATING LAYER

2811

POSITION A SUCCESSIVE ONE OF A PLURALITY OF FASTENERS
IN EACH VIA TO RETAIN EACH WINDOW PANE OVER THE OPENINGS

3000

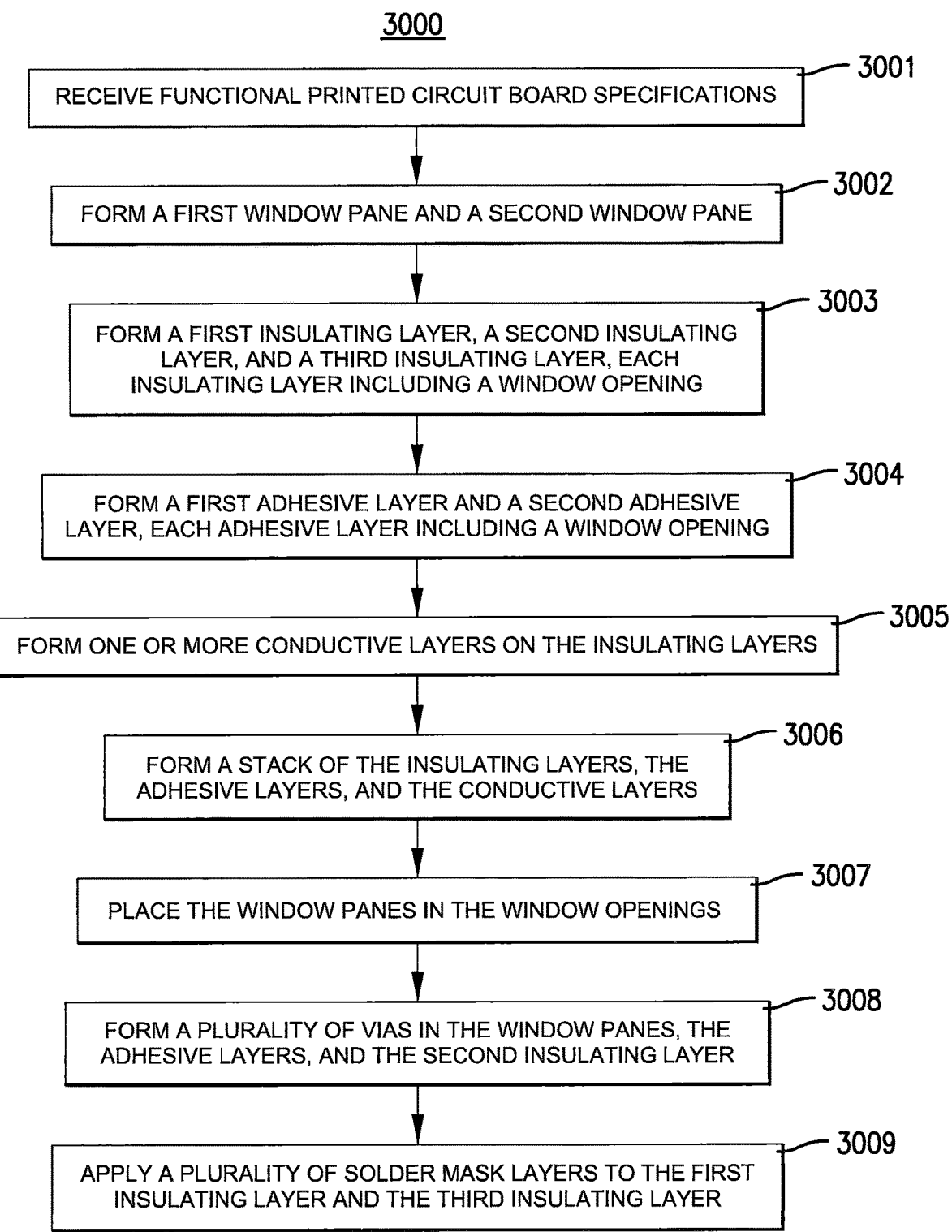

RECEIVE FUNCTIONAL PRINTED CIRCUIT BOARD SPECIFICATIONS — 3001

FORM A FIRST WINDOW PANE AND A SECOND WINDOW PANE — 3002

FORM A FIRST INSULATING LAYER, A SECOND INSULATING LAYER, AND A THIRD INSULATING LAYER, EACH INSULATING LAYER INCLUDING A WINDOW OPENING — 3003

FORM A FIRST ADHESIVE LAYER AND A SECOND ADHESIVE LAYER, EACH ADHESIVE LAYER INCLUDING A WINDOW OPENING — 3004

FORM ONE OR MORE CONDUCTIVE LAYERS ON THE INSULATING LAYERS — 3005

FORM A STACK OF THE INSULATING LAYERS, THE ADHESIVE LAYERS, AND THE CONDUCTIVE LAYERS — 3006

PLACE THE WINDOW PANES IN THE WINDOW OPENINGS — 3007

FORM A PLURALITY OF VIAS IN THE WINDOW PANES, THE ADHESIVE LAYERS, AND THE SECOND INSULATING LAYER — 3008

APPLY A PLURALITY OF SOLDER MASK LAYERS TO THE FIRST INSULATING LAYER AND THE THIRD INSULATING LAYER — 3009

*Fig. 41.*

TRANSPARENT PACKAGE FOR USE WITH PRINTED CIRCUIT BOARDS

RELATED APPLICATIONS

The current patent application is a continuation-in-part patent application which claims priority benefit, with regard to all common subject matter, of an earlier-filed U.S. Provisional Application entitled "TRANSPARENT PACKAGE FOR USE WITH PRINTED CIRCUIT BOARDS", Ser. No. 63/324,512, filed Mar. 28, 2022, and earlier-filed regular utility patent application with U.S. patent application Ser. No. 17/579,974, entitled "TRANSPARENT PACKAGE FOR USE WITH PRINTED CIRCUIT BOARDS", filed Jan. 20, 2022, which itself claims priority benefit, with regard to all common subject matter, of earlier-filed U.S. Provisional Application entitled "TRANSPARENT PACKAGE FOR USE WITH PRINTED CIRCUIT BOARDS", Ser. No. 63/191,194, filed May 20, 2021. The listed earlier-filed applications are hereby incorporated by reference, in their entireties, into the current patent application.

STATEMENT REGARDING FEDERALLY-SPONSORED RESEARCH OR DEVELOPMENT

This invention was made with Government support under Contract No.: DE-NA0002839 awarded by the United States Department of Energy/National Nuclear Security Administration. The Government has certain rights in the invention.

FIELD OF THE INVENTION

Embodiments of the current invention relate to electronic component packages that are transparent and to transparent printed circuit boards.

DESCRIPTION OF THE RELATED ART

Electronic circuitry production for devices such as TVs, computers, automotive control systems, smartphones, etc., often involves electrically connecting integrated circuit and discrete electronic component packages to a printed circuit board using solder, solder paste, and flux. The connection process often leaves behind residual solder, solder paste, and flux and may create dendrites, tin whiskers, and corrosion. Thus, the printed circuit board and component packages need to be cleaned. However, traditional cleaning processes may not sufficiently clean everything—particularly with leadless electronic component packages in which the solder connections are made on the bottom surface of the package and are covered by the package itself. One drawback is that there is no way to properly evaluate whether the electronic circuitry is being cleaned since in some cases the connections to be cleaned are hidden from view.

SUMMARY OF THE INVENTION

Embodiments of the current invention address one or more of the above-mentioned problems and provide a blank package which includes a body formed from transparent material and a plurality of conductive pads that are shaped and positioned in a same manner as conductive pads on a functional component package to be mimicked or imitated by the blank package. A plurality of blank packages, each imitating a particular functional electronic component package, is mounted on the printed circuit board. The printed circuit board undergoes the standard electrical connection and cleaning processes. After each process, the printed circuit board may be visually inspected. Since the blank packages are transparent to visible light, any debris or residue beneath the body of each blank package can be observed so as to gauge the quality of the fabrication and cleaning processes.

An embodiment of the blank package broadly comprises a body and a plurality of conductive pads. The body is formed from generally transparent electrically insulating material and has a top surface, a bottom surface, and a plurality of side surfaces. The bottom surface has a shape and dimensions that are similar to a bottom surface of the electronic component package. The conductive pads are formed from electrically conductive material and attached to the body, with each conductive pad corresponding to a successive one of the conductive pads of the electronic component package. Each conductive pad has features that are similar to features of the corresponding conductive pad of the electronic component package.

Another embodiment of the current invention provides a method of forming a blank package that mimics an electronic component package. The method broadly comprises receiving functional electronic component package specifications including body dimensions and conductive pad sizes, shapes, and locations; forming a body of the blank package from transparent electrically insulating material, wherein the body includes a bottom surface having a shape and dimensions that are similar to a bottom surface of the electronic component package; and forming a plurality of conductive pads on the body from electrically conductive material, each conductive pad corresponding to a successive one of the conductive pads of the electronic component package and each conductive pad having features that are similar to features of the corresponding conductive pad of the electronic component package.

Another embodiment of the current invention provides a transparent printed circuit board for mimicking an actual printed circuit board. The transparent printed circuit board broadly comprises a body, a plurality of package footprints, and a plurality of conductive traces. The body is formed from rigid, generally transparent electrically insulating material and has a top surface, a bottom surface, and a plurality of edges. The package footprints are formed from electrically conductive material and positioned on the body. The package footprints correspond to at least a portion of a plurality of package footprints of the actual printed circuit board.

Another embodiment of the current invention provides a method of forming a transparent printed circuit board to mimic an actual printed circuit board. The method broadly comprises receiving data regarding at least a portion of a placement of package footprints and routing of conductive traces for the actual printed circuit board; forming a body of the transparent printed circuit board from rigid, generally transparent electrically insulating material, the body having a top surface, a bottom surface, and a plurality of edges; forming a plurality of package footprints on the body corresponding to the package footprints of the actual printed circuit board; and forming a plurality of conductive traces on the body corresponding to the conductive traces of the actual printed circuit board.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 9A:
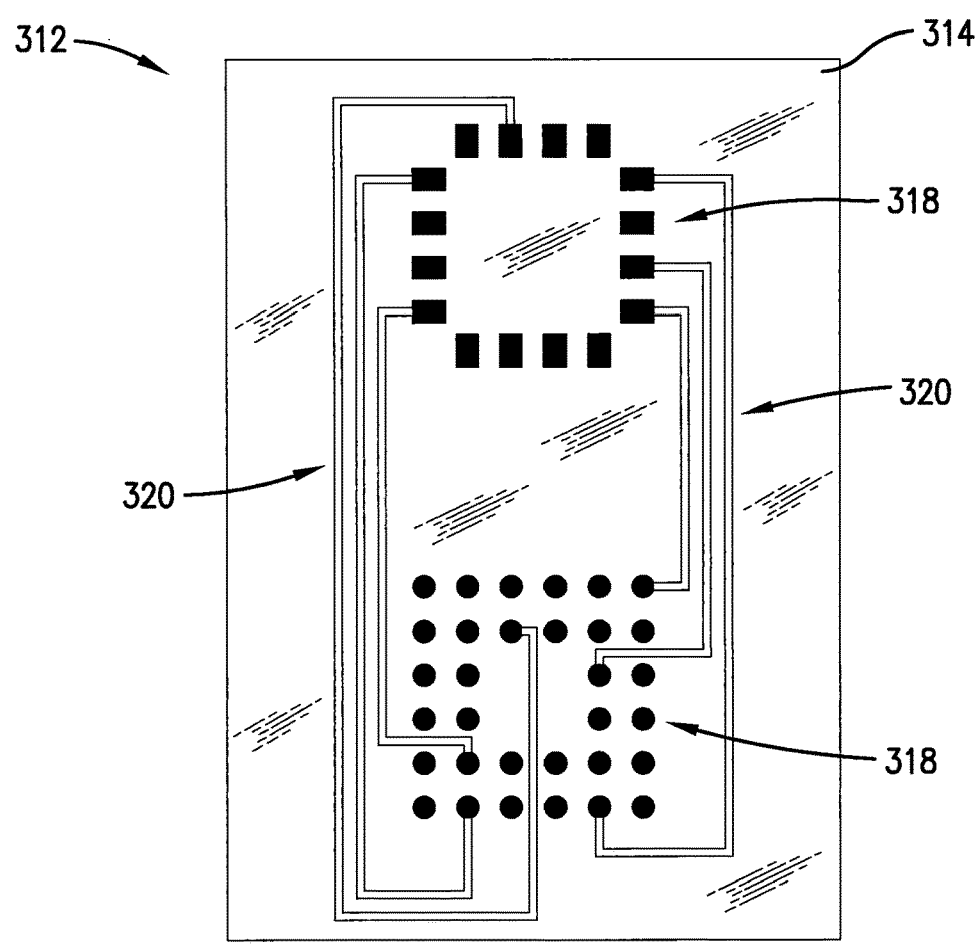
Figure 9B:
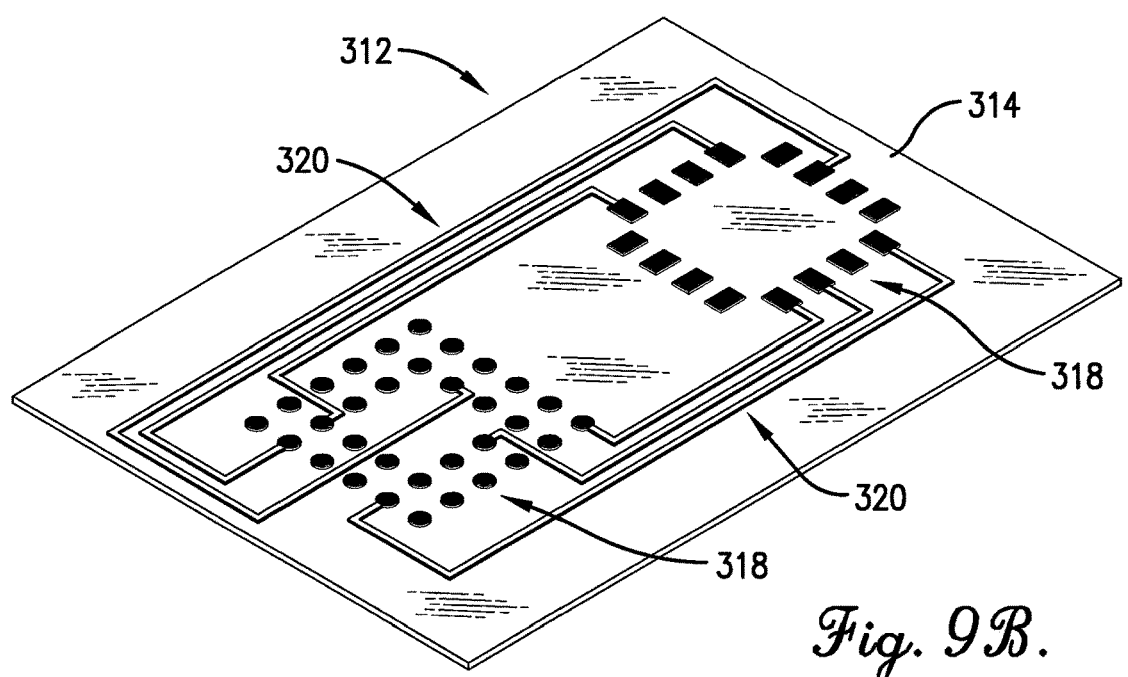
Figure 10A:
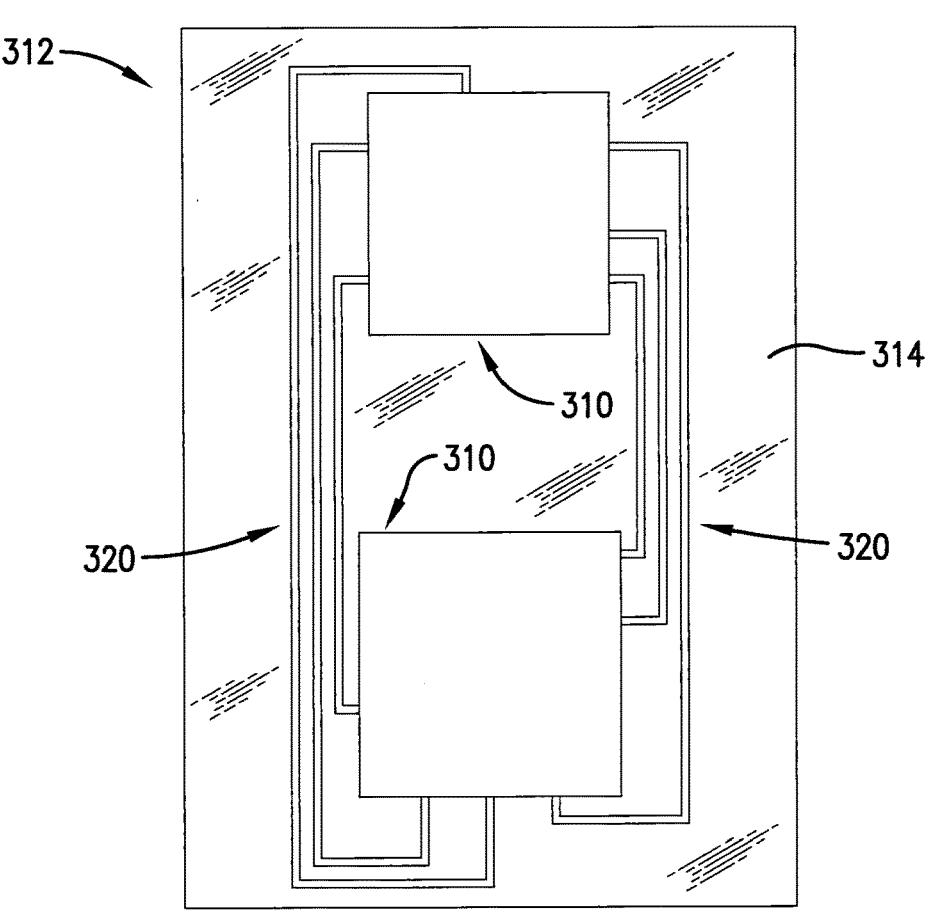
Figure 10B:
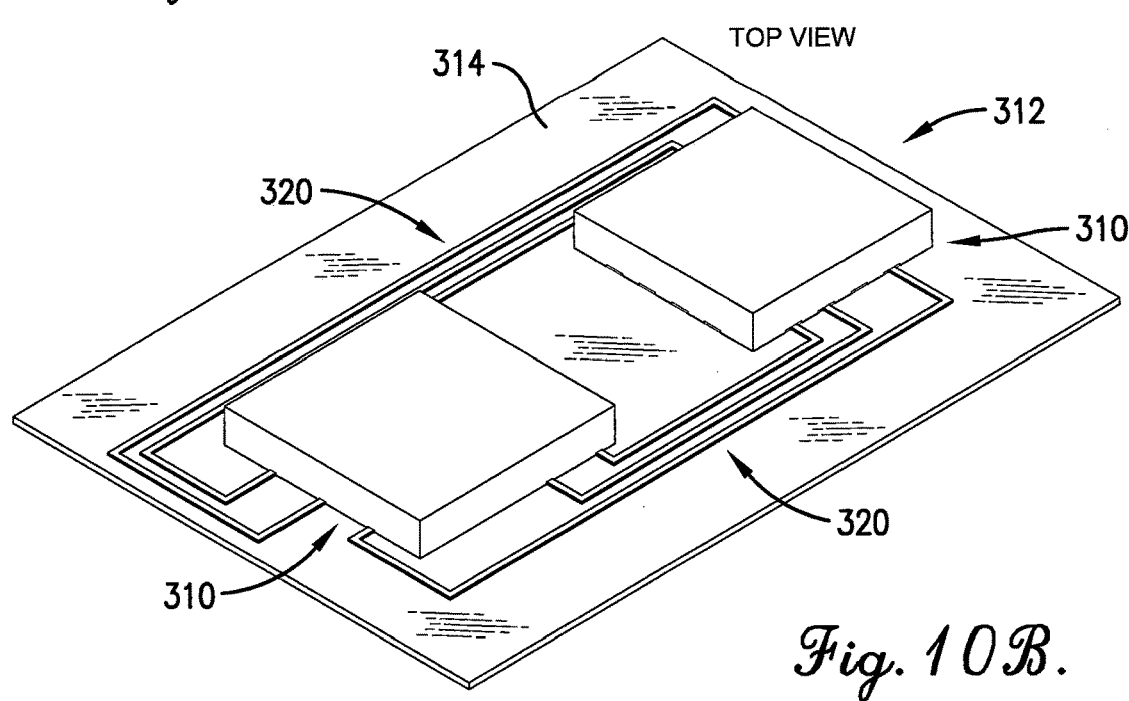
Figure 11A:
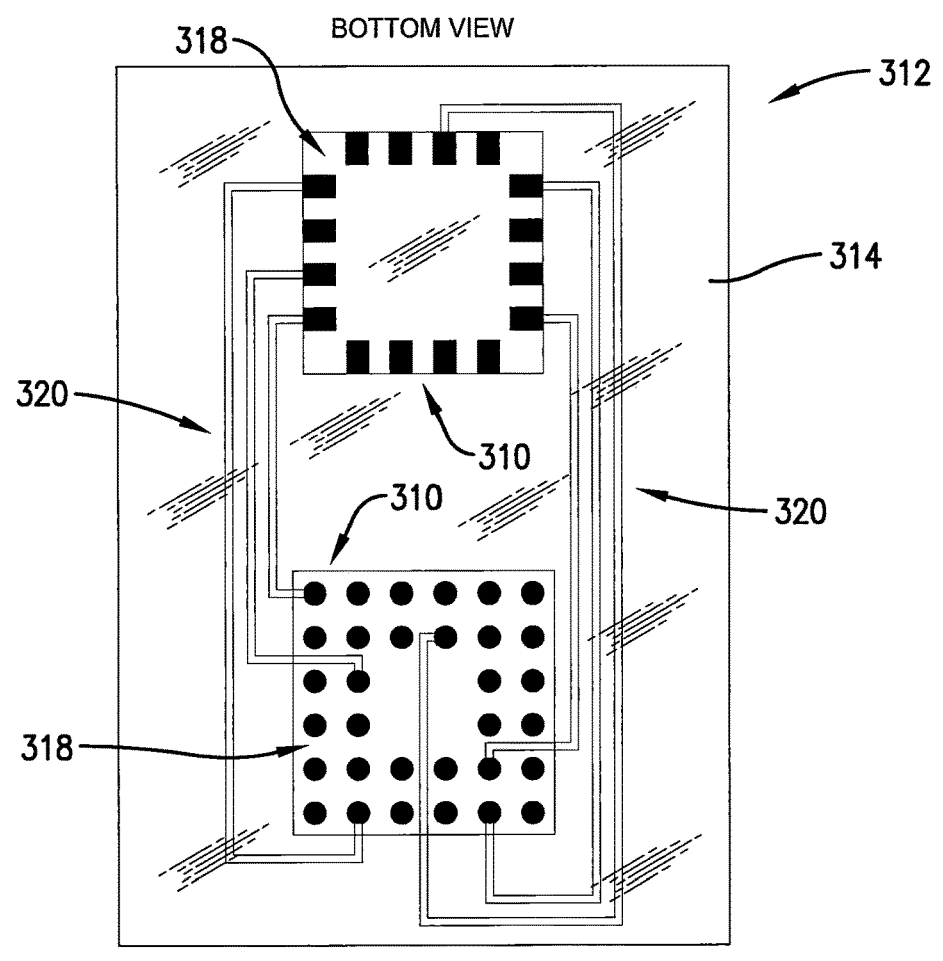
Figure 11B:
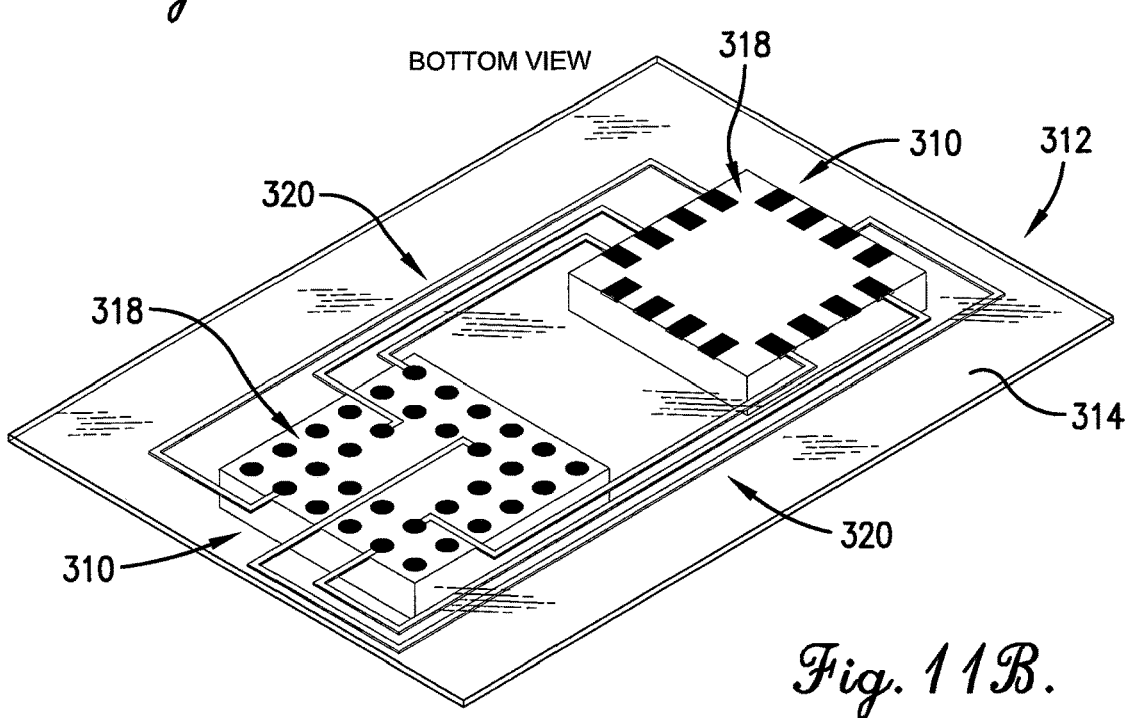
Figure 13A:
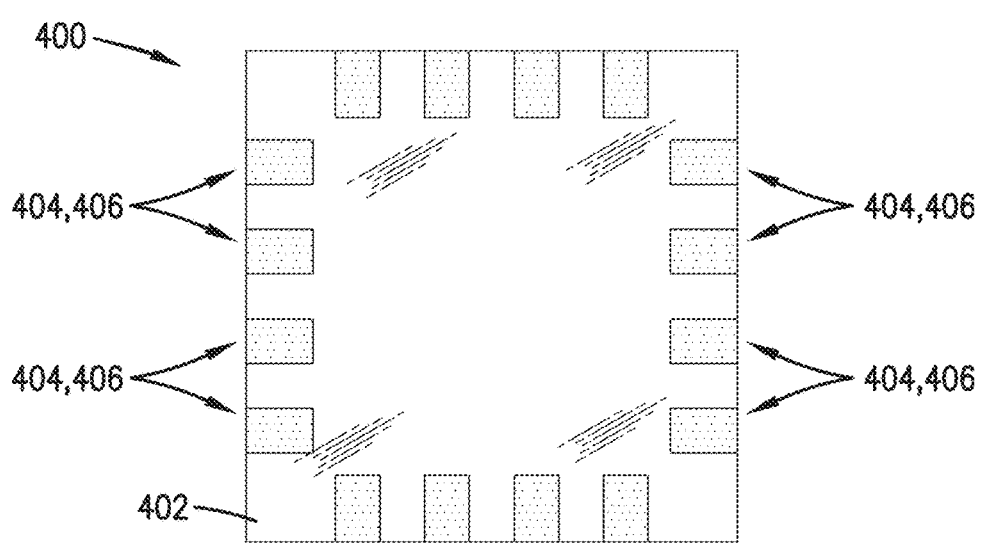

FIG. 8 includes a listing of at least a portion of the steps of a method of forming a blank package that mimics an electronic component package;

FIG. 9A is a top view of a transparent printed circuit board, constructed in accordance with various embodiments of the current invention, with a plurality of packages electrically connected thereto;

FIG. 9B is an upper perspective view of the transparent printed circuit board;

FIG. 10A is a top view of the transparent printed circuit board with a plurality of packages electrically connected thereto;

FIG. 10B is an upper perspective view of the transparent printed circuit board with the packages;

FIG. 11A is a bottom view of the transparent printed circuit board with a plurality of packages electrically connected thereto;

FIG. 11B is a lower perspective view of the transparent printed circuit board with the packages;

FIG. 12 includes a listing of at least a portion of the steps of a method of forming a transparent printed circuit board that mimics an actual printed circuit board;

FIG. 13A is a top view of another embodiment of a blank package;

4

Figure 13B:
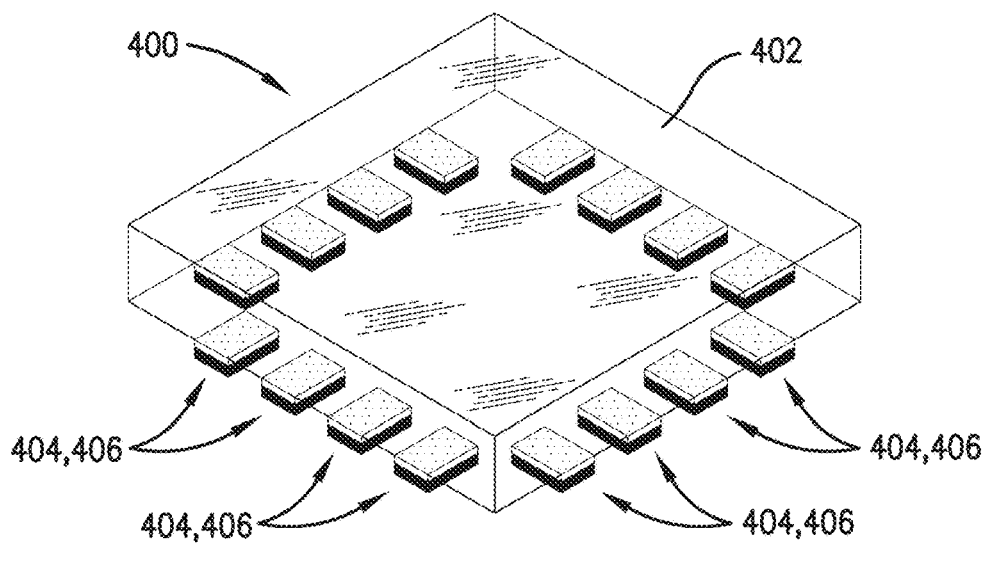
Figure 13C:
Figure 13D:
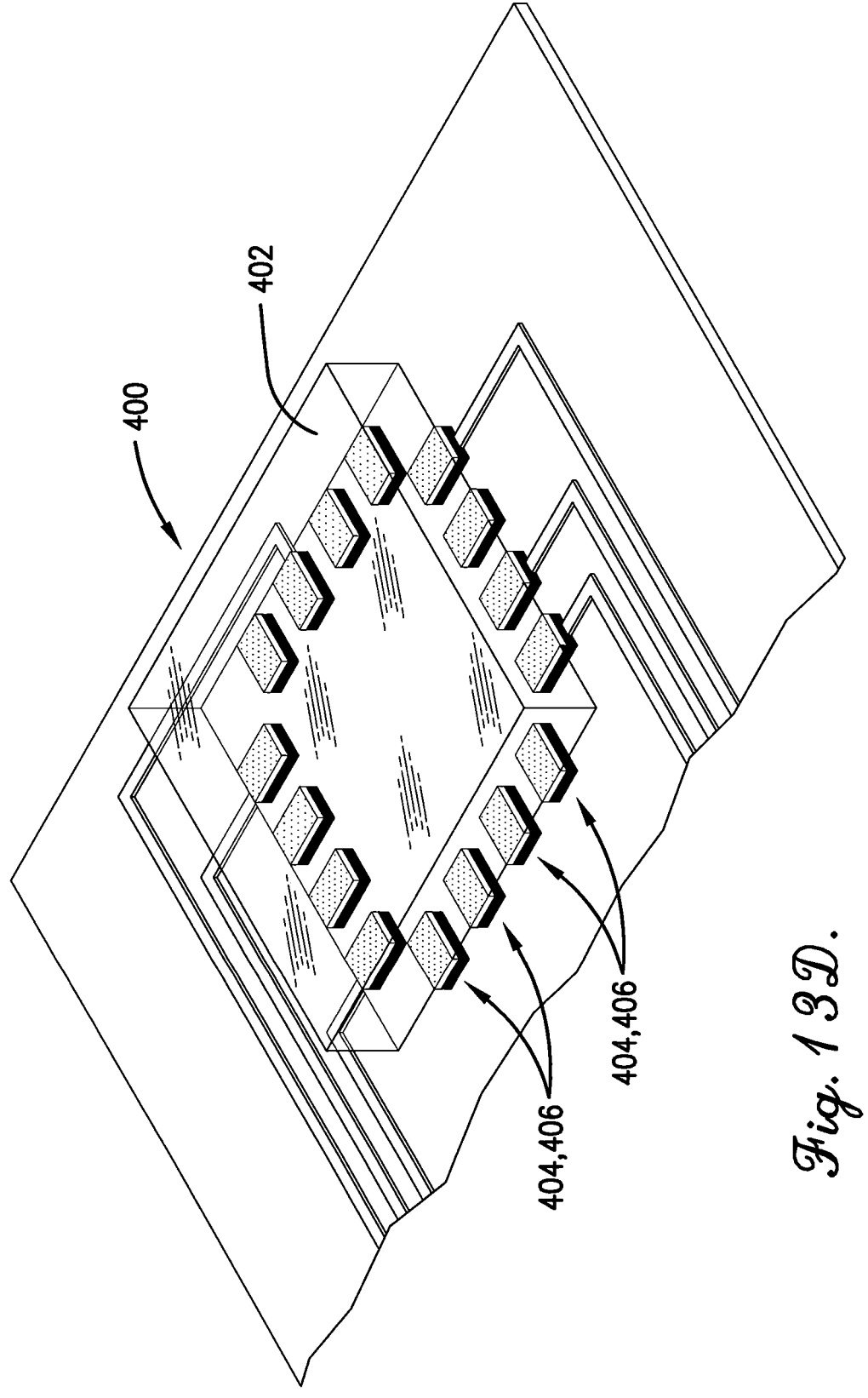
Figure 13E:
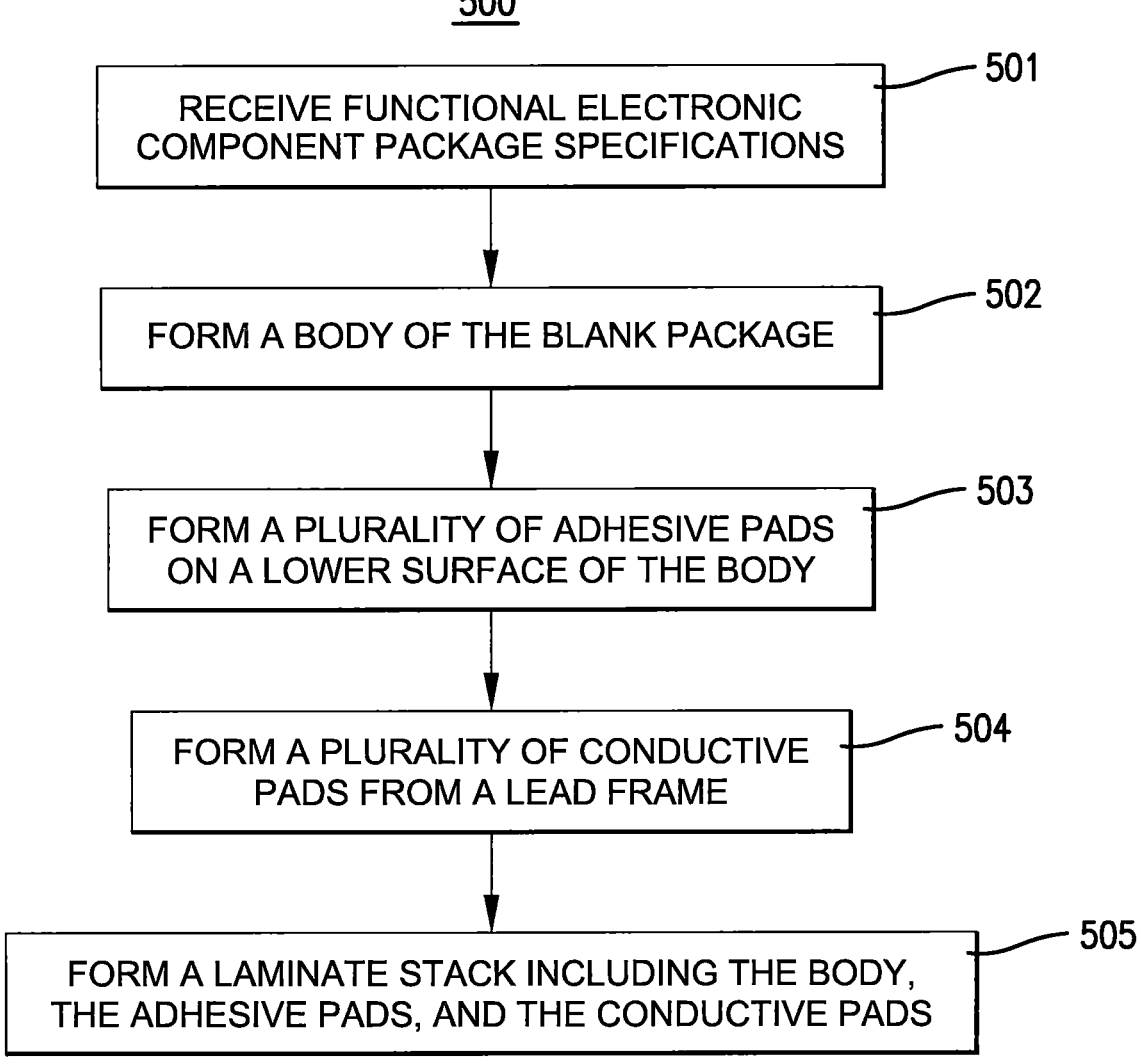
Figure 14A:
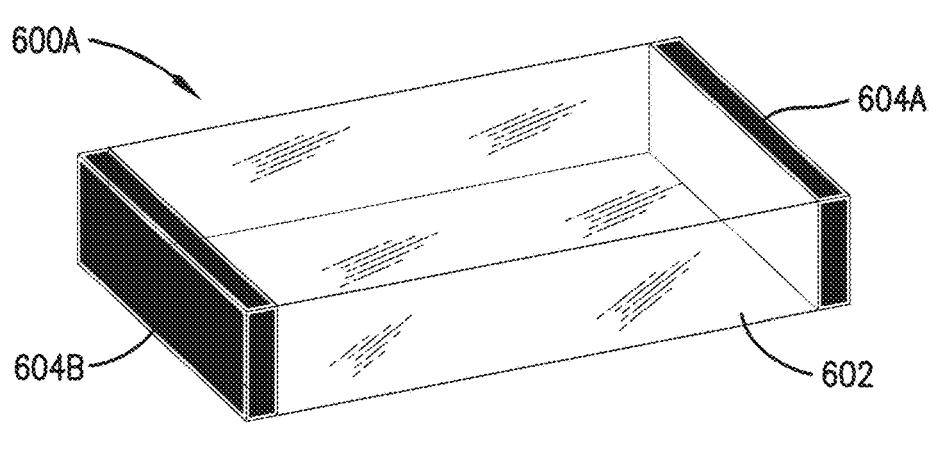
Figure 14B:
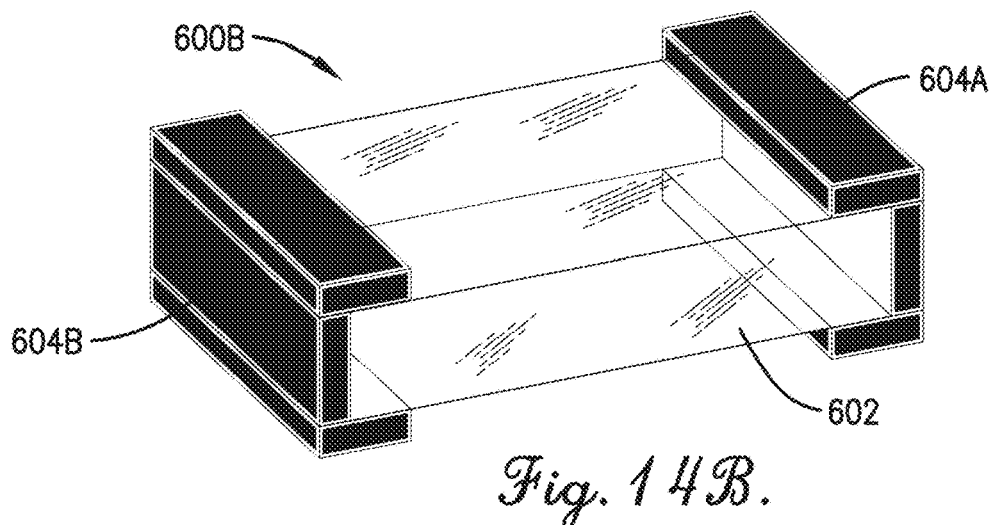
Figure 14C:
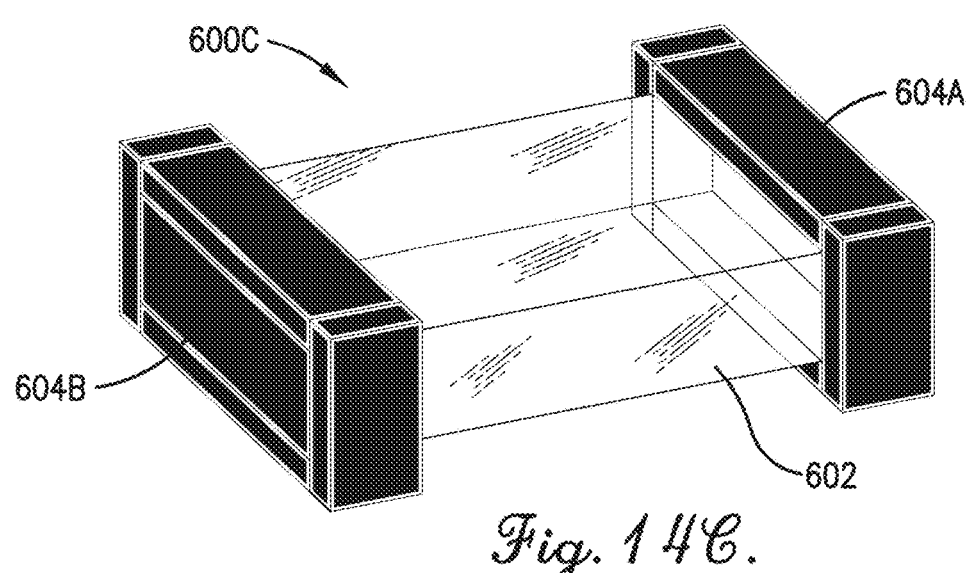
Figure 14D:
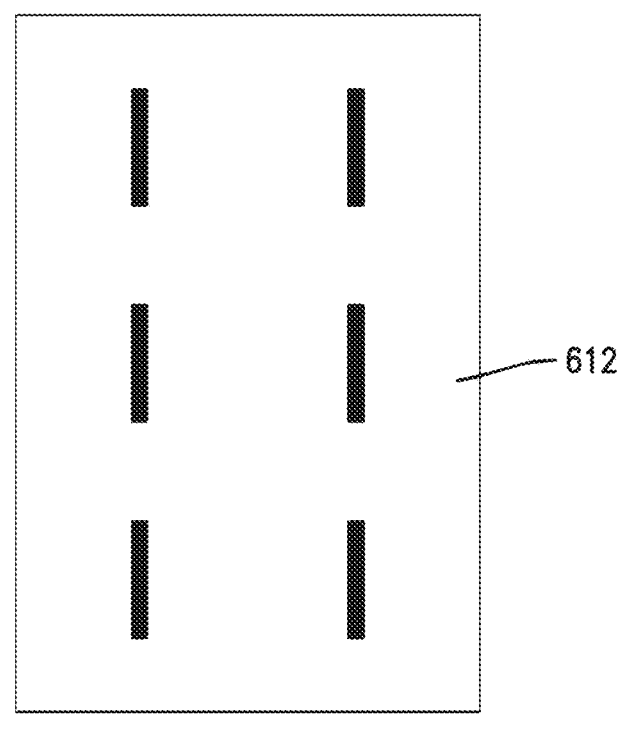
Figure 14E:
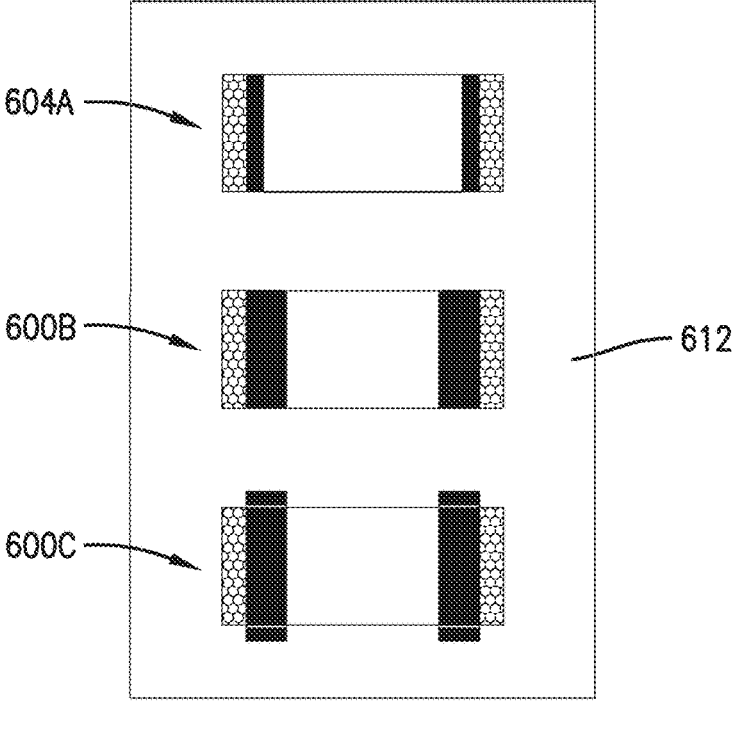
Figure 14F:
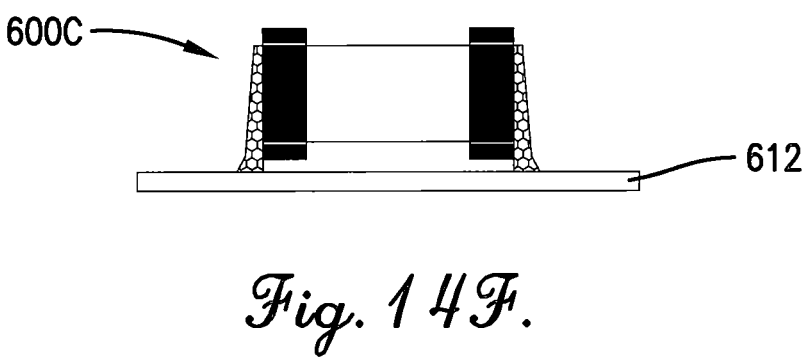
Figure 14G:
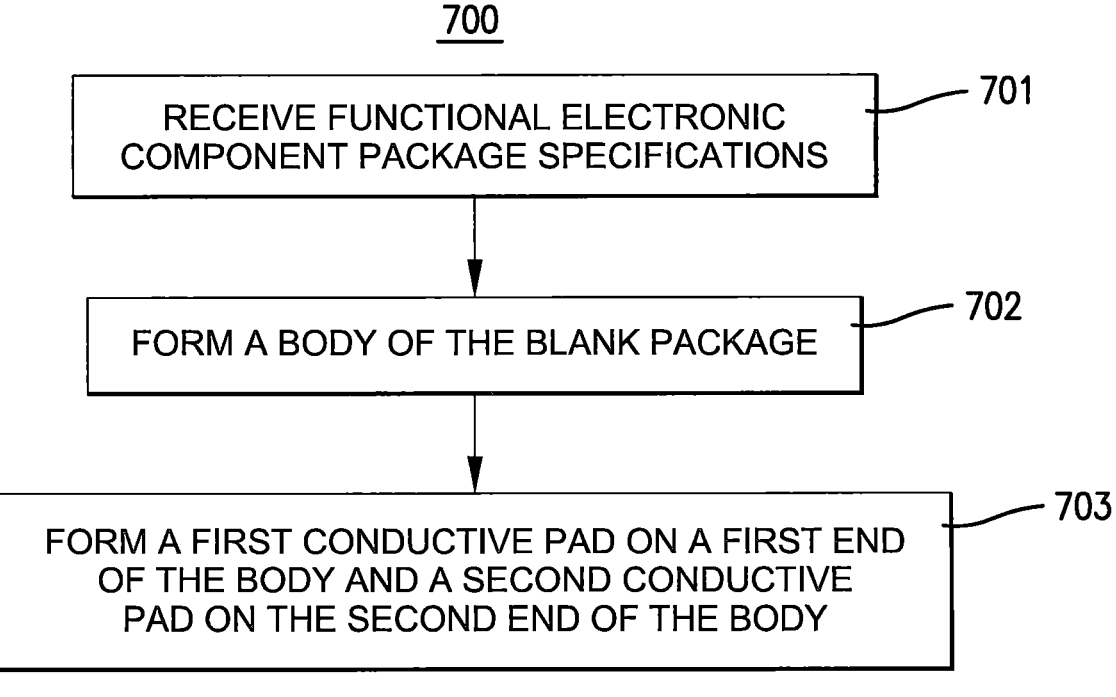
Figure 15A:
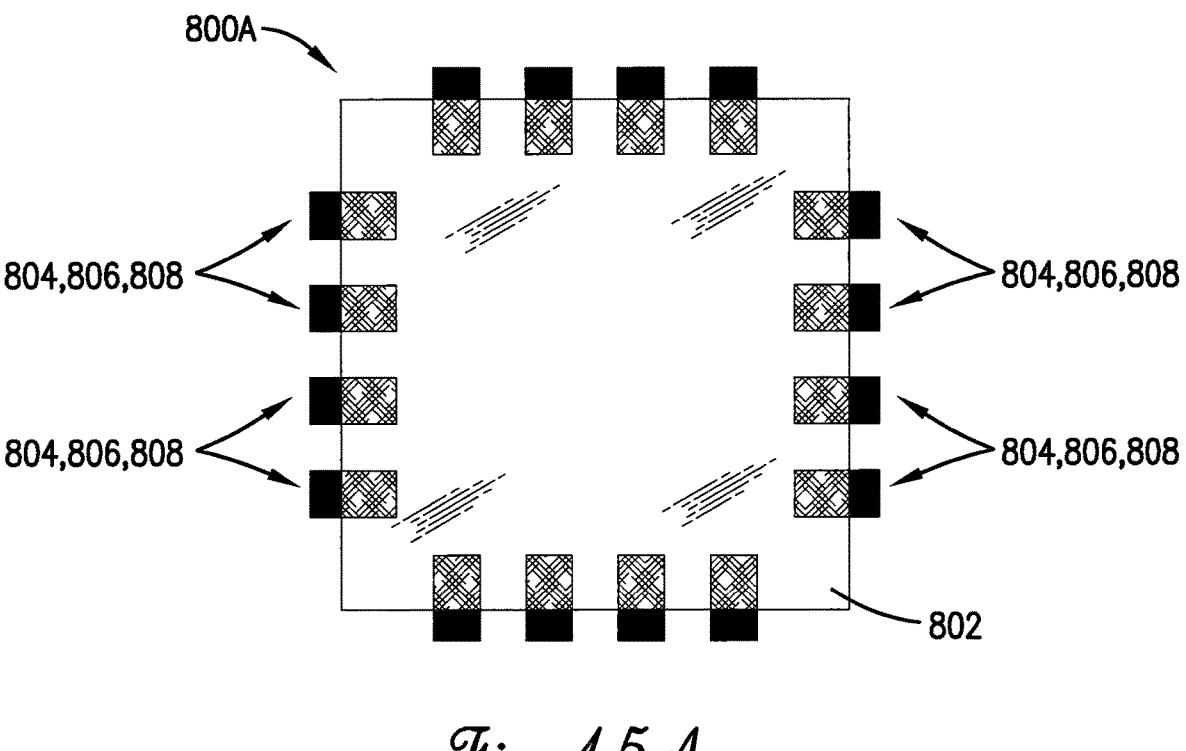
Figure 15B:
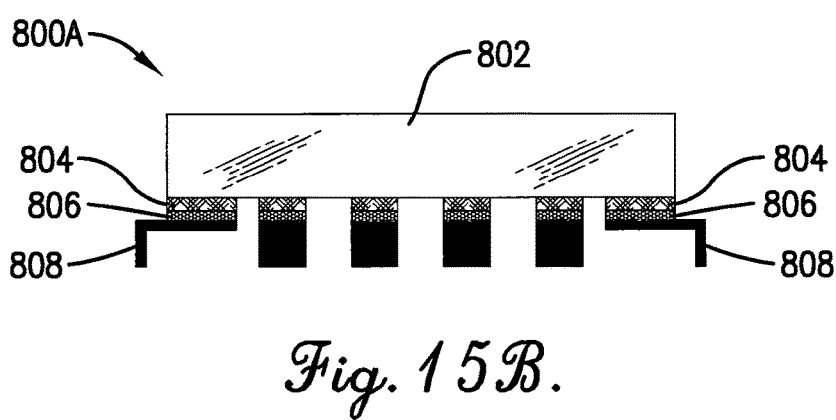
Figure 15C:
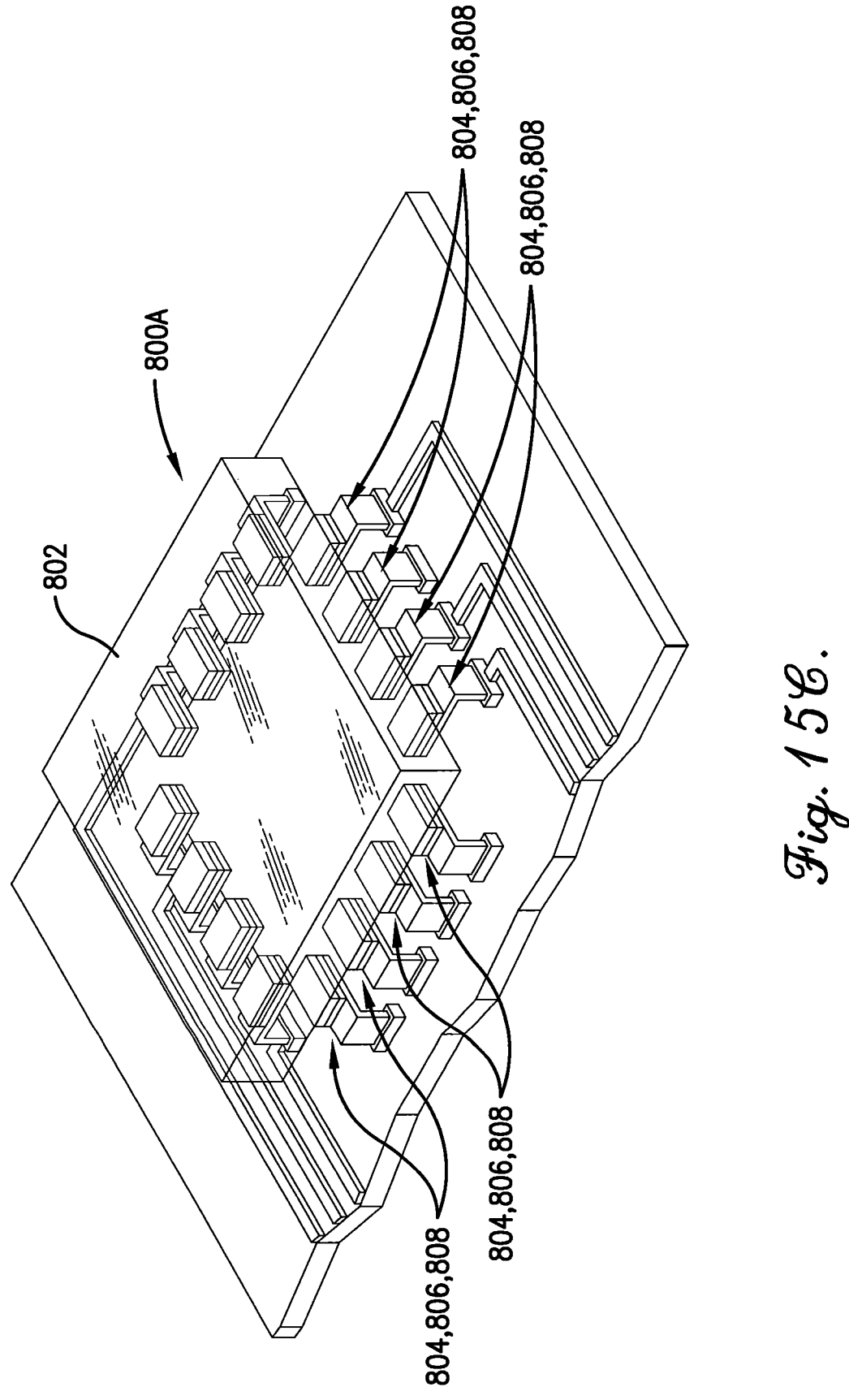
Figure 16A:
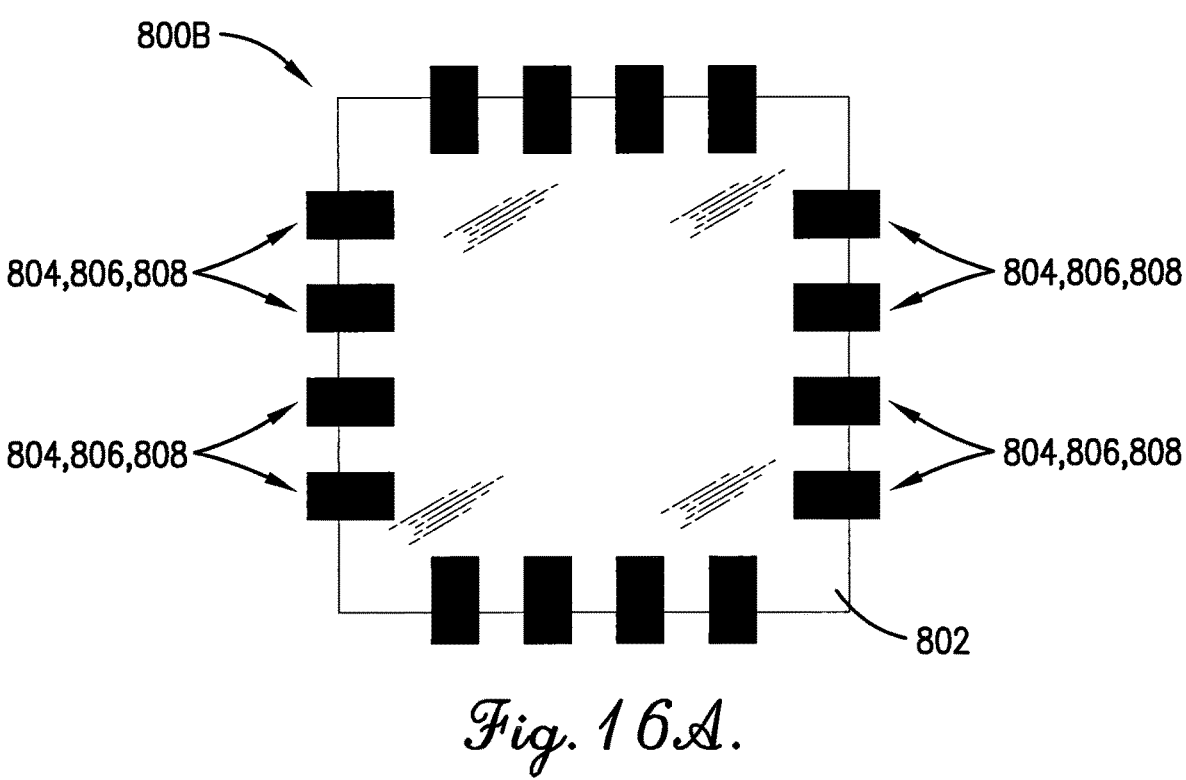
Figure 16B:
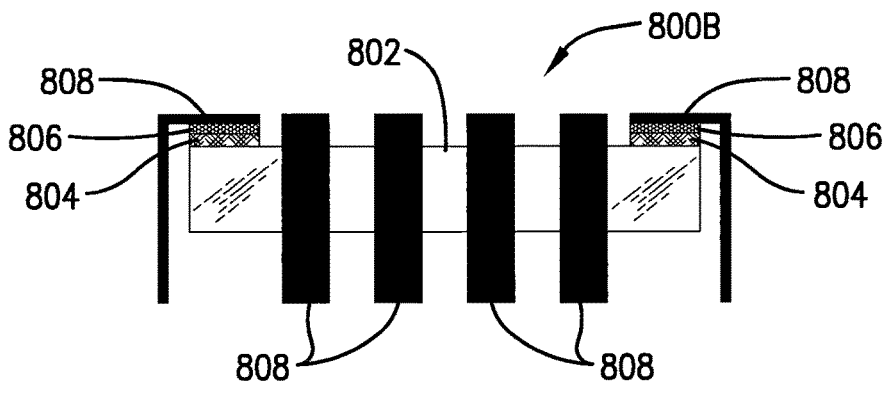
Figure 16C:
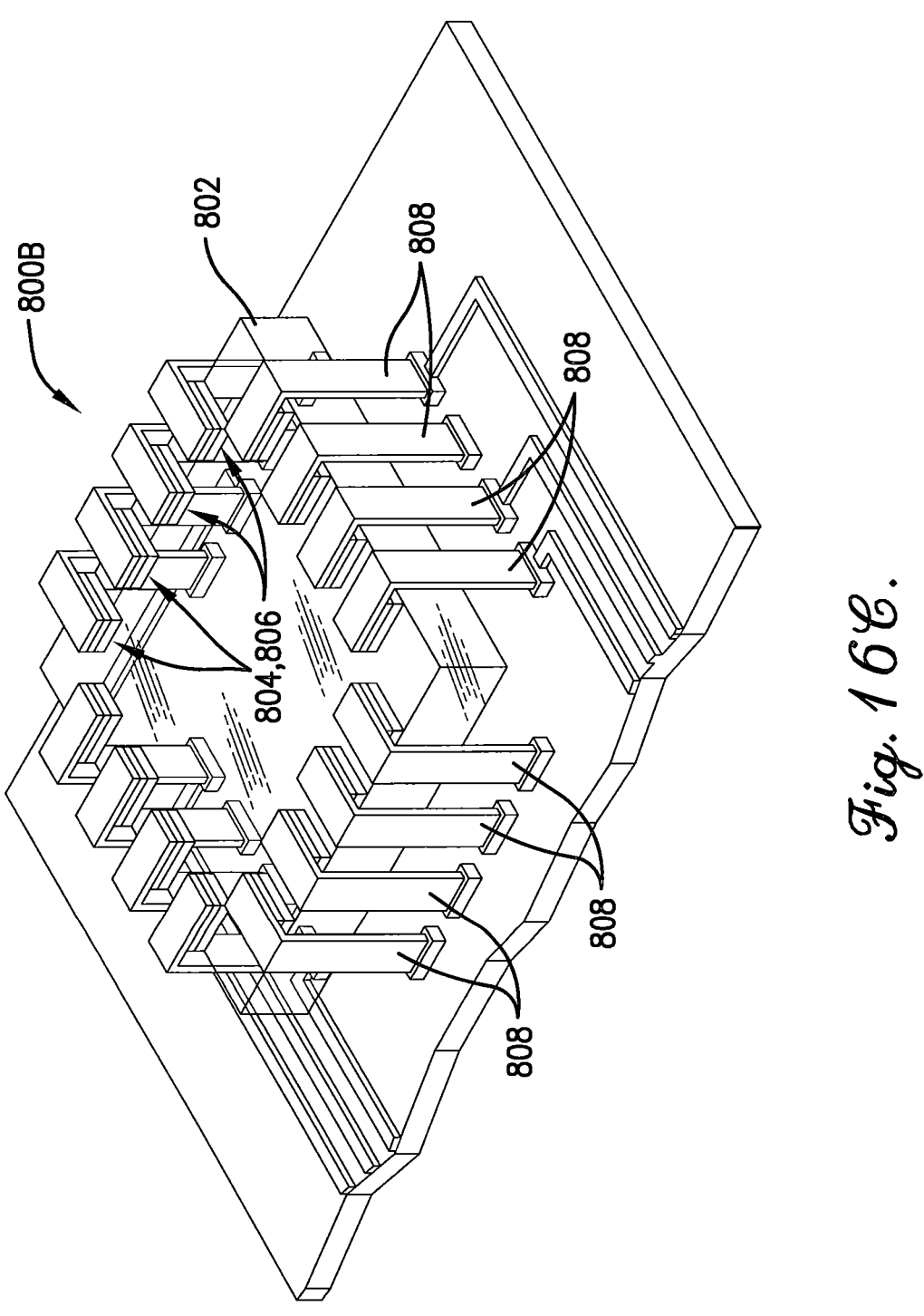
Figure 17A:
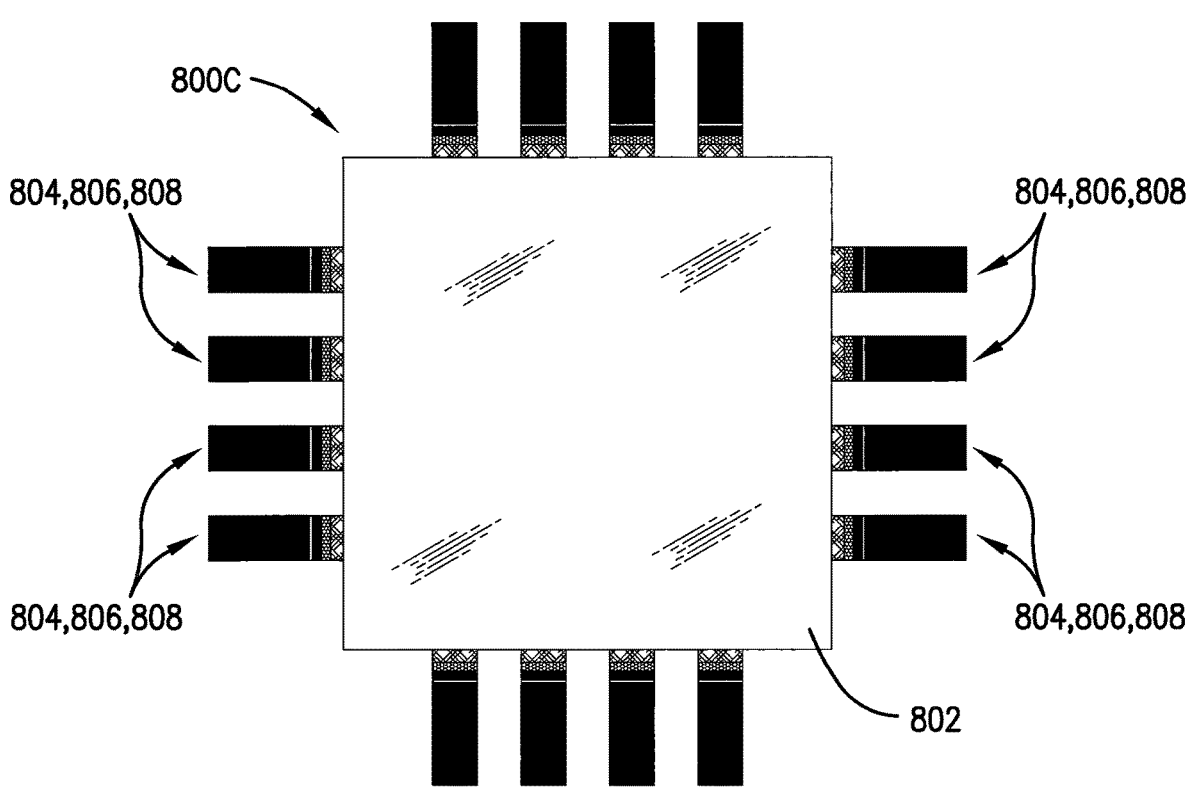
Figure 17B:
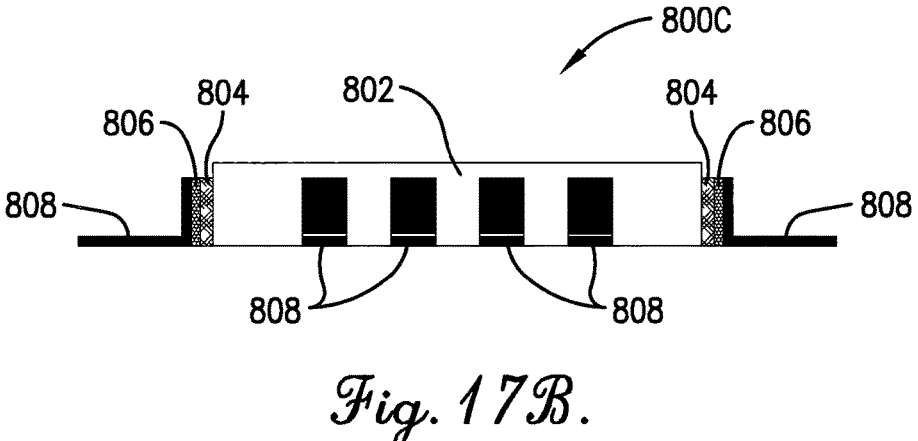
Figure 17C:
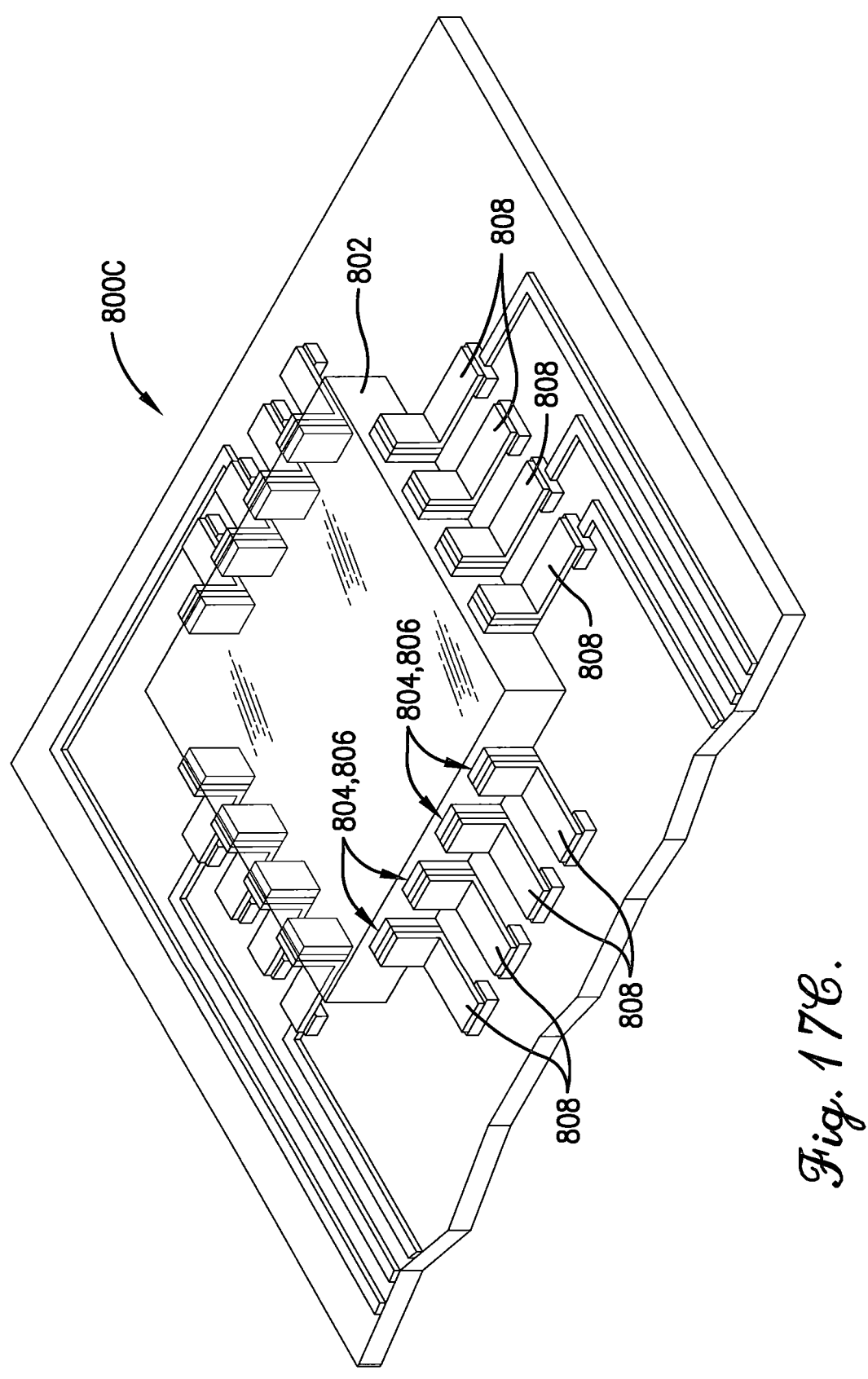
Figure 17D:
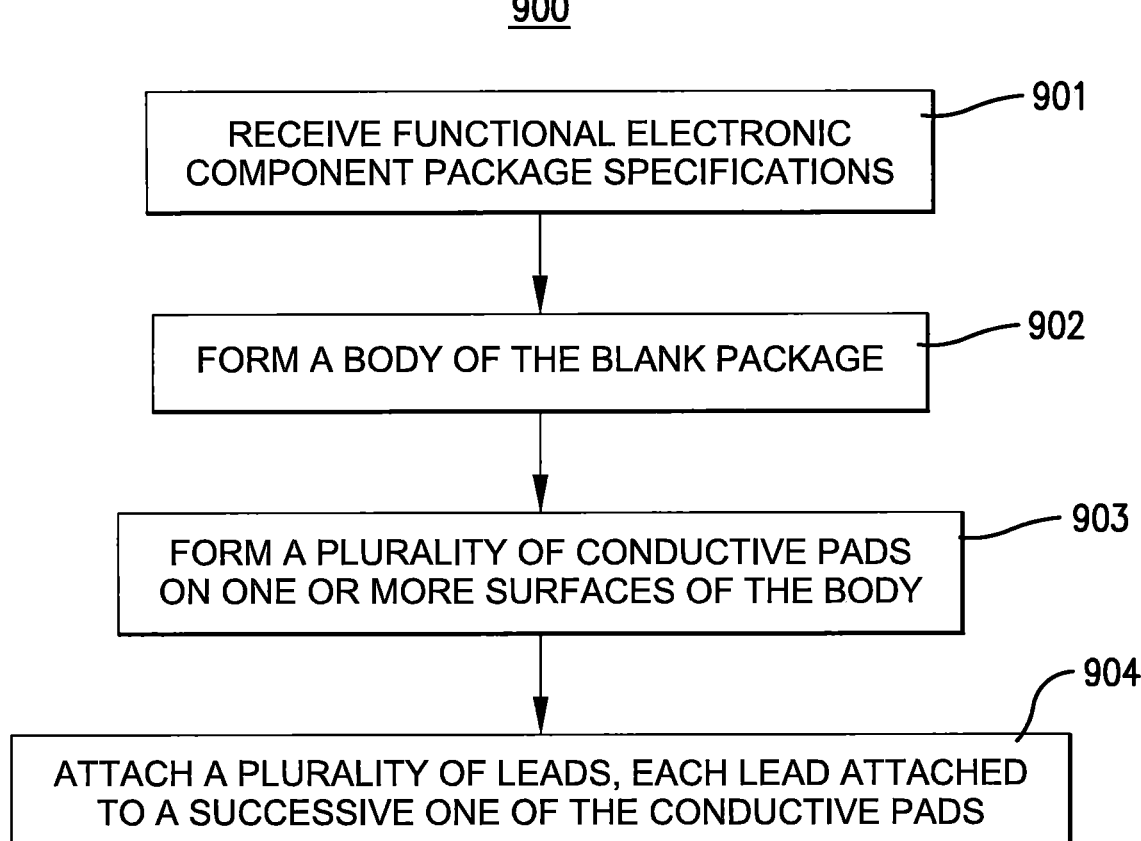
Figure 18A:
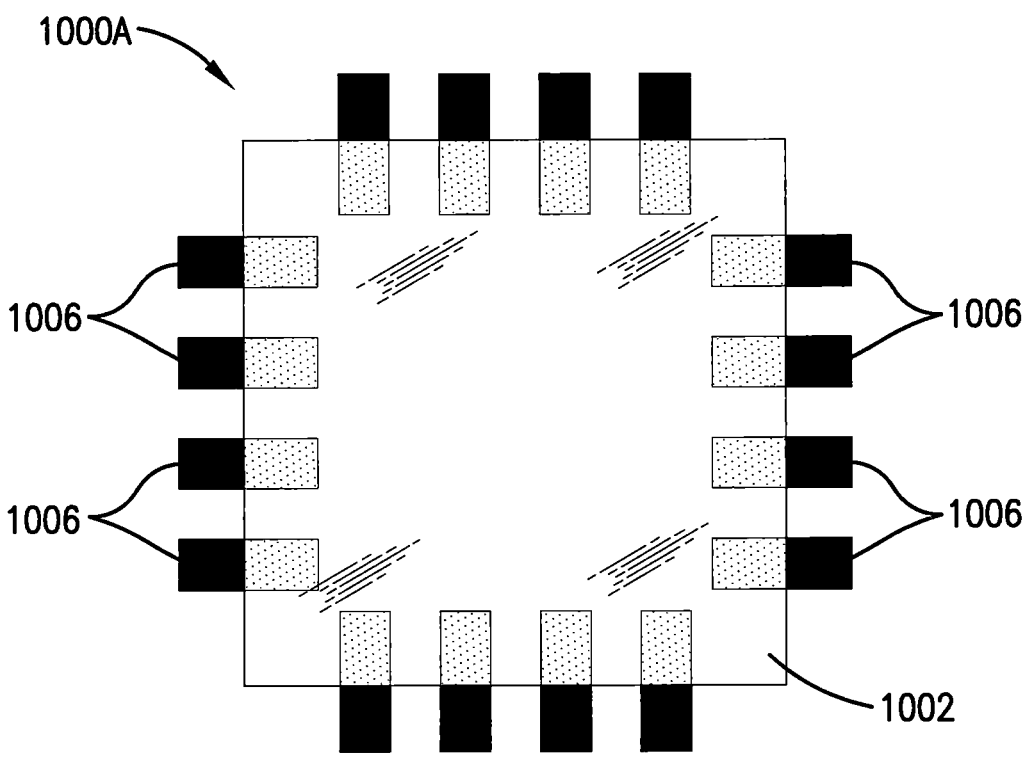
Figure 18B:
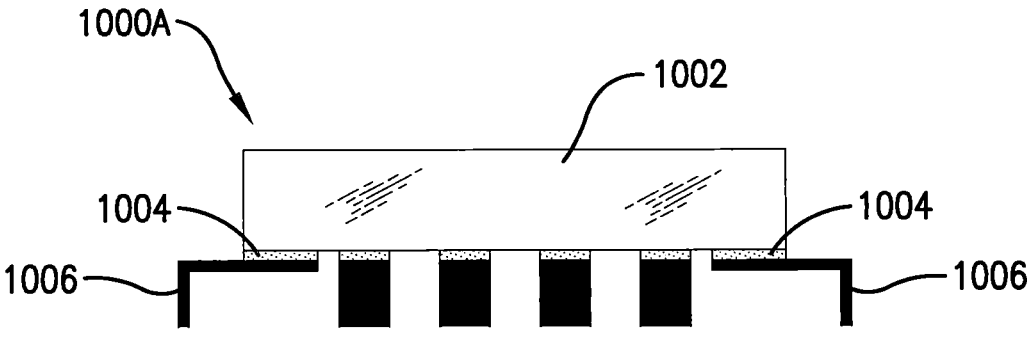
Figure 18C:
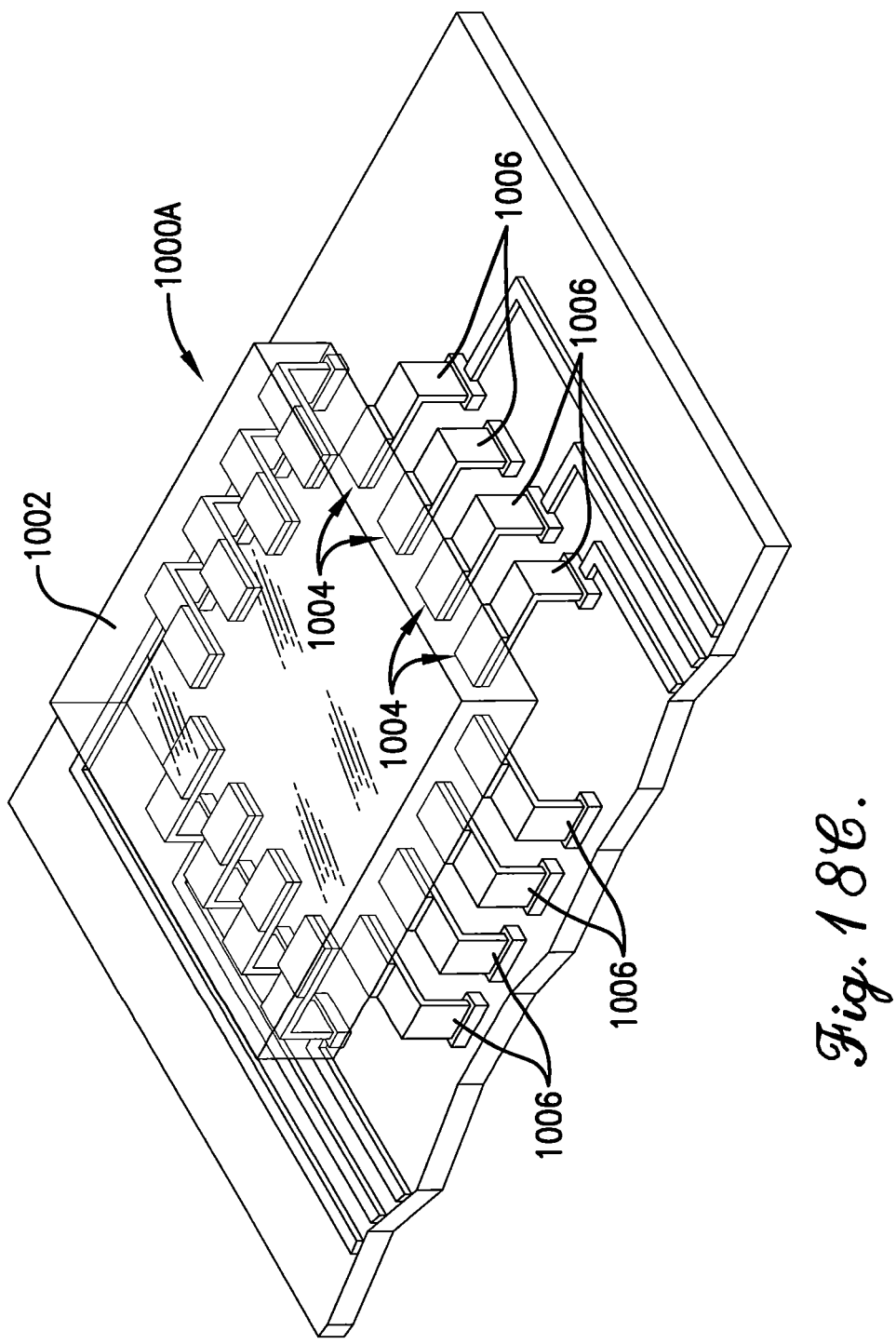
Figure 19A:
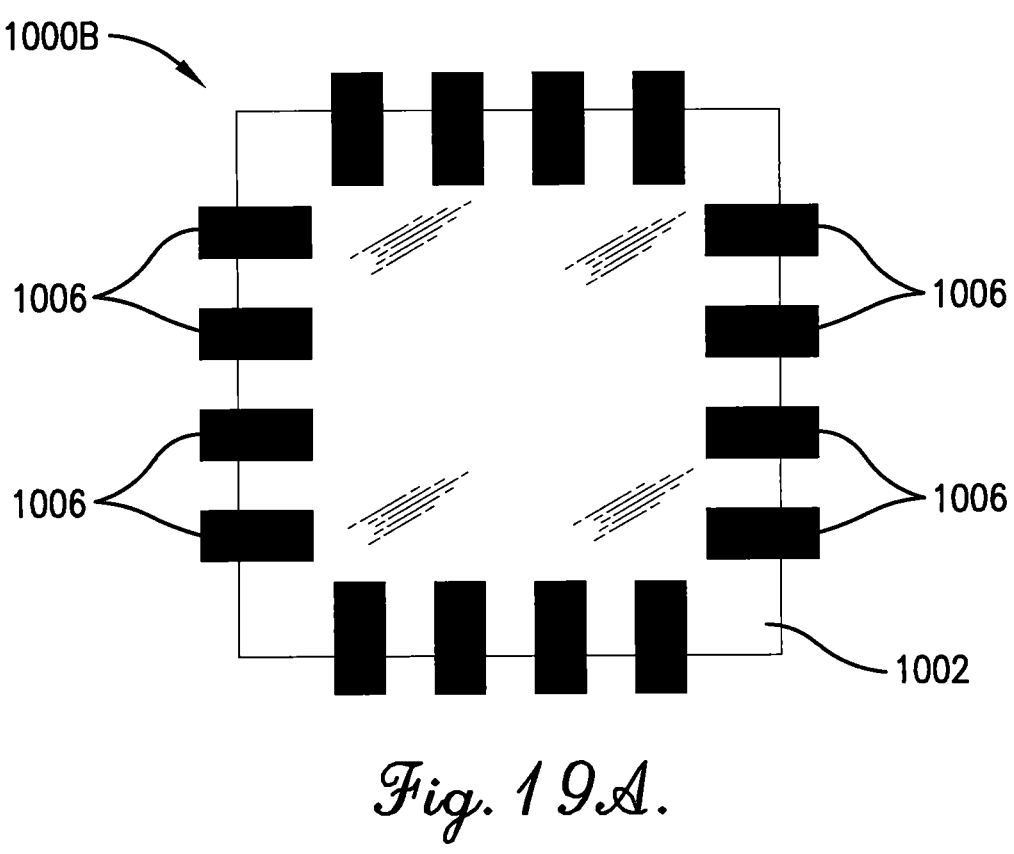
Figure 19B:
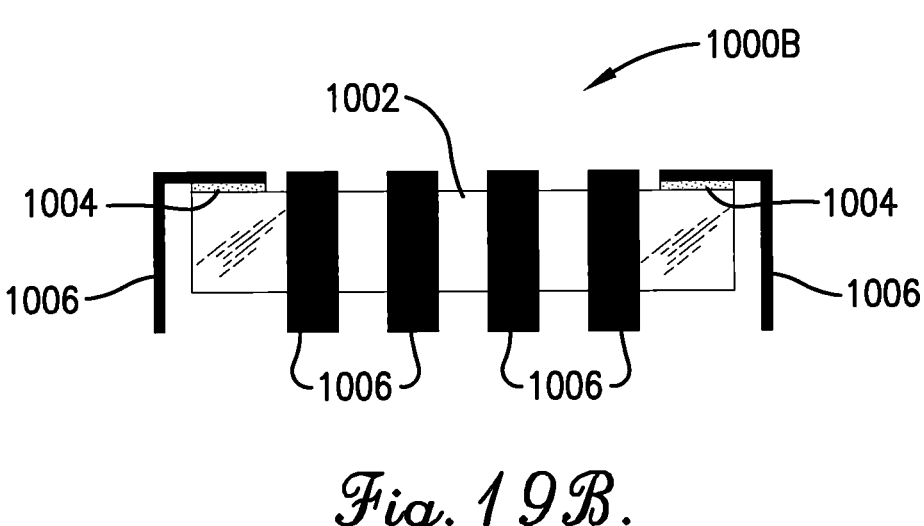
Figure 19C:
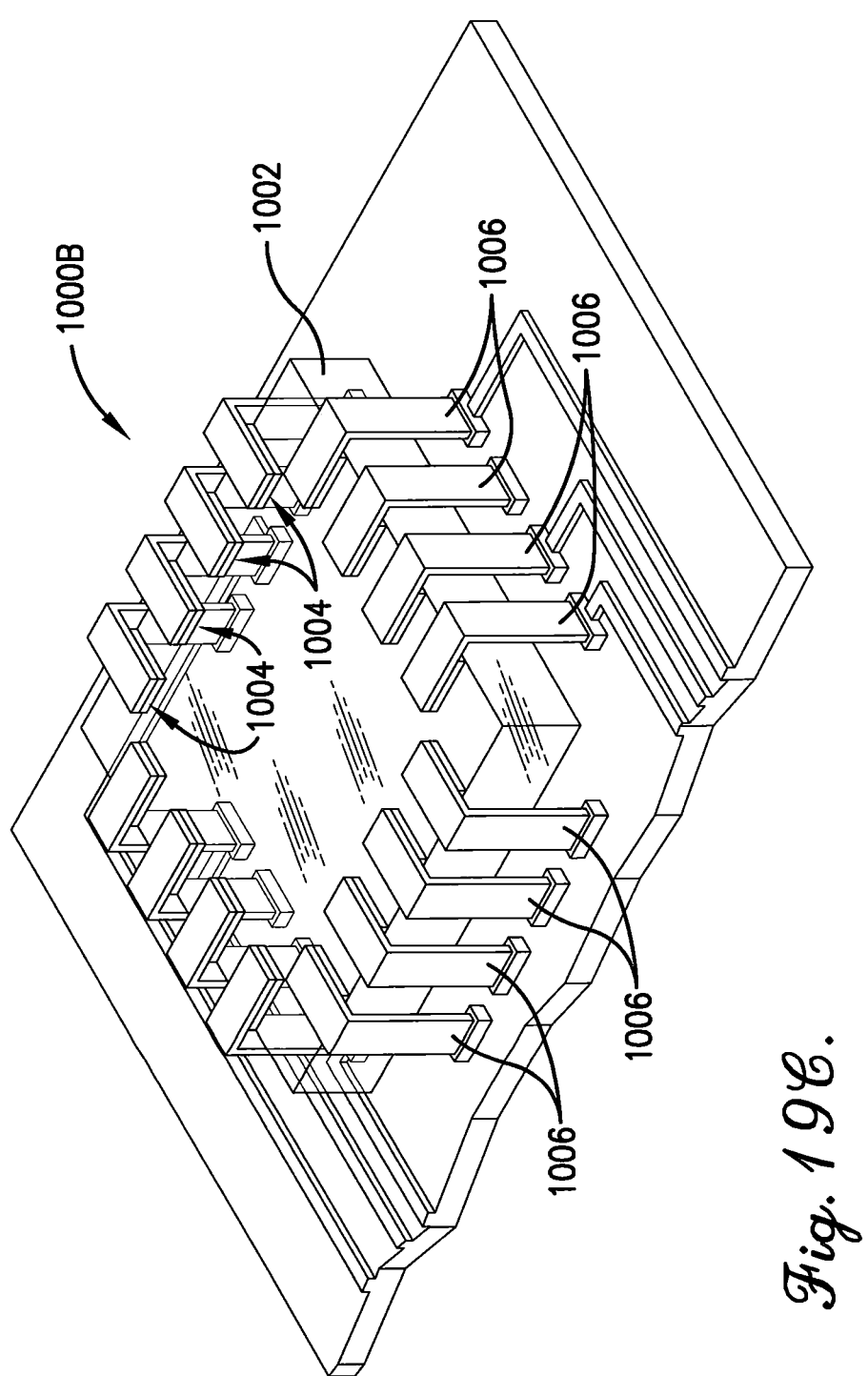
Figure 20A:
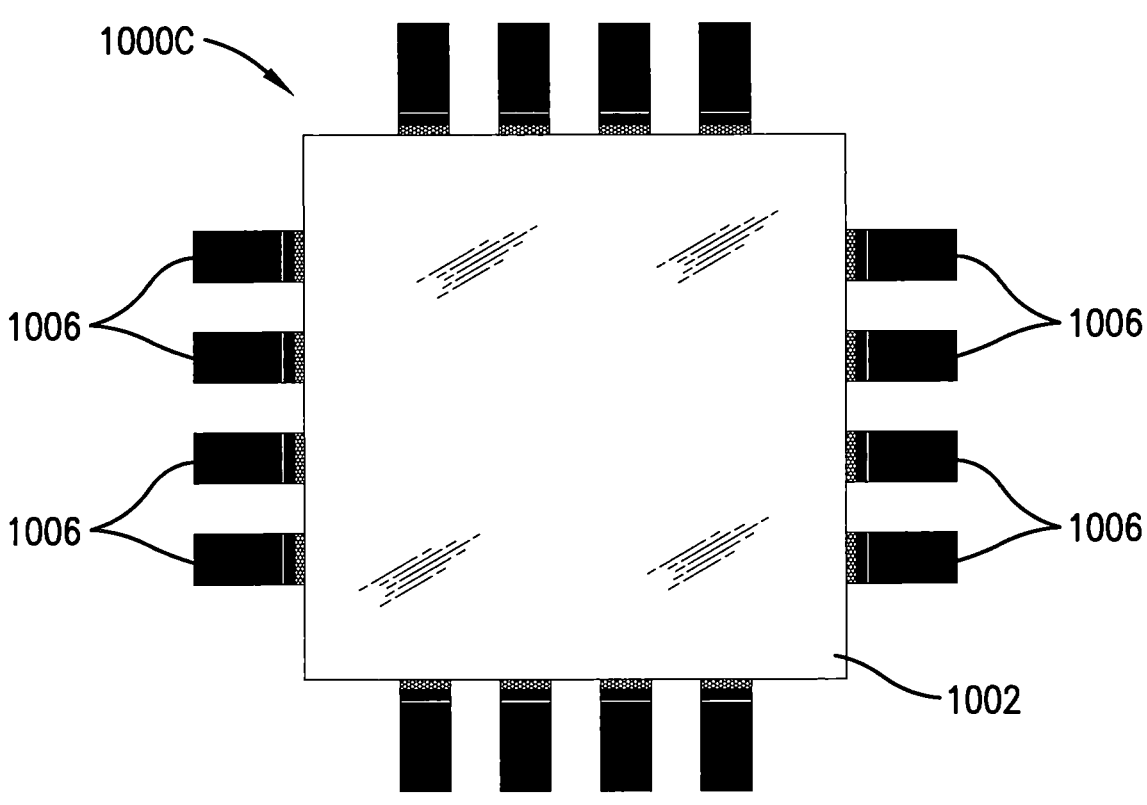
Figure 20B:
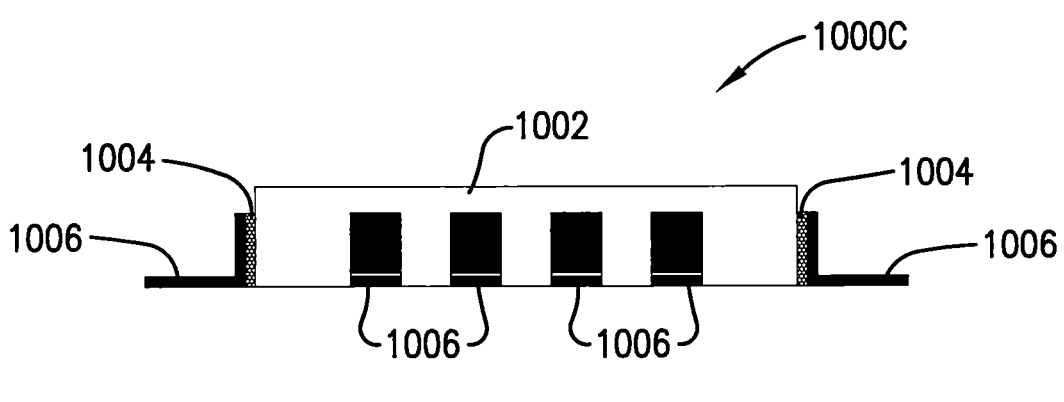
Figure 20C:
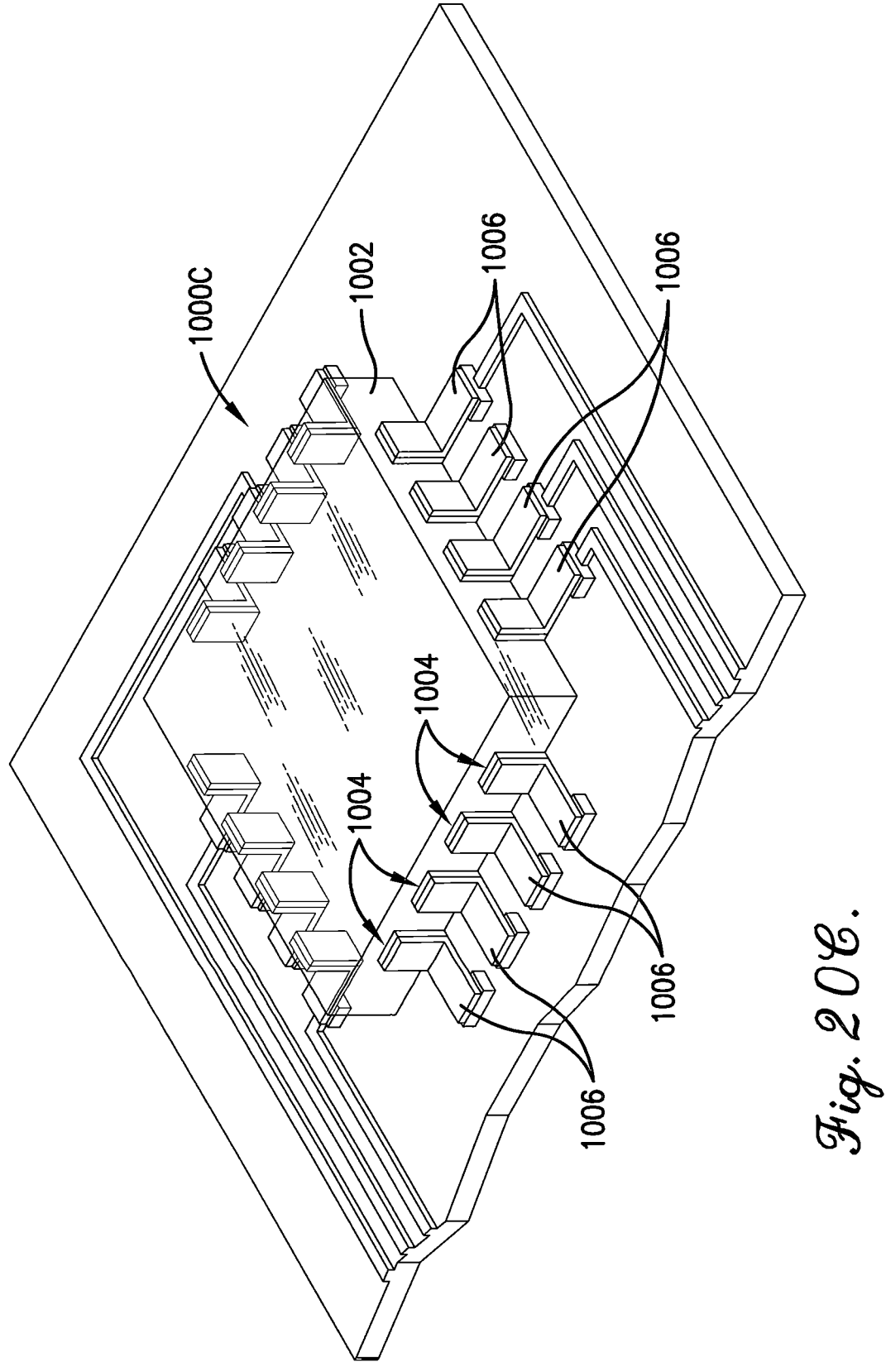
Figure 20D:
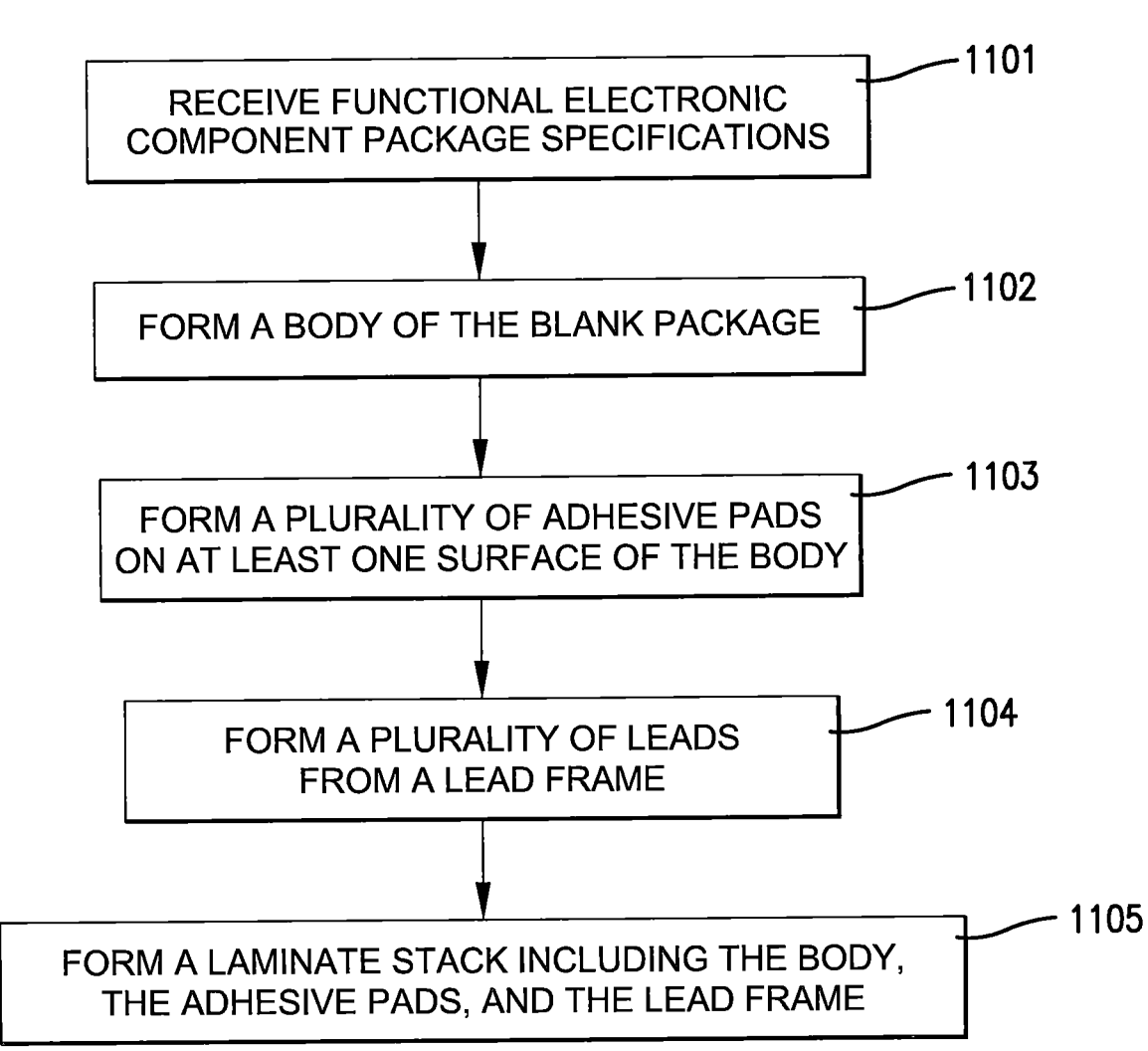
Figure 21A:
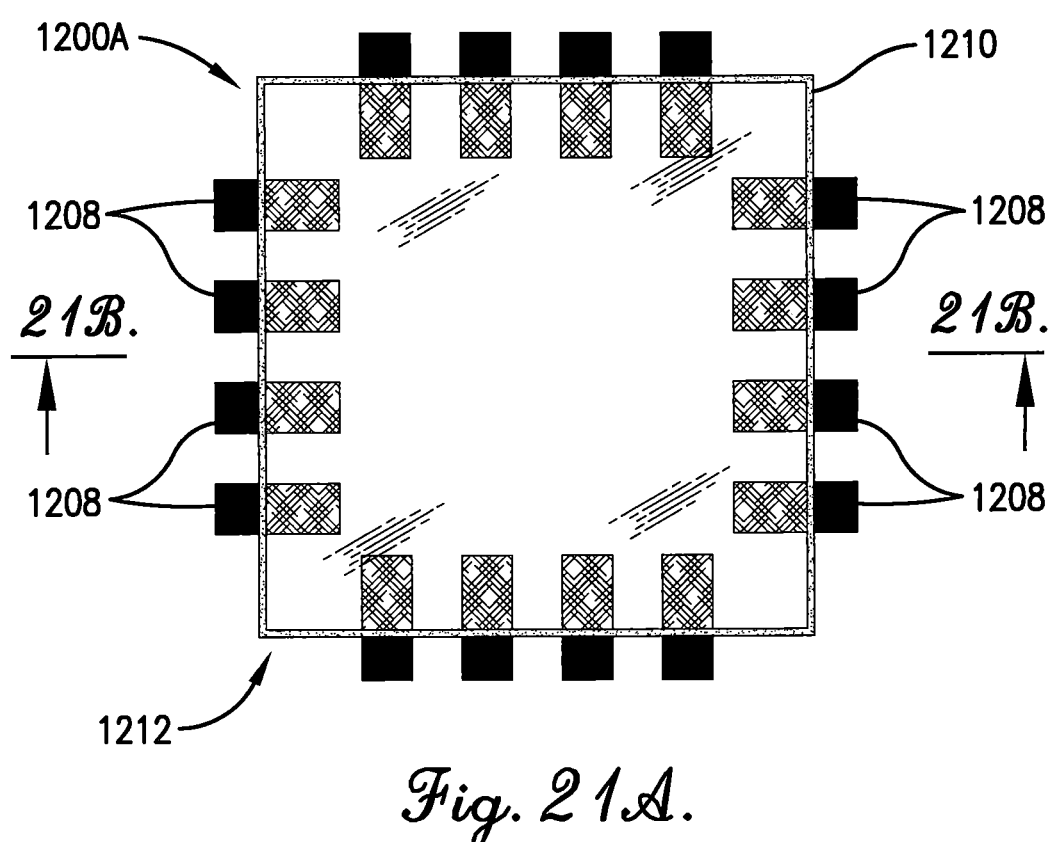
Figure 21B:
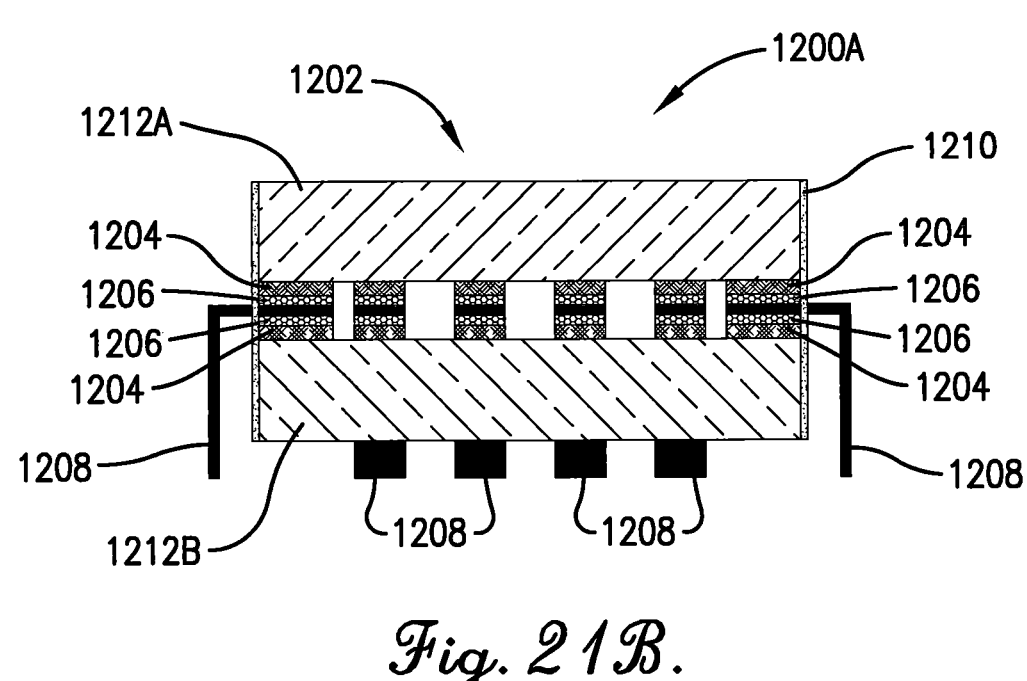
Figure 21C:
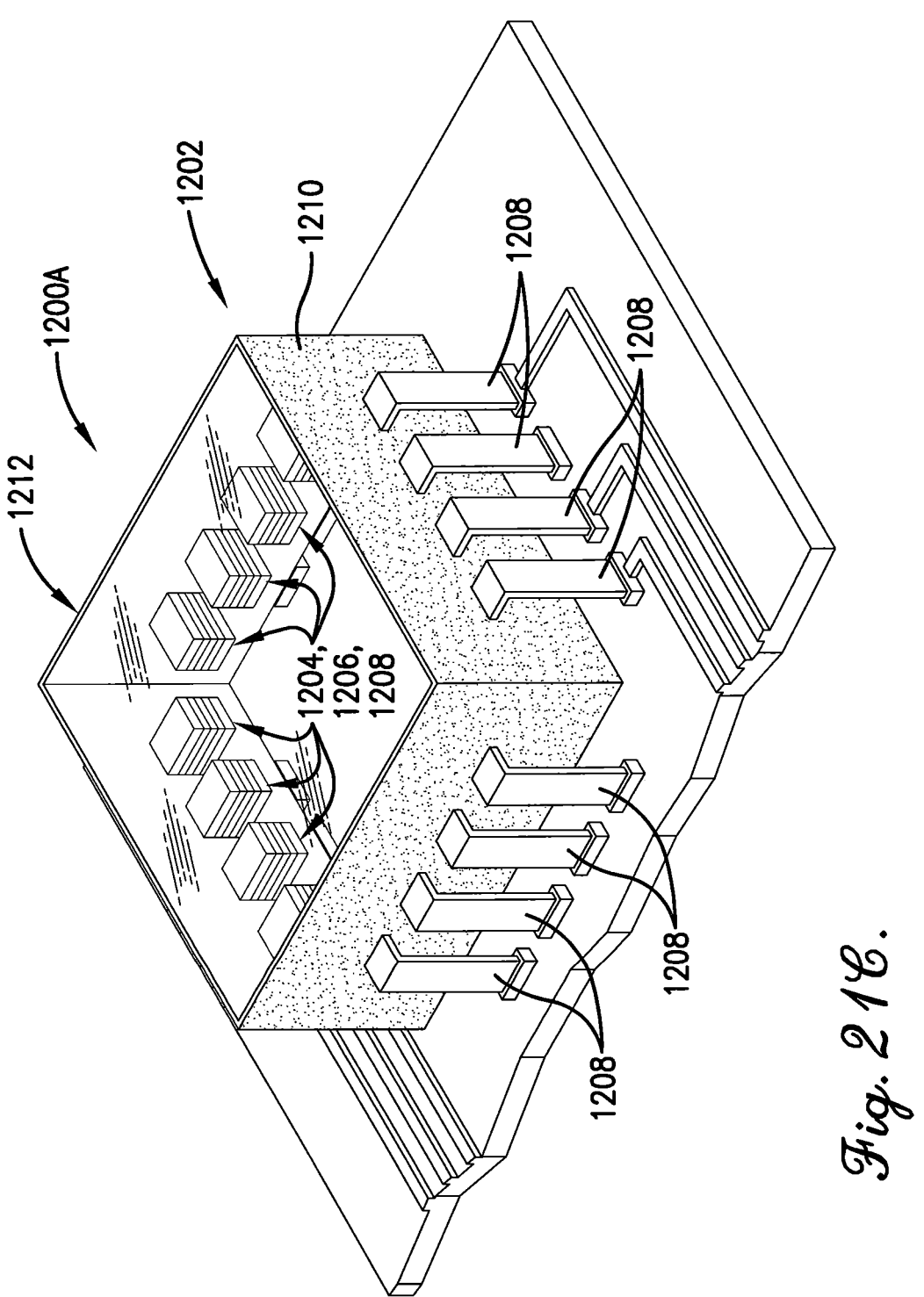
Figure 22A:
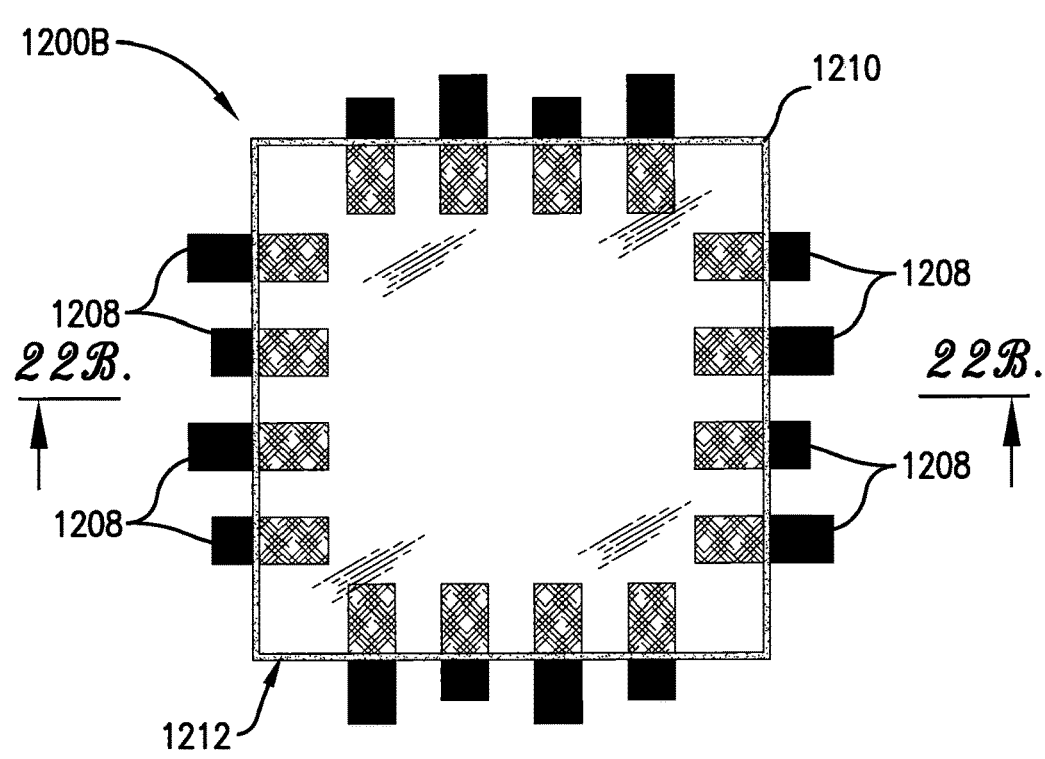
Figure 22B:
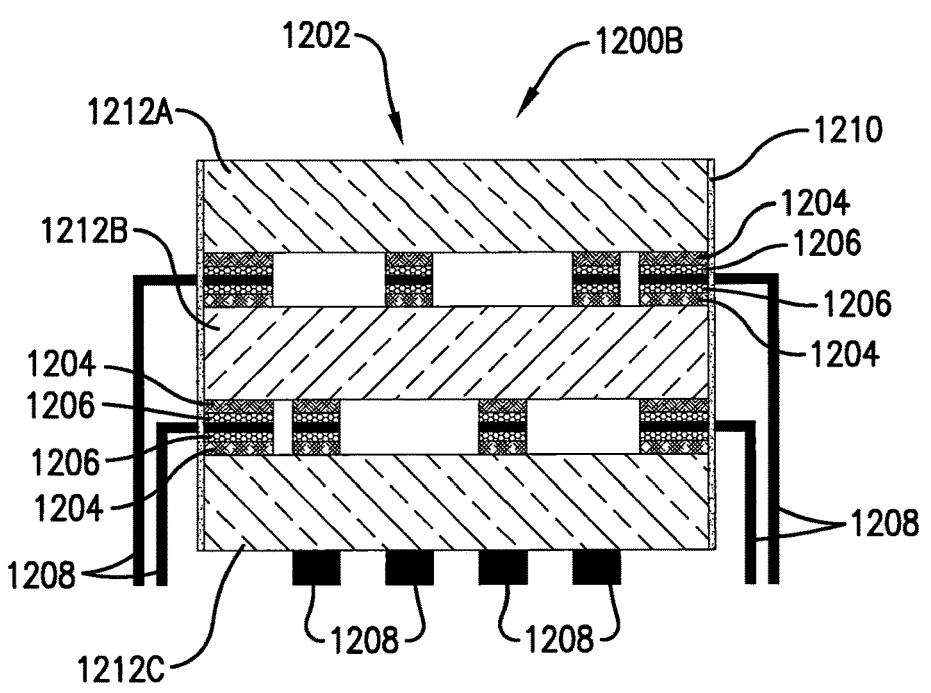
Figure 22C:
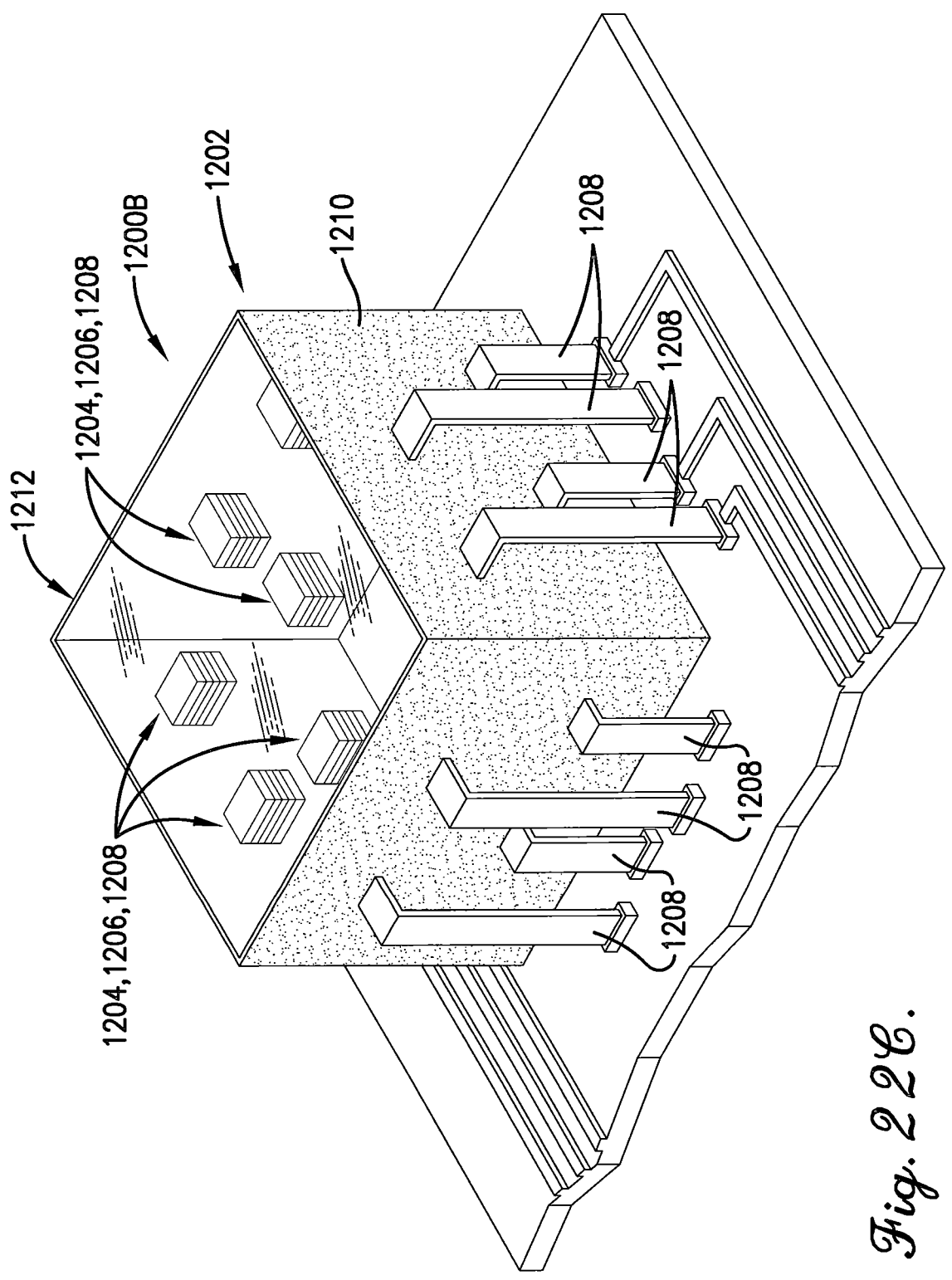
Figure 23A:
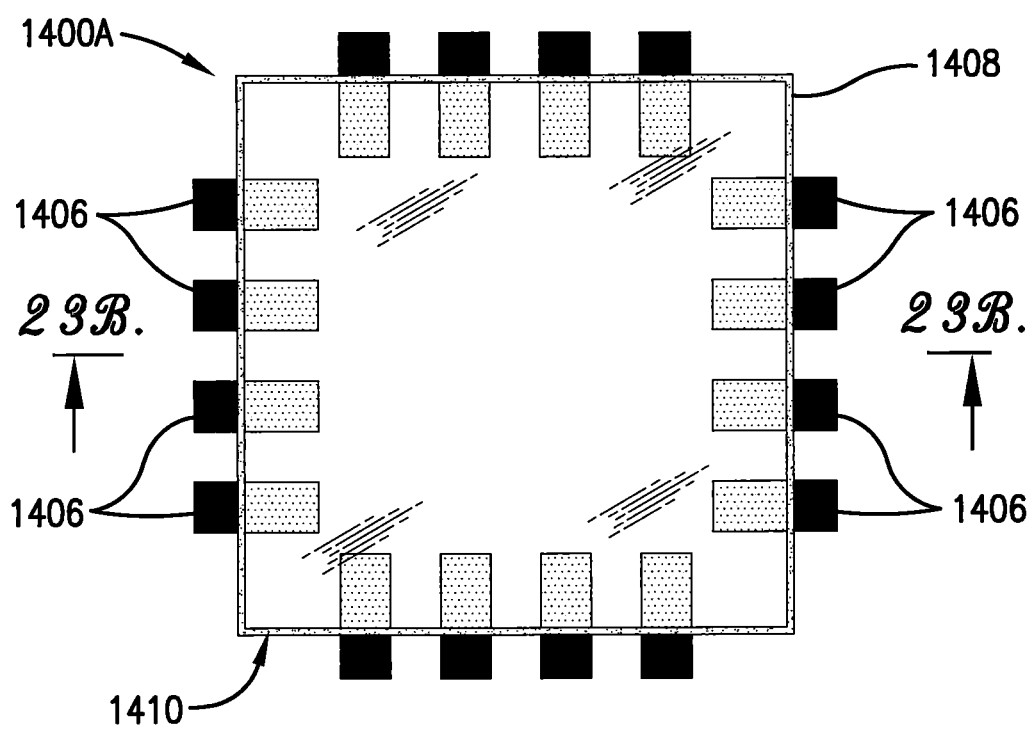
Figure 23B:
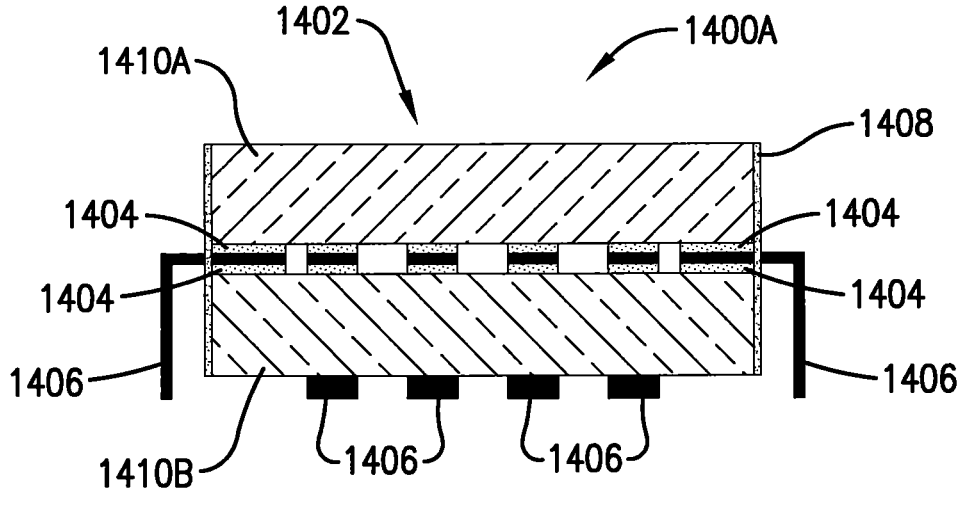
Figure 23C:
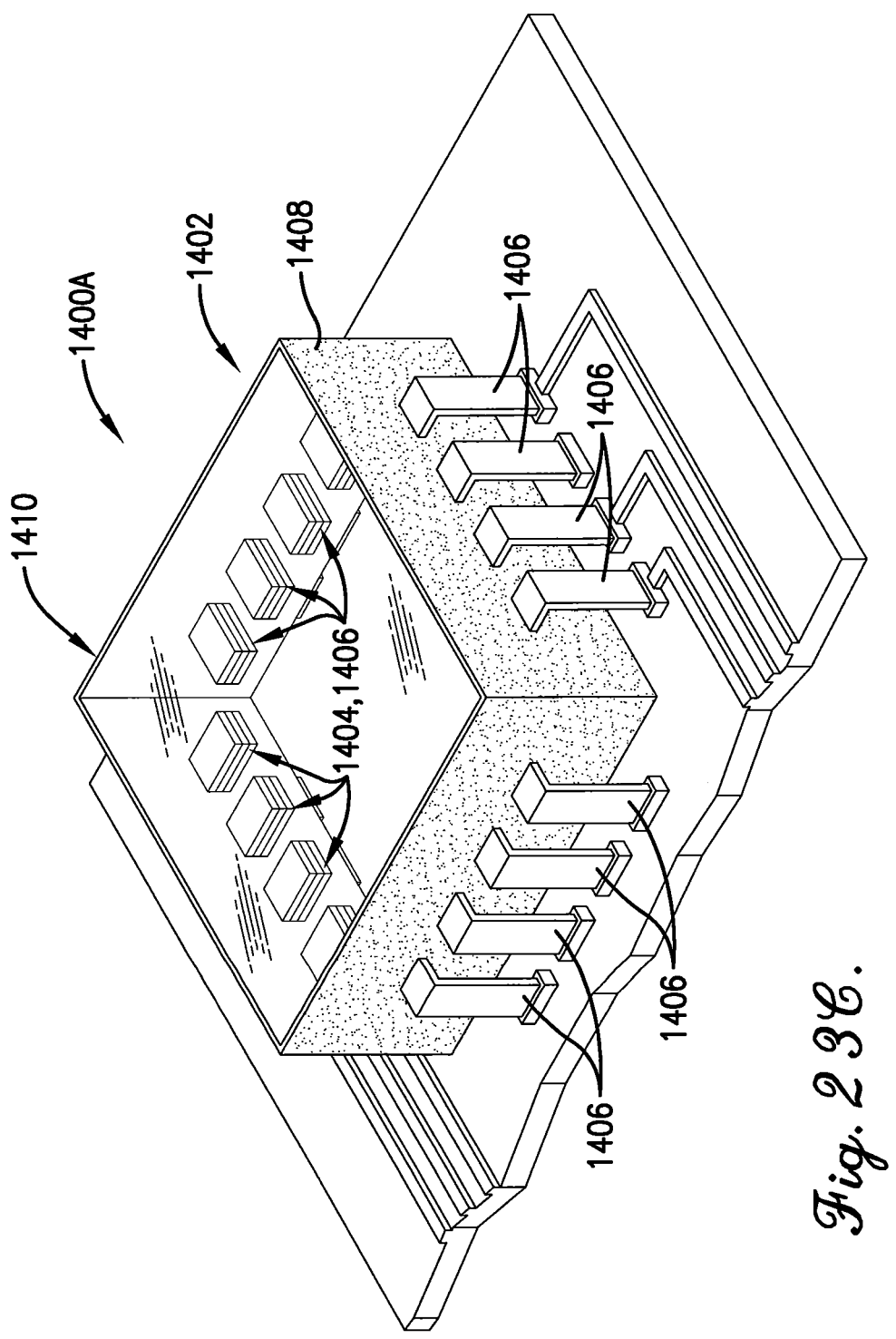
Figure 24A:
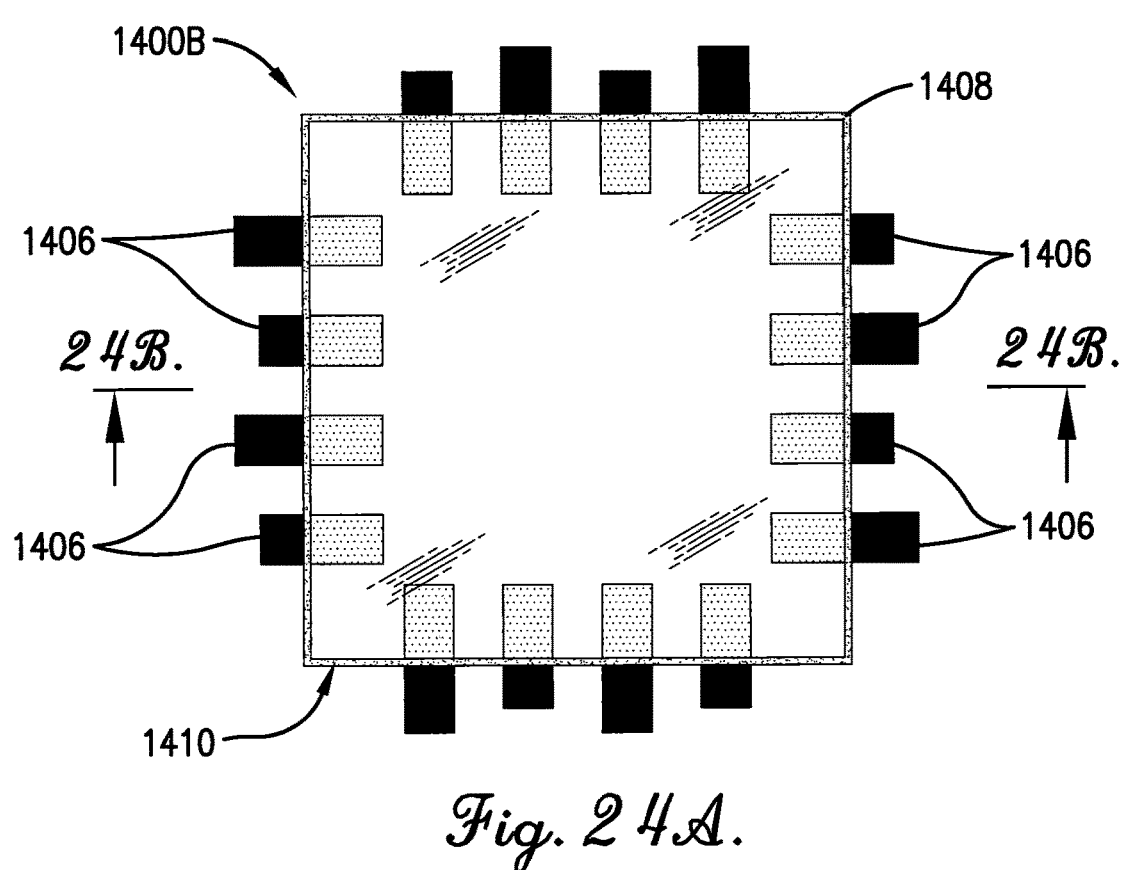
Figure 24B:
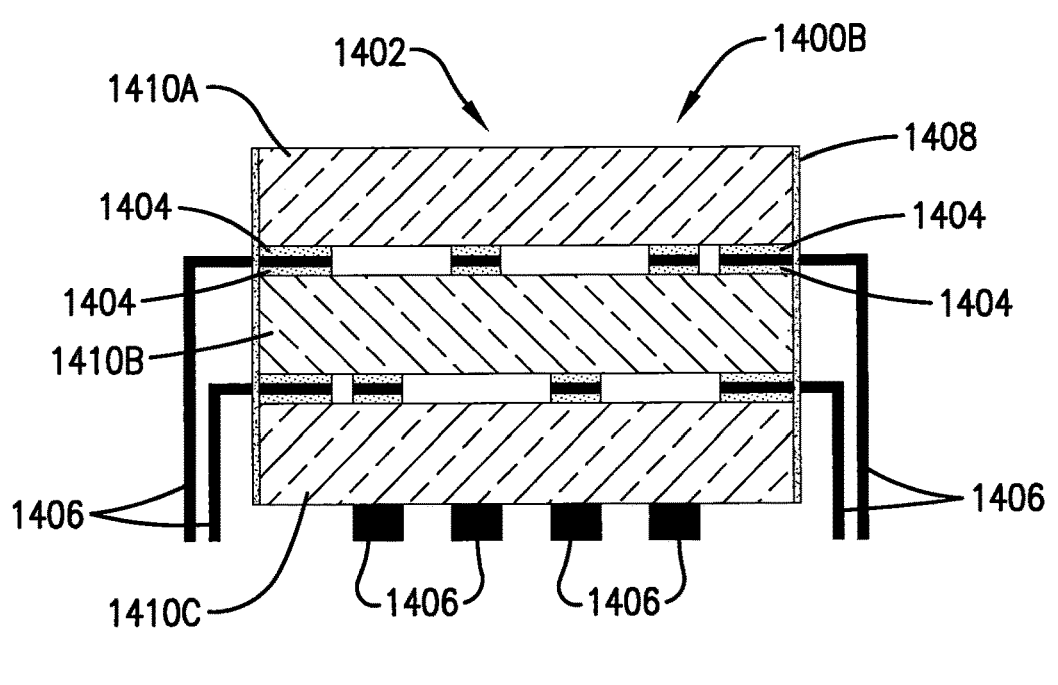
Figure 24E:
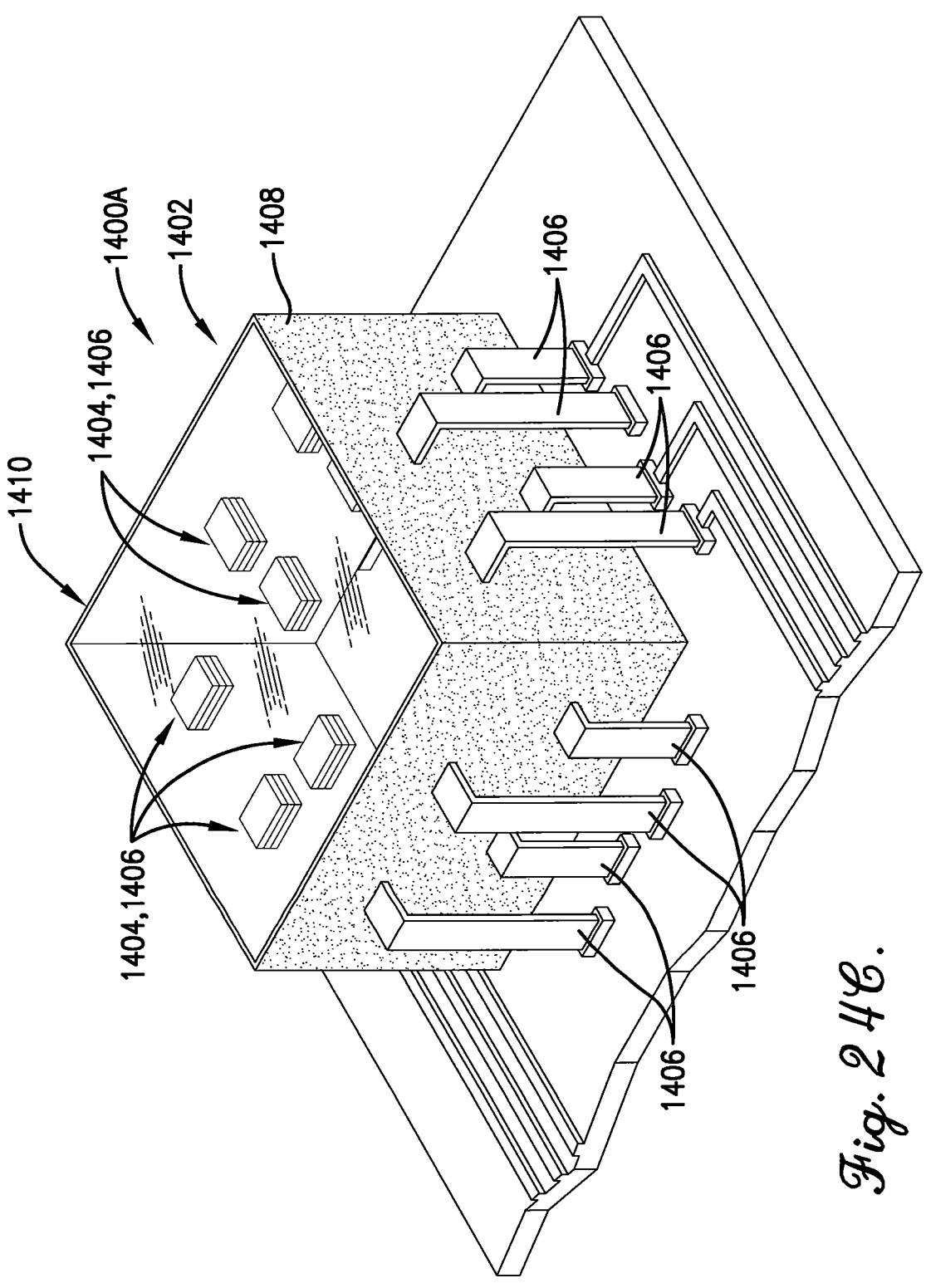
Figure 25A:
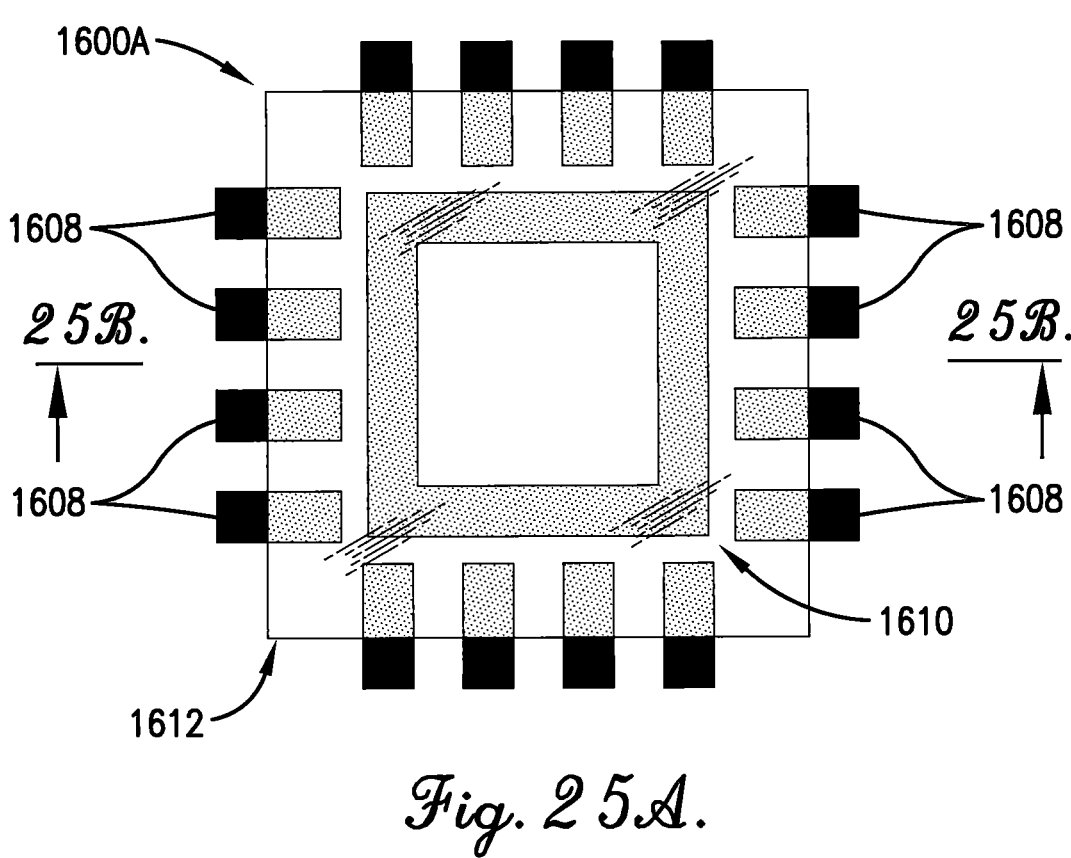
Figure 25B:
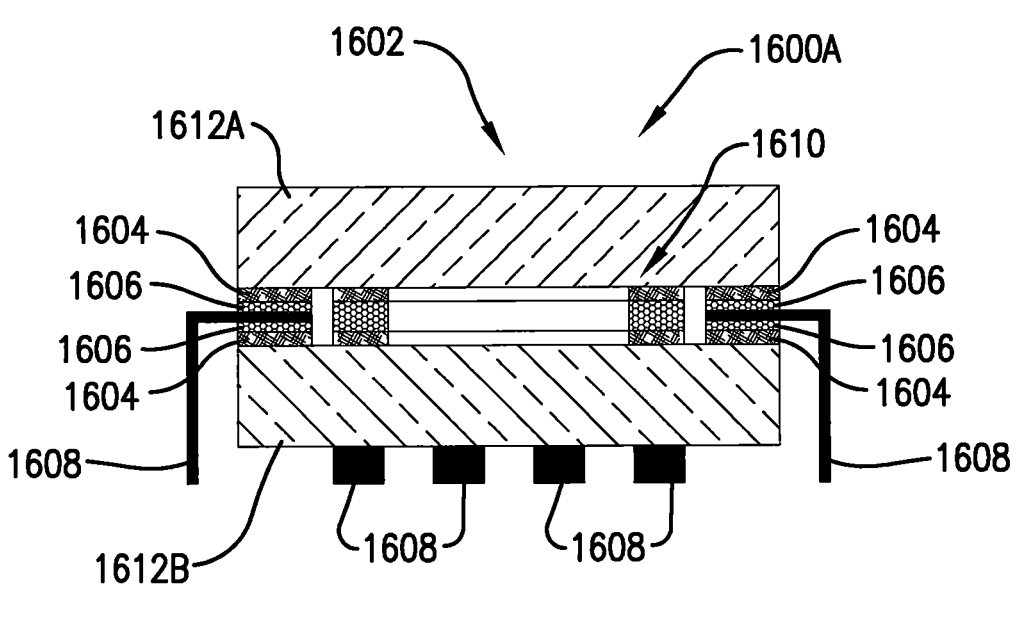
Figure 25C:
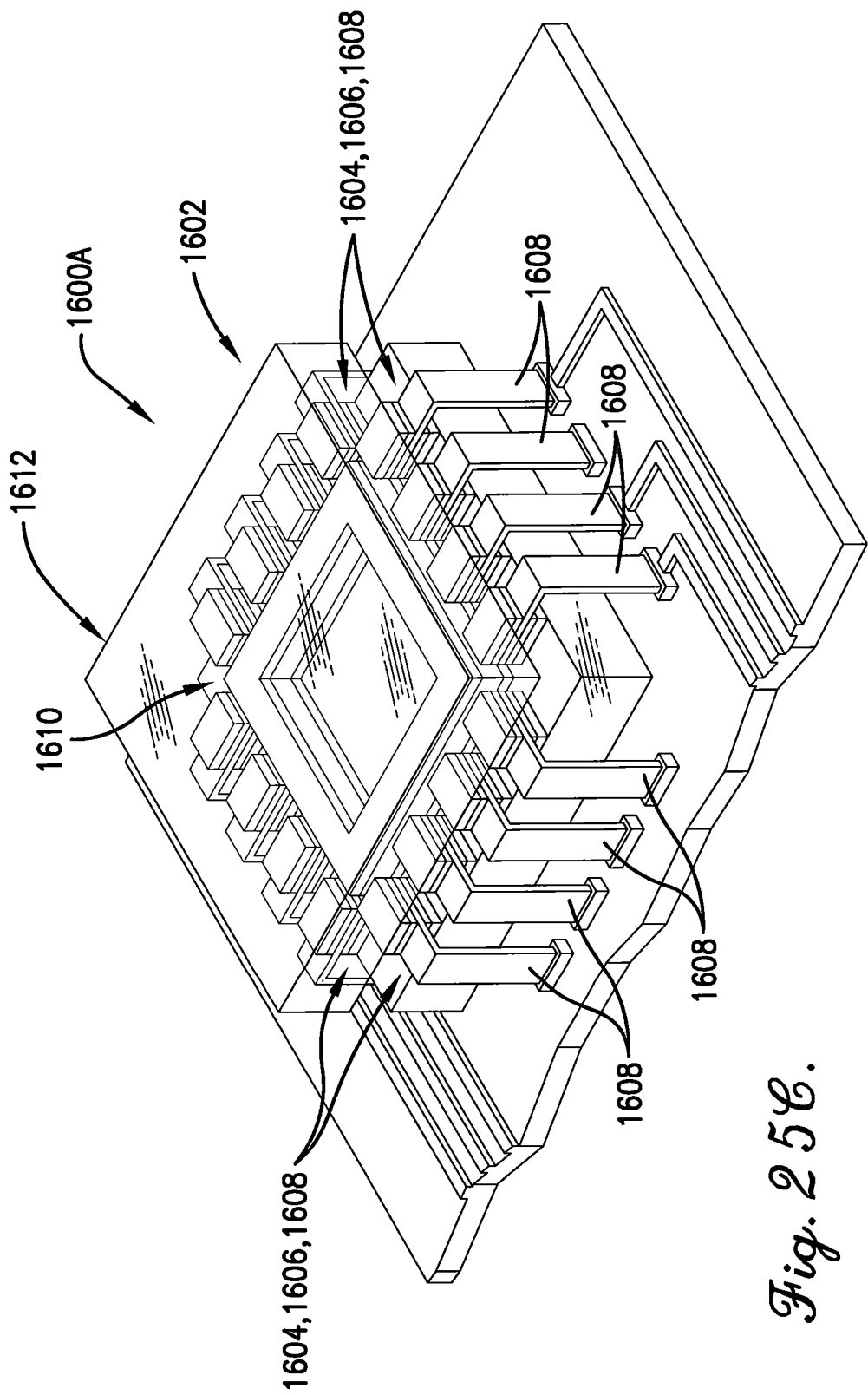
Figure 26A:
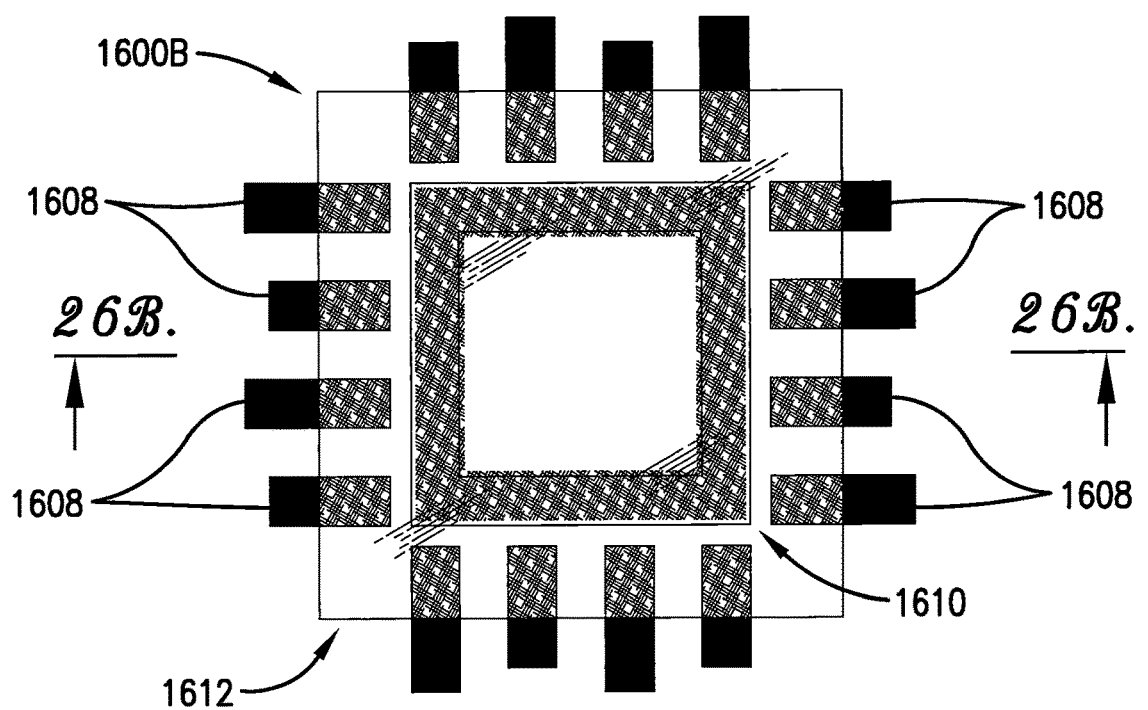
Figure 26B:
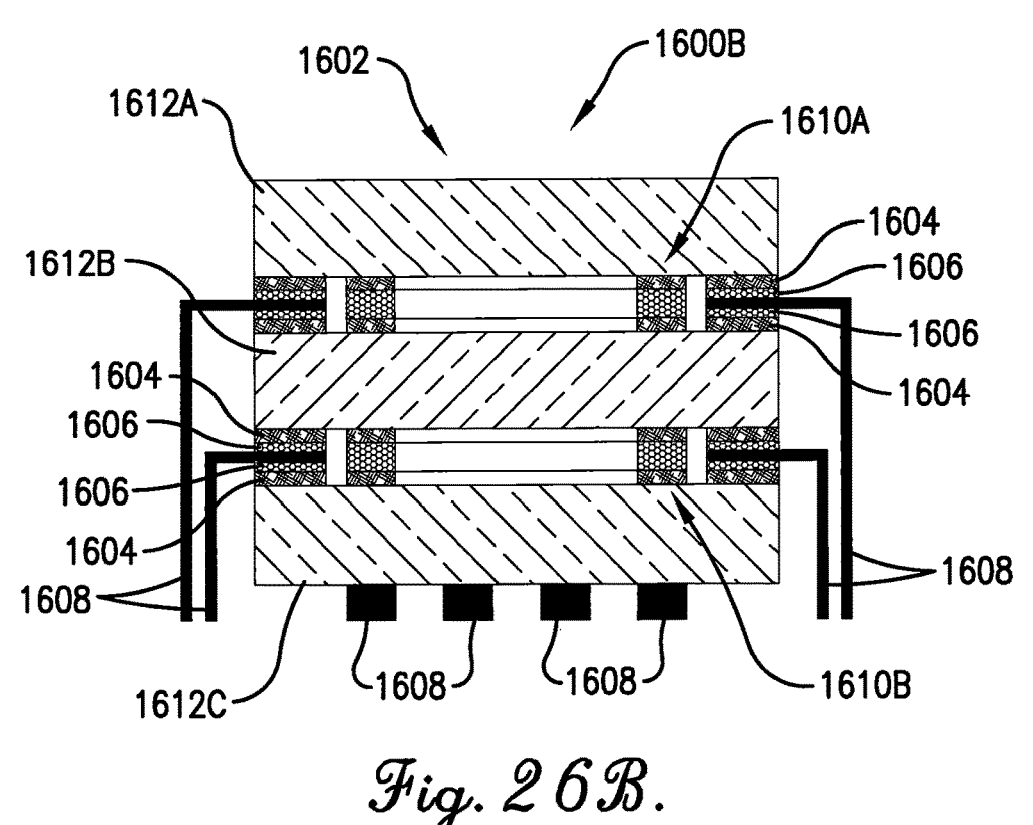
Figure 26C:
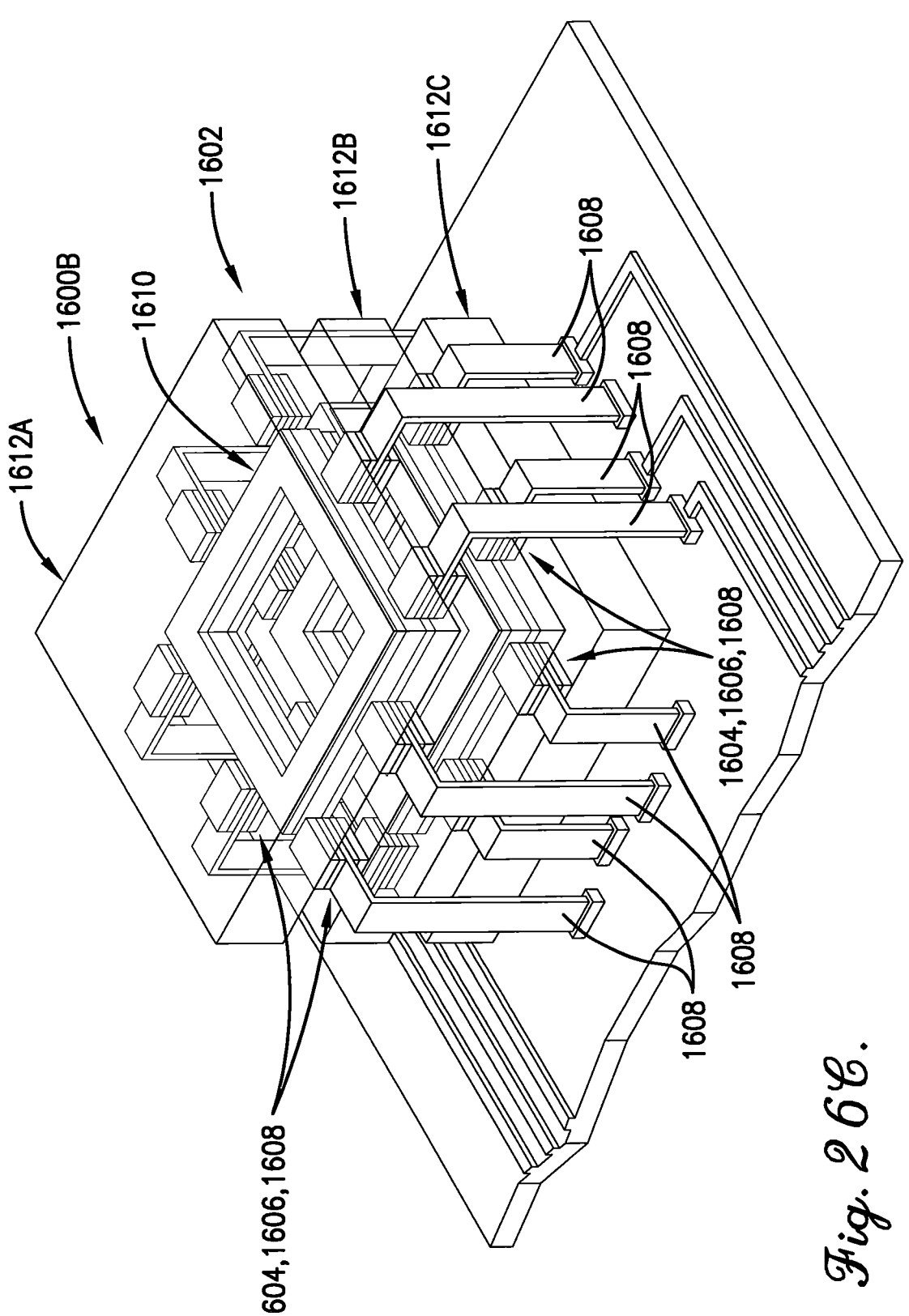
Figure 27A:
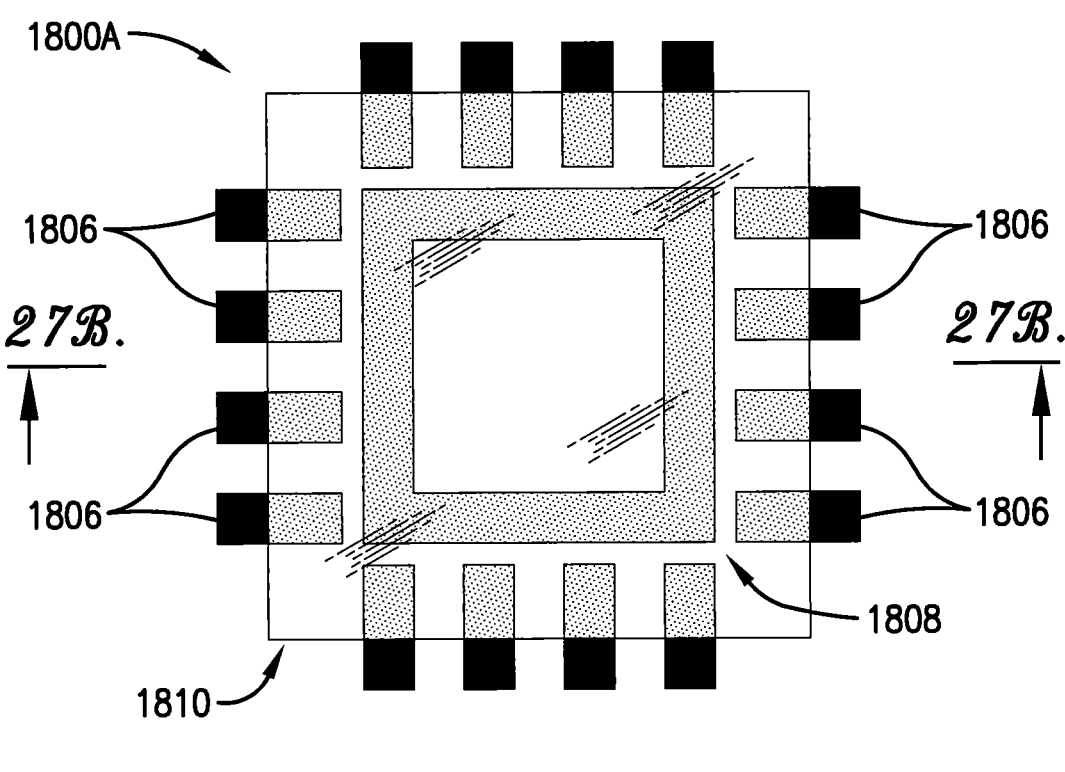
Figure 27B:
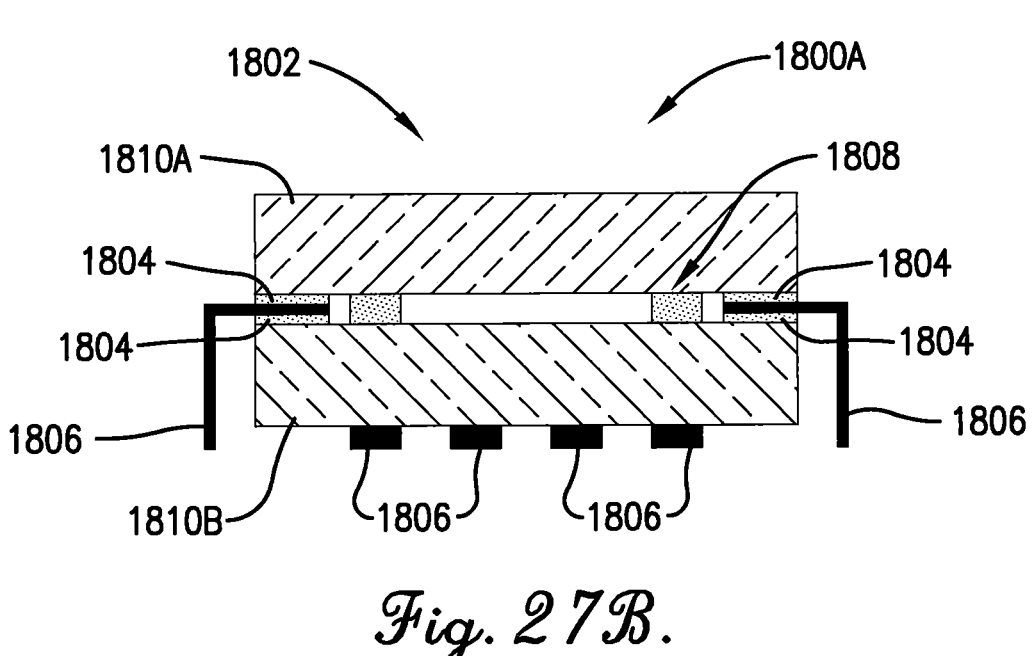
Figure 27C:
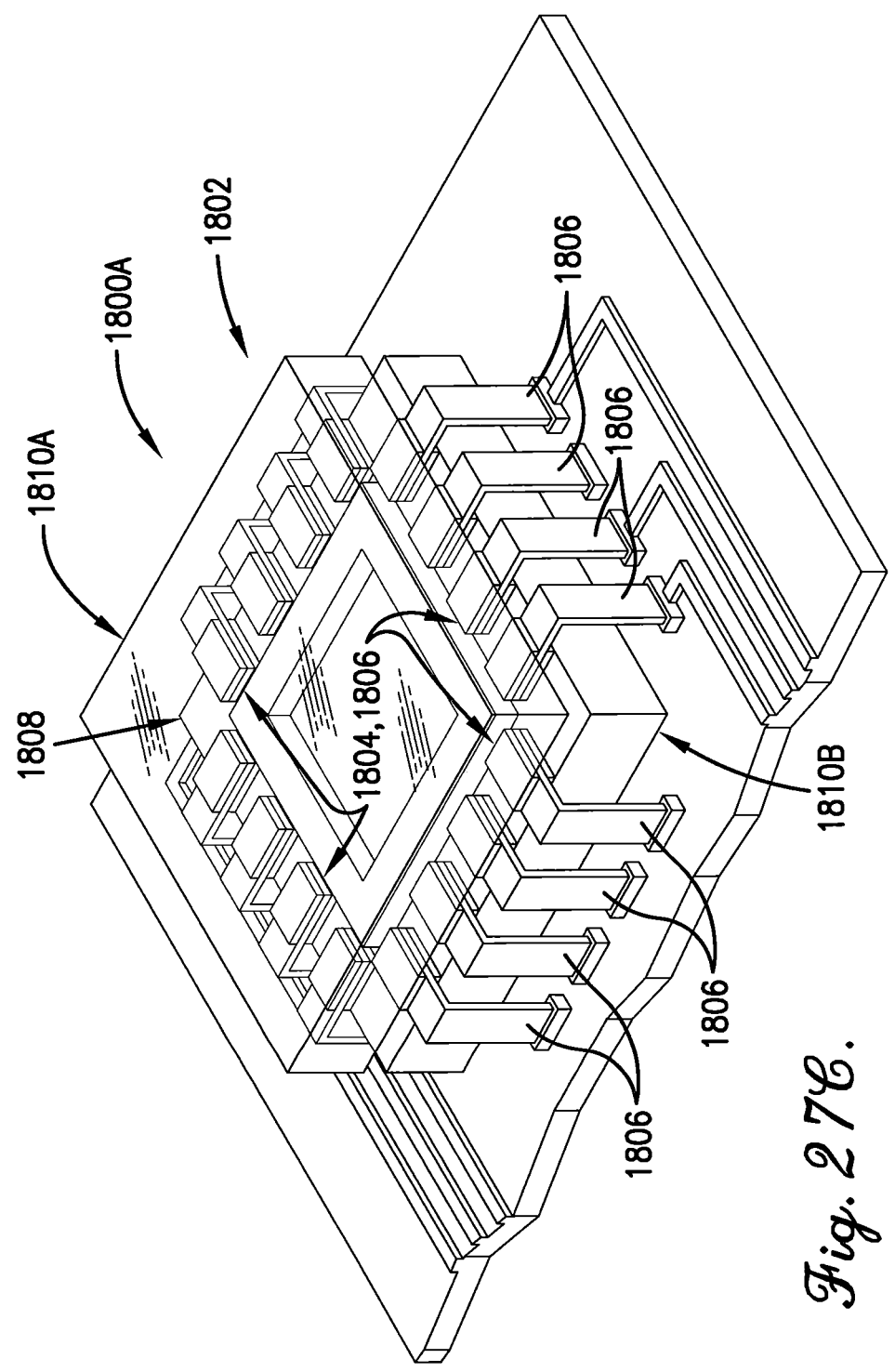
Figure 28A:
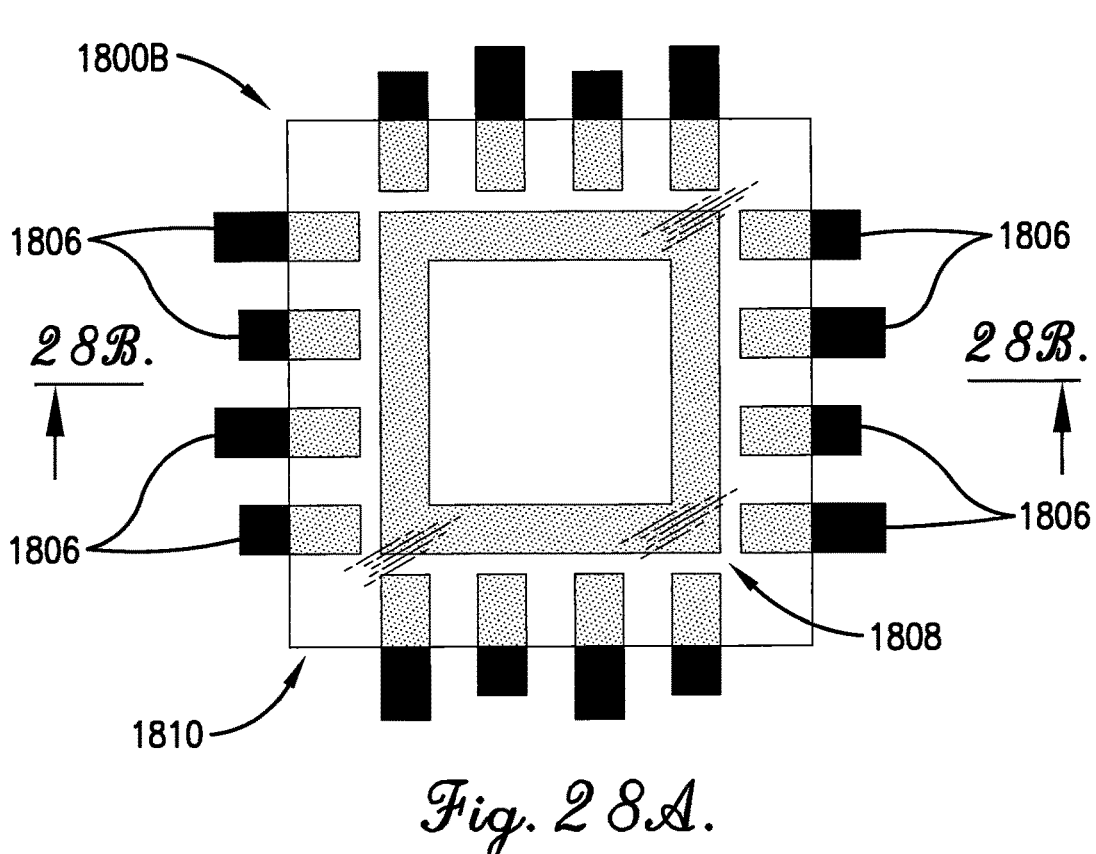
Figure 28B:
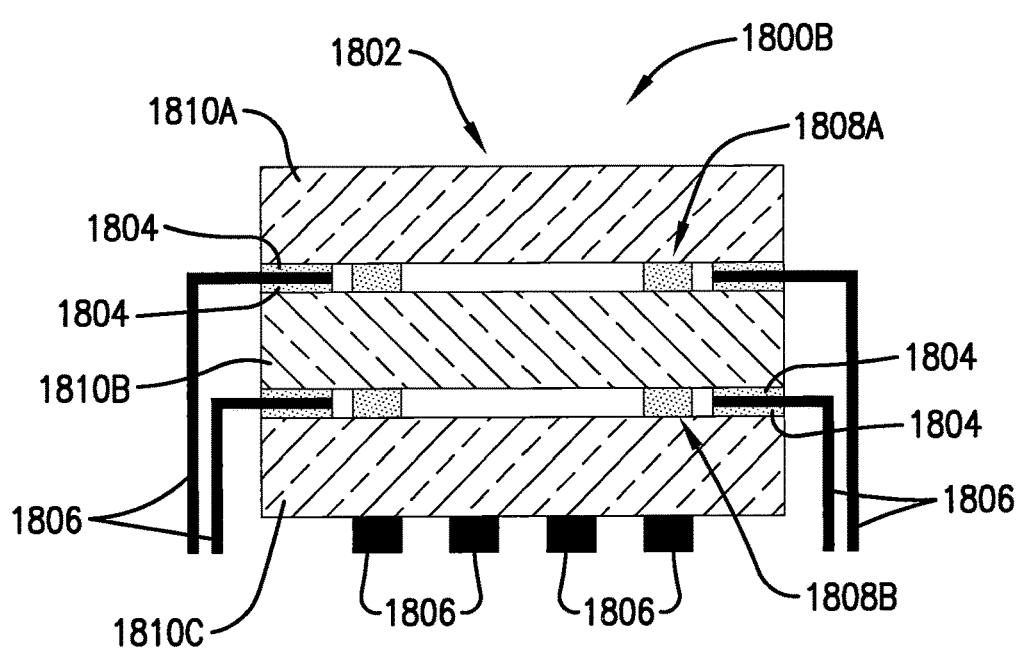
Figure 28C:
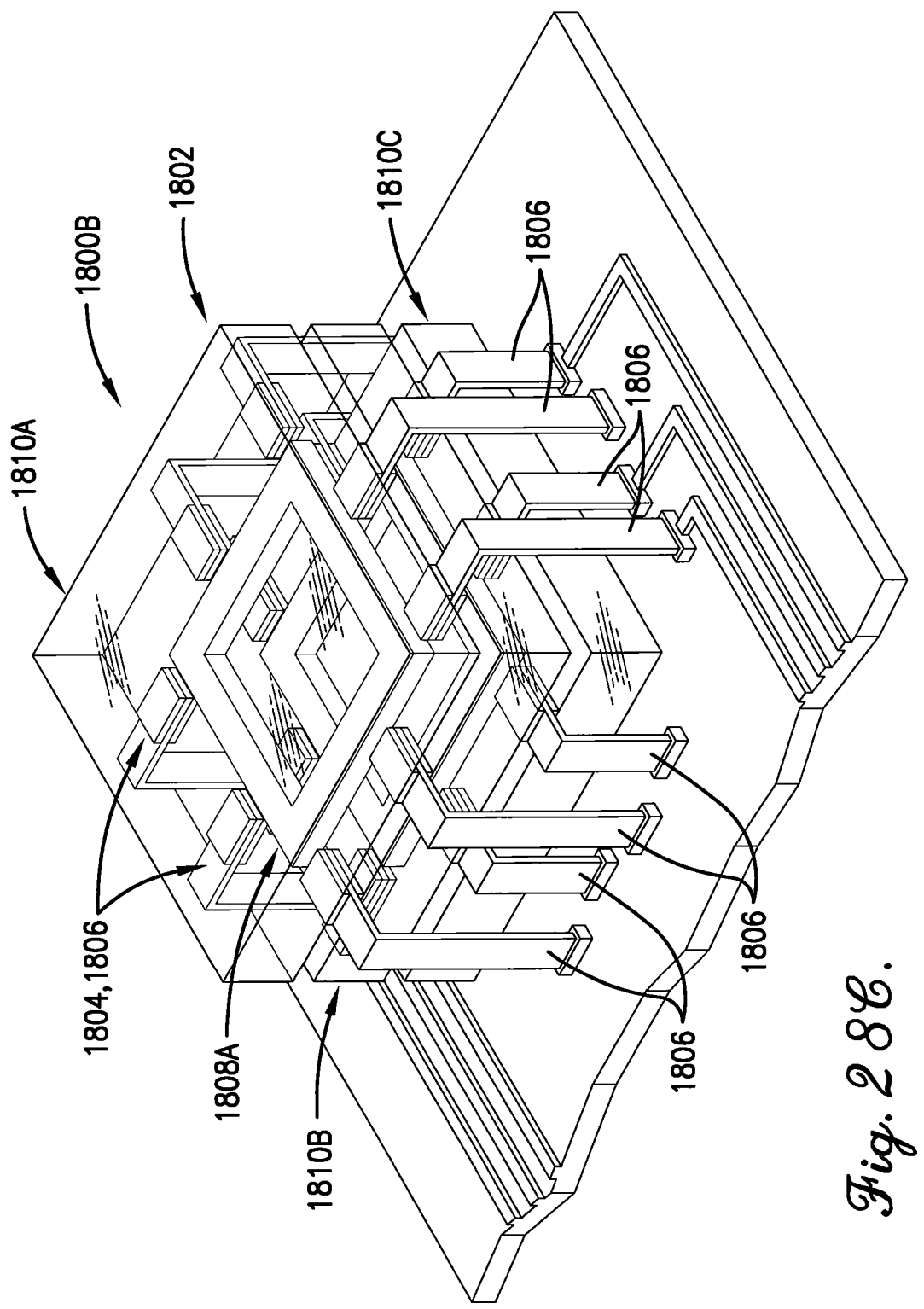
Figure 28D:
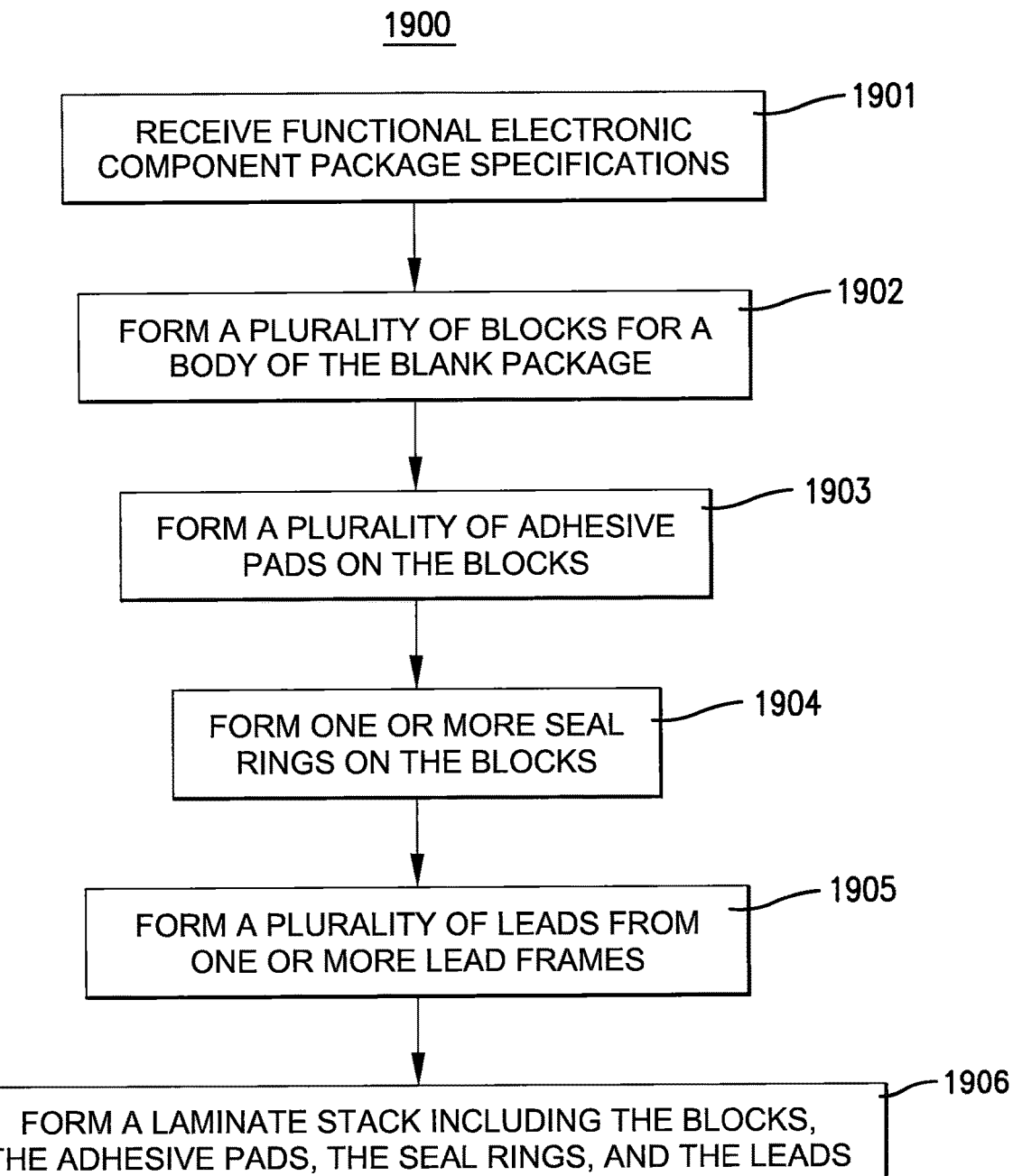
Figure 29A:
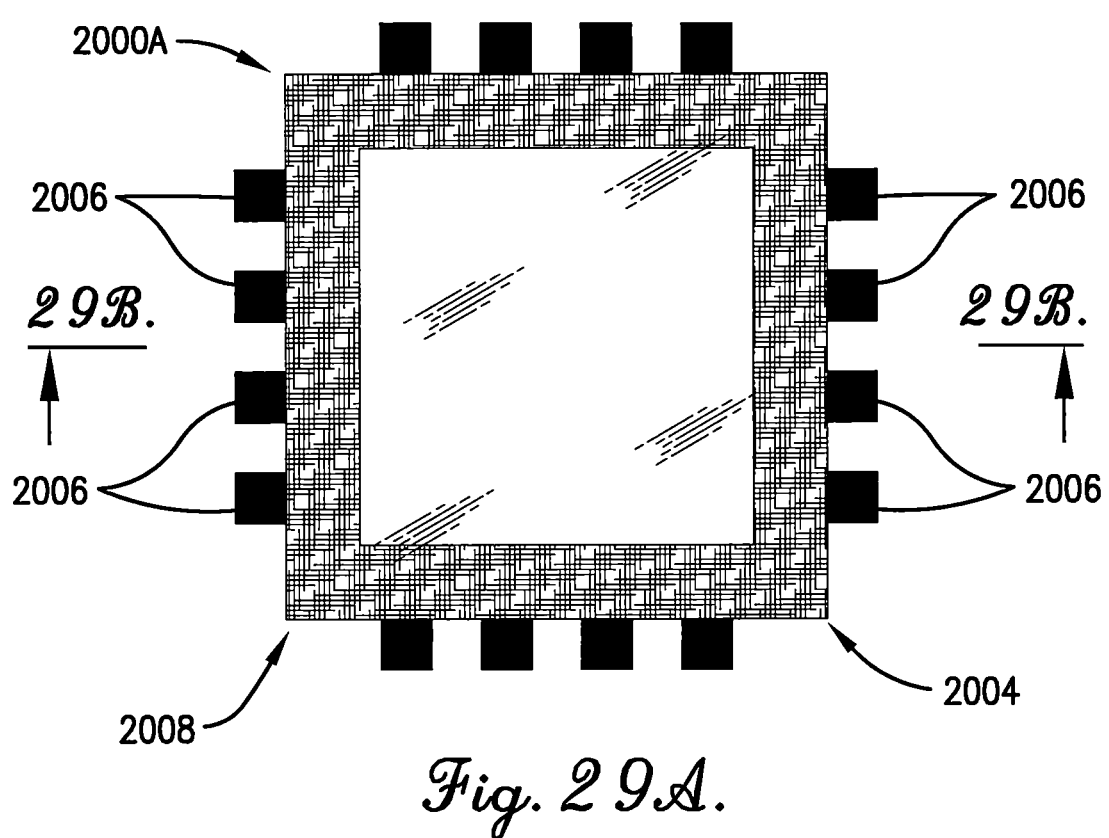
Figure 29B:
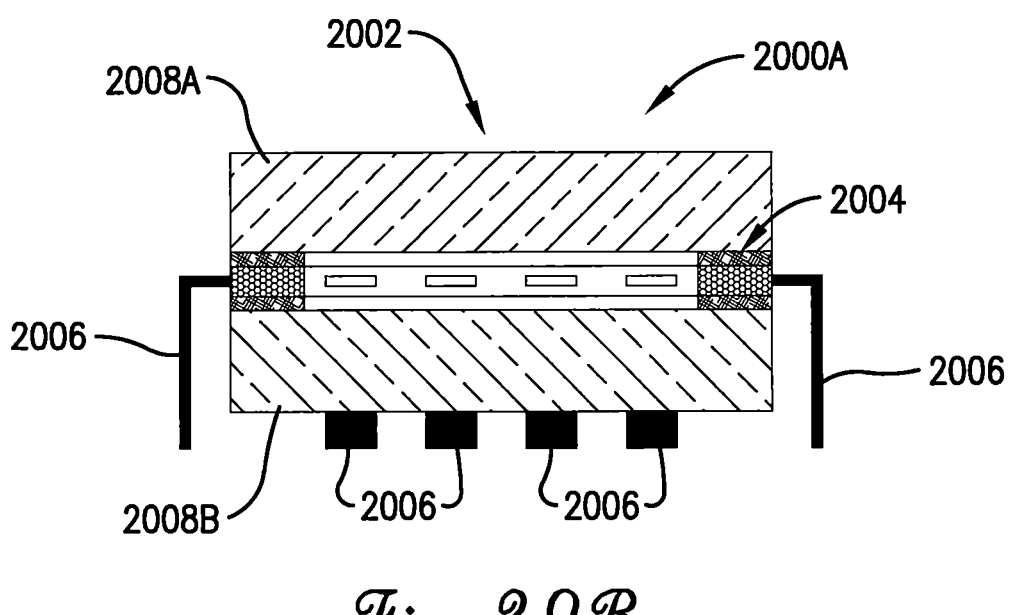
Figure 29C:
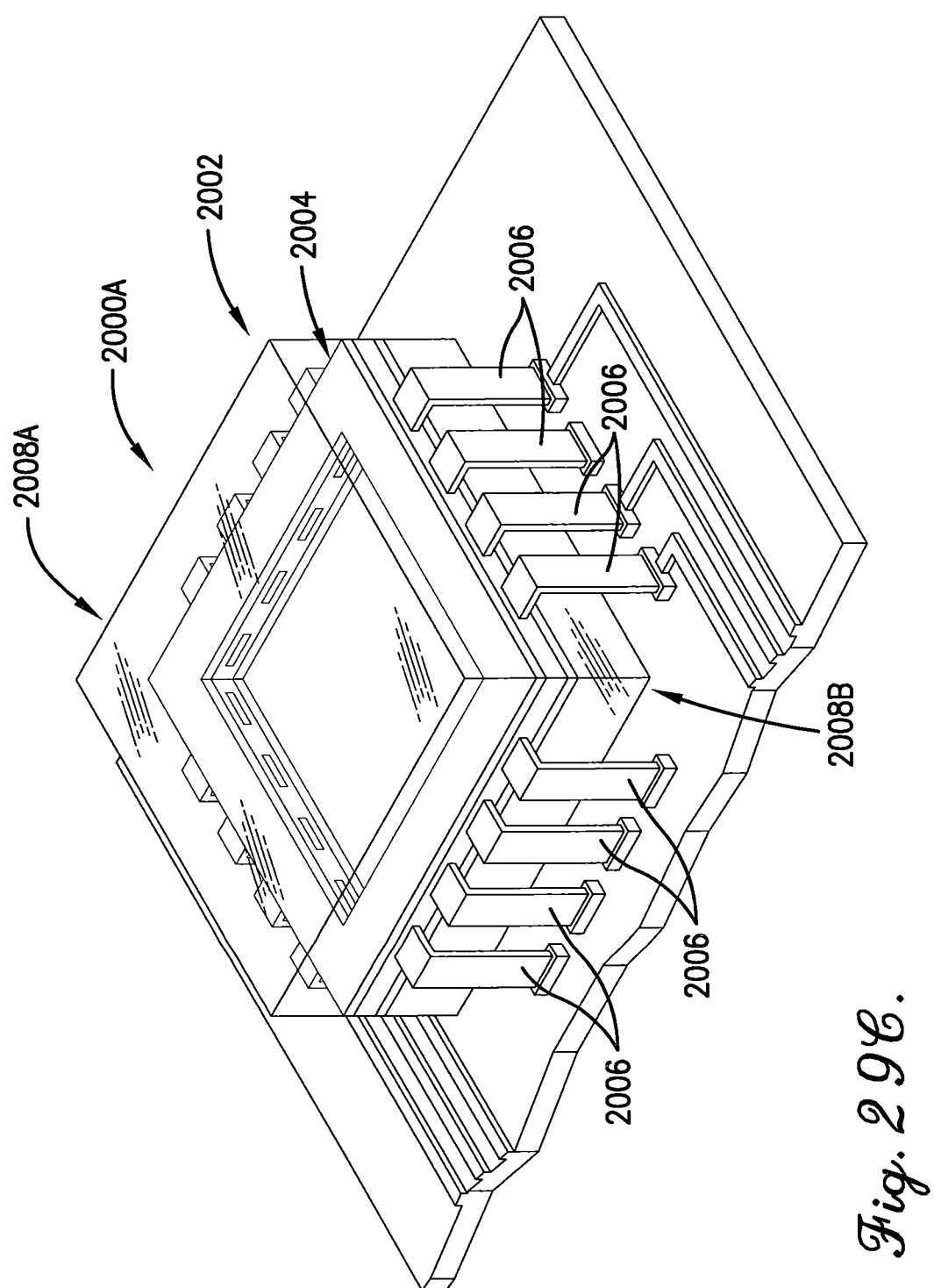
Figure 30A:
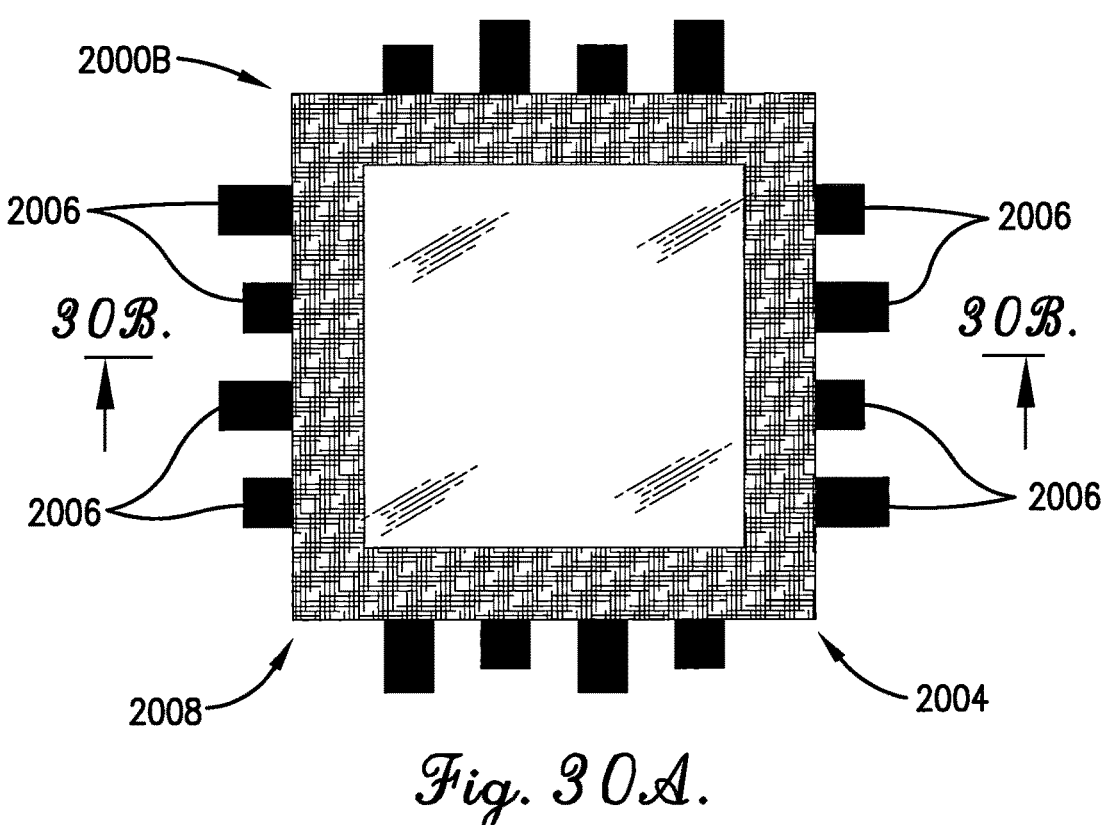
Figure 30B:
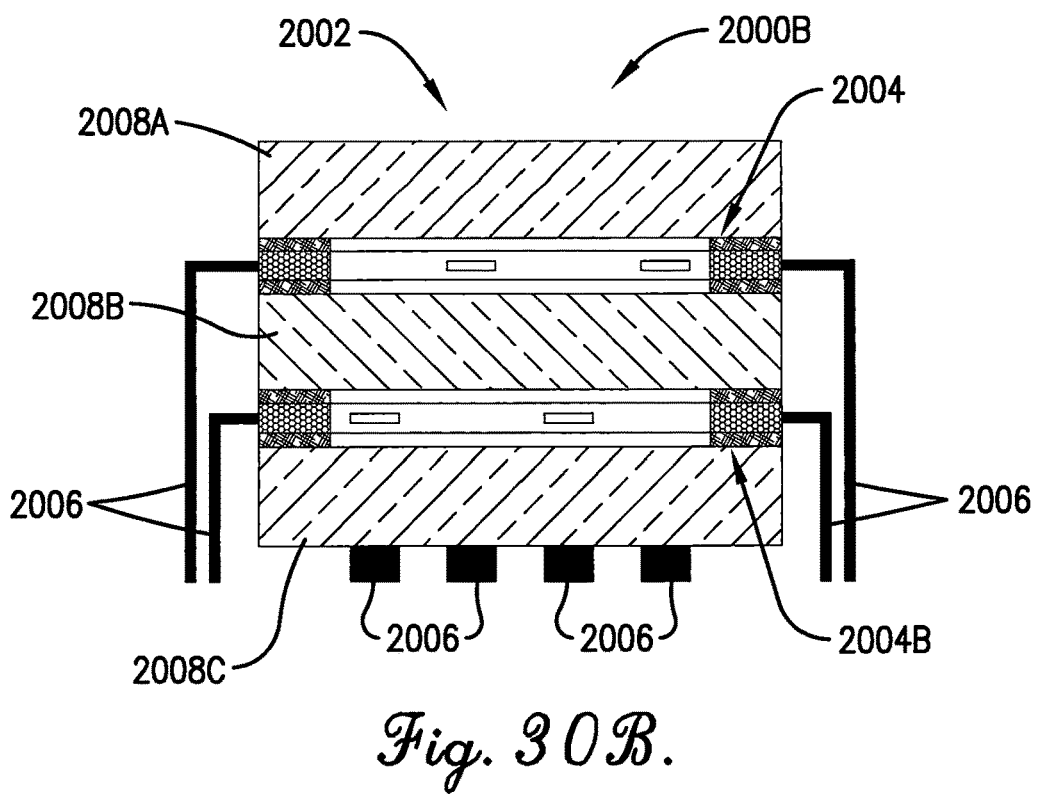
Figure 30C:
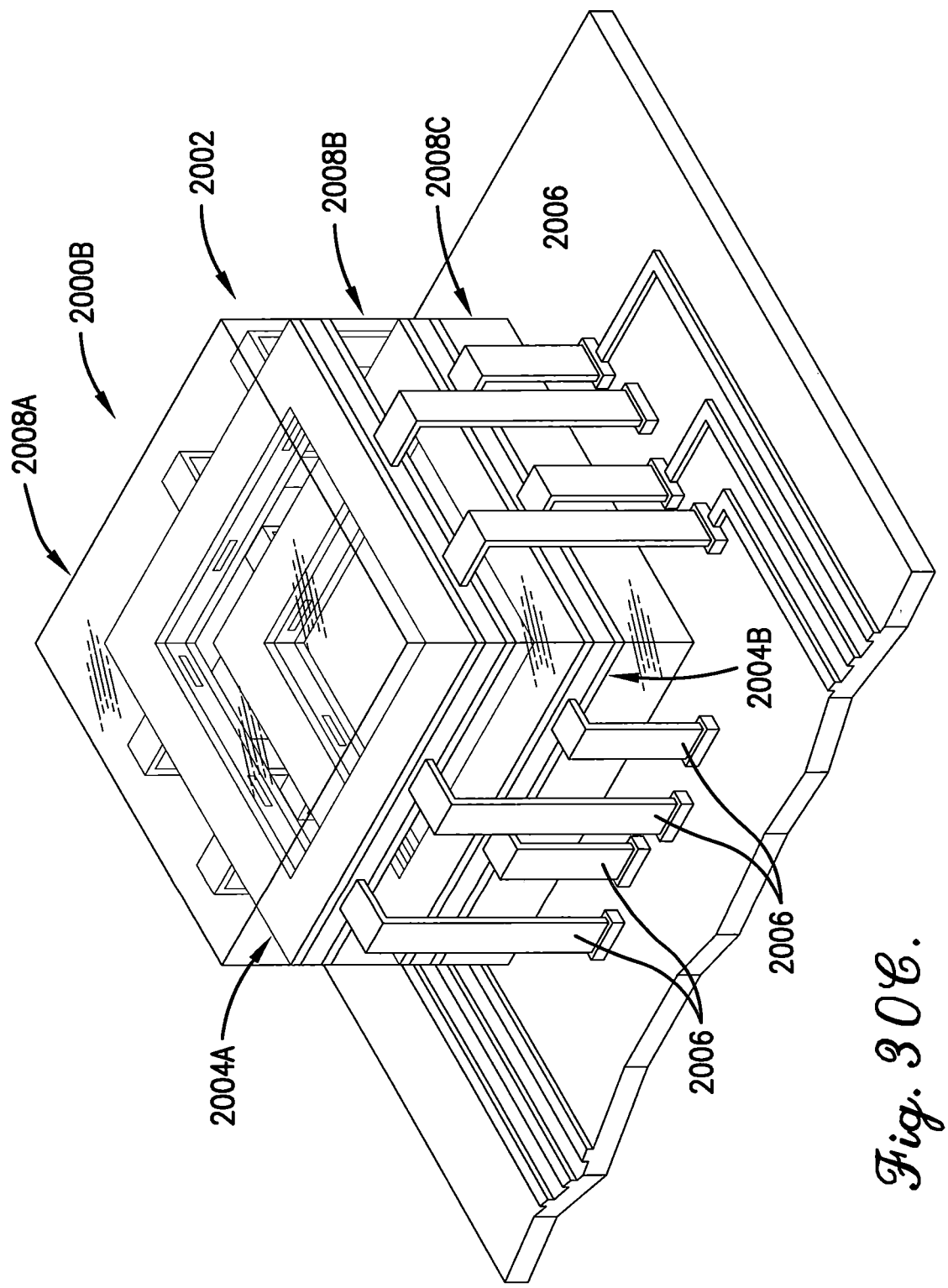
Figure 30D:
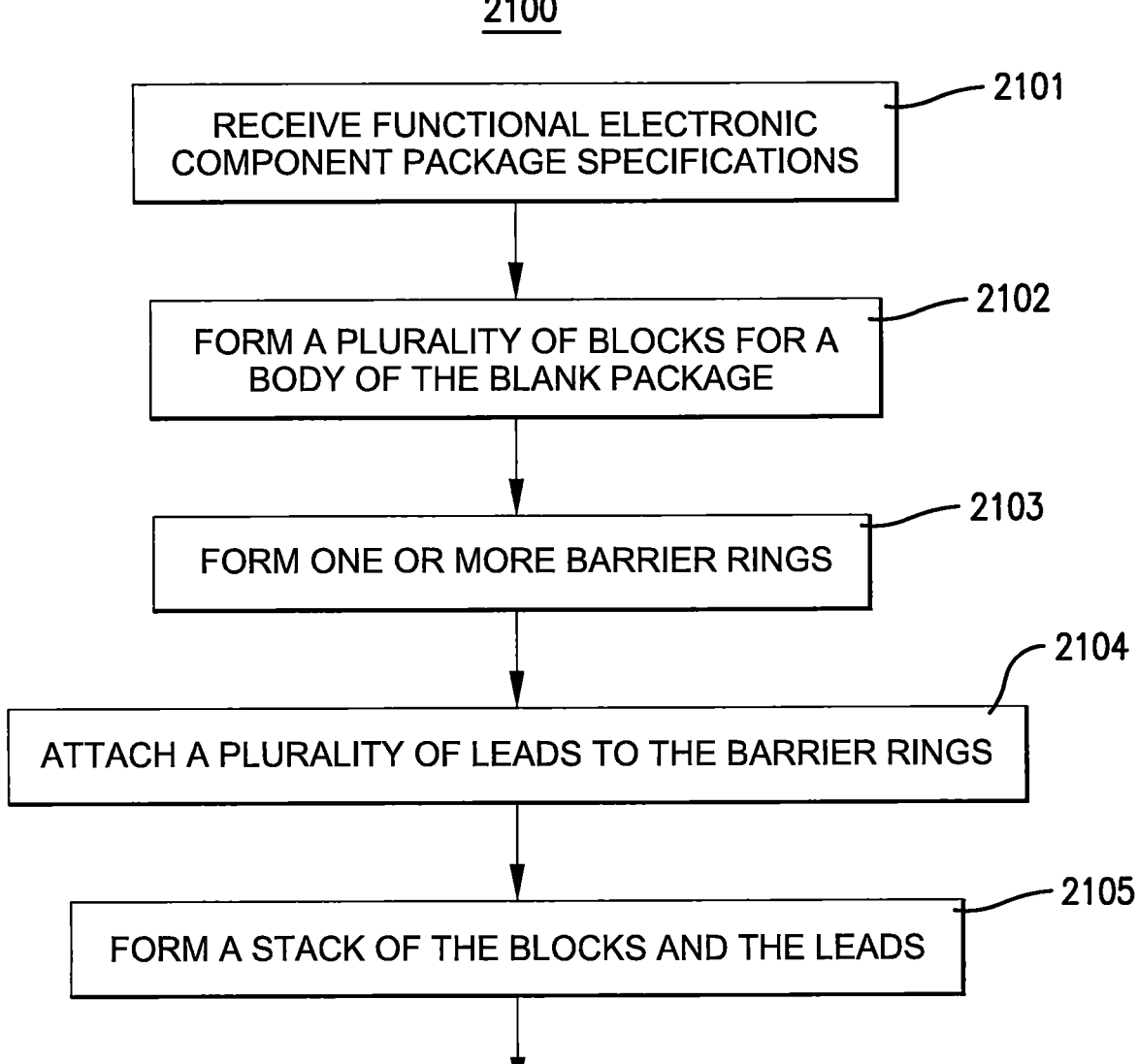
Figure 31A:
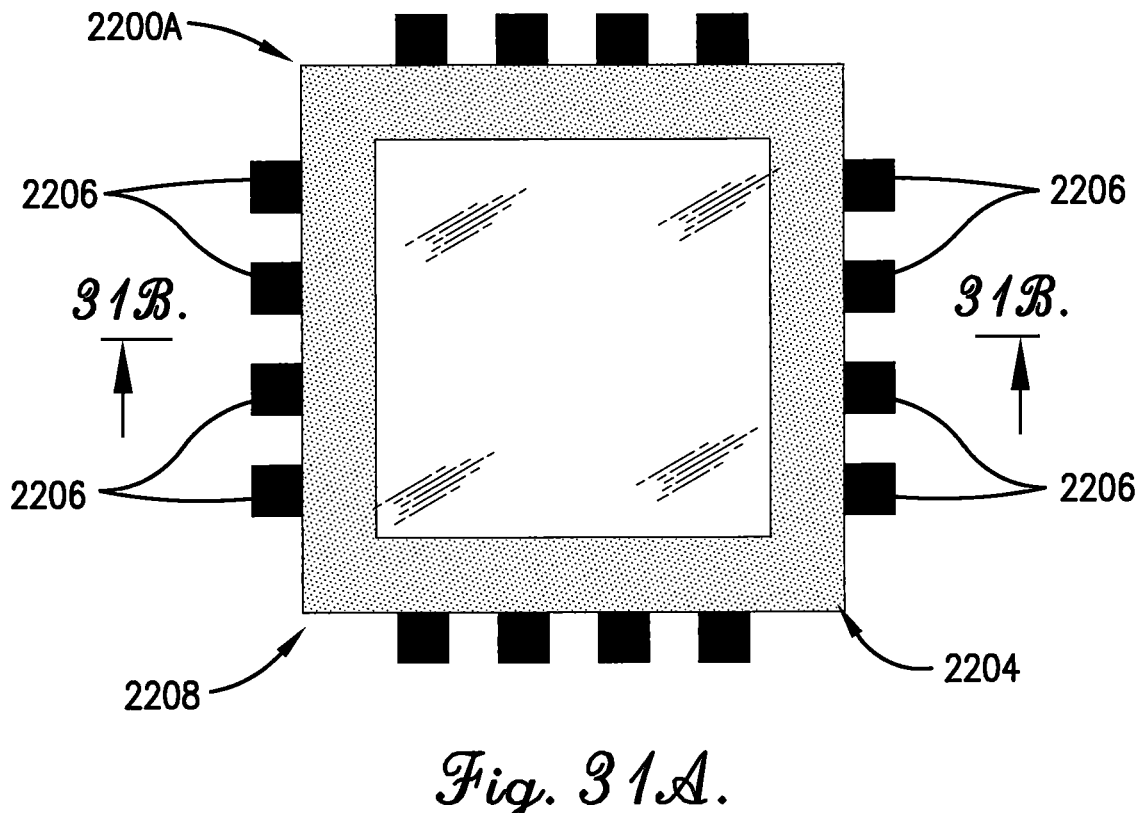
Figure 31B:
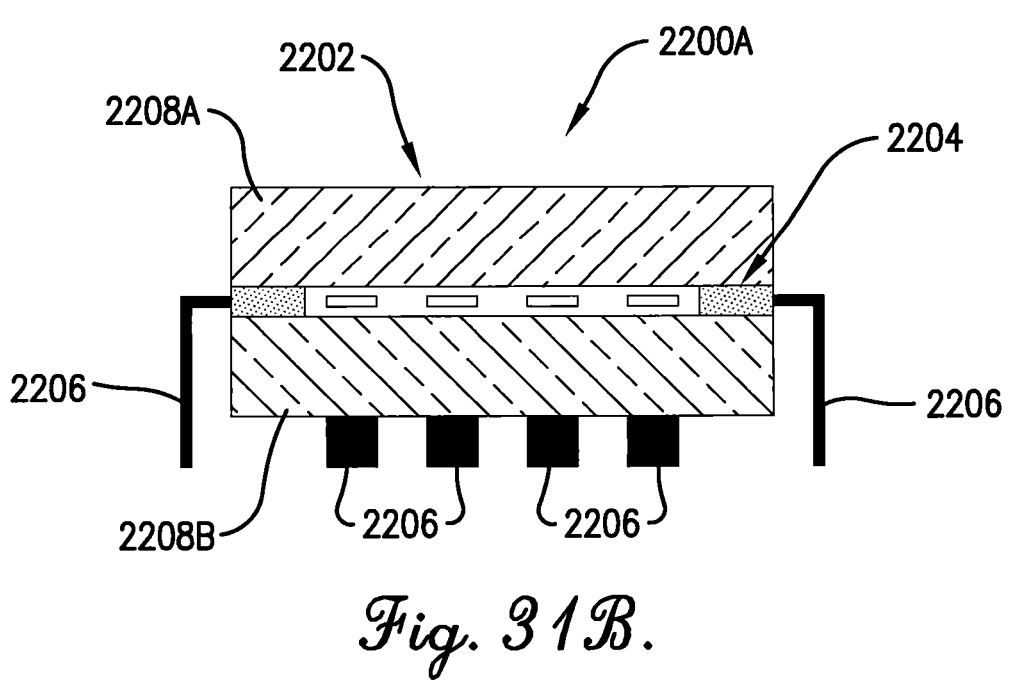
Figure 31C:
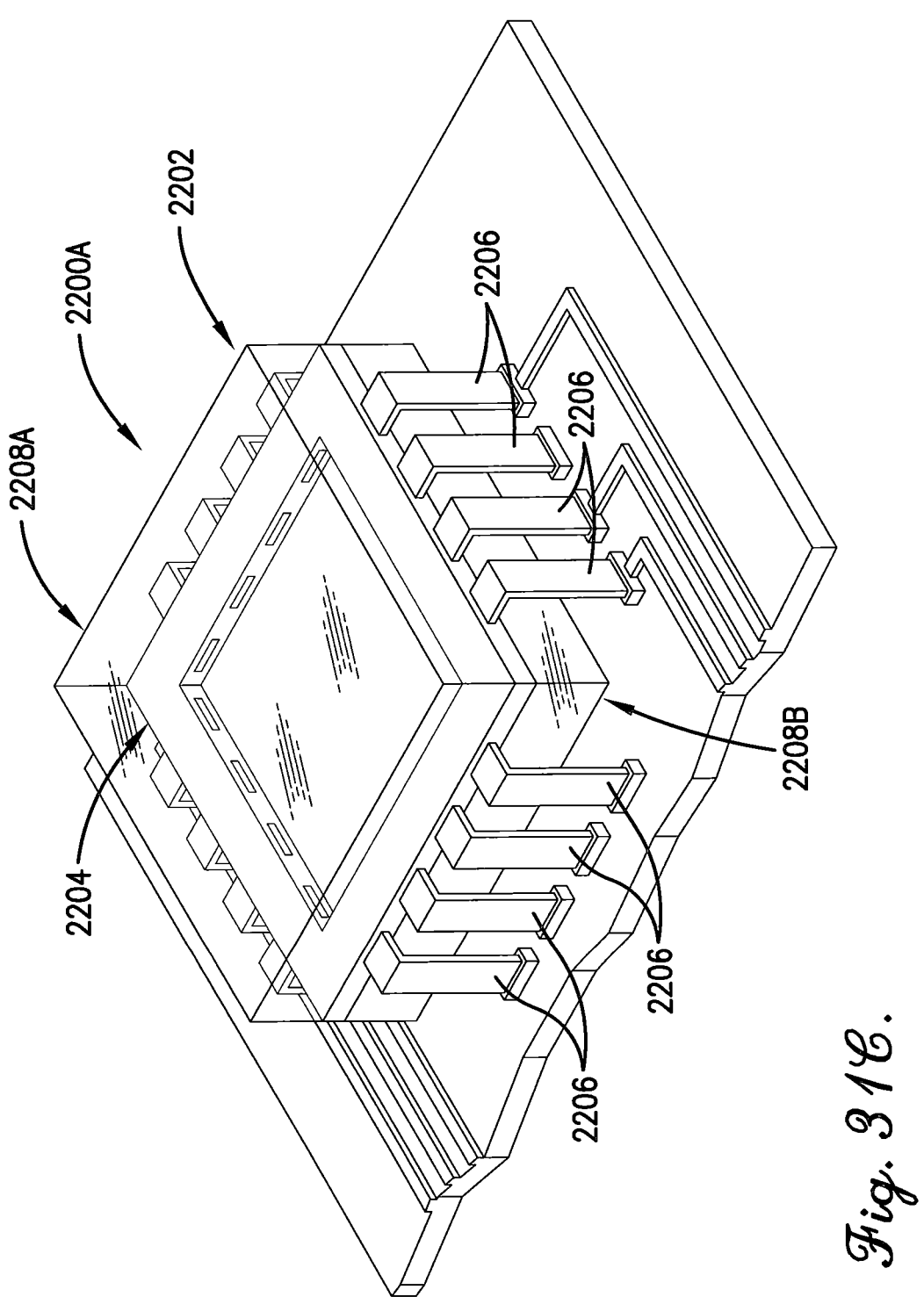
Figure 32A:
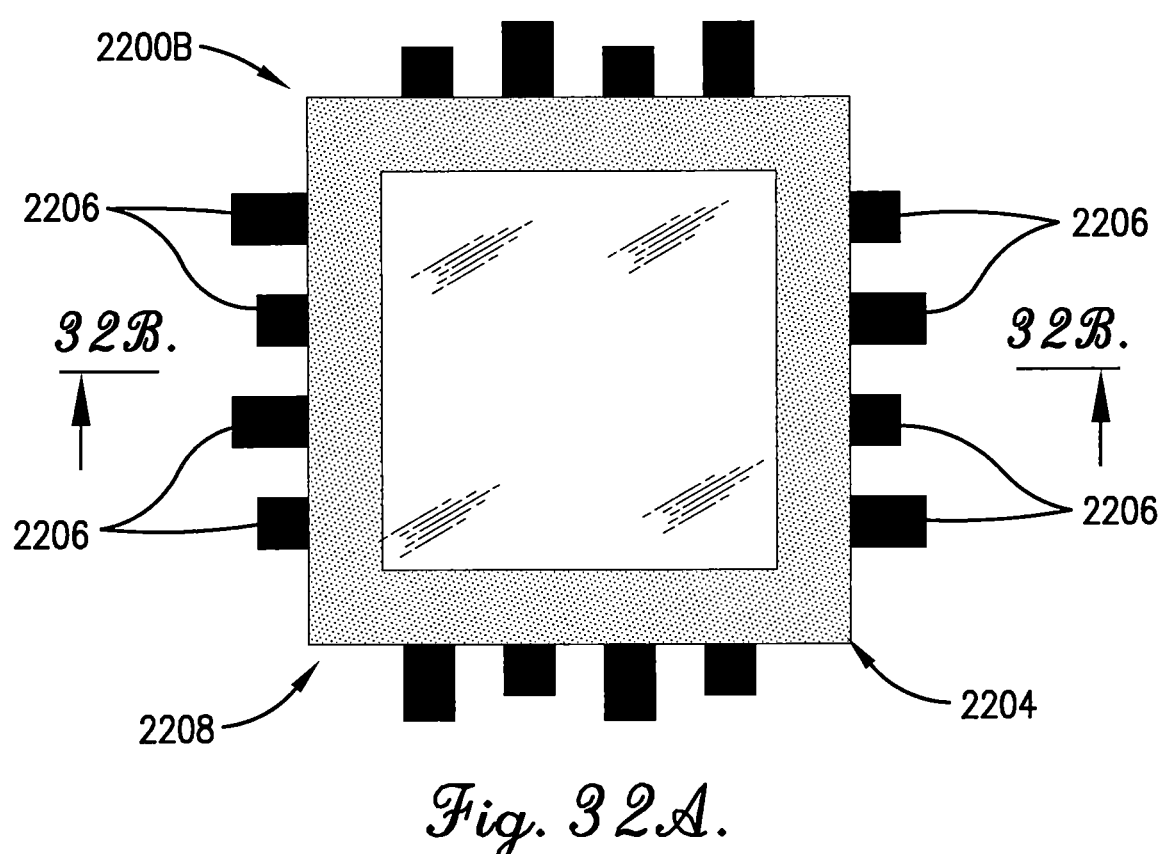
Figure 32B:
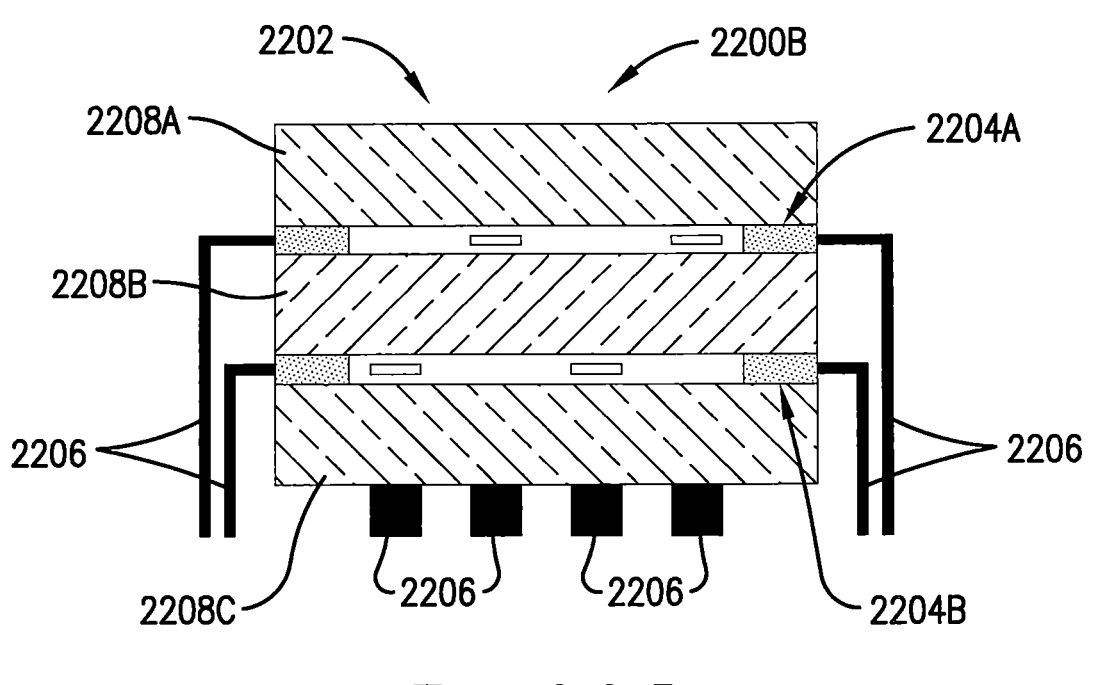
Figure 32C:
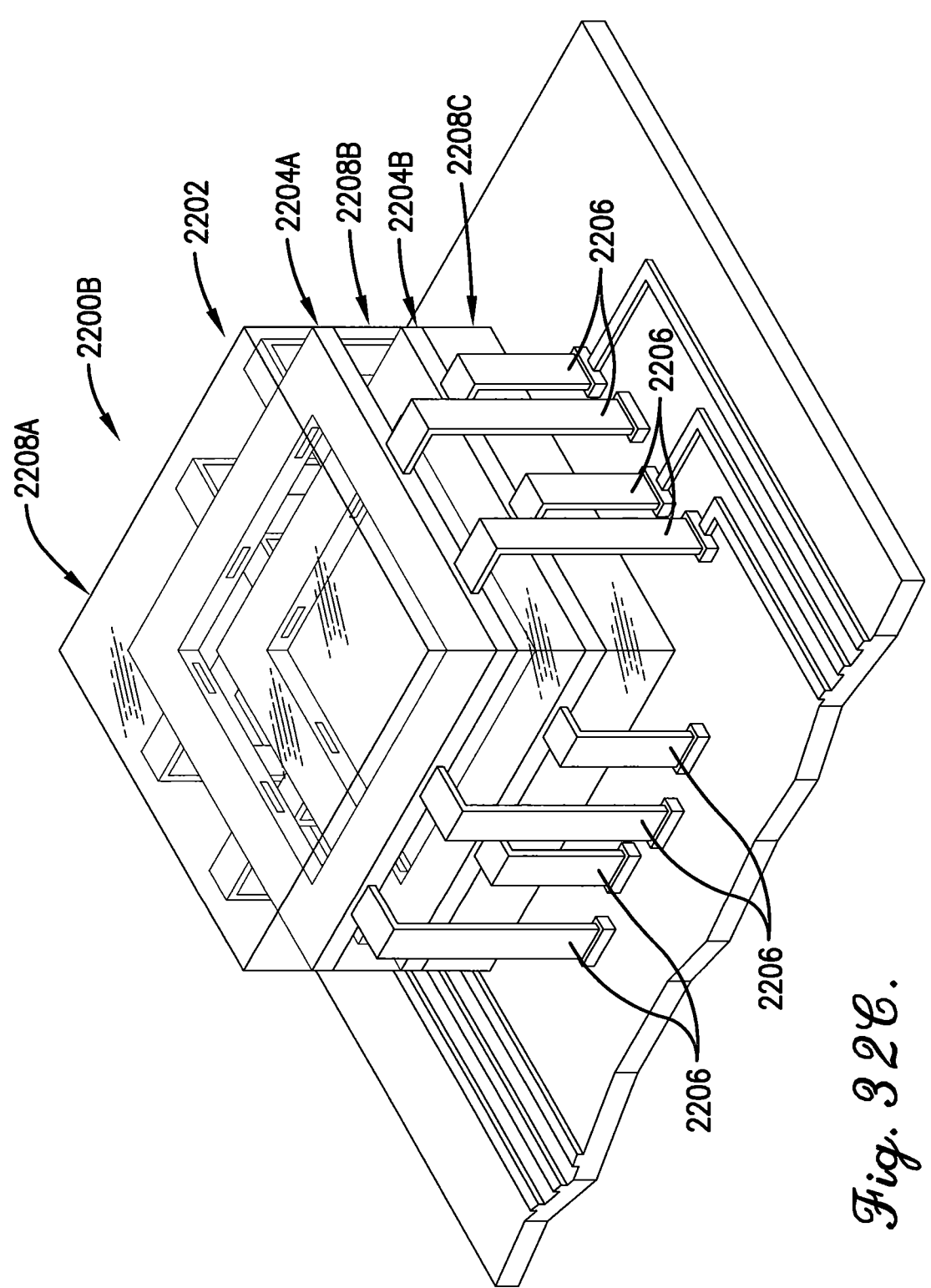
Figure 32D:
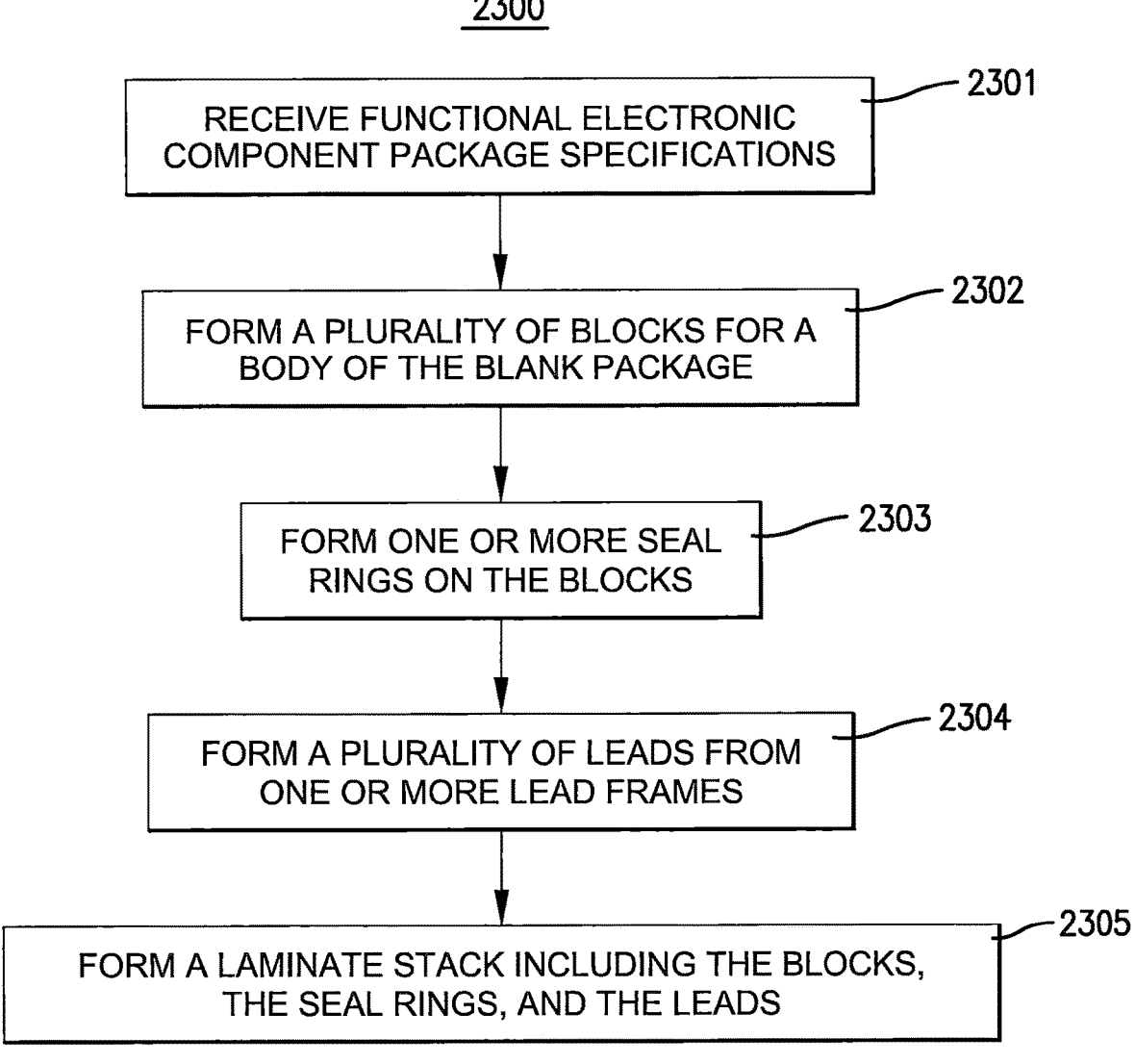
Figure 33A:
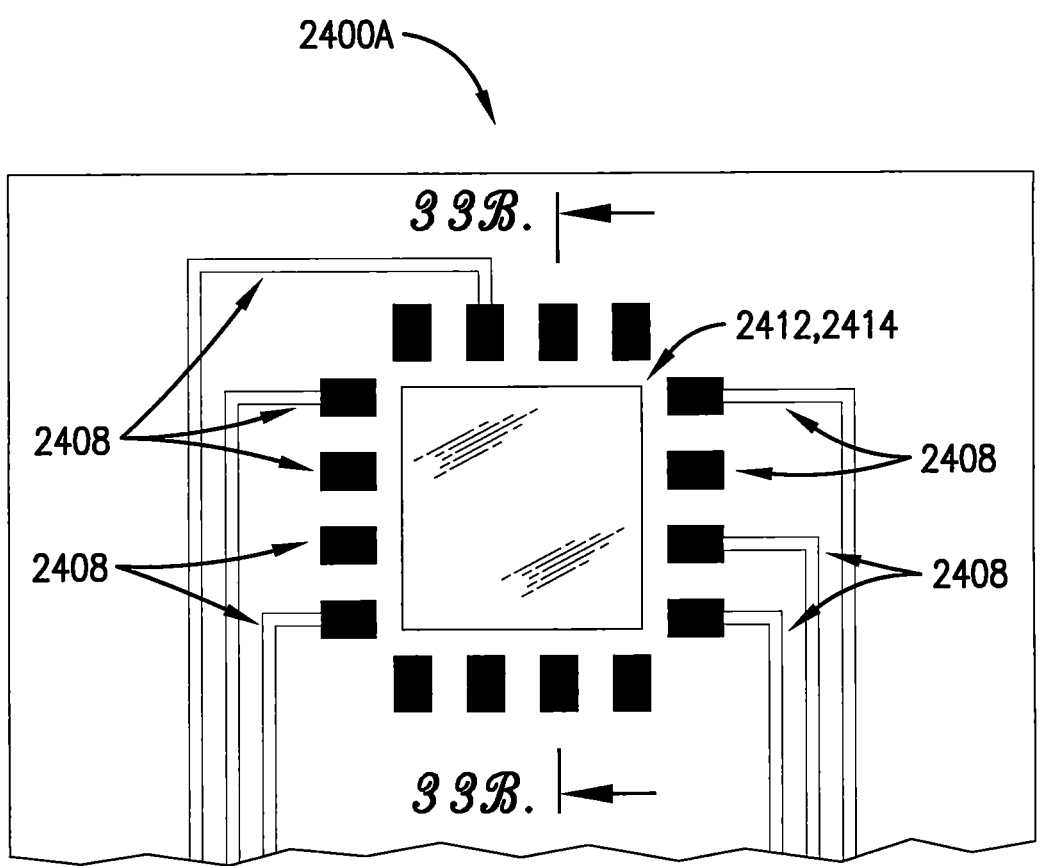
Figure 33B:
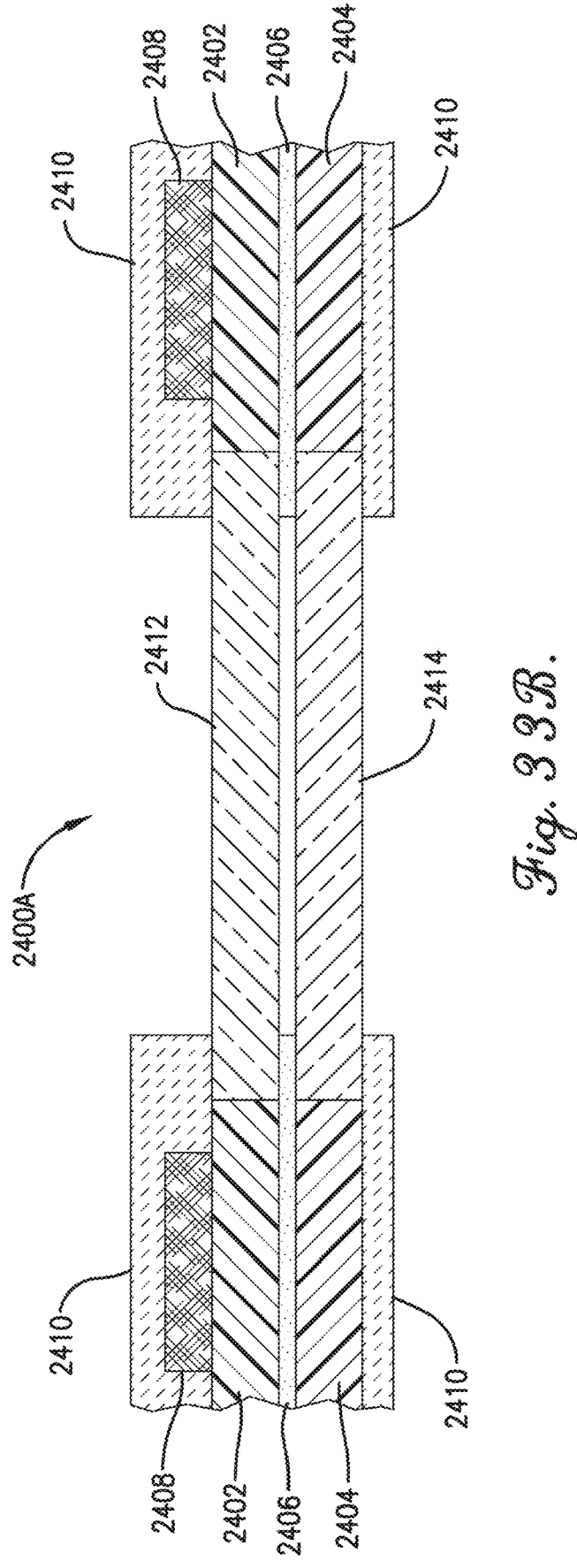
Figure 34A:
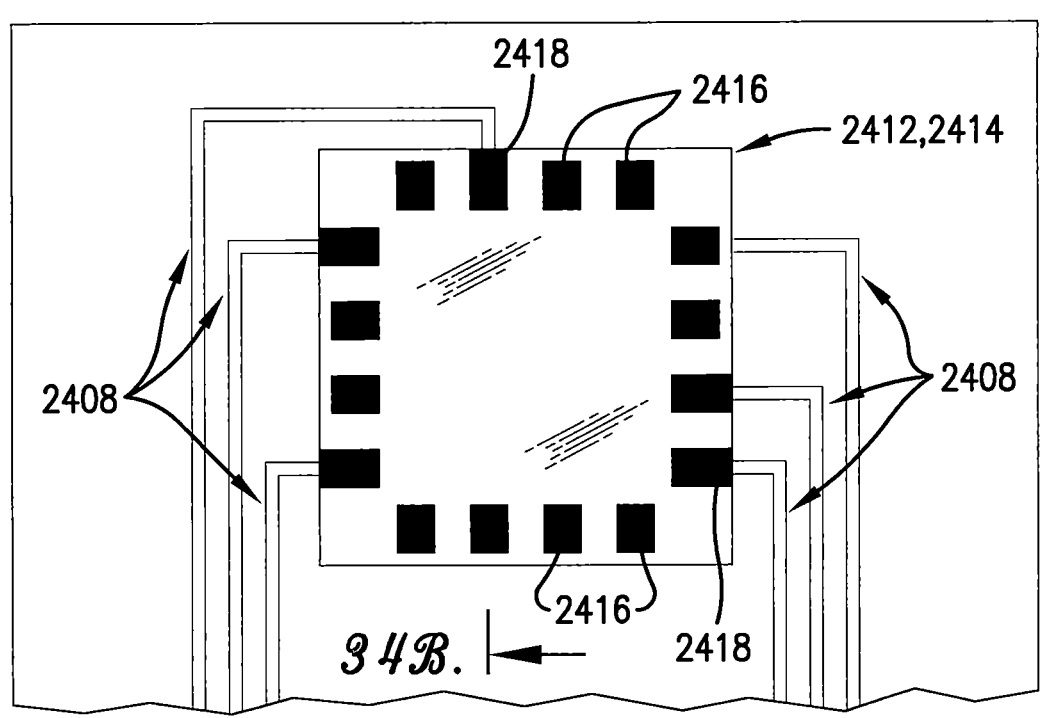
Figure 34B:
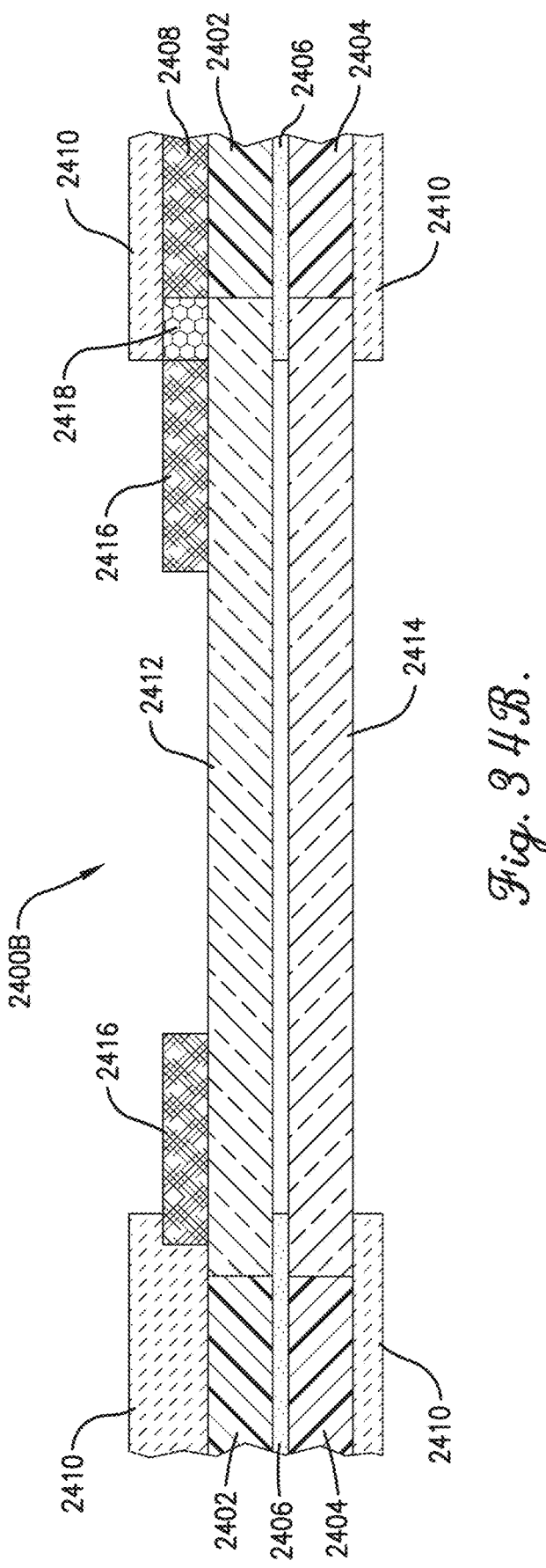
Figure 35A:
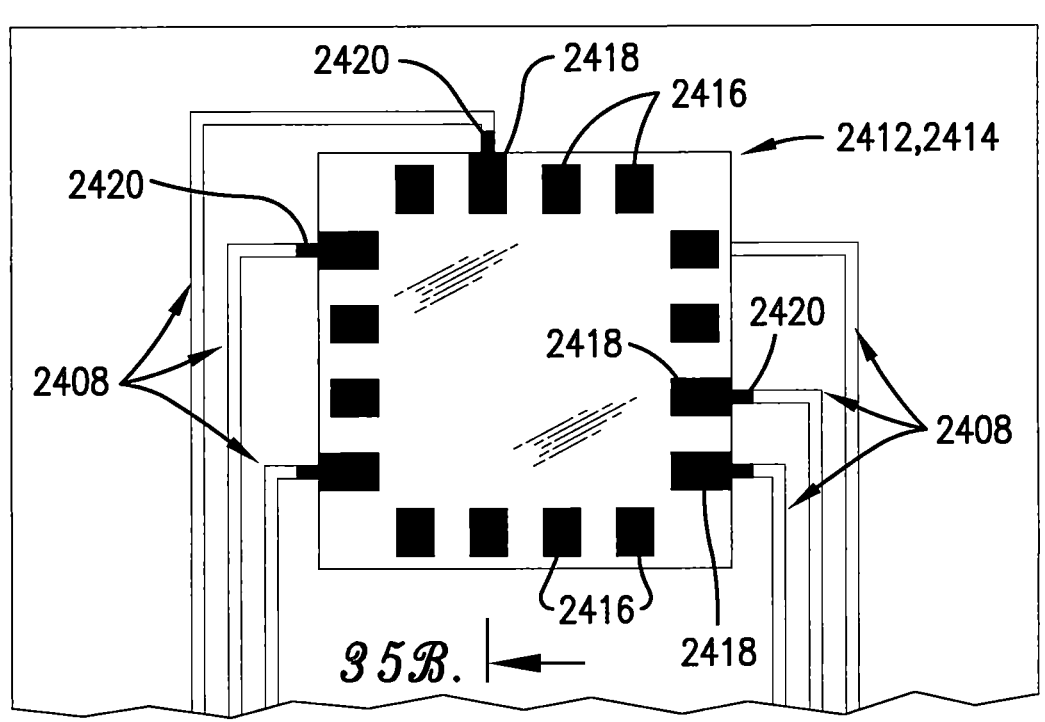
Figure 35B:
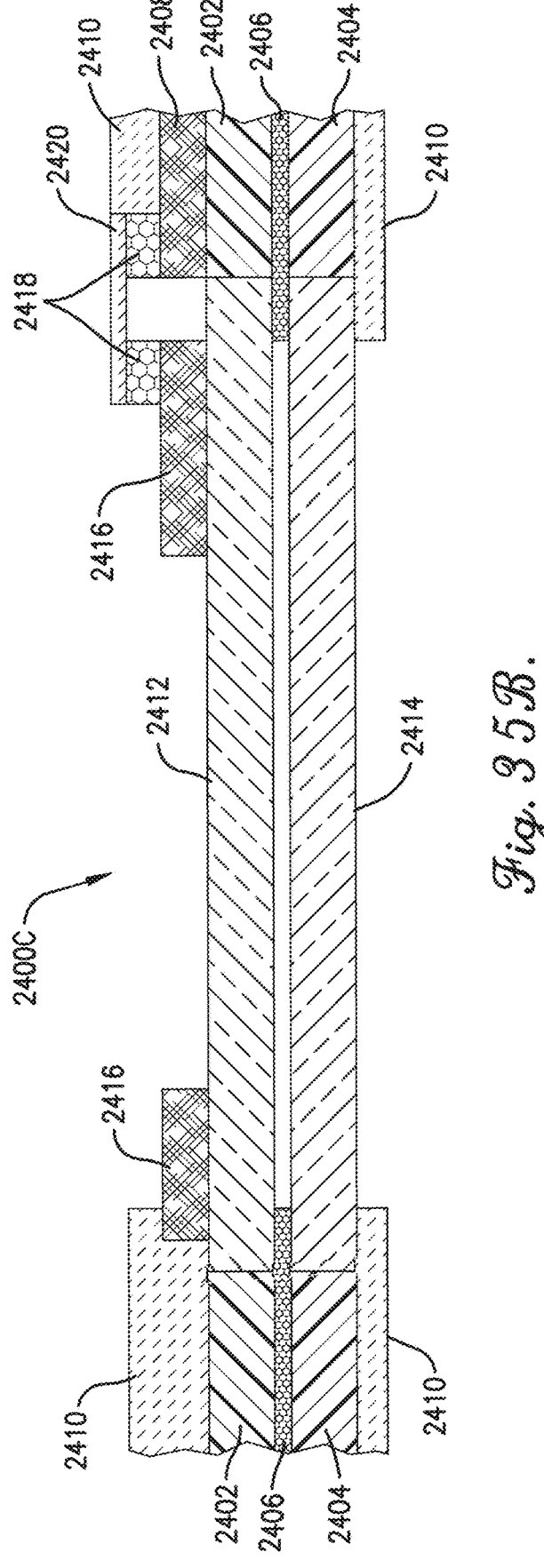
Figure 36A:
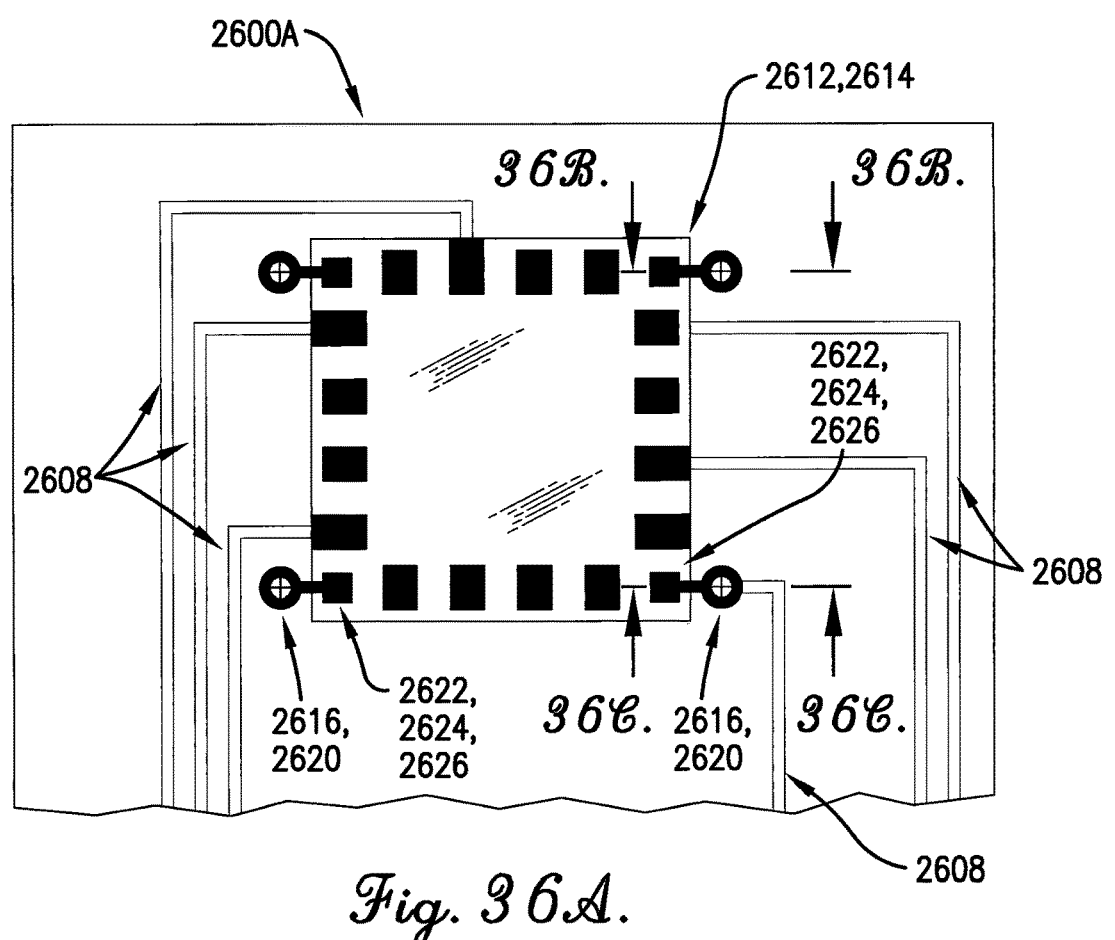
Figure 36B:
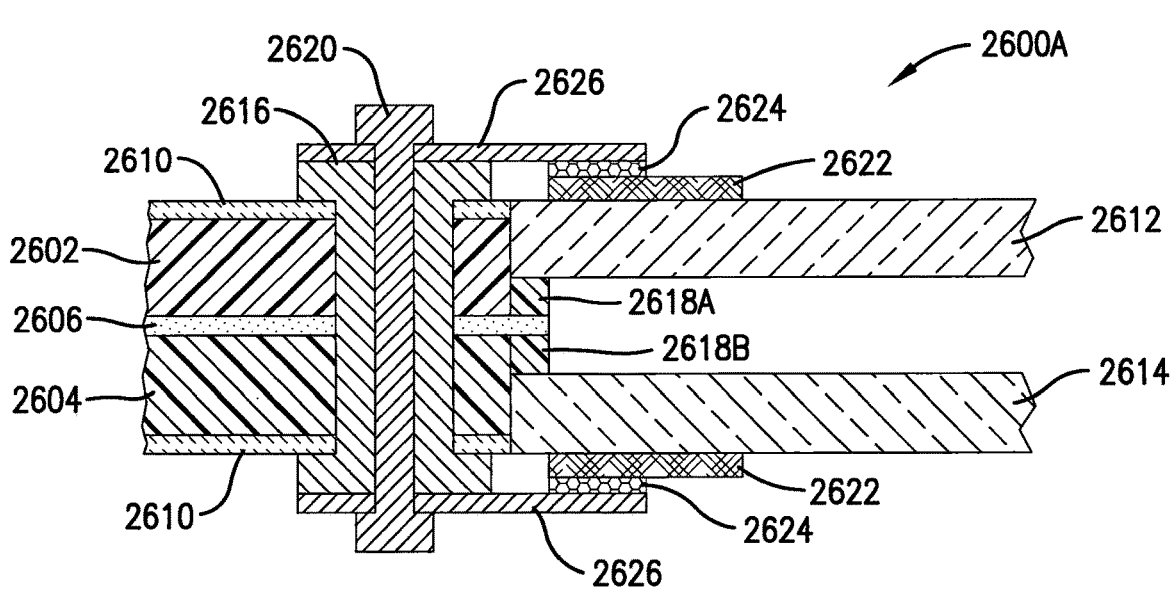
Figure 36C:
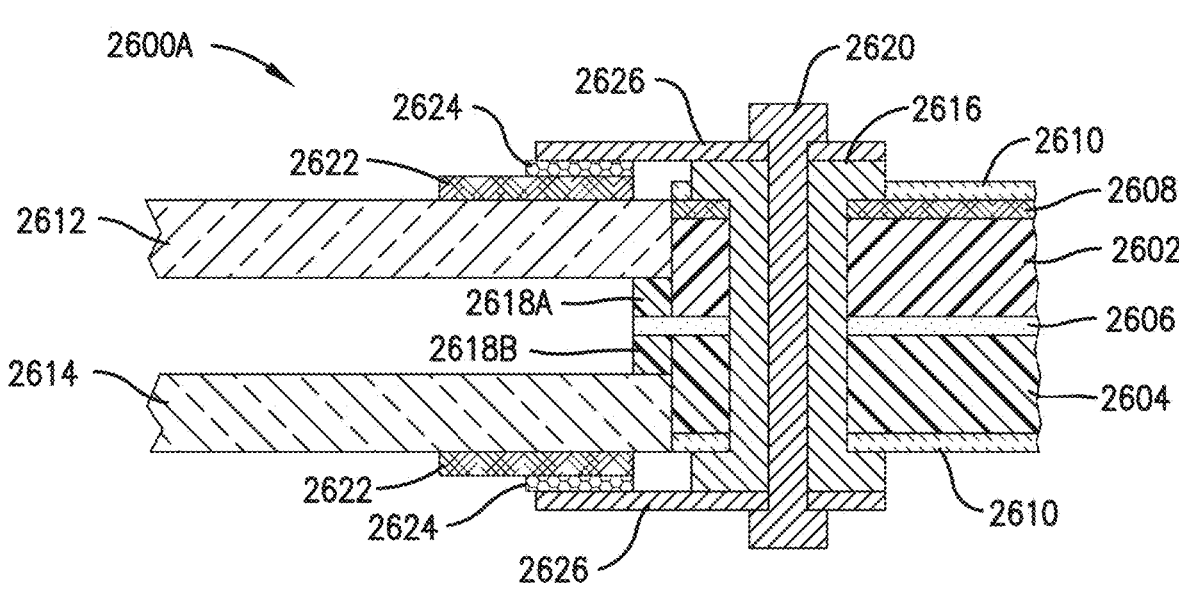
Figure 37A:
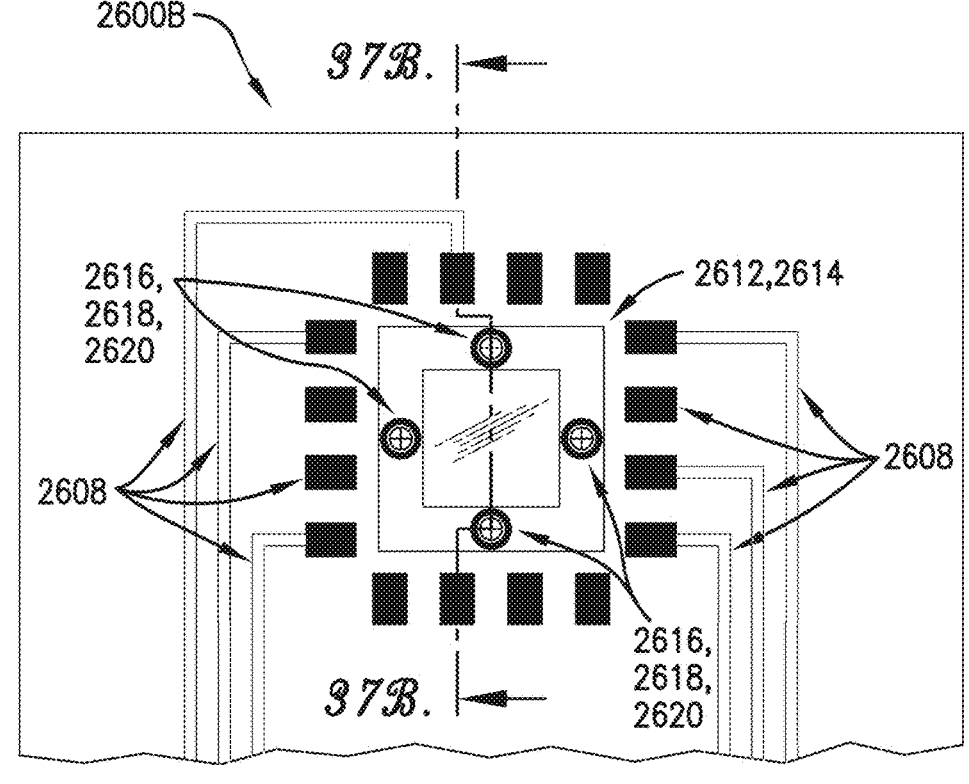
Figure 37B:
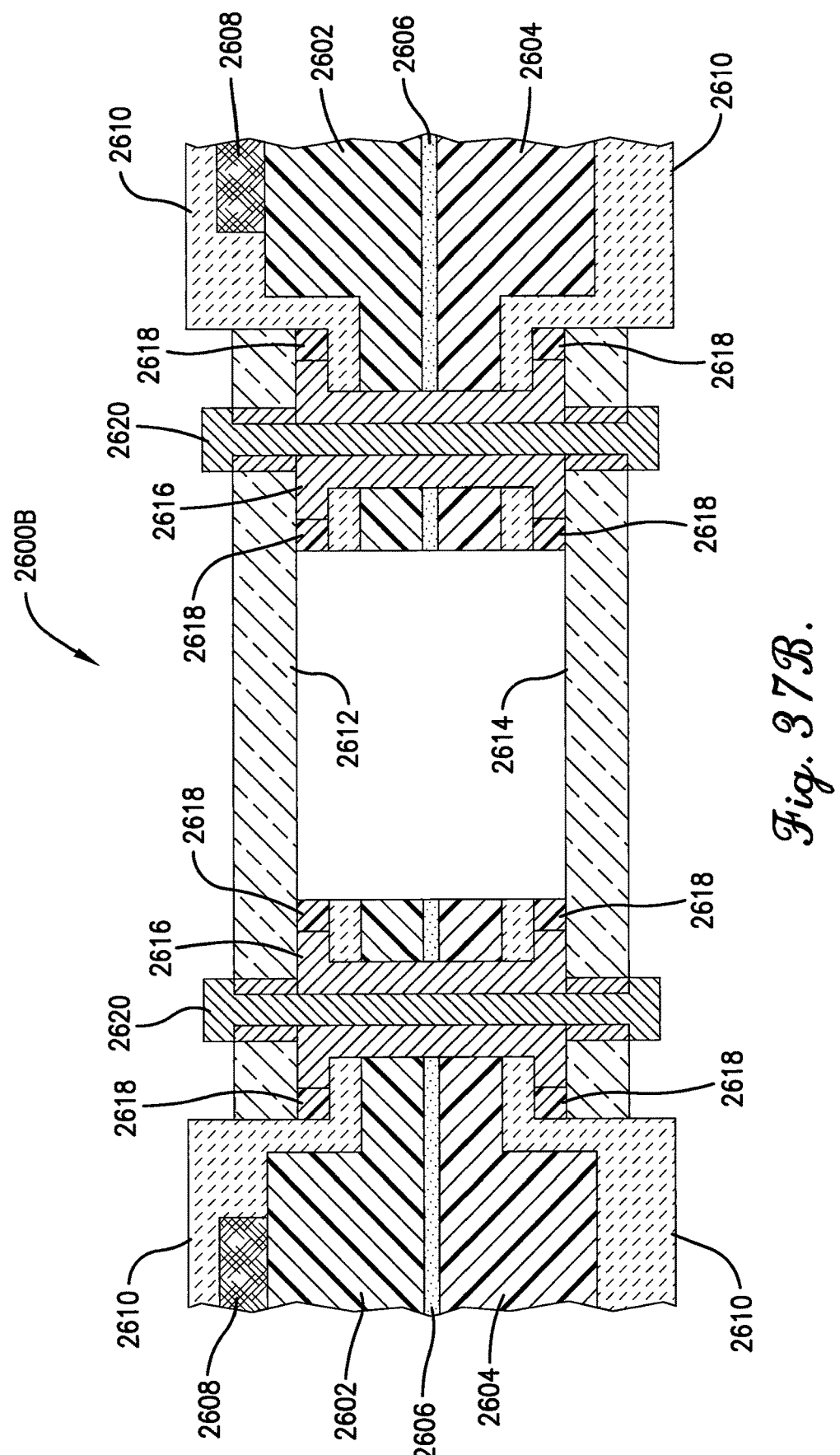
Figure 38B:
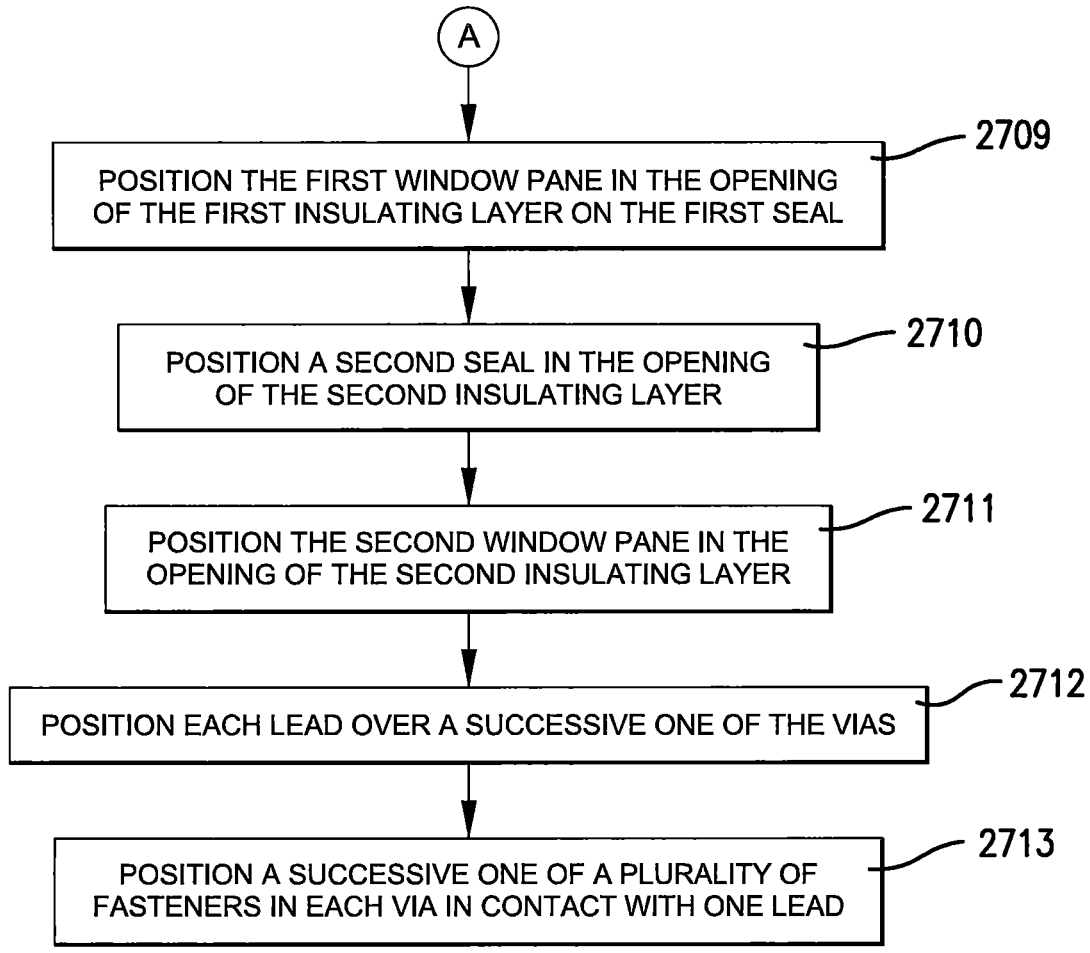
Figure 39B:
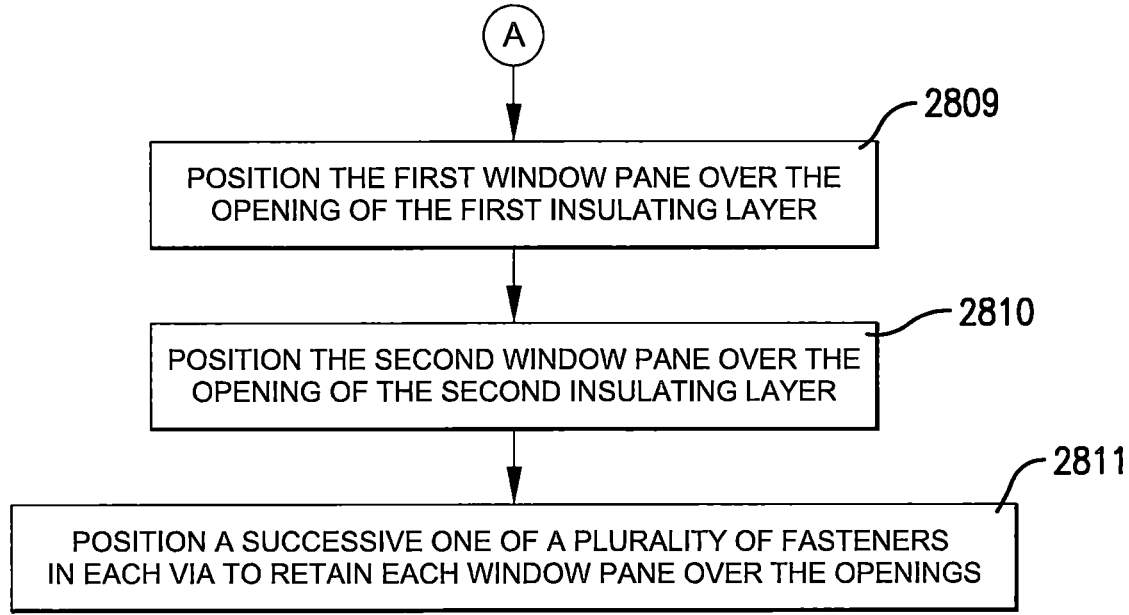
Figure 40A:
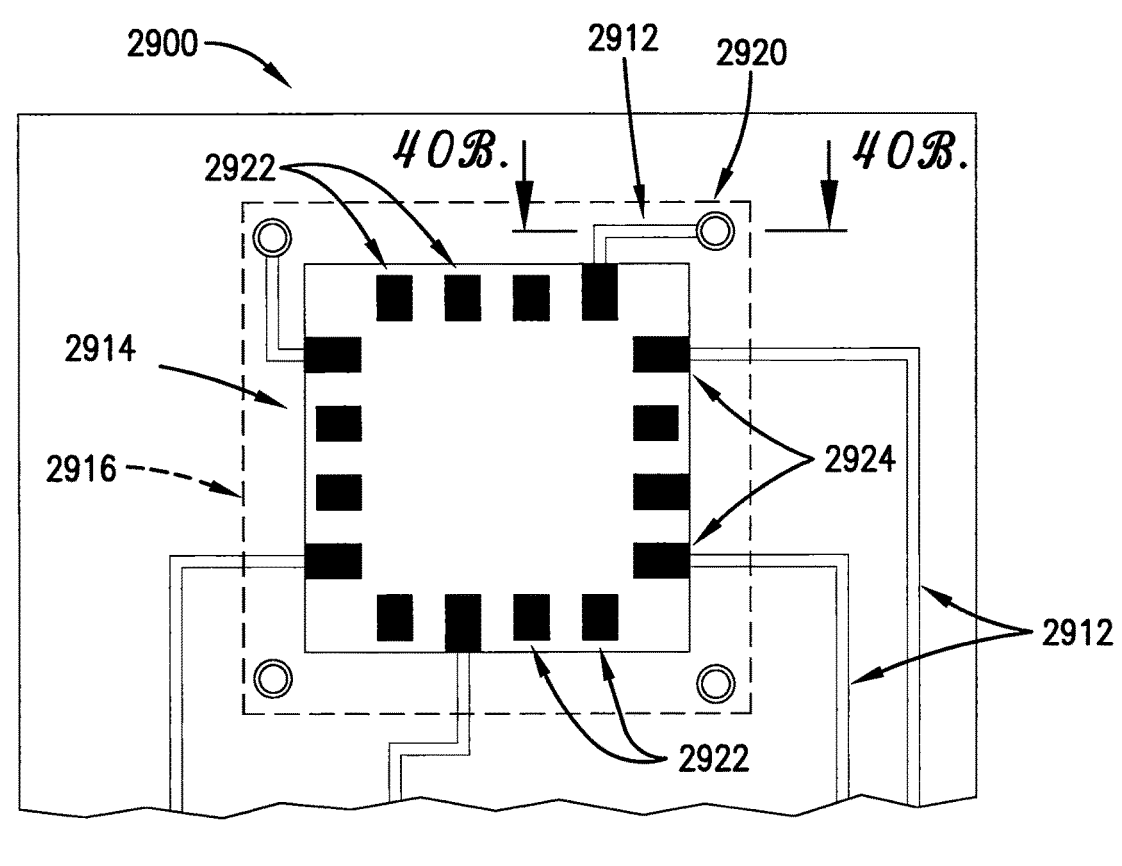
Figure 40B:
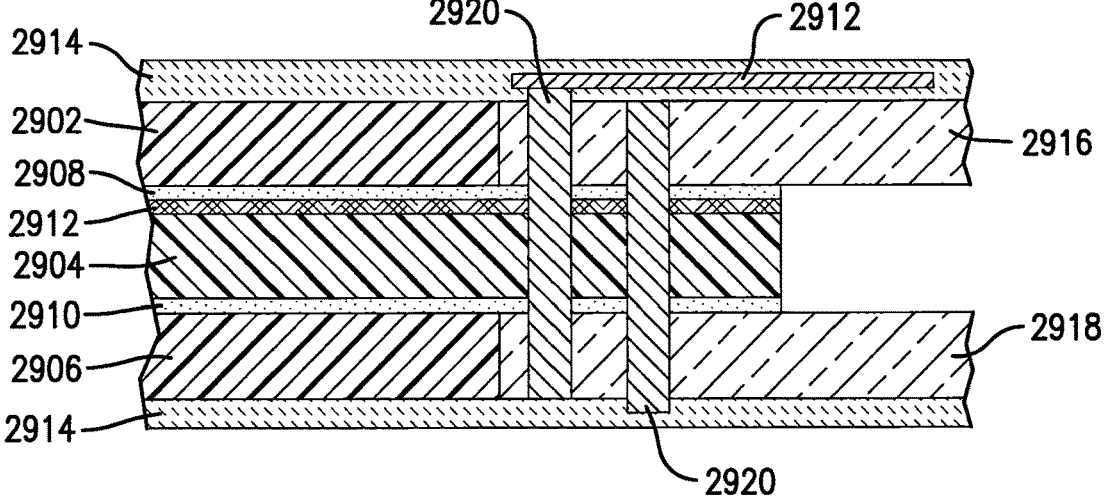
Figure 42A:
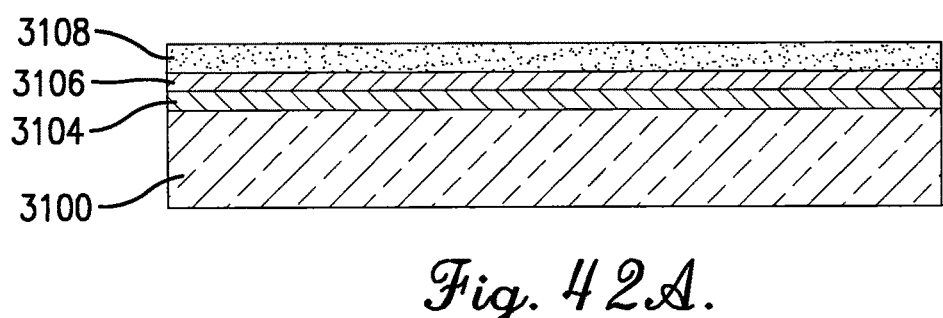
Figure 42B:
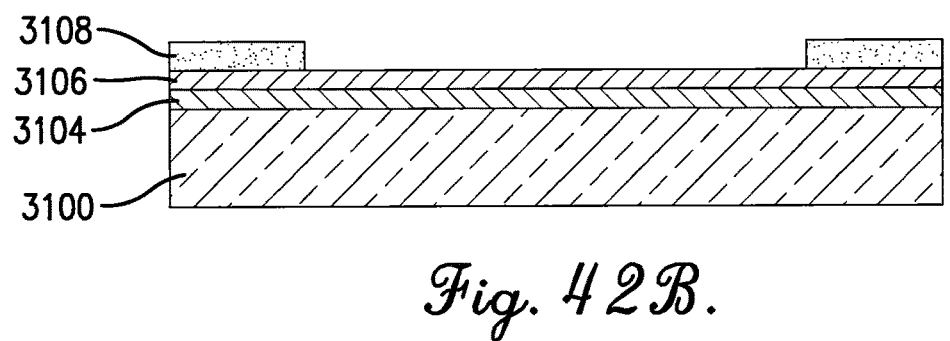
Figure 42C:
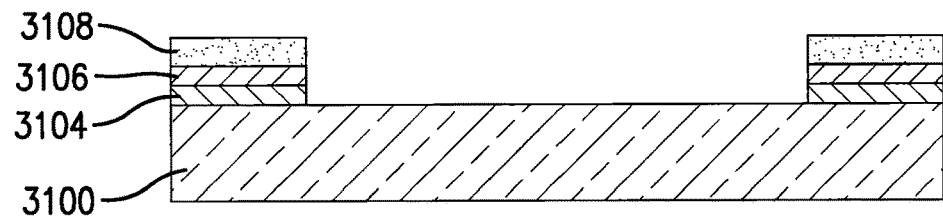
Figure 42D:
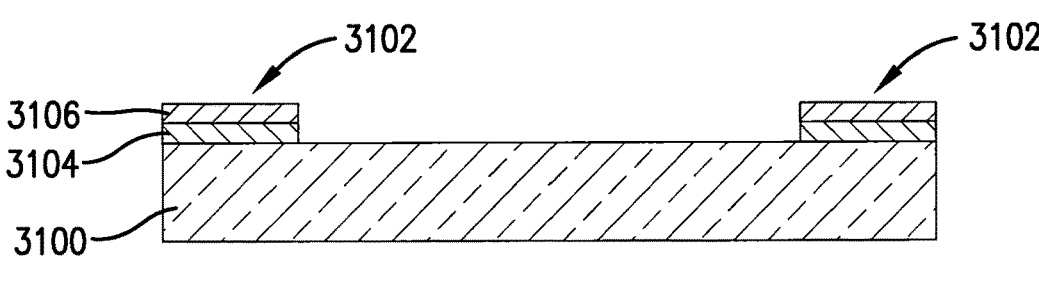
Figure 43:
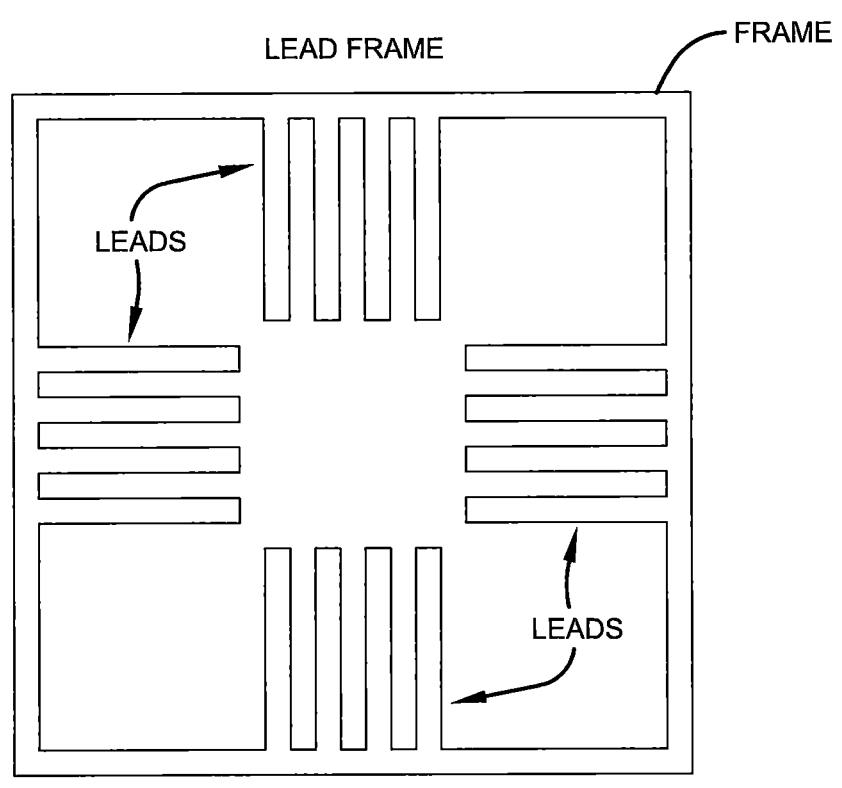

FIG. 13B is an upper perspective view of the blank package of FIG. 13A;

FIG. 13C is a side view of the blank package of FIG. 13A;

FIG. 13D is an upper perspective view of the blank package of FIG. 13A mounted on a printed circuit board;

FIG. 13E includes a listing of at least a portion of the steps of another method of forming a blank package that mimics an electronic component package;

FIG. 14A is an upper perspective view of an embodiment of a blank package for mimicking a surface mount electronic component package;

FIG. 14B is an upper perspective view of another embodiment of a blank package for mimicking a surface mount electronic component package;

FIG. 14C is an upper perspective view of another embodiment of a blank package for mimicking a surface mount electronic component package;

FIG. 14D is a top view of a printed circuit board that includes a plurality of footprints for the blank packages of FIGS. 14A, 14B, and 14C;

FIG. 14E is a top view of the printed circuit board of FIG. 14D that includes the blank packages of FIGS. 14A, 14B, and 14C mounted thereto;

FIG. 14F is a side view of the printed circuit board of FIG. 14E;

FIG. 14G includes a listing of at least a portion of the steps of a method of forming a blank package for mimicking a surface mount electronic component package;

FIG. 15A is a top view of another embodiment of a blank package;

FIG. 15B is a side view of the blank package of FIG. 15A;

FIG. 15C is an upper perspective view of a printed circuit board with the blank package of FIG. 15A mounted thereto;

FIG. 16A is a top view of another embodiment of a blank package;

FIG. 16B is a side view of the blank package of FIG. 16A;

FIG. 16C is an upper perspective view of a printed circuit board with the blank package of FIG. 16A mounted thereto;

FIG. 17A is a top view of another embodiment of a blank package;

FIG. 17B is a side view of the blank package of FIG. 17A;

FIG. 17C is an upper perspective view of a printed circuit board with the blank package of FIG. 17A mounted thereto;

FIG. 17D includes a listing of at least a portion of the steps of a method of forming blank package for mimicking an electronic component package that includes a plurality of leads;

FIG. 18A is a top view of another embodiment of a blank package;

FIG. 18B is a side view of the blank package of FIG. 18A;

FIG. 18C is an upper perspective view of a printed circuit board with the blank package of FIG. 18A mounted thereto;

FIG. 19A is a top view of another embodiment of a blank package;

FIG. 19B is a side view of the blank package of FIG. 19A;

FIG. 19C is an upper perspective view of a printed circuit board with the blank package of FIG. 19A mounted thereto;

FIG. 20A is a top view of another embodiment of a blank package;

FIG. 20B is a side view of the blank package of FIG. 20A;

FIG. 20C is an upper perspective view of a printed circuit board with the blank package of FIG. 20A mounted thereto;

FIG. 20D includes a listing of at least a portion of the steps of a method of forming blank package for mimicking an electronic component package that includes a plurality of leads;

FIG. 21A is a top view of another embodiment of a blank package;

FIG. 21B is a side view of the blank package of FIG. 21A;

FIG. 21C is an upper perspective view of a printed circuit board with the blank package of FIG. 21A mounted thereto;

FIG. 22A is a top view of another embodiment of a blank package;

FIG. 22B is a side view of the blank package of FIG. 22A;

FIG. 22C is an upper perspective view of a printed circuit board with the blank package of FIG. 22A mounted thereto;

FIG. 22D includes a listing of at least a portion of the steps of a method of forming blank package for mimicking an electronic component package that includes a plurality of leads;

FIG. 23A is a top view of another embodiment of a blank package;

FIG. 23B is a side view of the blank package of FIG. 23A;

FIG. 23C is an upper perspective view of a printed circuit board with the blank package of FIG. 23A mounted thereto;

FIG. 24A is a top view of another embodiment of a blank package;

FIG. 24B is a side view of the blank package of FIG. 24A;

FIG. 24C is an upper perspective view of a printed circuit board with the blank package of FIG. 24A mounted thereto;

FIG. 24D includes a listing of at least a portion of the steps of a method of forming blank package for mimicking an electronic component package that includes a plurality of leads;

FIG. 25A is a top view of another embodiment of a blank package;

FIG. 25B is a side view of the blank package of FIG. 25A;

FIG. 25C is an upper perspective view of a printed circuit board with the blank package of FIG. 25A mounted thereto;

FIG. 26A is a top view of another embodiment of a blank package;

FIG. 26B is a side view of the blank package of FIG. 26A;

FIG. 26C is an upper perspective view of a printed circuit board with the blank package of FIG. 26A mounted thereto;

FIG. 26D includes a listing of at least a portion of the steps of a method of forming blank package for mimicking an electronic component package that includes a plurality of leads;

FIG. 27A is a top view of another embodiment of a blank package;

FIG. 27B is a side view of the blank package of FIG. 27A;

FIG. 27C is an upper perspective view of a printed circuit board with the blank package of FIG. 27A mounted thereto;

FIG. 28A is a top view of another embodiment of a blank package;

FIG. 28B is a side view of the blank package of FIG. 28A;

FIG. 28C is an upper perspective view of a printed circuit board with the blank package of FIG. 28A mounted thereto;

FIG. 28D includes a listing of at least a portion of the steps of a method of forming blank package for mimicking an electronic component package that includes a plurality of leads;

FIG. 29A is a top view of another embodiment of a blank package;

FIG. 29B is a side view of the blank package of FIG. 29A;

FIG. 29C is an upper perspective view of a printed circuit board with the blank package of FIG. 29A mounted thereto;

FIG. 30A is a top view of another embodiment of a blank package;

FIG. 30B is a side view of the blank package of FIG. 30A;

FIG. 30C is an upper perspective view of a printed circuit board with the blank package of FIG. 30A mounted thereto;

FIG. 30D includes a listing of at least a portion of the steps of a method of forming blank package for mimicking an electronic component package that includes a plurality of leads;

FIG. 31A is a top view of another embodiment of a blank package;

FIG. 31B is a side view of the blank package of FIG. 31A;

FIG. 31C is an upper perspective view of a printed circuit board with the blank package of FIG. 31A mounted thereto;

FIG. 32A is a top view of another embodiment of a blank package;

FIG. 32B is a side view of the blank package of FIG. 32A;

FIG. 32C is an upper perspective view of a printed circuit board with the blank package of FIG. 32A mounted thereto;

FIG. 32D includes a listing of at least a portion of the steps of a method of forming blank package for mimicking an electronic component package that includes a plurality of leads;

FIG. 33A is a top view of an embodiment of a windowed printed circuit board;

FIG. 33B is a side cross-sectional view of the windowed printed circuit board of FIG. 33A cut along line 33B-33B;

FIG. 34A is a top view of another embodiment of a windowed printed circuit board;

FIG. 34B is a side cross-sectional view of the windowed printed circuit board of FIG. 34A cut along line 34B-34B;

FIG. 35A is a top view of an embodiment of a windowed printed circuit board;

FIG. 35B is a side cross-sectional view of the windowed printed circuit board of FIG. 35A cut along line 35B-35B;

FIG. 35C includes a listing of at least a portion of the steps of a method of forming a windowed printed circuit board for mimicking an actual printed circuit board;

FIG. 36A is a top view of an embodiment of a windowed printed circuit board;

FIG. 36B is a side cross-sectional view of the windowed printed circuit board of FIG. 36A cut along line 36B-36B;

FIG. 36C is a side cross-sectional view of the windowed printed circuit board of FIG. 36A cut along line 36C-36C;

FIG. 37A is a top view of an embodiment of a windowed printed circuit board;

FIG. 37B is a side cross-sectional view of the windowed printed circuit board of FIG. 37A cut along line 37B-37B;

FIGS. 38A and 38B includes a listing of at least a portion of the steps of a method of forming a windowed printed circuit board for mimicking an actual printed circuit board;

FIGS. 39A and 39B includes a listing of at least a portion of the steps of another method of forming a windowed printed circuit board for mimicking an actual printed circuit board;

FIG. 40A is a top view of an embodiment of a windowed printed circuit board;

FIG. 40B is a side cross-sectional view of the windowed printed circuit board of FIG. 40A cut along line 40B-40B;

FIG. 41 includes a listing of at least a portion of the steps of another method of forming a windowed printed circuit board for mimicking an actual printed circuit board;

FIGS. 42A, 42B, 42C, and 42D each show a side sectional view of a portion of a first substrate undergoing a metallization process to form a plurality of conductive pads; and FIG. 43 is a top plan view of a lead frame utilized in a plurality of methods of forming a blank package.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

Relational terms, such as "above", "below", "upper", "upward", "downward", "lower", "top", "bottom", "outer", "inner", etc., along with orientation terms, such as "horizontal" and "vertical", may be used throughout this description. These terms are used with reference to embodiments of the technology and the positions and orientations thereof shown in the accompanying figures. Embodiments of the technology may be positioned and oriented in other ways. Therefore, the terms do not limit the scope of the current technology.

Figure 1A:
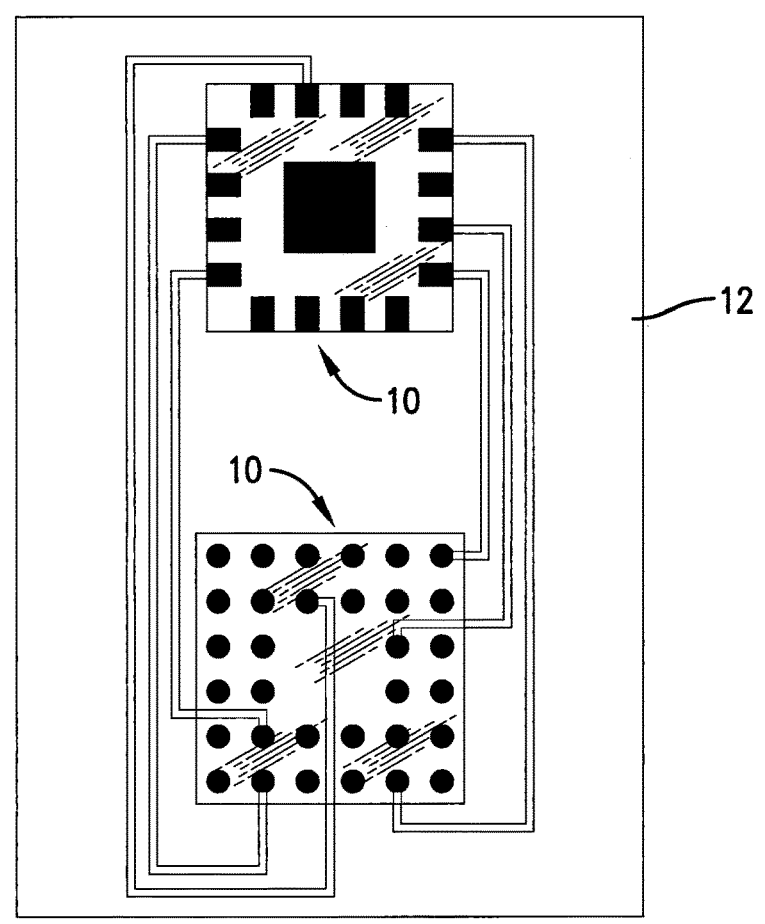
FIG. 1A is a top view of a printed circuit board with a plurality of blank packages, constructed in accordance with various embodiments of the current invention, electrically connected thereto.
Figure 1B:
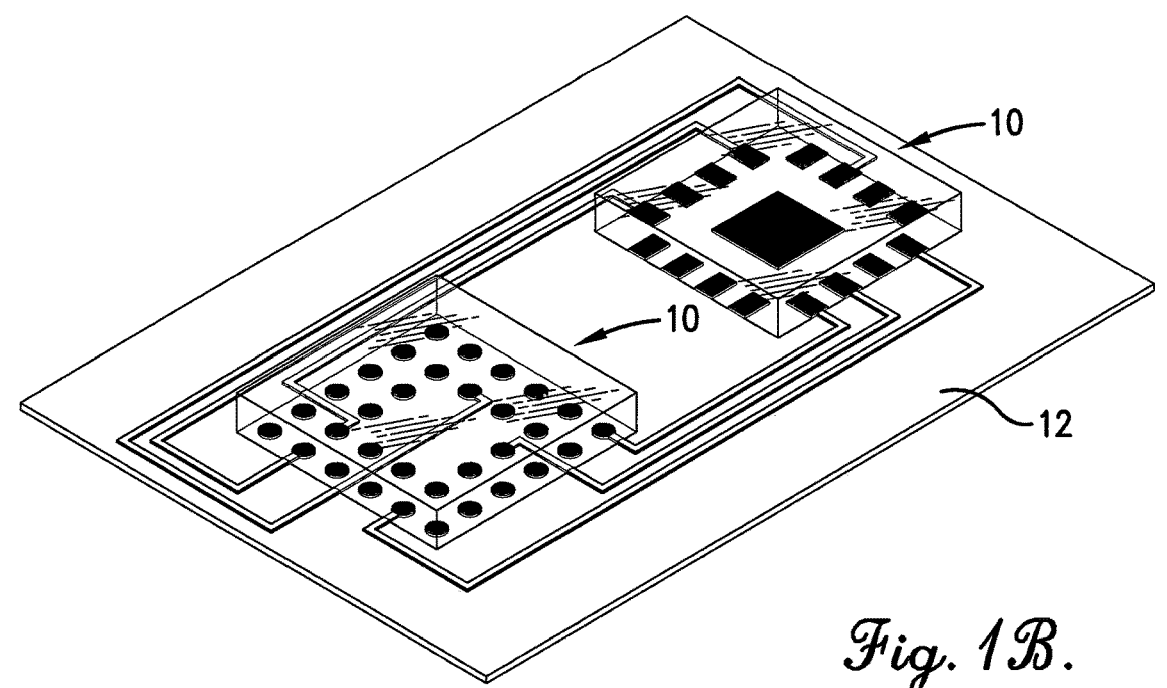
FIG. 1B is an upper perspective view of the printed circuit board with the blank packages.
Figure 2A:
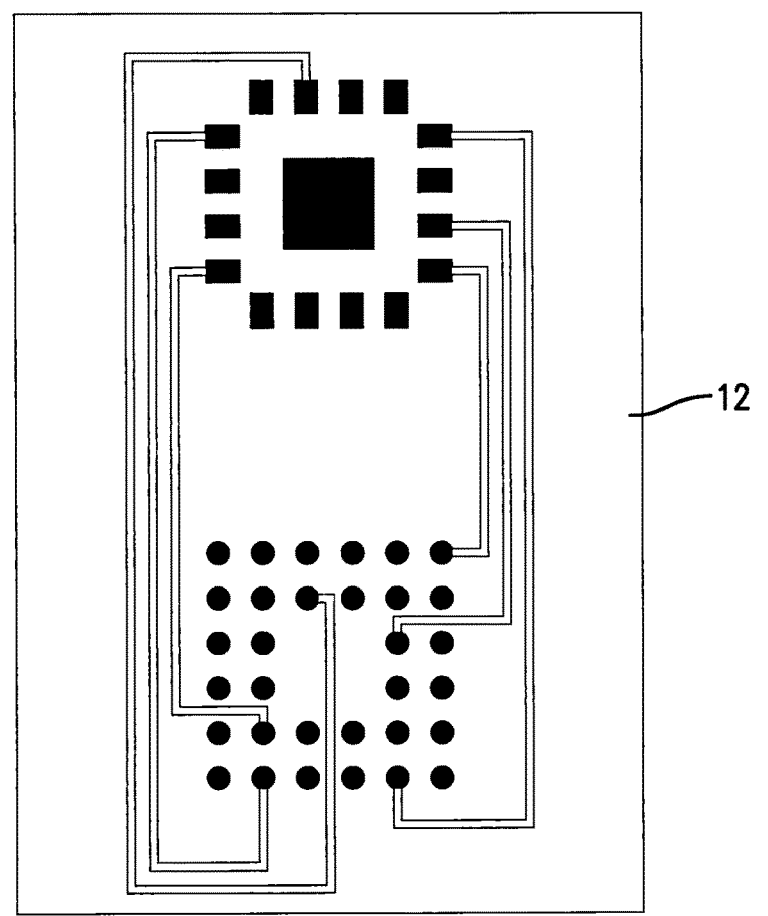
FIG. 2A is a top view of the printed circuit board by itself.
Figure 2B:
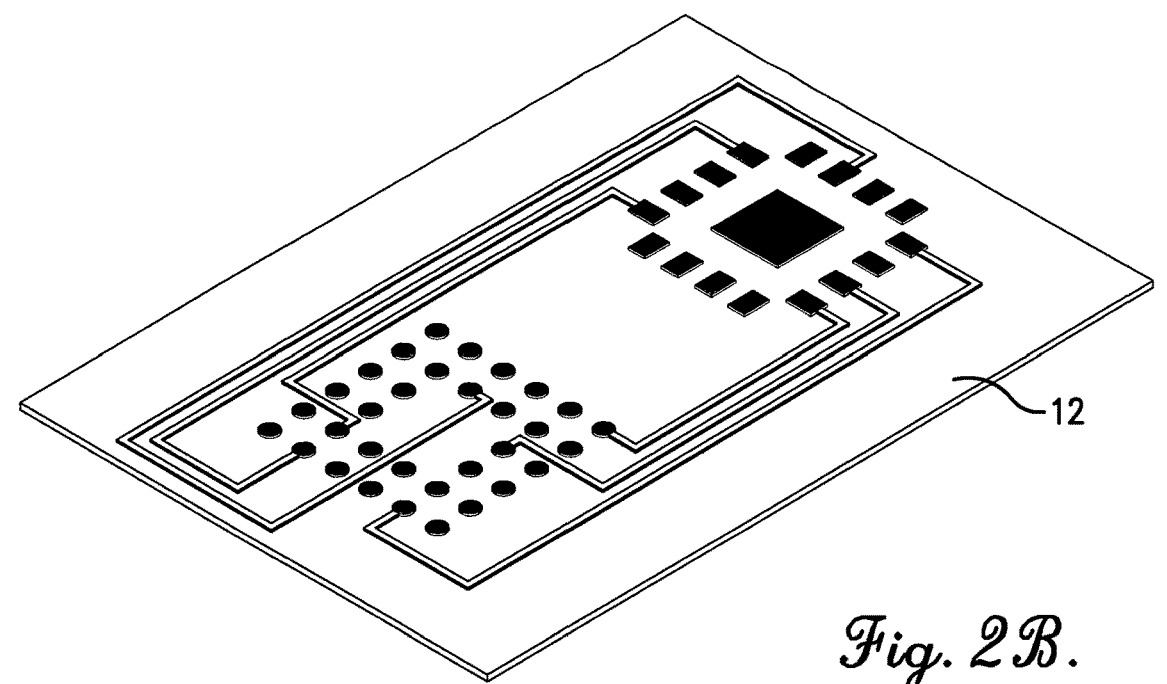
FIG. 2B is an upper perspective view of the printed circuit board by itself.

Referring to FIGS. 1A and 1B, a plurality of blank packages 10, constructed in accordance with various embodiments of the current invention, is shown. The blank packages 10 are transparent and provide for visual inspection of a printed circuit board (PCB) 12 to which the blank packages 10 are connected. Each blank package 10 includes no electric circuitry and performs no computational or logical operation. The purpose and/or function of the blank package 10 is to mimic the electrodes or electrical connectivity architecture of a functional integrated circuit or discrete electronic component package.

Referring to FIGS. 1A, 1B, 2A, and 2B, the PCB 12, or printed wiring board, may be of generally known construction with a first side and an opposing second side. The PCB 12 may also include multiple electrically conductive layers with a top conductive layer placed on the first side, a bottom conductive layer placed on the second side, one or more inner conductive layers positioned between the first and second sides, and an insulating layer between each pair of adjacent conductive layers. The insulating layers, which in combination form a substrate, may be formed from rigidized material that includes various combinations of fiberglass, woven glass, matte glass, cotton paper, phenolic cotton paper, polyester, epoxies, epoxy resins, and the like. Alternatively, the insulating layers may be formed from a flexible polymer thin film material. Each conductive layer may include one or more conductive electronic signal traces, electric power or ground traces, one or more signal, power, or ground lands, full or partial power planes, or full or partial ground planes. The conductive layers may be formed from metals typically including copper, but also including nickel, aluminum, gold, silver, palladium, zinc, tin, lead, and the like. In addition, the PCB 12 may include plated through hole vias, blind vias, buried vias, and the like.

The exemplary embodiment of the PCB 12 shown in the figures includes a first package footprint and a second package footprint. The first package footprint includes the land (or pad) placement for a quad flat no lead (QFN) component package, and the second package footprint includes the land placement for a ball grid array (BGA) component package. In addition, the PCB 12 includes a plurality of conductive traces, each of which electrically connect one land of the first package footprint to one land of the second package footprint. The PCB 12 may also include land for discrete components in packages such as 805, 603, etc. Furthermore, the PCB 12 may include other surface or through-hole package footprints.

Referring to FIGS. 1A, 1B, 3A, 3B, 4A, 4B, and 4C, the blank package 10 broadly comprises a body 14 and a plurality of conductive pads 16. The body 14 is formed from generally transparent, or translucent, electrically insulating material including various types of glass, such as silicate glass or borosilicate glass. The body 14 is transmissive to light in the visible spectrum, i.e., ranging from approximately 400 nanometers (nm) to approximately 700 nm— meaning that visible light passes through the body 14. Preferably, the material of the body 14 is capable of withstanding high temperature. The body 14 is typically solid with a box structure having a top surface, a bottom surface, and a plurality of side surfaces. Generally, the bottom surface of the body 14 has a shape and dimensions that are the same as, or similar to, a bottom surface of the electronic component package that the blank package 10 is created to mimic or imitate. However, the body 14 may be configured to mimic or imitate nearly any geometry. Exemplary embodiments of the body 14 are approximately 1.1 millimeters (mm) thick.

The conductive pads 16 are positioned on the bottom surface of the body 14 and/or extend outward from one or more side surfaces of the body 14. Each conductive pad 16 corresponds to a successive one of the conductive pads of the electronic component package. Each conductive pad 16 also has a size, a shape, and a location which is the same as, or similar to, a size, a shape, and a location, respectively, of a corresponding conductive pad or electrode on the electronic component package that the blank package 10 is mimicking or imitating.

Each conductive pad 16 is formed from electrically conductive material such as metals and/or metal alloys. In some embodiments, the conductive pad 16 may be formed from a plurality of layers of metals and/or metal alloys, wherein a lowest layer may be formed from a metal or metal alloy that enhances adhesion with the body 14. In some embodiments, the conductive pad 16 may be formed from a stack of metals including titanium (in contact with the body 14), nickel, and gold. These metals render the conductive pad 16 to be solderable, to withstand the high temperatures of a solder reflow process, and to withstand the caustic chemical solutions of the cleaning process. In other embodiments, the conductive pad 16 may be formed from a stack of metals including titanium (in contact with the body 14), aluminum, titanium, nickel, and gold. This stack of metals provides the additional feature of the conductive pad 16 to include electrically conductive traces.

Figure 3A:
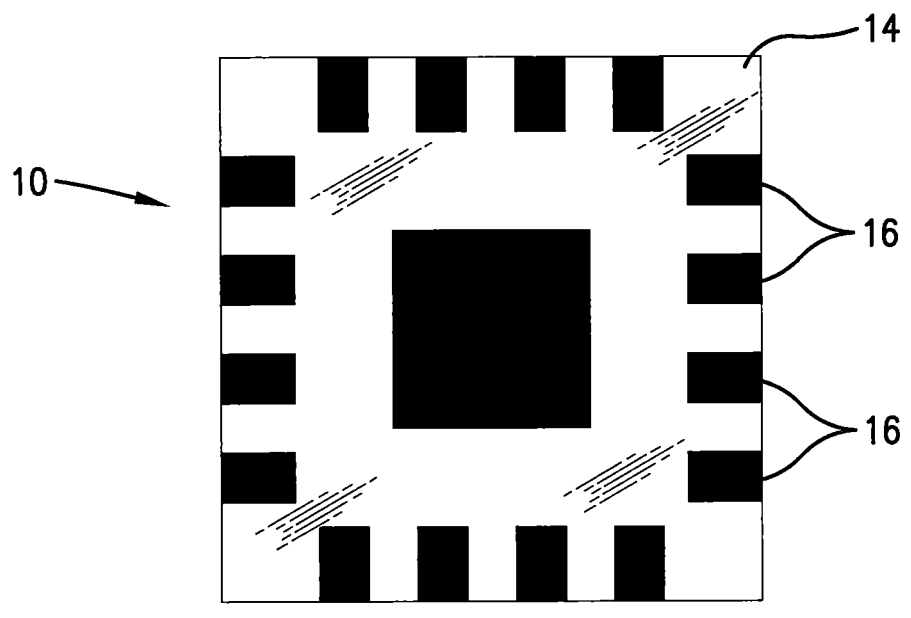
FIG. 3A is a top view of one embodiment of the blank package.
Figure 3B:
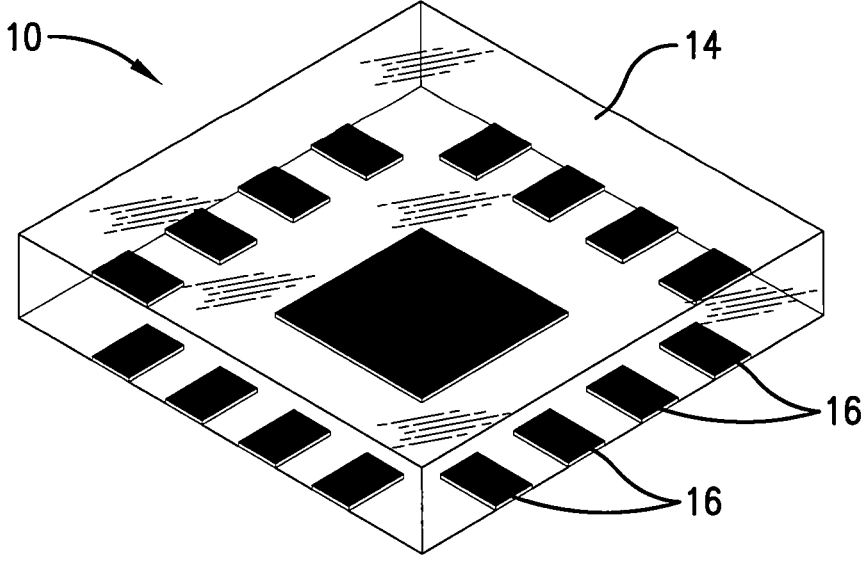
FIG. 3B is an upper perspective view of the blank package.
Figure 4A:
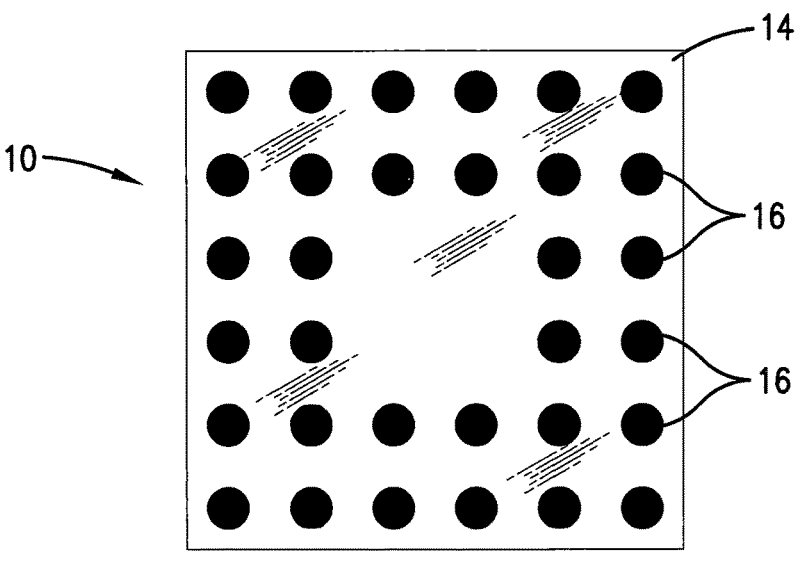
FIG. 4A is a top view of another embodiment of the blank package.
Figure 4B:
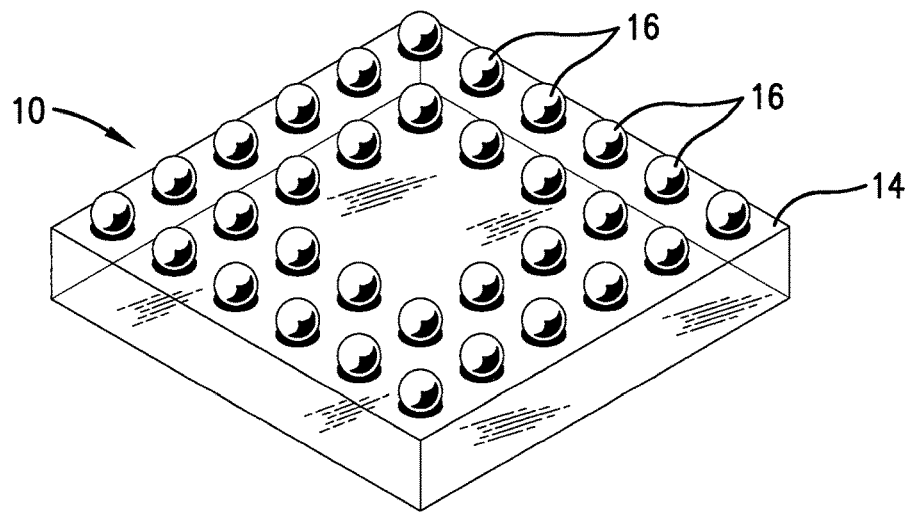
FIG. 4B is an upper perspective view of the blank package.
Figure 4C:
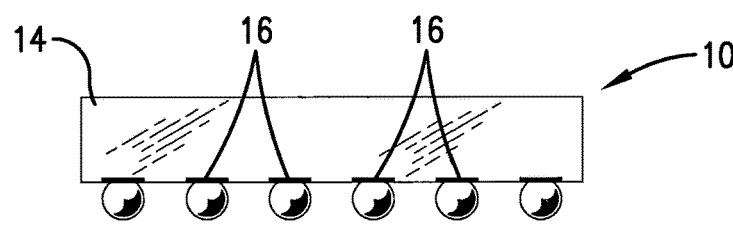
FIG. 4C is a side view of the blank package.
Figure 5A:
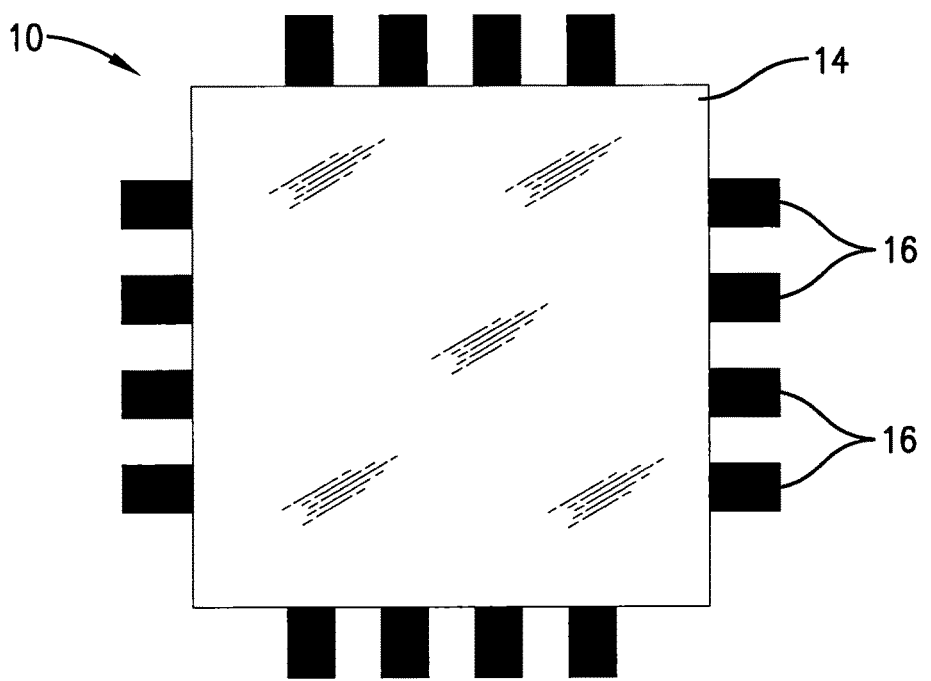
FIG. 5A is a top view of another embodiment of the blank package which includes leads.
Figure 5B:
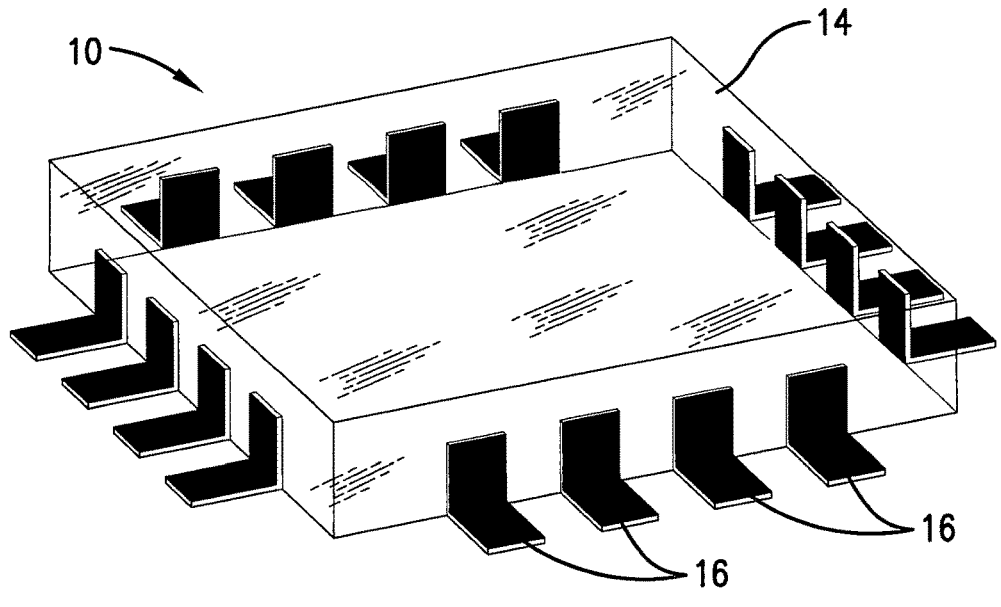
FIG. 5B is an upper perspective view of the blank package which includes leads.

Exemplary blank packages 10 include a QFN package shown in FIGS. 3A and 3B, a BGA package with solder balls attached shown in FIGS. 4A, 4B, and 4C, and a quad flat package (QFP) shown in FIGS. 5A and 5B. Generally, the blank package 10 may be configured to mimic or imitate nearly surface mount technology package wherein pads or leads are positioned on the bottom surface of the package or leads extend outward from one or more side surfaces of the package. In addition, the blank package 10 may be configured to mimic or imitate and discrete component packages such as 805, 603, and the like. It is also possible that the blank package 10 may be configured to mimic or imitate through-hole packages.

Figure 6A:
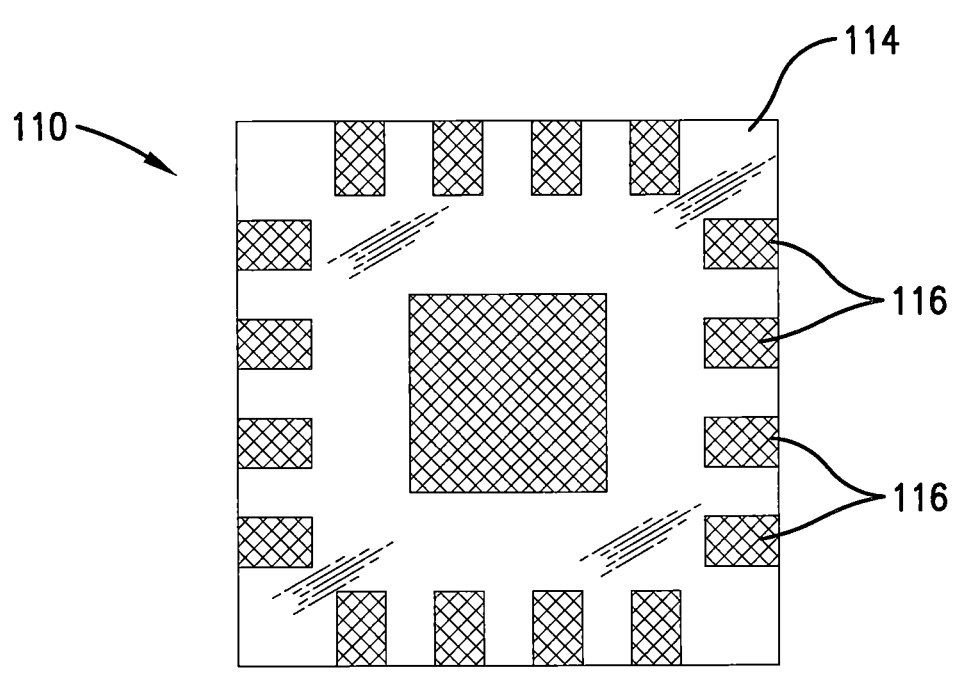
FIG. 6A is a top view of another embodiment of the blank package which includes conductive pads that have a hatch pattern.
Figure 6B:
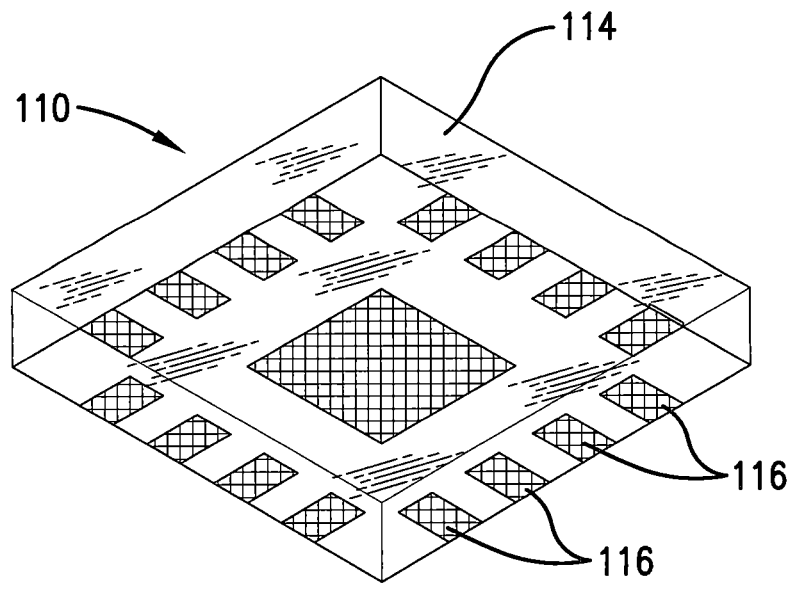
FIG. 6B is an upper perspective view of the blank package which includes conductive pads that have a hatch pattern.

Referring to FIGS. 6A and 6B, other embodiments of the blank package 110 include a body 114 and a plurality of conductive pads 116. The body 114 is the same as, or substantially similar to, the body 14. The conductive pads 116 have the same, or substantially similar, size, shape, and position as the conductive pads 116. The primary difference between the conductive pads 116 and the conductive pads 16 is that at least a portion of the conductive pads 116 have a hatch pattern in the one or more layers of metal that form the conductive pad 116. That is, some conductive pads 116 include a plurality of narrow lanes or channels that extend across the conductive pad 116 fully along one or more dimensions in which the metal is absent. The lanes are parallel and spaced apart from one another. The lanes may be configured to extend in one direction only or extend in two directions such that each lane crosses one or more other lanes in a grid fashion. The lanes allow for control of the direction in which cleaning solutions, along with residual solder, solder paste, and flux, flow between the blank package 110 and the PCB 12. The lanes may be created by etching, machining, laser cutting, or the like.

Figure 7A:
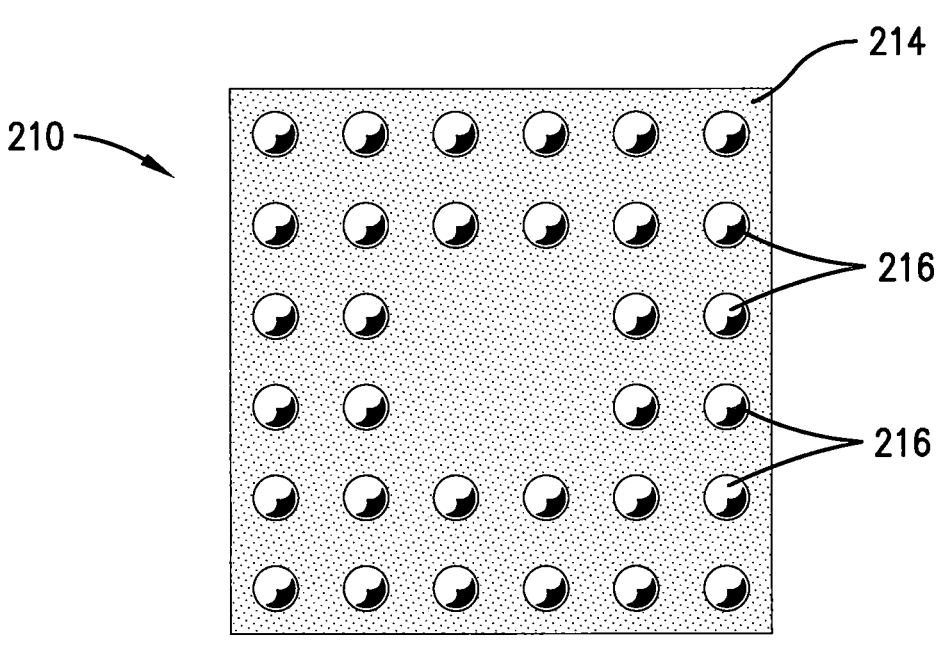
FIG. 7A is a top view of another embodiment of the blank package which includes a bottom surface that has a rough finish.
Figure 7B:
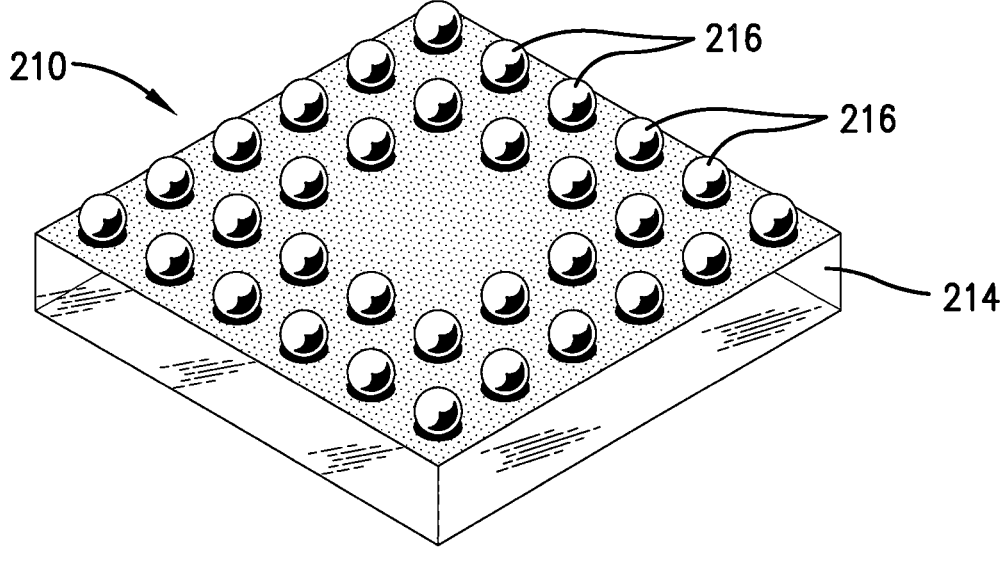
FIG. 7B is an upper perspective view of the blank package which includes a bottom surface that has a rough finish.

Referring to FIGS. 7A and 7B, still other embodiments of the blank package 210 include a body 214 and a plurality of conductive pads 216. The conductive pads 216 are the same as, or substantially similar to, the conductive pads 16. The body 214 is similar to the body 14, except that the bottom surface is not smooth. The bottom surface has a rough or coarse finish that gives it a diffuse, frosted, or somewhat opaque appearance. The bottom surface may be etched, machined, laser treated, or the like to create the rough finish before the conductive pads 216 are formed thereon. The rough finish of the bottom surface gives the bottom surface a diffuse appearance when the blank package 210 is soldered to the PCB 12 cleanly and there is no residue from cleaning solutions, solder, solder paste, or flux in contact with the bottom surface. However, any residue in contact with the bottom surface changes the index of refraction of the bottom surface in those areas where residual contact is made so that those areas are more transparent, or at least visibly different from the areas where nothing is in contact with the bottom surface.

In usage, at least one extra PCB 12 is fabricated for a standard production run. The PCB 12 may have nearly any intended usage or application such as in an appliance, a TV, a computer, an automotive control system, a smartphone, or the like. Ideally, one blank package 10, 110, or 210 is created for each functional package on the PCB 12. Alternatively, one blank package 10, 110, or 210 is created for at least a portion of the functional packages on the PCB 12. The blank packages 10, 110, or 210 are placed on one of the PCBs 12, and the PCB 12 with the blank packages 10, 110, or 210 undergoes the same electrical connection process using solder and flux as the functional PCBs do. Afterward, the PCB 12 with the blank packages 10, 110, or 210 undergoes the same cleaning process as the functional PCBs do. The PCB 12 with the blank packages 10, 110, or 210 may be visually inspected after the electrical connection (solder reflow) process, the cleaning process, or both.

Using visibly transparent blank packages 10, 110, or 210 in place of functional integrated circuit packages, such as QFN and BGA packages, it is possible to see to the solder connections in a way that is otherwise impossible. So the solder reflow process results can be inspected. In addition, the results of the cleaning process can be examined. It can be determined whether residue of both processes is being removed from the space between the bottom of the blank package 10 and the top surface of the PCB 12. Furthermore, the inspection process may be executed using an automated optical inspection system. Using artificial intelligence, the automated optical inspection system may be trained to identify blank packages 10, 110, or 210 under which there is residue or contamination. If the blank packages 210 are used on the PCB 12, the diffuse bottom surface of the blank package 210 provides a greater visible difference between residue being present and residue being absent, which may result in lower resolution imaging being used with the automated optical inspection system.

FIG. 8 depicts a listing of at least a portion of the steps of an exemplary method 100 of forming a blank package 10, 110, or 210 that mimics an electronic component package for providing visual inspection of a PCB 12. The steps may be performed in the order shown in FIG. 8, or they may be performed in a different order. Furthermore, some steps may be performed concurrently as opposed to sequentially. In addition, some steps may be optional or may not be performed.

Referring to step 101, functional electronic component package specifications are received, including body dimensions and conductive pad sizes, shapes, and locations. The functional electronic component package may include nearly any type of integrated circuit or discrete component package wherein pads or leads are positioned on the bottom surface of the package or leads extend outward from one or more side surfaces of the package, such as ball grid arrays, quad flat leaded or no leads, leaded or leadless chip carriers, and so forth. In some instances, simply a package identification number may be received and the specifications regarding the body and the pads may be retrieved from a database of integrated circuit package specifications. In other instances, the specifications regarding the body and the pads may be received from a manufacturer or other source. In still other instances, the dimensions, sizes, and locations of a specific package may be measured and recorded.

Referring to step 102, a body 14, 114, or 214 of the blank package 10, 110, 210 is formed from transparent electrically insulating material, wherein the body 14, 114, or 214 includes a bottom surface with the same, or similar, dimensions as a bottom surface of the functional component package. The body 14, 114, or 214 may be formed from various types of glass, such as silicate glass or borosilicate glass. The body 14, 114, or 214 is transmissive to light in the visible spectrum, i.e., ranging from approximately 400 nanometers (nm) to approximately 700 nm—meaning that visible light passes through the body 14, 114, or 214. Preferably, the material of the body 14, 114, or 214 is capable of withstanding high temperature. The body 14, 114, or 214 is typically solid with a box structure having a top surface, a bottom surface, and four side surfaces. However, the body 14, 114, or 214 may be configured to mimic or imitate nearly any geometry.

In some embodiments, the bottom surface of the body 214 is additionally processed to have a rough or coarse finish that gives it a diffuse, frosted, or somewhat opaque appearance. The bottom surface may be etched, machined, or laser treated to create the rough finish.

In addition, a plurality of bodies 14, 114, or 214 may be formed from a single block of glass material.

Referring to step 103, a plurality of conductive pads 16, 116, or 216 is formed on the bottom surface of the body 14, 114, or 214. The conductive pads 16, 116, or 216 are positioned on the bottom surface of the body 14, 114, or 214 and/or extend outward from one or more side surfaces of the body 14, 114, or 214. Each conductive pad 16, 116, or 216 corresponds to a successive one of the conductive pads of the electronic component package. Each conductive pad 16, 116, or 216 also has a size, a shape, and a location which is the same as, or similar to, a size, a shape, and a location, respectively, of a corresponding conductive pad or electrode on the electronic component package that the blank package 10, 110, or 210 is mimicking or imitating.

Each conductive pad 16, 116, or 216 may be formed by using physical vapor deposition, electroplating, or a combination thereof. Each conductive pad 16, 116, or 216 may include a plurality of layers, including a first layer which contacts the bottom surface of the body 14, 114, or 214 and is formed from a metal or metal alloy that adheres well to glass-type materials.

In exemplary embodiments, the conductive pads 16, 116, or 216 may be formed using the following process. Using physical vapor deposition techniques, such as sputtering, a layer of titanium, approximately 100 nanometers (nm) thick, may be deposited on the bottom surface of the body 14, 114, or 214. A layer of nickel, approximately 500 nm thick, may be deposited on the layer of titanium, and a layer of gold, approximately 400 nm thick, may be deposited on the layer of nickel. Using photopatterning and etching techniques, a portion of the layers of metals may be removed in order to form the conductive pads 16, 116, or 216.

In some embodiments, at least a portion of the conductive pads 116 are additionally processed to create a hatch pattern in the metal layer(s). Some conductive pads 116 include a plurality of narrow lanes or channels that extend across the conductive pad 116 fully along one or more dimensions in which the metal is absent. The lanes are parallel and spaced apart from one another. The lanes may be configured to extend in one direction only or extend in two directions such that each lane crosses one or more other lanes in a grid fashion. The lanes allow for control of the direction in which cleaning solutions, along with residual solder, solder paste, and flux, flow between the blank package 110 and the PCB 12. The lanes may be created by etching, machining, laser cutting, or the like.

In addition, the conductive pads 16, 116, or 216 for a plurality of blank packages 10, 110, or 210 may be formed on the same block of glass material using the techniques mentioned above. The block of glass may then be cut to form the individual blank packages 10, 110, or 210.

Referring to FIGS. 9A, 9B, 10A, 10B, 11A, and 11B, a transparent printed circuit board (PCB) 312, constructed in accordance with various embodiments of the current invention, for mimicking an actual printed circuit board is shown. The transparent PCB 312 broadly comprises a body 314, a plurality of package footprints 318 and a plurality of conductive traces 320. The body 314 is formed from rigid, generally transparent, or translucent, electrically insulating material including various types of glass, such as silicate glass or borosilicate glass. The body 314 typically has a quadrilateral shape with a top surface, a bottom surface, and four edges. The body 314 also generally has a thickness that is small compared with the area of the top and bottom surfaces.

Each package footprint 318 includes the land (or pad) placement for a package 310. Thus, each package footprint 318 includes a plurality of lands (pads) with a quadrilateral or circular shape arranged in nearly any type of configuration such as flat packages, ball grid arrays, leaded chip carriers, leadless chip carriers, as well as through-hole packages such as pin grid arrays and in line packages, and the like. The lands are configured to receive the conductive pads of the package 310.

The package 310 may be an actual functional electronic component package, such as for a microprocessor, etc., or may be a blank package, such as the blank package 10, the blank package 110, or the blank package 210. Thus, the package 310 includes a plurality of conductive pads positioned on the bottom surface of the package 310 and/or extend outward from one or more side surfaces of the package 310. Exemplary packages 310 shown in FIGS. 10A, 10B, 11A, and 11B are functional integrated circuit packages.

The conductive traces 320 may carry or convey electronic signals or may provide electrical power (i.e., electric voltage and electric current) and electrical ground. The conductive traces 320 may electrically connect one or more lands on one package footprint 318 to one or more lands on one or more other package footprints 318 or to components or devices off of the transparent PCB 312. Thus, the transparent PCB 312 may further include a plurality of conductive terminals (not shown in the figures). The conductive terminals may be positioned at one or more edges of the body 314 to accommodate and connect to edge connectors or at other locations on the body 314 to accommodate and connect to other connectors such as headers, jumpers, ribbon connectors, sockets, and the like.

The package footprints 318, including the lands, and the conductive traces 320 are formed from electrically conductive material such as metals and/or metal alloys. In some embodiments, the package footprints 318 and the conductive traces 320 may be formed from a plurality of layers of metals and/or metal alloys. For example, the package footprints 318 may be formed from a stack of metals including titanium (in contact with the body 314), nickel, and gold, and the conductive traces 320 may be formed from a stack of metals including titanium (in contact with the body 314), aluminum, titanium, nickel, and gold.

The package footprints 318, the conductive traces 320, and the conductive terminals may be positioned on the top surface, the bottom surface, or both surfaces. The transparent PCB 312 may further include a plurality of through-hole plated vias (not shown in the figures) which electrically connect one or more conductive traces 320 on one surface to one or more conductive traces 320 on the opposing surface.

The transparent PCB 312 is typically created to mimic an actual functional printed circuit board, or at least a portion of an actual function printed circuit board. Thus, the transparent PCB 312 may include the same, or similar, placement of package footprints 318 and the same, or similar, routing of the conductive traces 320 as the actual functional printed circuit board. The transparent PCB 312 may be populated with blank packages 10, 110, or 210 or with functional electronic component packages in order to observe the results of the solder process and the cleaning process. Contamination and residue can be viewed by looking through the transparent PCB 312 or through blank packages 10, 110, or 210, if they are utilized.

It is also possible that, if functional electronic component packages are used for the packages 310, then the transparent PCB 312 may be electrically connected to an electric voltage source and the electronic circuitry included in the packages may be activated. Thus, it may also be possible to determine a relationship between a performance of the circuitry and a level of cleanliness (or contamination) of the solder connections on the transparent PCB 312.

FIG. 12 depicts a listing of at least a portion of the steps of an exemplary method 200 of forming a transparent printed circuit board 312 to mimic an actual printed circuit board. The steps may be performed in the order shown in FIG. 12, or they may be performed in a different order. Furthermore, some steps may be performed concurrently as opposed to sequentially. In addition, some steps may be optional or may not be performed.

Referring to step 201, data is received regarding at least a portion of a placement of package footprints and routing of conductive traces for the actual printed circuit board. In some embodiments, the entire actual printed circuit board may be replicated. In other embodiments, only a portion of the printed circuit board may be replicated for inspecting the results of the solder and cleaning processes.

Referring to step 202, a body 314 of the transparent printed circuit board 312 is formed from rigid, generally transparent electrically insulating material. The body 314 typically has a quadrilateral shape with a top surface, a bottom surface, and four edges. The body 314 also generally has a thickness that is small compared with the area of the top and bottom surfaces. The body 314 is formed from various types of glass, such as silicate glass or borosilicate glass.

Referring to step 203, a plurality of package footprints 318 is formed on the body 314 corresponding to the package footprints of the actual printed circuit board. Each package footprint 318 includes the land (or pad) placement for a package 310. Thus, each package footprint 318 includes a plurality of lands (pads) with a quadrilateral or circular shape arranged in nearly any type of configuration such as flat packages, ball grid arrays, leaded chip carriers, leadless chip carriers, as well as through-hole packages such as pin grid arrays and in line packages, and the like. The lands are configured to receive the conductive pads of the package 310.

The package footprints 318, including the lands, are formed from electrically conductive material such as metals and/or metal alloys. In some embodiments, the package footprints 318 may be formed from a plurality of layers of metals and/or metal alloys. For example, the package footprints 318 may be formed from a stack of metals including titanium (in contact with the body 314), nickel, and gold.

In exemplary embodiments, the conductive footprints 318 may be formed using the following process. Using physical vapor deposition techniques, such as sputtering, a layer of titanium, approximately 100 nanometers (nm) thick, may be deposited on the bottom surface of the body 314. A layer of nickel, approximately 500 nm thick, may be deposited on the layer of titanium, and a layer of gold, approximately 400 nm thick, may be deposited on the layer of nickel. Using photopatterning and etching techniques, a portion of the layers of metals may be removed in order to form the conductive footprints 318.

Referring to step 204, a plurality of conductive traces 320 is formed on the body 314 corresponding to the conductive traces of the actual printed circuit board. The conductive traces 320 may carry or convey electronic signals or may provide electrical power (i.e., electric voltage and electric current) and electrical ground. The conductive traces 320 may electrically connect one or more lands on one package footprint 318 to one or more lands on one or more other package footprints 318 or to components or devices off of the transparent PCB 312. Thus, the transparent PCB 312 may further include a plurality of conductive terminals (not shown in the figures). The conductive terminals may be positioned at one or more edges of the body 314 to accommodate and connect to edge connectors or at other locations on the body 314 to accommodate and connect to other connectors such as headers, jumpers, ribbon connectors, sockets, and the like.

The conductive traces 320 are formed from electrically conductive material such as metals and/or metal alloys. In some embodiments, the conductive traces 320 may be formed from a plurality of layers of metals and/or metal alloys. For example, the conductive traces 320 may be formed from a stack of metals including titanium (in contact with the body 314), aluminum, titanium, nickel, and gold.

In exemplary embodiments, the conductive traces 320 may be formed using the following process. Using physical vapor deposition techniques, such as sputtering, a layer of titanium, approximately 100 nanometers (nm) thick, may be deposited on the bottom surface of the body 314. A layer of aluminum, approximately 1000 nm thick, may be deposited on the layer of titanium, a layer of titanium, approximately 100 nm thick, may be deposited on the layer of aluminum, a layer of nickel, approximately 500 nm thick, may be deposited on the layer of titanium, and a layer of gold, approximately 375 nm thick, may be deposited on the layer of nickel. Using photopatterning and etching techniques, a portion of the layers of metals may be removed in order to form the conductive traces 320.

In addition, holes may be drilled in the body 314 in order to create through-holes vias to electrically connect one or more conductive traces 320 on one surface to one or more conductive traces 320 on the opposing surface. Holes may also be drilled for through-hole package footprints 318 to accommodate through-hole electronic packages, such as pin grid array. The holes may be drilled using a pulsed laser or electron beam system. As an example, a femtosecond pulsed laser may be used for drilling the holes. After the holes are drilled, the holes may be plated with electrically conductive material using electroplating techniques.

Another embodiment of a blank package 400 is shown in FIGS. 13A, 13B, 13C, and 13D. The blank package 400 may be utilized to imitate an electronic component package in fabrication processes that have a lower temperature and/or less harsh cleaning environment. The blank package 400 includes a body 402, a plurality of conductive pads 404, and a plurality of adhesive pads 406. The body 402 is generally transparent and may be the same as, or similar to, the body 14, described above.

Each conductive pad 404 corresponds to a successive one of the conductive pads of the electronic component package. Each conductive pad 404 also has a size, a shape, and a location which is the same as, or similar to, a size, a shape, and a location, respectively, of a corresponding conductive pad or electrode on the electronic component package that the blank package 400 is mimicking or imitating.

Each conductive pad 404 is formed from electrically conductive material such as metals and/or metal alloys. Exemplary metals to form the conductive pad 404 may include copper and the like.

Each adhesive pad 406 generally adheres a successive one of the conductive pads 404 to one or more surfaces of the body 402. The adhesive pads 406 may be formed from one or more resins or preimpregnated (prepreg) fibers with an epoxy, phenolic resin, Teflon, or the like. Each adhesive pad 406 may be positioned on the surface of the body 402 in a location corresponding to a location of one of the conductive pads on the electronic component package that the blank package 400 is mimicking or imitating. Thus, an associated conductive pad 404 is positioned on each adhesive pad 406.

The exemplary blank package 400 shown in FIGS. 13A, 13B, 13C, and 13D mimics or imitates a QFN-type electronic package. Referring to FIG. 13D, the blank package 400 is soldered to a printed circuit board, such as PCB 12.

Utilizing an adhesive to attach conductive pads to the body of the blank package 400 may provide a cost-effective structure for mimicking or imitating an electronic component package.

FIG. 13E depicts a listing of at least a portion of the steps of an exemplary method 500 of forming a blank package 400 that mimics an electronic component package. The steps may be performed in the order shown in FIG. 13E, or they may be performed in a different order. Furthermore, some steps may be performed concurrently as opposed to sequentially. In addition, some steps may be optional or may not be performed.

Referring to step 501, functional electronic component package specifications are received, including body dimensions and conductive pad sizes, shapes, and locations. The functional electronic component package may include nearly any type of integrated circuit or discrete component package wherein pads or leads are positioned on the bottom surface of the package or leads extend outward from one or more side surfaces of the package, such as ball grid arrays, quad flat leaded or no leads, leaded or leadless chip carriers, and so forth. In some instances, simply a package identification number may be received and the specifications regarding the body and the pads may be retrieved from a database of integrated circuit package specifications. In other instances, the specifications regarding the body and the pads may be received from a manufacturer or other source. In still other instances, the dimensions, sizes, and locations of a specific package may be measured and recorded.

Referring to step 502, a body 402 of the blank package 400 is formed from transparent electrically insulating material, wherein the body 402 includes a bottom surface with the same, or similar, dimensions as a bottom surface of the functional component package. The body 402 may be formed from various types of glass, such as lead glass, aluminosilicate glass, high silica glass, fused silica glass, silicate glass, or borosilicate glass. The body 402 is transmissive to light in the visible spectrum, i.e., ranging from approximately 400 nanometers (nm) to approximately 700 nm—meaning that visible light passes through the body 402. Preferably, the material of the body 402 is capable of withstanding high temperature. The body 402 is typically solid with a box structure having a top surface, a bottom surface, and four side surfaces. However, the body 402 may be configured to mimic or imitate nearly any geometry. The body 402 may be formed from a large block of transparent electrically insulating material that is ultimately cut or diced to form a plurality of bodies 402.

Step 502 may further include cleaning and degreasing the body 402, or the block of transparent electrically insulating material. In addition, the body 402, or block, may undergo a plasma desmear process in which oxygen plasma or gas is applied to the surfaces of the body 402 to remove organic material and activate the surfaces so that the surfaces are more susceptible to bonding with other material or objects in subsequent steps.

Referring to step 503, a plurality of adhesive pads 406 are formed on a lower surface of the body 402. The adhesive pads 406 may be formed from one or more resins or preimpregnated (prepreg) fibers with an epoxy, phenolic resin, Teflon, or the like. The adhesive pads 406 are deposited directly onto the body 402 in the locations of the conductive pad or electrode on the electronic component package that the blank package 400 is mimicking or imitating. The adhesive pads 406 may be deposited using stencil, screen, or jet printing methods.

Referring to step 504, a plurality of conductive pads 404 are formed from a lead frame. The lead frame may be formed from a sheet of metal and/or metal alloys, such as copper, tin, and the like, which is cut, stamped, or etched to form each of the conductive pads 404 in the proper relative location, along with a frame or panel to hold the pads 404 together.

Referring to step 505, a laminate stack is formed which includes the body 402 with the adhesive pads 406 positioned thereon and the conductive pads 404 (formed by the lead frame). The body 402 may be positioned with the adhesive pads 406 facing upward. The conductive pads 404 may be placed so that each conductive pad 404 is positioned on top of, and in contact with, its associated adhesive pad 406. Pressure and heat may be applied to each conductive pad 404 in order to cure the adhesive pads 406 and bond the conductive pads 404 to the body 402. After curing the conductive pads 404 on the lead frame are bent to shape, if necessary, and cut to the proper length.

Another embodiment of the blank package 600A, 600B, 600C is shown in FIGS. 14A, 14B, 14C, 14D, 14E, and 14F. The blank package 600A, 600B, 600C may be utilized to mimic or imitate passive surface mount devices, such as resistors, inductors, and capacitors, with sizes such as 0805 packages, 0603 packages, and the like. The blank package 600A, 600B, 600C includes a body 602 and a plurality of conductive pads 604. The body 602 is generally transparent or translucent and formed from electrically insulating material including various types of glass, such as lead glass, aluminosilicate glass, high silica glass, fused silica glass, silicate glass, or borosilicate glass—similar in fashion to the body 14. The body 602 is typically solid with a box structure having a top surface, a bottom surface, two opposing side surfaces, and two opposing end surfaces.

Each conductive pad 604 is formed from electrically conductive material such as metals and/or metal alloys. In some embodiments, the conductive pad 604 may be formed from a plurality of layers of metals and/or metal alloys, wherein a lowest layer may be formed from a metal or metal alloy that enhances adhesion with the body 602. In some embodiments, the conductive pad 604 may be formed from a stack of metals including titanium (in contact with the body 602), nickel, and gold. The conductive pads 604 include a first conductive pad 604A having the same dimensions as, positioned on, and in contact with, a first end surface and a second conductive pad 604B having the same dimensions as, positioned on, and in contact with, a second end surface.

With the blank package 600A shown in FIG. 14A, each conductive pad 604 is one-sided, meaning that each conductive pad 604 includes a first side which contacts its associated end surface only. With the blank package 600B shown in FIG. 14B, each conductive pad 604 is three-sided, meaning that each conductive pad 604 includes a first side which contacts its associated end surface, a second side which contacts a portion of the top surface, and a third side which contacts a portion of the bottom surface. With the blank package 600C shown in FIG. 14C, each conductive pad 604 is five-sided, meaning that each conductive pad 604 includes a first side which contacts its associated end surface, a second side which contacts a portion of the top surface, a third side which contacts a portion of the bottom surface, a fourth side which contacts a portion of a first side surface, and a fifth side which contacts a portion of a second side surface.

Referring to FIG. 14D, a printed circuit board 612 is shown which includes package footprints for each embodiment of the blank package 600A, 600B, 600C. Each package footprint includes a first pad or land for the first conductive pad 604A and a second pad or land for the second conductive pad 604B. Referring to FIG. 14E, each of the three embodiments of the blank package 600A, 600B, 600C is soldered to the respective package footprints. Referring to FIG. 14F, a side view of the blank package 600C is shown, with the blank package 600 soldered to the printed circuit board 612.

FIG. 14G depicts a listing of at least a portion of the steps of an exemplary method 700 of forming a blank package 600A, 600B, 600C that mimics an electronic component package. The steps may be performed in the order shown in FIG. 14G, or they may be performed in a different order. Furthermore, some steps may be performed concurrently as opposed to sequentially. In addition, some steps may be optional or may not be performed.

Referring to step 701, functional electronic component package specifications are received, including body dimensions and conductive pad sizes, shapes, and locations.

Referring to step 702, a body 602 of the blank package 600A, 600B, 600C is formed from transparent electrically insulating material, wherein the body 602 has the same, or approximately the same, dimensions as the functional electronic component package that it is to mimic or imitate. The body 602 may be formed from various types of glass, such as lead glass, aluminosilicate glass, high silica glass, fused silica glass, silicate glass, or borosilicate glass. The body 602 is transmissive to light in the visible spectrum. Preferably, the material of the body 602 is capable of withstanding high temperature. The body 602 is typically solid with an elongated box structure having a top surface, a bottom surface, a first end surface, a second end surface, a first side surface, and a second side surface.

Step 702 may further include cleaning and degreasing the body 602. In addition, the body 602 may undergo a plasma desmear process in which oxygen plasma or gas is applied to the surfaces of the body 602 to remove organic material and activate the surfaces so that the surfaces are more susceptible to bonding with other material or objects in subsequent steps.

Referring to step 703, a first conductive pad 604A is formed on the first end surface of the body 602, and a second conductive pad 604B is formed on the second end surface of the body 602. Forming the conductive pads 604 may include performing a plurality of sub steps including forming a seed layer of electrically conductive material. The seed layer is positioned in contact with, or formed on, the end surfaces of the body 602 and may include metals and/or metal alloys, such as titanium, copper, nickel, silver, gold, and the like. Typically, the seed layer is a thin film. The seed layer may be formed on the end surfaces of the body 602 by utilizing electroless plating, dipping, or immersion processes. Alternatively, the seed layer is formed on the end surfaces of the body 602 by utilizing physical vapor deposition (PVD) techniques or chemical vapor deposition (CVD) techniques. PVD techniques include electron beam evaporation, ion assisted deposition, thermal evaporation, magnetron sputtering, ion beam sputtering, and pulsed laser deposition. CVD techniques include atmospheric pressure CVD, low pressure CVD, ultrahigh vacuum CVD, atomic layer reposition, and plasma enhanced CVD. The sub steps further include applying an additional layer of metals and/or metal alloys on top of the seed layer to increase the thickness of the conductive pads 604. The additional layer of metals and/or metal alloys may be applied using electrolytic plating techniques.

Step 703 may further include forming the first conductive pad 604A on the first end surface, a first portion of the top surface, and a first portion of the bottom surface of the body 602. In addition, step 703 may further include forming the second conductive pad 604B on the second end surface, a second portion of the top surface, and a second portion of the bottom surface of the body 602.

Step 703 may also include forming the first conductive pad 604A on the first end surface, the first portion of the top surface, the first portion of the bottom surface, a first portion of the first side surface, and a first portion of the second side surface of the body 602. In addition, step 703 may also include forming the second conductive pad 604B on the second end surface, the second portion of the top surface, the second portion of the bottom surface, a second portion of the first side surface, and a second portion of the second side surface of the body 602.

Another embodiment of a blank package 800A is shown in FIGS. 15A-15C. An embodiment of a blank package 800B is shown in FIGS. 16A-16C. An embodiment of a blank package 800C is shown in FIGS. 17A-17C. The blank package 800A, 800B, 800C may be utilized to mimic or imitate electronic component packages that include a plurality of leads, wherein the leads are attached to a bottom surface of the package, a top surface of the package, or side surfaces of the package. The blank package 800A, 800B, 800C includes a body 802, a plurality of conductive pads 804, a plurality of solder pads 806, and a plurality of leads 808. The body 802 is generally transparent and may be the same as, or similar to, the body 14, described above.

Each conductive pad 804 is formed from electrically conductive material such as metals and/or metal alloys. In some embodiments, the conductive pad 804 may be formed from a plurality of layers of metals and/or metal alloys, wherein a lowest layer may be formed from a metal or metal alloy that enhances adhesion with the body 802. In some embodiments, the conductive pad 804 may be formed from a stack of metals including titanium (in contact with the body 802), nickel, and gold. Each conductive pad 804 is positioned on the body 802 in a location where a successive one of the leads 808 is attached. In the exemplary embodiment of the blank package 800A shown in FIGS. 15A, 15B, and 15C, the leads 808 are spaced apart from one another and attached to a bottom surface of the body 802. Thus, the conductive pads 804 are spaced apart from one another and positioned on the bottom surface of the body 802. In the exemplary embodiment of the blank package 800B shown in FIGS. 16A, 16B, and 16C, the leads 808 are spaced apart from one another and attached to a top surface of the body 802. Thus, the conductive pads 804 are spaced apart from one another and positioned on the top surface of the body 802. In the exemplary embodiment of the blank package 800C shown in FIGS. 17A, 17B, and 17C, the leads 808 are spaced apart from one another and attached to each of the four side surfaces of the body 802. Thus, the conductive pads 804 are spaced apart from one another and positioned on each of the four side surfaces of the body 802.

Each solder pad 806 is positioned on, in contact with, and/or connected to, a successive one of the conductive pads 804 and attaches each conductive pad 804 to a successive one of the leads 808. The solder pad 806 may be formed from tin-lead alloy solder or other tin-based alloy solder that includes silver, copper, antimony, or the like that melts at higher temperatures than the printed circuit board level solder which attaches the blank package 800A, 800B, 800C to a printed circuit board, such as the PCB 12. In various embodiments, the solder pad 806 may melt at temperatures greater than or equal to approximately 700 degrees Fahrenheit, whereas the printed circuit board level solder may melt around approximately 360 degrees Fahrenheit.

Each lead 808 is formed from electrically conductive material such as metals and/or metal alloys including copper, tin, and the like, which may be plated with nickel and/or palladium. With blank package 800A and blank package 800B, each lead 808 includes a first end attached to a successive one of the conductive pads 804 through the solder pad 806 and a second end that extends outward and downward from the body 802. With blank package 800C, the first end of each lead 808 is attached to a successive one of the conductive pads 804 through the solder pad 806 and the second end extends downward and outward from the body 802.

The exemplary blank package 800A shown in FIGS. 15A and 15B mimics or imitates a QFP-type electronic package with leads that are attached to a bottom surface of the package. Referring to FIG. 15C, the blank package 800A is soldered to a printed circuit board, such as PCB 12.

The exemplary blank package 800B shown in FIGS. 16A and 16B mimics or imitates a QFP-type electronic package with leads that are attached to a top surface of the package. Referring to FIG. 16C, the blank package 800B is soldered to a printed circuit board, such as PCB 12.

The exemplary blank package 800C shown in FIGS. 17A and 17B mimics or imitates a QFP-type electronic package with leads that are attached to the side surfaces of the package. Referring to FIG. 17C, the blank package 800C is soldered to a printed circuit board, such as PCB 12.

Utilizing a high temperature solder to attach leads to the body of the blank package 800A, 800B, 800C may provide a structure for mimicking or imitating an electronic component package that is very robust and resistant to delamination or becoming disconnected during the printed circuit board soldering and cleaning processes.

FIG. 17D depicts a listing of at least a portion of the steps of an exemplary method 900 of forming a blank package 800A, 800B, 800C that mimics an electronic component package. The steps may be performed in the order shown in FIG. 17D, or they may be performed in a different order. Furthermore, some steps may be performed concurrently as opposed to sequentially. In addition, some steps may be optional or may not be performed.

Referring to step 901, functional electronic component package specifications are received, including body dimensions and lead sizes, shapes, and locations. The leads of the functional electronic component package may be located on a top surface, one or more side surfaces, or the bottom surface.

Referring to step 902, a body 802 of the blank package 800A, 800B, 800C is formed from transparent electrically insulating material, wherein the body 802 includes a bottom surface, four side surfaces, and/or a top surface with the same, or similar, dimensions as a bottom surface, four side surfaces, and/or a top surface, respectively, of the functional component package. The body 802 may be formed from various types of glass, such as lead glass, aluminosilicate glass, high silica glass, fused silica glass, silicate glass, or borosilicate glass. The body 802 is transmissive to light in the visible spectrum. Preferably, the material of the body 802 is capable of withstanding high temperature. The body 802 is typically solid with a box structure having a top surface, a bottom surface, and four side surfaces. The body 802 may be formed from a large block of transparent electrically insulating material that is ultimately cut or diced to form a plurality of bodies 802.

Step 902 may further include cleaning and degreasing the body 802, or the block of transparent electrically insulating material. In addition, the body 802, or block, may undergo a plasma desmear process in which oxygen plasma or gas is applied to the surfaces of the body 802 to remove organic material and activate the surfaces so that the surfaces are more susceptible to bonding with other material or objects in subsequent steps.

Referring to step 903, a plurality of conductive pads 804 is formed on one or more surfaces of the body 802 in locations that correspond to locations of the leads 808. For the blank package 800A, the conductive pads 804 are formed on the bottom surface of the body 802. For the blank package 800B, the conductive pads 804 are formed on the top surface of the body 802. For the blank package 800C, the conductive pads 804 are formed on each of the four side surfaces of the body 802.

Forming the conductive pads 804 may include performing a plurality of sub steps including forming a seed layer of electrically conductive material. The seed layer is positioned in contact with, or formed on, the entire bottom surface of the body 802A, the entire top surface of the body 802B, or the entirety of the four side surfaces of the body 802C. The seed layer may include metals and/or metal alloys, such as titanium, copper, nickel, silver, gold, and the like. Typically, the seed layer is a thin film. The seed layer may be formed on the listed surfaces of the body 802 by utilizing electroless plating, dipping, or immersion processes. Alternatively, the seed layer is formed on the listed surfaces of the body 802 by utilizing PVD techniques or CVD techniques. The sub steps further include applying an upper metal layer formed from metals and/or metal alloys on top of the seed layer to increase the thickness of the conductive pads 804. The upper metal layer may be applied using electrolytic plating techniques.

The sub steps also include removing portions of the upper metal layer and the seed layer in order to form the conductive pads 804. The sub steps include applying a layer of photoresist to the surface of the upper metal layer. If PVD techniques or CVD techniques were used to deposit the seed layer, then a layer of hexamethyldisilazane (HMDS) is applied before the photoresist. The photoresist may be embodied by one of several types of photoresist, including photopolymeric, photodecomposing, and photocrosslinking photoresist. The photoresist may be applied using any of several methods, including spin coating. The sub steps further include curing the photoresist, exposing the photoresist to ultraviolet light with a positive or negative patterned mask, developing the photoresist, and optionally performing a hard bake of the photoresist. The mask may be patterned with a positive or negative image of the layout of the conductive pads 804. The sub steps further include etching the portion of the upper metal layer which was exposed by the patterned mask and the underlying seed layer using a chemical etch, ion milling, or ion beam etching. After etching, the conductive pads 804 are formed. However, the conductive pads 804 each still have photoresist on the upper surface. The remaining photoresist may be removed with a chemical or plasma strip. If a large block of transparent electrically insulating material was used for the above steps, then the large block is cut or diced to form the individual bodies 802.

Referring to step 904, a plurality of leads 808 is attached to the conductive pads 804, wherein each lead 808 is attached to a successive one of the conductive pads 804. Attaching the leads 808 to the conductive pads 804 includes performing a plurality of sub steps including applying a plurality of solder pads 806 to the conductive pads 804, wherein each solder pad 806 is applied to a successive one of the conductive pads 804. The solder pad 806 may be formed from tin-lead alloy solder or other tin-based alloy solder that includes silver, copper, antimony, or the like that melts at higher temperatures than the printed circuit board level solder which attaches the blank package 800A, 800B, 800C to a printed circuit board, such as the PCB 12. In various embodiments, the solder pad 806 may melt at temperatures greater than or equal to approximately 700 degrees Fahrenheit, whereas the printed circuit board level solder may melt around approximately 360 degrees Fahrenheit. The solder pad 806 may be applied to each conductive pad 804 using screen printing, stencil printing, or jet printing techniques, among others, wherein the solder may be in a paste form.

The sub steps further include forming a lead frame which includes all of the leads 808 for one blank package 800A, 800B, 800C. The lead frame may be formed frame a sheet of metal and/or metal alloys, such as copper, tin, and the like, which is cut, stamped, or etched to form the individual leads 808 along with a frame or panel to hold the leads 808 together. The sub steps further include aligning the leads 808 of the lead frame with their associated conductive pads 804. The leads 808 are positioned such that each lead 808 contacts a successive one of the solder pads 806 (positioned on each conductive pad 804). The sub steps further include reflowing the lead frame and the solder pads 806 to form a mechanical and electrical connection between each lead 808 and its associated conductive pad 804. The reflow may be performed by heating the body 802, the conductive pads 804, the solder pads 806, and the lead frame in a heating chamber or by applying a heat source to the lead frame. The sub steps further include removing the frame from the leads 808 and bending the leads 808 in the appropriate direction. The sub steps may optionally include plating the leads 808 with nickel and/or palladium or dipping the leads 808 in solder.

Another embodiment of a blank package 1000A is shown in FIGS. 18A-18C. An embodiment of a blank package 1000B is shown in FIGS. 19A-19C. An embodiment of a blank package 1000C is shown in FIGS. 20A-20C. The blank package 1000A, 1000B, 1000C may be utilized to mimic or imitate electronic component packages that include a plurality of leads, wherein the leads are attached to a bottom surface of the package, a top surface of the package, or side surfaces of the package. The blank package 1000A, 1000B, 1000C includes a body 1002, a plurality of adhesive pads 1004, and a plurality of leads 1006. The body 1002 is generally transparent and may be the same as, or similar to, the body 14, described above.

Each adhesive pad 1004 generally adheres a successive one of the leads 1006 to one or more surfaces of the body 1002. The adhesive pads 1004 may be formed from one or more resins or preimpregnated (prepreg) fibers with an epoxy, phenolic resin, Teflon, or the like. Each adhesive pad 1004 may be positioned on the surface of the body 1002 in a location corresponding to a location of one of the leads on the electronic component package that the blank package 1000A, 1000B, 1000C is mimicking or imitating. In the exemplary embodiment of the blank package 1000A shown in FIGS. 18A, 18B, and 18C, the leads 1006 are spaced apart from one another and attached to a bottom surface of the body 1002. Thus, the adhesive pads 1004 are spaced apart from one another and positioned on the bottom surface of the body 1002. In the exemplary embodiment of the blank package 1000B shown in FIGS. 19A, 19B, and 19C, the leads 1006 are spaced apart from one another and attached to a top surface of the body 1002. Thus, the adhesive pads 1004 are spaced apart from one another and positioned on the top surface of the body 1002. In the exemplary embodiment of the blank package 1000C shown in FIGS. 20A, 20B, and 20C, the leads 1006 are spaced apart from one another and attached to each of the four side surfaces of the body 1002. Thus, the adhesive pads 1004 are spaced apart from one another and positioned on each of the four side surfaces of the body 1002.

Each lead 1006 is formed from electrically conductive material such as metals and/or metal alloys including copper, tin, and the like, which may be plated with nickel and/or palladium. With blank package 1000A and blank package 1000B, each lead 1006 includes a first end attached to the body 1002 through a successive one of the adhesive pads 1004 and a second end that extends outward and downward from the body 1002. With blank package 1000C, the first end of each lead 1006 is attached to the body 1002 through a successive one of the adhesive pads 1004 and the second end extends downward and outward from the body 1002.

The exemplary blank package 1000A shown in FIGS. 18A and 18B mimics or imitates a QFP-type electronic package with leads that are attached to a bottom surface of the package. Referring to FIG. 18C, the blank package 1000A is soldered to a printed circuit board, such as PCB 12.

The exemplary blank package 1000B shown in FIGS. 19A and 19B mimics or imitates a QFP-type electronic package with leads that are attached to a top surface of the package. Referring to FIG. 19C, the blank package 1000B is soldered to a printed circuit board, such as PCB 12.

The exemplary blank package 1000C shown in FIGS. 20A and 20B mimics or imitates a QFP-type electronic package with leads that are attached to the side surfaces of the package. Referring to FIG. 20C, the blank package 1000C is soldered to a printed circuit board, such as PCB 12.

Utilizing a resin or epoxy adhesive to attach leads to the body of the blank package 1000A, 1000B, 1000C may provide a cost-effective structure for mimicking or imitating an electronic component package.

FIG. 20D depicts a listing of at least a portion of the steps of an exemplary method 1100 of forming a blank package 1000A, 1000B, 1000C that mimics an electronic component package. The steps may be performed in the order shown in FIG. 20D, or they may be performed in a different order. Furthermore, some steps may be performed concurrently as opposed to sequentially. In addition, some steps may be optional or may not be performed.

Referring to step 1101, functional electronic component package specifications are received, including body dimensions and lead sizes, shapes, and locations. The leads of the functional electronic component package may be located on a top surface, one or more side surfaces, or the bottom surface.

Referring to step 1102, a body 1002 of the blank package 1000 is formed from transparent electrically insulating material, wherein the body 1002 may have the same, or similar, dimensions as a body of the functional component package. The body 1002 may be formed from various types of glass, such as lead glass, aluminosilicate glass, high silica glass, fused silica glass, silicate glass, or borosilicate glass. The body 1002 is transmissive to light in the visible spectrum. Preferably, the material of the body 1002 is capable of withstanding high temperature. The body 1002 is typically solid with a box structure having a top surface, a bottom surface, and four side surfaces. However, the body 1002 may be configured to mimic or imitate nearly any geometry. The body 1002 may be formed from a large block of transparent electrically insulating material that is ultimately cut or diced to form a plurality of bodies 1002.

Step 1102 may further include cleaning and degreasing the body 1002, or the block of transparent electrically insulating material. In addition, the body 1002, or block, may undergo a plasma desmear process in which oxygen plasma or gas is applied to the surfaces of the body 1002 to remove organic material and activate the surfaces so that the surfaces are more susceptible to bonding with other material or objects in subsequent steps.

Referring to step 1103, a plurality of adhesive pads 1004 are formed on at least one surface of the body 1002. The adhesive pads 1004 may be formed from one or more resins or preimpregnated (prepreg) fibers with an epoxy, phenolic resin, Teflon, or the like. The adhesive pads 1004 are deposited directly onto the body 1002 in the locations of the conductive pad or electrode on the electronic component package that the blank package 1000 is mimicking or imitating. The adhesive pads 1004 may be deposited using stencil, screen, or jet printing methods. With the blank package 1000A, the adhesive pads 1004 are deposited on the bottom surface of the body 1002. With the blank package 10008, the adhesive pads 1004 are deposited on the top surface of the body 1002. With the blank package 1000C, the adhesive pads 1004 are deposited on each of the side surfaces of the body 1002.

Referring to step 1104, a plurality of leads 1006 is formed from a lead frame. The lead frame may be formed from a sheet of metal and/or metal alloys, such as copper, tin, and the like, which is cut, stamped, or etched to form each of the leads 1006 in the proper relative location, along with a frame or panel to hold the leads 1006 together.

Referring to step 1105, a laminate stack is formed which includes the body 1002 with the adhesive pads 1004 positioned thereon and the leads 1006 (formed by the lead frame). With the blank package 1000A, the leads 1006 (with the lead frame) may be positioned first. The body 1002 may be placed on the lead frame with the adhesive pads 1004 facing downward. With the blank package 1000B, the body 1002 may be positioned with the adhesive pads 1004 facing upward. The leads 1006 (with the lead frame) may be placed so that each lead 1006 is positioned on top of, and in contact with, its associated adhesive pad 1004. With the blank package 1000A, the leads 1006 on the lead frame may be bent such that a portion of each lead 1006 is bent at roughly a right angle to the rest of the lead 1006. The body 1002 may be positioned on its bottom surface with the adhesive pads 1004 facing sideways (outward from the center). The lead frame may be placed such that the leads 1006 surround the body 1002 and each lead 1006 contacts its associated adhesive pad 1004. Pressure and heat may be applied to each lead 1006 in order to cure the adhesive pads 1004 and bond the leads 1006 to the body 1002. After curing, the leads 1006 on the lead frame are bent to shape, if necessary, and cut to the proper length.

Another embodiment of a blank package 1200A is shown in FIGS. 21A-21C. An embodiment of a blank package 1200B is shown in FIGS. 22A-22C. The blank package 1200A, 1200B may be utilized to mimic or imitate electronic component packages that include a plurality of leads, wherein the leads are attached through side surfaces of the package. The blank package 1200A, 1200B includes a body 1202, a plurality of conductive pads 1204, a plurality of solder pads 1206, a plurality of leads 1208, and a seal layer 1210.

The body 1202 includes a plurality of blocks 1212, wherein each block 1212 is generally transparent and may be the same as, or similar to, the body 14, described above. Thus, each block 1212 is typically solid with a box structure having a top surface, a bottom surface, and four side surfaces. In the exemplary embodiment of the blank package 1200A shown in FIGS. 21A, 21B, and 21C, the body 1202 includes a first block 1212A stacked one on top of a second block 1212B. In the exemplary embodiment of the blank package 1200B shown in FIGS. 22A, 22B, and 22C, the body 1202 includes the first block 1212A stacked one on top of the second block 1212B, which is stacked on top of a third block 1212C.

Each conductive pad 1204 is formed from electrically conductive material such as metals and/or metal alloys. In some embodiments, the conductive pad 1204 may be formed from a plurality of layers of metals and/or metal alloys, wherein a lowest layer may be formed from a metal or metal alloy that enhances adhesion with the blocks 1212. In some embodiments, the conductive pad 1204 may be formed from a stack of metals including titanium (in contact with the blocks 1212), nickel, and gold. Each conductive pad 1204 is positioned on the blocks 1212 in a location where a successive one of the leads 1208 is attached. In the exemplary embodiment of the blank package 1200A, the leads 1208 are spaced apart from one another and attached to a bottom surface of the first block 1212A and a top surface of the second block 1212B. Thus, a first portion of the conductive pads 1204 are spaced apart from one another and positioned on the bottom surface of the first block 1212A. A second portion of the conductive pads 1204 are spaced apart from one another and positioned on the top surface of the second block 1212B in alignment with the first portion of the conductive pads 1204 so that each conductive pad 1204 in alignment with another conductive pad 1204 forms one of a plurality of pairs of conductive pads 1204.

In the exemplary embodiment of the blank package 1200B, a first portion of the leads 1208 are spaced apart from one another and attached to the bottom surface of the first block 1212A and the top surface of the second block 1212B, and a second portion of the leads 1208 are spaced apart from one another and attached to the bottom surface of the second block 1212B and a top surface of the third block 1212C. Thus, a first portion of the conductive pads 1204 are spaced apart from one another and positioned on the bottom surface of the first block 1212A. A second portion of the conductive pads 1204 are spaced apart from one another and positioned on the top surface of the second block 1212B in alignment with the first portion of the conductive pads 1204 so that each conductive pad 1204 in alignment with another conductive pad 1204 forms one of a first set of pairs of conductive pads 1204. A third portion of the conductive pads 1204 are spaced apart from one another and positioned on the bottom surface of the second block 1212B. A fourth portion of the conductive pads 1204 are spaced apart from one another and positioned on a top surface of the third block 1212C in alignment with the third portion of the conductive pads 1204 so that each conductive pad 1204 in alignment with another conductive pad 1204 forms one of a second set of pairs of conductive pads 1204.

Each solder pad 1206 is positioned on, in contact with, and/or connected to, a successive one of the conductive pads 1204 and attaches each conductive pad 1204 to one of the leads 1208. The solder pad 1206 may be formed from tin-lead alloy solder or other tin-based alloy solder that includes silver, copper, antimony, or the like that melts at higher temperatures than the printed circuit board level solder which attaches the blank package 1200A, 1200B to a printed circuit board, such as the PCB 12. In various embodiments, the solder pad 1206 may melt at temperatures greater than or equal to approximately 700 degrees Fahrenheit, whereas the printed circuit board level solder may melt around approximately 360 degrees Fahrenheit.

Each lead 1208 is formed from electrically conductive material such as metals and/or metal alloys including copper, tin, and the like, which may be plated with nickel and/or palladium. In the exemplary embodiment of the blank package 1200A, each lead 1208 includes a first end attached to a successive one of the pairs of conductive pads 1204 through the solder pads 1206 and a second end that extends outward and downward from the body 1202.

In the exemplary embodiment of the blank package 1200B, the first portion of the leads 1208, are spaced apart from one another and positioned between the first block 1212A and the second block 1212B, and the second portion the leads 1208, are spaced apart from one another, positioned between the second block 1212B and the third block 1212C, and staggered laterally from the first portion of leads 1208. Each lead 1208 of the first portion of the leads 1208 includes a first end attached to a successive one of the first set of pairs of conductive pads 1204 through the solder pads 1206 and a second end that extends outward and downward from the body 1202. Each lead 1208 of the second portion of the leads 1208 includes a first end attached to a successive one of the second set of pairs of conductive pads 1204 through the solder pads 1206 and a second end that extends outward and downward from the body 1202.

The seal layer 1210 generally forms a barrier along the edges of the spaces between adjacent blocks 1212 of the body 1202 to prevent foreign matter from entering the space between the adjacent blocks 1212. The seal layer 1210 is formed from or includes a resin or epoxy or the like. The seal layer 1210 is applied to, positioned on, in contact with, and/or connected to, each of the side surfaces of each of the blocks 1212 of the body 1202. In addition, the seal layer 1210 fills at least the edges of the spaces between adjacent blocks 1212 of the body 1202.

The blank package 1200A mimics or imitates an electronic component package that includes leads that extend outward from the side surfaces of the body of the package. The blank package 1200B mimics or imitates an electronic component package that includes two layers of leads that extend outward from the side surfaces of the body of the package. Referring to FIG. 21C, the blank package 1200A is soldered to a printed circuit board, such as PCB 12. Referring to FIG. 22C, the blank package 1200B is soldered to a printed circuit board, such as PCB 12.

Utilizing two or more blocks of glass material stacked one on another with leads positioned therebetween more accurately mimics or imitates an encapsulated electronic component package. Utilizing two layers of leads that staggered or offset reduces the risk of internal solder bridging between adjacent leads. Including a seal layer reduces the possibility of foreign matter entering between the blocks and obscuring visibility. In addition, utilizing a high temperature solder to attach the leads to the blocks may provide a structure for mimicking or imitating an electronic component package that is very robust and resistant to delamination or becoming disconnected during the printed circuit board soldering and cleaning processes.

FIG. 22D depicts a listing of at least a portion of the steps of an exemplary method 1300 of forming a blank package 1200A, 1200B that mimics an electronic component package that includes a plurality of leads, wherein the leads are attached through side surfaces of the package. The steps may be performed in the order shown in FIG. 22D, or they may be performed in a different order. Furthermore, some steps may be performed concurrently as opposed to sequentially. In addition, some steps may be optional or may not be performed.

Referring to step 1301, functional electronic component package specifications are received, including body dimensions and lead sizes, shapes, and locations. The leads of the functional electronic component package may extend from the side surfaces of the package with one layer of leads or two layers of leads extending from each side surface.

Referring to step 1302, a plurality of blocks 1212 to form a body 1202 of the blank package 1200A, 1200B is formed from transparent electrically insulating material. Typically, the blocks 1212 are stacked one on another to form the body 1202, which may have the same, or similar, dimensions as a body of the functional component package. For blank package 1200A, the body 1202 includes a first block 1212A stacked one on top of a second block 1212B. For the blank package 1200B, the body 1202 includes the first block 1212A stacked one on top of the second block 1212B, which is stacked on top of a third block 1212C.

Each block 1212 may be formed from various types of glass, such as lead glass, aluminosilicate glass, high silica glass, fused silica glass, silicate glass, or borosilicate glass. The blocks 1212 are transmissive to light in the visible spectrum. Preferably, the material of the blocks 1212 is capable of withstanding high temperature. The blocks 1212 are typically solid with a box structure having a top surface, a bottom surface, and four side surfaces.

Step 1302 may further include cleaning and degreasing the blocks 1212. In addition, the blocks 1212 may undergo a plasma desmear process in which oxygen plasma or gas is applied to the surfaces of the blocks 1212 to remove organic material and activate the surfaces so that the surfaces are more susceptible to bonding with other material or objects in subsequent steps.

Referring to step 1303, a plurality of conductive pads 1204 is formed on surfaces of the blocks 1212 in locations that correspond to locations of the leads 1208. For the blank package 1200A, a first portion of the conductive pads 1204 are positioned on the bottom surface of the first block 1212A. A second portion of the conductive pads 1204 are positioned on the top surface of the second block 1212B in alignment with the first portion of the conductive pads 1204 so that each conductive pad 1204 in alignment with another conductive pad 1204 forms one of a plurality of pairs of conductive pads 1204.

For the blank package 1200B, a first portion of the conductive pads 1204 are positioned on the bottom surface of the first block 1212A. A second portion of the conductive pads 1204 are positioned on the top surface of the second block 1212B in alignment with the first portion of the conductive pads 1204 so that each conductive pad 1204 in alignment with another conductive pad 1204 forms one of a first set of pairs of conductive pads 1204. A third portion of the conductive pads 1204 are positioned on the bottom surface of the second block 1212B. A fourth portion of conductive pads 1204 are positioned on a top surface of the third block 1212C in alignment with the third portion of the conductive pads 1204 so that each conductive pad 1204 in alignment with another conductive pad 1204 forms one of a second set of pairs of conductive pads 1204.

Forming the conductive pads 1204 may include performing a plurality of sub steps including forming a plurality of seed layers of electrically conductive material. For the blank package 1200A, a first seed layer is positioned in contact with, or formed on, the entire bottom surface of the first block 1212A, and a second seed layer is positioned in contact with, or formed on, the entire top surface of the second block 1212B. For the blank package 1200B, the first seed layer is positioned in contact with, or formed on, the entire bottom surface of the first block 1212A, the second seed layer is positioned in contact with, or formed on, the entire top surface of the second block 1212B, a third seed layer is positioned in contact with, or formed on, the entire bottom surface of the second block 1212B, and a fourth seed layer is positioned in contact with, or formed on, the entire top surface of the third block 1212C.

The seed layers may include metals and/or metal alloys, such as titanium, copper, nickel, silver, gold, and the like. Typically, each seed layer is a thin film. The seed layers may be formed on the listed surfaces of the blocks 1212 by utilizing electroless plating, dipping, or immersion processes. Alternatively, the seed layers are formed on the listed surfaces of the blocks 1212 by utilizing PVD techniques or CVD techniques. The sub steps further include applying a plurality of upper metal layers formed from metals and/or metal alloys, each upper metal layer formed from on top of a successive one of the seed layers to increase the thickness of the conductive pads 1204. The upper metal layers may be applied using electrolytic plating techniques.

The sub steps also include removing portions of the upper metal layers and the seed layers in order to form the conductive pads 1204. The sub steps include applying a layer of photoresist to the surface of each upper metal layer. If PVD techniques or CVD techniques were used to deposit the seed layers, then a layer of hexamethyldisilazane (HMDS) is applied before the photoresist. The photoresist may be embodied by one of several types of photoresist, including photopolymeric, photodecomposing, and photo-crosslinking photoresist. The photoresist may be applied using any of several methods, including spin coating. The sub steps further include curing the photoresist, exposing the photoresist to ultraviolet light with a positive or negative patterned mask, developing the photoresist, and optionally performing a hard bake of the photoresist. The mask may be patterned with a positive or negative image of the layout of the conductive pads 1204. The sub steps further include etching the portion of the upper metal layers which was exposed by the patterned mask and the underlying seed layers using a chemical etch, ion milling, or ion beam etching. After etching, the conductive pads 1204 are formed. However, the conductive pads 1204 each still have photoresist on the upper surface. The remaining photoresist may be removed with a chemical or plasma strip.

Referring to step 1304, a plurality of leads 1208 is attached to the conductive pads 1204, wherein each lead 1208 is attached to a successive one of the pairs of the conductive pads 1204. Attaching the leads 1208 to the conductive pads 1204 includes performing a plurality of sub steps including applying a plurality of solder pads 1206 to the conductive pads 1204, wherein each solder pad 1206 is applied to a successive one of the conductive pads 1204. The solder pad 1206 may be formed from tin-lead alloy solder or other tin-based alloy solder that includes silver, copper, antimony, or the like that melts at higher temperatures than the printed circuit board level solder which attaches the blank package 1200A, 1200B to a printed circuit board, such as the PCB 12. In various embodiments, the solder pad 1206 may melt at temperatures greater than or equal to approximately 700 degrees Fahrenheit, whereas the printed circuit board level solder may melt around approximately 360 degrees Fahrenheit. The solder pad 1206 may be applied to each conductive pad 1204 using screen printing, stencil printing, or jet printing techniques, among others, wherein the solder may be in a paste form.

The sub steps further include forming one or more lead frames which include all of the leads 1208 for one blank package 1200. For the blank package 1200A, one lead frame is formed to be positioned between the first block 1212A and the second block 1212B. For the blank package 1200B, a first lead frame is formed to be positioned between the first block 1212A and the second block 1212B, and a second lead frame is formed to be positioned between the second block 1212B and the third block 1212C. The lead frames may be formed frame a sheet of metal and/or metal alloys, such as copper, tin, and the like, which is cut, stamped, or etched to form the individual leads 1208 along with a frame or panel to hold the leads 1208 together.

The sub steps further include aligning the leads 1208 of the lead frames with their associated conductive pads 1204. For the blank package 1200A, the leads 1208 of the one lead frame are aligned with the conductive pads 1204 of the second block 1212B, such that each lead 1208 is contacts the aligned solder pad 1206 (positioned on each conductive pad 1204) on the second block 1212B. For the blank package 1200B, the leads 1208 of the second lead frame are aligned with the conductive pads 1204 of the third block 1212C, such that each lead 1208 contacts the aligned solder pad 1206 (positioned on each conductive pad 1204) on the third block 1212C. The leads 1208 of the first lead frame are aligned with the conductive pads 1204 of the second block 1212B, such that each lead 1208 is contacts the aligned solder pad 1206 (positioned on each conductive pad 1204) on the second block 1212B.

Referring to step 1305, a stack of the blocks 1212 and the leads 1208 is formed. For the blank package 1200A, the first block 1212A is positioned on the second block 1212B so that each solder pad 1206 of the first block 1212A contacts its associated lead 1208. For the blank package 1200B, the second block 1212B and the first lead frame are positioned on top of the third block 1212C and the second lead frame. The first block 1212A is then positioned on the second block 1212B.

Referring to step 1306, the leads 1208 and the solder pads 1206 are reflowed to form a mechanical and electrical connection between each lead 1208 and its associated pair of conductive pads 1204. The reflow may be performed by heating the blocks 1212, the conductive pads 1204, the solder pads 1206, and the lead frames in a heating chamber or by applying a heat source to the lead frames. The sub steps further include removing the frame from the leads 1208 and bending the leads 1208 in the appropriate direction. The sub steps may optionally include plating the leads 1208 with nickel and/or palladium or dipping the leads 1208 in solder.

Referring to step 1307, a seal layer 1210 is applied to each of the side surfaces of the body 1202 to seal the gap between each pair of blocks 1212. The seal layer 1210 is formed from or includes a resin or epoxy or the like. The seal layer 1210 may be applied by dipping the blank package 1200A, 1200B in a resin or epoxy, painting the seal layer 1210 on the side surfaces of the body 1202, encapsulation molding, or the like.

Another embodiment of a blank package 1400A is shown in FIGS. 23A-23C. An embodiment of a blank package 1400B is shown in FIGS. 24A-24C. The blank package 1400A, 1400B may be utilized to mimic or imitate electronic component packages that include a plurality of leads, wherein the leads are attached through side surfaces of the package. The blank package 1400A, 1400B includes a body 1402, a plurality of adhesive pads 1404, a plurality of leads 1406, and a seal layer 1408.

The body 1402 includes a plurality of blocks 1410, wherein each block 1410 is generally transparent and may be the same as, or similar to, the body 14, described above. Thus, each block 1410 is typically solid with a box structure having a top surface, a bottom surface, and four side surfaces. In the exemplary embodiment of the blank package 1400A shown in FIGS. 23A, 23B, and 23C, the body 1402 includes a first block 1410A stacked one on top of a second block 1410B. In the exemplary embodiment of the blank package 1400B shown in FIGS. 24A, 24B, and 24C, the body 1402 includes the first block 1410A stacked one on top of the second block 1410B, which is stacked on top of a third block 1410C.

Each adhesive pad 1404 generally adheres one of the leads 1406 to one or more surfaces of the blocks 1410. The adhesive pads 1404 may be formed from one or more resins or preimpregnated (prepreg) fibers with an epoxy, phenolic resin, Teflon, or the like. For the blank package 1400A, a first portion of the adhesive pads 1404 is positioned on a bottom surface of the first block 1410A in a location corresponding to a location of one of the leads on the electronic component package that the blank package 1400A is mimicking or imitating. A second portion of the adhesive pads 1404 is positioned on a top surface of the second block 1410B in alignment with the first portion of the adhesive pads 1404, wherein the combination of each adhesive pad 1404 of the second portion the adhesive pad 1404 of the first portion with which it is aligned forms one of a plurality of pairs of adhesive pads 1404.

For the blank package 1400B, the first portion of the adhesive pads 1404 is positioned on the bottom surface of the first block 1410A in a location corresponding to a location of one of the leads on the electronic component package that the blank package 1400B is mimicking or imitating. The second portion of the adhesive pads 1404 is positioned on the top surface of the second block 1410B in alignment with the first portion of the adhesive pads 1404, wherein the combination of each adhesive pad 1404 of the second portion the adhesive pad 1404 of the first portion with which it is aligned forms one of a plurality of first pairs of adhesive pads 1404. A third portion of the adhesive pads 1404 is positioned on a bottom surface of the second block 1410B in a location corresponding to a location of one of the leads on the electronic component package that the blank package 1400B is mimicking or imitating. A fourth portion of the adhesive pads 1404 is positioned on a top surface of the third block 1410C in alignment with the third portion of the adhesive pads 1404, wherein the combination of each adhesive pad 1404 of the fourth portion the adhesive pad 1404 of the third portion with which it is aligned forms one of a plurality of second pairs of adhesive pads 1404.

Each lead 1406 is formed from electrically conductive material such as metals and/or metal alloys including copper, tin, and the like, which may be plated with nickel and/or palladium. For the blank package 1400A, each lead 1406 includes a first end attached to a successive one of the pairs of adhesive pads 1404 on the first block 1410A and the second block 1410B and a second end that extends outward and downward from the body 1402.

For the blank package 1400B, the leads 1406 include a first portion and a second portion. The first portion of the leads 1406, are spaced apart from one another and positioned between the first block 1410A and the second block 1410B, and the second portion the leads 1406, are spaced apart from one another, positioned between the second block 1410B and the third block 1410C, and staggered laterally from the first portion of leads 1406. Each lead 1406 of the first portion of the leads 1406 includes a first end attached to a successive one of the first pairs of adhesive pads 1404 and a second end that extends outward and downward from the body 1402. Each lead 1406 of the second portion of the leads 1406 includes a first end attached to a successive one of the second pairs of adhesive pads 1404 and a second end that extends outward and downward from the body 1402.

The seal layer 1408 generally forms a barrier along the edges of the spaces between adjacent blocks 1410 of the body 1402 to prevent foreign matter from entering the space between the adjacent blocks 1410. The seal layer 1408 is formed from or includes a resin or epoxy or the like. The seal layer 1408 is applied to, positioned on, in contact with, and/or connected to, each of the side surfaces of each of the blocks 1410 of the body 1402. In addition, the seal layer 1408 fills at least the edges of the spaces between adjacent blocks 1410 of the body 1402.

The blank package 1400A mimics or imitates an electronic component package that includes leads that extend outward from the side surfaces of the body of the package. The blank package 1400B mimics or imitates an electronic component package that includes two layers of leads that extend outward from the side surfaces of the body of the package. Referring to FIG. 23C, the blank package 1400A is soldered to a printed circuit board, such as PCB 12. Referring to FIG. 24C, the blank package 1400B is soldered to a printed circuit board, such as PCB 12.

Utilizing two or more blocks of glass material stacked one on another with leads positioned therebetween more accurately mimics or imitates an encapsulated electronic component package. Utilizing two layers of leads that staggered or offset reduces the risk of internal solder bridging between adjacent leads. Including a seal layer reduces the possibility of foreign matter entering between the blocks and obscuring visibility. In addition, utilizing a resin or epoxy adhesive to attach the leads to the blocks may provide a cost-effective structure for mimicking or imitating an electronic component package.

FIG. 24D depicts a listing of at least a portion of the steps of an exemplary method 1500 of forming a blank package 1400A, 1400B that mimics an electronic component package that includes a plurality of leads, wherein the leads are attached through side surfaces of the package. The steps may be performed in the order shown in FIG. 24D, or they may be performed in a different order. Furthermore, some steps may be performed concurrently as opposed to sequentially. In addition, some steps may be optional or may not be performed.

Referring to step 1501, functional electronic component package specifications are received, including body dimensions and lead sizes, shapes, and locations. The leads of the functional electronic component package may extend from the side surfaces of the package with one layer of leads or two layers of leads extending from each side surface.

Referring to step 1502, a plurality of blocks 1410 to form a body 1402 of the blank package 1400A, 1400B is formed from transparent electrically insulating material. Typically, the blocks 1410 are stacked one on another to form the body 1402, which may have the same, or similar, dimensions as a body of the functional component package. For blank package 1400A, the body 1402 includes a first block 1410A stacked one on top of a second block 1410B. For the blank package 1400B, the body 1402 includes the first block 1410A stacked one on top of the second block 1410B, which is stacked on top of a third block 1410C.

Each block 1410 may be formed from various types of glass, such as lead glass, aluminosilicate glass, high silica glass, fused silica glass, silicate glass, or borosilicate glass. The blocks 1410 are transmissive to light in the visible spectrum. Preferably, the material of the blocks 1410 is capable of withstanding high temperature. The blocks 1410 are typically solid with a box structure having a top surface, a bottom surface, and four side surfaces.

Step 1502 may further include cleaning and degreasing the blocks 1410. In addition, the blocks 1410 may undergo a plasma desmear process in which oxygen plasma or gas is applied to the surfaces of the blocks 1410 to remove organic material and activate the surfaces so that the surfaces are more susceptible to bonding with other material or objects in subsequent steps.

Referring to step 1503, a plurality of adhesive pads 1404 are formed on the blocks 1410. The adhesive pads 1404 may be formed from one or more resins or preimpregnated (prepreg) fibers with an epoxy, phenolic resin, Teflon, or the like. The adhesive pads 1404 are deposited directly onto the body 1402 in the locations of the conductive pad or electrode on the electronic component package that the blank package 1400 is mimicking or imitating. The adhesive pads 1404 may be deposited using stencil, screen, or jet printing methods. With the blank package 1400A, the adhesive pads 1404 are deposited on the bottom surface of the first block 1410A and the top surface of the second block 1410B. With the blank package 1400B, the adhesive pads 1004 are deposited on the bottom surface of the first block 1410A, the top surface and the bottom surface of the second block 1410B, and the top surface of the third block 1410C.

Referring to step 1504, a plurality of leads 1406 is formed from one or more lead frames. The lead frames may be formed from a sheet of metal and/or metal alloys, such as copper, tin, and the like, which is cut, stamped, or etched to form each of the leads 1406 in the proper relative location, along with a frame or panel to hold the leads 1406 together. With the blank package 1400A, a single lead frame is formed. With the blank package 1400B, a first lead frame is formed for the leads 1406 between the first block 1410A and the second block 1410B, and a second lead frame is formed for the leads between the second block 1410B and the third block 1410C.

Referring to step 1505, a laminate stack is formed which includes the blocks 1410 with the adhesive pads 1404 positioned thereon and the leads 1406 (formed by the lead frame). With the blank package 1400A, the second block 1410B may be positioned. The leads 1406 (with the lead frame) may be placed on the upper surface of the second block 1410B with each lead 1406 in contact with its associated adhesive pad 1404. The first block 1410A may be placed on top of the second block 1410B with the adhesive pads 1404 on the first block 1410A being aligned with the adhesive pads 1404 on the second block 1410B and in contact with the leads 1406.

With the blank package 1400B, the third block 1410C may be positioned. The leads 1406 of the second lead frame may be placed on the upper surface of the third block 1410C with each lead 1406 in contact with its associated adhesive pad 1404. The second block 1410B may be placed on top of the third block 1410C with the adhesive pads 1404 on the second block 1410B being aligned with the adhesive pads 1404 on the third block 1410C and in contact with the leads 1406. The leads 1406 of the first lead frame may be placed on the upper surface of the second block 1410B with each lead 1406 in contact with its associated adhesive pad 1404. The first block 1410A may be placed on top of the second block 1410B with the adhesive pads 1404 on the first block 1410A being aligned with the adhesive pads 1404 on the second block 1410B and in contact with the leads 1406.

Pressure and heat may be applied to the upper surface and the lower surface of the body 1402 in order to cure the adhesive pads 1404 and bond the leads 1406 to the body 1402. After curing, the leads 1406 on the lead frame(s) are bent to shape, if necessary, and cut to the proper length.

Referring to step 1506, a seal layer 1408 is applied to each of the side surfaces of the body 1402 to seal the gap between each pair of blocks 1410. The seal layer 1408 is formed from or includes a resin or epoxy or the like. The seal layer 1408 may be applied by dipping the blank package 1400A, 1400B in a resin or epoxy, painting the seal layer 1408 on the side surfaces of the body 1402, encapsulation molding, or the like.

Another embodiment of a blank package 1600A is shown in FIGS. 25A-25C. An embodiment of a blank package 1600B is shown in FIGS. 26A-26C. The blank package 1600A, 1600B may be utilized to mimic or imitate electronic component packages that include a plurality of leads, wherein the leads are attached through side surfaces of the package. The blank package 1600A, 1600B includes a body 1602, a plurality of conductive pads 1604, a plurality of solder pads 1606, a plurality of leads 1608, and one or more barrier rings 1610.

The body 1602 includes a plurality of blocks 1612, wherein each block 1612 is generally transparent and may be the same as, or similar to, the body 14, described above. Thus, each block 1612 is typically solid with a box structure having a top surface, a bottom surface, and four side surfaces. In the exemplary embodiment of the blank package 1600A shown in FIGS. 25A, 25B, and 25C, the body 1602 includes a first block 1612A stacked one on top of a second block 1612B. In the exemplary embodiment of the blank package 1600B shown in FIGS. 26A, 26B, and 26C, the body 1602 includes the first block 1612A stacked one on top of the second block 1612B, which is stacked on top of a third block 1612C.

Each conductive pad 1604 is formed from electrically conductive material such as metals and/or metal alloys. In some embodiments, the conductive pad 1604 may be formed from a plurality of layers of metals and/or metal alloys, wherein a lowest layer may be formed from a metal or metal alloy that enhances adhesion with the blocks 1612. In some embodiments, the conductive pad 1604 may be formed from a stack of metals including titanium (in contact with the blocks 1612), nickel, and gold. Each conductive pad 1604 is positioned on the blocks 1612 in a location where a successive one of the leads 1608 is attached. In the exemplary embodiment of the blank package 1600A, the leads 1608 are spaced apart from one another and attached to a bottom surface of the first block 1612A and a top surface of the second block 1612B. Thus, a first portion of the conductive pads 1604 are spaced apart from one another and positioned on the bottom surface of the first block 1612A. A second portion of the conductive pads 1604 are spaced apart from one another and positioned on the top surface of the second block 1612B in alignment with the first portion of the conductive pads 1604 so that each conductive pad 1604 in alignment with another conductive pad 1604 forms one of a plurality of pairs of conductive pads 1604.

In the exemplary embodiment of the blank package 1600B, a first portion of the leads 1608 are spaced apart from one another and attached to the bottom surface of the first block 1612A and the top surface of the second block 1612B, and a second portion of the leads 1608 are spaced apart from one another and attached to the bottom surface of the second block 1612B and a top surface of the third block 1612C. Thus, a first portion of the conductive pads 1604 are spaced apart from one another and positioned on the bottom surface of the first block 1612A. A second portion of the conductive pads 1604 are spaced apart from one another and positioned on the top surface of the second block 1612B in alignment with the first portion of the conductive pads 1604 so that each conductive pad 1604 in alignment with another conductive pad 1604 forms one of a first set of pairs of conductive pads 1604. A third portion of the conductive pads 1604 are spaced apart from one another and positioned on the bottom surface of the second block 1612B. A fourth portion of the conductive pads 1604 are spaced apart from one another and positioned on a top surface of the third block 1612C in alignment with the third portion of the conductive pads 1604 so that each conductive pad 1604 in alignment with another conductive pad 1604 forms one of a second set of pairs of conductive pads 1604.

Each solder pad 1606 is positioned on, in contact with, and/or connected to, a successive one of the conductive pads 1604 and attaches each conductive pad 1604 to one of the leads 1608. The solder pad 1606 may be formed from tin-lead alloy solder or other tin-based alloy solder that includes silver, copper, antimony, or the like that melts at higher temperatures than the printed circuit board level solder which attaches the blank package 1600A, 1600B to a printed circuit board, such as the PCB 12. In various embodiments, the solder pad 1606 may melt at temperatures greater than or equal to approximately 700 degrees Fahrenheit, whereas the printed circuit board level solder may melt around approximately 360 degrees Fahrenheit.

Each lead 1608 is formed from electrically conductive material such as metals and/or metal alloys including copper, tin, and the like, which may be plated with nickel and/or palladium. In the exemplary embodiment of the blank package 1600A, each lead 1608 includes a first end attached to a successive one of the pairs of conductive pads 1604 through the solder pads 1606 and a second end that extends outward and downward from the body 1602.

In the exemplary embodiment of the blank package 1600B, the first portion of the leads 1608, are spaced apart from one another and positioned between the first block 1612A and the second block 1612B, and the second portion the leads 1608, are spaced apart from one another, positioned between the second block 1612B and the third block 1612C, and staggered laterally from the first portion of leads 1608. Each lead 1608 of the first portion of the leads 1608 includes a first end attached to a successive one of the first set of pairs of conductive pads 1604 through the solder pads 1606 and a second end that extends outward and downward from the body 1602. Each lead 1608 of the second portion of the leads 1608 includes a first end attached to a successive one of the second set of pairs of conductive pads 1604 through the solder pads 1606 and a second end that extends outward and downward from the body 1602.

Each barrier ring 1610 generally presents a barrier to prevent foreign matter from entering the space between the adjacent blocks 1612. Each barrier ring 1610 includes four side walls connected together to form a quadrilateral shape with an opening in the center. Each side wall of the barrier ring 1610 includes a first ring metal layer, a second metal layer spaced apart from the first ring metal layer, and a ring solder layer positioned therebetween. The first ring metal layer and the second ring metal layer are each formed from the same electrically conductive material as the conductive pads 1604, including metals and/or metal alloys, such as titanium, copper, nickel, silver, gold, and the like. The ring solder layer is formed from the same electrically conductive material as the solder pad 1606, including tin-lead alloy solder or other tin-based alloy solder that includes silver, copper, antimony, or the like that melts at higher temperatures than the printed circuit board level solder which attaches the blank package 1600A, 1600B to a printed circuit board, such as the PCB 12.

The blank package 1600A includes one barrier ring 1610 positioned between the first block 1612A and the second block 1612B so that the side walls are spaced inward from the pairs of conductive pads 1604 and solder pads 1606. The blank package 1600B includes a first barrier ring 1610A positioned between the first block 1612A and the second block 1612B and a second barrier ring 1610B positioned between the second block 1612B and the third block 1612C. Each of the barrier rings 1610 in the blank package 1600B is spaced inward from the pairs of conductive pads 1604 and solder pads 1606.

The blank package 1600A mimics or imitates an electronic component package that includes leads that extend outward from the side surfaces of the body of the package. The blank package 1600B mimics or imitates an electronic component package that includes two layers of leads that extend outward from the side surfaces of the body of the package. Referring to FIG. 25C, the blank package 1600A is soldered to a printed circuit board, such as PCB 12. Referring to FIG. 26C, the blank package 1600B is soldered to a printed circuit board, such as PCB 12.

Utilizing two or more blocks of glass material stacked one on another with leads positioned therebetween more accurately mimics or imitates an encapsulated electronic component package. Utilizing two layers of leads that staggered or offset reduces the risk of internal solder bridging between adjacent leads. Including a seal layer reduces the possibility of foreign matter entering between the blocks and obscuring visibility. In addition, utilizing a high temperature solder to attach the leads to the blocks may provide a structure for mimicking or imitating an electronic component package that is very robust and resistant to delamination or becoming disconnected during the printed circuit board soldering and cleaning processes.

FIG. 26D depicts a listing of at least a portion of the steps of an exemplary method 1700 of forming a blank package 1600A, 1600B that mimics an electronic component package that includes a plurality of leads, wherein the leads are attached through side surfaces of the package. The steps may be performed in the order shown in FIG. 26D, or they may be performed in a different order. Furthermore, some steps may be performed concurrently as opposed to sequentially. In addition, some steps may be optional or may not be performed.

Referring to step 1701, functional electronic component package specifications are received, including body dimensions and lead sizes, shapes, and locations. The leads of the functional electronic component package may extend from the side surfaces of the package with one layer of leads or two layers of leads extending from each side surface.

Referring to step 1702, a plurality of blocks 1612 to form a body 1602 of the blank package 1600A, 1600B is formed from transparent electrically insulating material. Typically, the blocks 1612 are stacked one on another to form the body 1602, which may have the same, or similar, dimensions as a body of the functional component package. For blank package 1600A, the body 1602 includes a first block 1612A stacked one on top of a second block 1612B. For the blank package 1600B, the body 1602 includes the first block 1612A stacked one on top of the second block 1612B, which is stacked on top of a third block 1612C.

Each block 1612 may be formed from various types of glass, such as lead glass, aluminosilicate glass, high silica glass, fused silica glass, silicate glass, or borosilicate glass. The blocks 1612 are transmissive to light in the visible spectrum. Preferably, the material of the blocks 1612 is capable of withstanding high temperature. The blocks 1612 are typically solid with a box structure having a top surface, a bottom surface, and four side surfaces.

Step 1702 may further include cleaning and degreasing the blocks 1612. In addition, the blocks 1612 may undergo a plasma desmear process in which oxygen plasma or gas is applied to the surfaces of the blocks 1612 to remove organic material and activate the surfaces so that the surfaces are more susceptible to bonding with other material or objects in subsequent steps.

Referring to step 1703, a plurality of conductive pads 1604 is formed on surfaces of the blocks 1612 in locations that correspond to locations of the leads 1608. For the blank package 1600A, a first portion of the conductive pads 1604 are positioned on the bottom surface of the first block 1612A. A second portion of the conductive pads 1604 are positioned on the top surface of the second block 1612B in alignment with the first portion of the conductive pads 1604 so that each conductive pad 1604 in alignment with another conductive pad 1604 forms one of a plurality of pairs of conductive pads 1604.

For the blank package 1600B, a first portion of the conductive pads 1604 are positioned on the bottom surface of the first block 1612A. A second portion of the conductive pads 1604 are positioned on the top surface of the second block 1612B in alignment with the first portion of the conductive pads 1604 so that each conductive pad 1604 in alignment with another conductive pad 1604 forms one of a first set of pairs of conductive pads 1604. A third portion of the conductive pads 1604 are positioned on the bottom surface of the second block 1612B. A fourth portion of the conductive pads 1604 are positioned on a top surface of the third block 1612C in alignment with the third portion of the conductive pads 1604 so that each conductive pad 1604 in alignment with another conductive pad 1604 forms one of a second set of pairs of conductive pads 1604.

Forming the conductive pads 1604 may include performing a plurality of sub steps including forming a plurality of seed layers of electrically conductive material. For the blank package 1600A, a first seed layer is positioned in contact with, or formed on, the entire bottom surface of the first block 1612A, and a second seed layer is positioned in contact with, or formed on, the entire top surface of the second block 1612B. For the blank package 1600B, the first seed layer is positioned in contact with, or formed on, the entire bottom surface of the first block 1612A, the second seed layer is positioned in contact with, or formed on, the entire top surface of the second block 1612B, a third seed layer is positioned in contact with, or formed on, the entire bottom surface of the second block 1612B, and a fourth seed layer is positioned in contact with, or formed on, the entire top surface of the third block 1612C.

The seed layers may include metals and/or metal alloys, such as titanium, copper, nickel, silver, gold, and the like. Typically, each seed layer is a thin film. The seed layers may be formed on the listed surfaces of the blocks 1612 by utilizing electroless plating, dipping, or immersion processes. Alternatively, the seed layers are formed on the listed surfaces of the blocks 1612 by utilizing PVD techniques or CVD techniques. The sub steps further include applying a plurality of upper metal layers formed from metals and/or metal alloys, each upper metal layer formed from on top of a successive one of the seed layers to increase the thickness of the conductive pads 1604. The upper metal layers may be applied using electrolytic plating techniques.

The sub steps also include removing portions of the upper metal layers and the seed layers in order to form the conductive pads 1604. The sub steps include applying a layer of photoresist to the surface of each upper metal layer. If PVD techniques or CVD techniques were used to deposit the seed layers, then a layer of hexamethyldisilazane (HMDS) is applied before the photoresist. The photoresist may be embodied by one of several types of photoresist, including photopolymeric, photodecomposing, and photo-crosslinking photoresist. The photoresist may be applied using any of several methods, including spin coating. The sub steps further include curing the photoresist, exposing the photoresist to ultraviolet light with a positive or negative patterned mask, developing the photoresist, and optionally performing a hard bake of the photoresist. The mask may be patterned with a positive or negative image of the layout of the conductive pads 1604. The sub steps further include etching the portion of the upper metal layers which was exposed by the patterned mask and the underlying seed layers using a chemical etch, ion milling, or ion beam etching. After etching, the conductive pads 1604 are formed. However, the conductive pads 1604 each still have photoresist on the upper surface. The remaining photoresist may be removed with a chemical or plasma strip.

Referring to step 1704, a plurality of leads 1608 is attached to the conductive pads 1604, wherein each lead 1608 is attached to a successive one of the pairs of the conductive pads 1604. Attaching the leads 1608 to the conductive pads 1604 includes performing a plurality of sub steps including applying a plurality of solder pads 1606 to the conductive pads 1604, wherein each solder pad 1606 is applied to a successive one of the conductive pads 1604. The solder pad 1606 may be formed from tin-lead alloy solder or other tin-based alloy solder that includes silver, copper, antimony, or the like that melts at higher temperatures than the printed circuit board level solder which attaches the blank package 1600A, 1600B to a printed circuit board, such as the PCB 12. In various embodiments, the solder pad 1606 may melt at temperatures greater than or equal to approximately 700 degrees Fahrenheit, whereas the printed circuit board level solder may melt around approximately 360 degrees Fahrenheit. The solder pad 1606 may be applied to each conductive pad 1604 using screen printing, stencil printing, or jet printing techniques, among others, wherein the solder may be in a paste form.

The sub steps further include forming one or more lead frames which include all of the leads 1608 for one blank package 1600. For the blank package 1600A, one lead frame is formed to be positioned between the first block 1612A and the second block 1612B. For the blank package 1600B, a first lead frame is formed to be positioned between the first block 1612A and the second block 1612B, and a second lead frame is formed to be positioned between the second block 1612B and the third block 1612C. The lead frames may be formed from a sheet of metal and/or metal alloys, such as copper, tin, and the like, which is cut, stamped, or etched to form the individual leads 1608 along with a frame or panel to hold the leads 1608 together.

The sub steps further include aligning the leads 1608 of the lead frames with their associated conductive pads 1604.

For the blank package 1600A, the leads 1608 of the one lead frame are aligned with the conductive pads 1604 of the second block 1612B, such that each lead 1608 is contacts the aligned solder pad 1606 (positioned on each conductive pad 1604) on the second block 1612B. For the blank package 1600B, the leads 1608 of the second lead frame are aligned with the conductive pads 1604 of the third block 1612C, such that each lead 1608 contacts the aligned solder pad 1606 (positioned on each conductive pad 1604) on the third block 1612C. The leads 1608 of the first lead frame are aligned with the conductive pads 1604 of the second block 1612B, such that each lead 1608 is contacts the aligned solder pad 1606 (positioned on each conductive pad 1604) on the second block 1612B.

Referring to step 1705, one or more barrier rings 1610 are formed. The barrier ring 1610 generally presents a barrier to prevent foreign matter from entering the space between the adjacent blocks 1612. Each barrier ring 1610 includes four side walls connected together to form a quadrilateral shape. Each barrier ring 1610 includes a first ring metal layer, a second metal layer spaced apart from the first ring metal layer, and a ring solder layer positioned therebetween. The first ring metal layer and the second ring metal layer are each formed from the same electrically conductive material as the conductive pads 1604, including metals and/or metal alloys, such as titanium, copper, nickel, silver, gold, and the like. The ring solder layer is formed from the same electrically conductive material as the solder pad 1606, including tin-lead alloy solder or other tin-based alloy solder that includes silver, copper, antimony, or the like that melts at higher temperatures than the printed circuit board level solder which attaches the blank package 1600A, 1600B to a printed circuit board, such as the PCB 12.

The blank package 1600A includes one barrier ring 1610 positioned between the first block 1612A and the second block 1612B so that the side walls are spaced inward from the pairs of conductive pads 1604 and solder pads 1606. The blank package 1600B includes a first barrier ring 1610A positioned between the first block 1612A and the second block 1612B and a second barrier ring 1610B positioned between the second block 1612B and the third block 1612C. Each of the barrier rings 1610 in the blank package 1600B is spaced inward from the pairs of conductive pads 1604 and solder pads 1606.

Forming the barrier rings 1610 may include performing a plurality of sub steps. The first ring metal layer and the second ring metal layer of each barrier ring 1610 are formed generally at the same time as the conductive pads 1604. That is, the first ring metal layer and the second ring metal layer are each formed from the seed layer and upper metal layer, which cover the surfaces of the blocks 1612 as described in step 1703. And, when portions of the upper metal layers and the seed layers are removed in order to form the conductive pads 1604, other portions of the upper metal layers and the seed layers are removed in order to form the first ring metal layer and the second ring metal layer of each barrier ring 1610 using the same sub steps as described in step 1703. In addition, the ring solder layer of each barrier ring 1610 is formed at generally the same time as the solder pads 1606 as described in step 1704. That is, high temperature solder paste is applied to the first ring metal layer and the second ring metal layer.

Referring to step 1706, a stack of the blocks 1612 and the leads 1608 is formed. The first block 1612A is then positioned on the second block 1612B so that each solder pad 1606 of the first block 1612A contacts its associated lead 1608. The second block 1612B and the first lead frame are positioned on top of the third block 1612C and the second lead frame. The first block 1612A is then positioned on the second block 1612B.

Referring to step 1707, the lead frames, the solder pads 1606, and the barrier rings 1610 are reflowed. The lead frames and the solder pads 1606 are reflowed to form a mechanical and electrical connection between each lead 1608 and its associated pair of conductive pads 1604. The reflow may be performed by heating the blank package 1600, including the blocks 1612, the conductive pads 1604, the solder pads 1606, the lead frames, and the barrier rings 1610, in a heating chamber or by applying a heat source to the blocks 1810 and the lead frames. The sub steps further include removing the frame from the leads 1608 and bending the leads 1608 in the appropriate direction. The sub steps may optionally include plating the leads 1608 with nickel and/or palladium or dipping the leads 1608 in solder.

Another embodiment of a blank package 1800A is shown in FIGS. 27A-27C. An embodiment of a blank package 1800B is shown in FIGS. 28A-28C. The blank package 1800A, 1800B may be utilized to mimic or imitate electronic component packages that include a plurality of leads, wherein the leads are attached through side surfaces of the package. The blank package 1800A, 1800B includes a body 1802, a plurality of adhesive pads 1804, a plurality of leads 1806, and one or more seal rings 1808.

The body 1802 includes a plurality of blocks 1810, wherein each block 1810 is generally transparent and may be the same as, or similar to, the body 14, described above. Thus, each block 1810 is typically solid with a box structure having a top surface, a bottom surface, and four side surfaces. In the exemplary embodiment of the blank package 1800A shown in FIGS. 27A, 27B, and 27C, the body 1802 includes a first block 1810A stacked one on top of a second block 1810B. In the exemplary embodiment of the blank package 1800B shown in FIGS. 28A, 28B, and 28C, the body 1802 includes the first block 1810A stacked one on top of the second block 1810B, which is stacked on top of a third block 1810C.

Each adhesive pad 1804 generally adheres one of the leads 1806 to one or more surfaces of the blocks 1810. The adhesive pads 1804 may be formed from one or more resins or preimpregnated (prepreg) fibers with an epoxy, phenolic resin, Teflon, or the like. For the blank package 1800A, a first portion of the adhesive pads 1804 is positioned on a bottom surface of the first block 1810A in a location corresponding to a location of one of the leads on the electronic component package that the blank package 1800A is mimicking or imitating. A second portion of the adhesive pads 1804 is positioned on a top surface of the second block 1810B in alignment with the first portion of the adhesive pads 1804, wherein the combination of each adhesive pad 1804 of the second portion the adhesive pad 1804 of the first portion with which it is aligned forms one of a plurality of pairs of adhesive pads 1804.

For the blank package 1800B, the first portion of the adhesive pads 1804 is positioned on the bottom surface of the first block 1810A in a location corresponding to a location of one of the leads on the electronic component package that the blank package 1800B is mimicking or imitating. The second portion of the adhesive pads 1804 is positioned on the top surface of the second block 1810B in alignment with the first portion of the adhesive pads 1804, wherein the combination of each adhesive pad 1804 of the second portion the adhesive pad 1804 of the first portion with which it is aligned forms one of a plurality of first pairs of adhesive pads 1804. A third portion of the adhesive pads 1804 is positioned on a bottom surface of the second block 1810B in a location corresponding to a location of one of the leads on the electronic component package that the blank package 1800B is mimicking or imitating. A fourth portion of the adhesive pads 1804 is positioned on a top surface of the third block 1810C in alignment with the third portion of the adhesive pads 1804, wherein the combination of each adhesive pad 1804 of the fourth portion the adhesive pad 1804 of the third portion with which it is aligned forms one of a plurality of second pairs of adhesive pads 1804.

Each lead 1806 is formed from electrically conductive material such as metals and/or metal alloys including copper, tin, and the like, which may be plated with nickel and/or palladium. For the blank package 1800A, each lead 1806 includes a first end attached to a successive one of the pairs of adhesive pads 1804 on the first block 1810A and the second block 1810B and a second end that extends outward and downward from the body 1802.

For the blank package 1800B, the leads 1806 include a first portion and a second portion. The first portion of the leads 1806, are spaced apart from one another and positioned between the first block 1810A and the second block 1810B, and the second portion the leads 1806, are spaced apart from one another, positioned between the second block 1810B and the third block 1810C, and staggered laterally from the first portion of leads 1806. Each lead 1806 of the first portion of the leads 1806 includes a first end attached to a successive one of the first pairs of adhesive pads 1804 and a second end that extends outward and downward from the body 1802. Each lead 1806 of the second portion of the leads 1806 includes a first end attached to a successive one of the second pairs of adhesive pads 1804 and a second end that extends outward and downward from the body 1802.

Each seal ring 1808 generally presents a seal to prevent foreign matter from entering the space between the adjacent blocks 1810. Each seal ring 1808 has a quadrilateral shape with an opening in the center and is formed from a resin or epoxy or the like. The blank package 1800A includes one seal ring 1808 positioned between the first block 1810A and the second block 1810B so that the sides are spaced inward from the pairs adhesive pads 1804. The blank package 1800B includes a first seal ring 1808A positioned between the first block 1810A and the second block 1810B and a second seal ring 1808B positioned between the second block 1810B and the third block 1810C. Each of the seal rings 1808 in the blank package 1800B is spaced inward from the pairs of adhesive pads 1804.

Utilizing two or more blocks of glass material stacked one on another with leads positioned therebetween more accurately mimics or imitates an encapsulated electronic component package. Utilizing two layers of leads that staggered or offset reduces the risk of internal solder bridging between adjacent leads. Including a seal layer reduces the possibility of foreign matter entering between the blocks and obscuring visibility. In addition, utilizing a resin or epoxy adhesive to attach the leads to the blocks may provide a cost-effective structure for mimicking or imitating an electronic component package.

FIG. 28D depicts a listing of at least a portion of the steps of an exemplary method 1900 of forming a blank package 1800A, 1800B that mimics an electronic component package that includes a plurality of leads, wherein the leads are attached through side surfaces of the package. The steps may be performed in the order shown in FIG. 28D, or they may be performed in a different order. Furthermore, some steps may be performed concurrently as opposed to sequentially. In addition, some steps may be optional or may not be performed.

Referring to step 1901, functional electronic component package specifications are received, including body dimensions and lead sizes, shapes, and locations. The leads of the functional electronic component package may extend from the side surfaces of the package with one layer of leads or two layers of leads extending from each side surface.

Referring to step 1902, a plurality of blocks 1810 to form a body 1802 of the blank package 1800A, 1800B is formed from transparent electrically insulating material. Typically, the blocks 1810 are stacked one on another to form the body 1802, which may have the same, or similar, dimensions as a body of the functional component package. For blank package 1800A, the body 1802 includes a first block 1810A stacked one on top of a second block 1810B. For the blank package 1800B, the body 1802 includes the first block 1810A stacked one on top of the second block 1810B, which is stacked on top of a third block 1810C.

Each block 1810 may be formed from various types of glass, such as lead glass, aluminosilicate glass, high silica glass, fused silica glass, silicate glass, or borosilicate glass. The blocks 1810 are transmissive to light in the visible spectrum. Preferably, the material of the blocks 1810 is capable of withstanding high temperature. The blocks 1810 are typically solid with a box structure having a top surface, a bottom surface, and four side surfaces.

Step 1902 may further include cleaning and degreasing the blocks 1810. In addition, the blocks 1810 may undergo a plasma desmear process in which oxygen plasma or gas is applied to the surfaces of the blocks 1810 to remove organic material and activate the surfaces so that the surfaces are more susceptible to bonding with other material or objects in subsequent steps.

Referring to step 1903, a plurality of adhesive pads 1804 are formed on the blocks 1810. The adhesive pads 1804 may be formed from one or more resins or preimpregnated (prepreg) fibers with an epoxy, phenolic resin, Teflon, or the like. The adhesive pads 1804 are deposited directly onto the body 1802 in the locations of the conductive pad or electrode on the electronic component package that the blank package 1800 is mimicking or imitating. The adhesive pads 1804 may be deposited using stencil, screen, or jet printing methods. With the blank package 1800A, the adhesive pads 1804 are deposited on the bottom surface of the first block 1810A and the top surface of the second block 1810B. With the blank package 1800B, the adhesive pads 1804 are deposited on the bottom surface of the first block 1810A, the top surface and the bottom surface of the second block 1810B, and the top surface of the third block 1810C.

Referring to step 1904, one or more seal rings 1808 are formed on the blocks 1810. The blank package 1800A includes one seal ring 1808, and the blank package 1800B includes a first seal ring 1808A and a second seal ring 1808B. The seal rings 1808 may be formed from one or more resins or preimpregnated (prepreg) fibers with an epoxy, phenolic resin, Teflon, or the like. The seal rings 1808 are deposited directly onto the blocks 1810. With the blank package 1800A, the seal ring 1808 is deposited on the bottom surface of the first block 1810A and/or the top surface of the second block 1810B. With the blank package 1800B, the first seal ring 1808A is deposited on the bottom surface of the first block 1810A and/or the top surface of the second block 1810B. The second seal ring 1808B is deposited on the bottom surface of the second block 1810B and/or the top surface of the third block 1810C.

Referring to step 1905, a plurality of leads 1806 is formed from one or more lead frames. The lead frames may be formed from a sheet of metal and/or metal alloys, such as copper, tin, and the like, which is cut, stamped, or etched to form each of the leads 1806 in the proper relative location, along with a frame or panel to hold the leads 1806 together. With the blank package 1800A, a single lead frame is formed. With the blank package 1800B, a first lead frame is formed for the leads 1806 between the first block 1810A and the second block 1810B, and a second lead frame is formed for the leads between the second block 1810B and the third block 1810C.

Referring to step 1906, a laminate stack is formed which includes the blocks 1810 with the adhesive pads 1804 and the seal rings 1808 positioned thereon and the leads 1806 (formed by the lead frame). With the blank package 1800A, the second block 1810B may be positioned. The leads 1806 (with the lead frame) may be placed on the upper surface of the second block 1810B with each lead 1806 in contact with its associated adhesive pad 1804. The first block 1810A may be placed on top of the second block 1810B with the adhesive pads 1804 on the first block 1810A being aligned with the adhesive pads 1804 on the second block 1810B and in contact with the leads 1806.

With the blank package 1800B, the third block 1810C may be positioned. The leads 1806 of the second lead frame may be placed on the upper surface of the third block 1810C with each lead 1806 in contact with its associated adhesive pad 1804. The second block 1810B may be placed on top of the third block 1810C with the adhesive pads 1804 on the second block 1810B being aligned with the adhesive pads 1804 on the third block 1810C and in contact with the leads 1806. The leads 1806 of the first lead frame may be placed on the upper surface of the second block 1810B with each lead 1806 in contact with its associated adhesive pad 1804. The first block 1810A may be placed on top of the second block 1810B with the adhesive pads 1804 on the first block 1810A being aligned with the adhesive pads 1804 on the second block 1810B and in contact with the leads 1806.

Pressure and heat may be applied to the upper surface and the lower surface of the body 1802 in order to cure the adhesive pads 1804 and bond the leads 1806 to the body 1802. The seal rings 1808 are cured as well. After curing, the leads 1806 on the lead frame(s) are bent to shape, if necessary, and cut to the proper length.

Another embodiment of a blank package 2000A is shown in FIGS. 29A-29C. An embodiment of a blank package 2000B is shown in FIGS. 30A-30C. The blank package 2000A, 2000B may be utilized to mimic or imitate electronic component packages that include a plurality of leads, wherein the leads are attached through side surfaces of the package. The blank package 2000A, 2000B includes a body 2002, one or more barrier rings 2004, and a plurality of leads 2006.

The body 2002 includes a plurality of blocks 2008, wherein each block 2008 is generally transparent and may be the same as, or similar to, the body 14, described above. Thus, each block 2008 is typically solid with a box structure having a top surface, a bottom surface, and four side surfaces. In the exemplary embodiment of the blank package 2000A shown in FIGS. 29A, 29B, and 29C, the body 2002 includes a first block 2008A stacked one on top of a second block 2008B. In the exemplary embodiment of the blank package 2000B shown in FIGS. 30A, 30B, and 30C, the body 2002 includes the first block 2008A stacked one on top of the second block 2008B, which is stacked on top of a third block 2008C.

Each barrier ring 2004 generally presents a barrier to prevent foreign matter from entering the space between the adjacent blocks 2008. Each barrier ring 2004 includes four side walls connected together to form a quadrilateral shape with an opening in the center. Each side wall of the barrier ring 2004 includes a first ring metal layer, a second metal layer spaced apart from the first ring metal layer, and a ring solder layer positioned therebetween. The first ring metal layer and the second ring metal layer are each formed from electrically conductive material, including metals and/or metal alloys, such as titanium, copper, nickel, silver, gold, and the like. The ring solder layer is formed from electrically conductive material, including tin-lead alloy solder or other tin-based alloy solder that includes silver, copper, antimony, or the like that melts at higher temperatures than the printed circuit board level solder which attaches the blank package 2000A, 2000B to a printed circuit board, such as the PCB 12.

The blank package 2000A includes one barrier ring 2004 positioned between the first block 2008A and the second block 2008B so that the outer edges of the side walls are aligned with the outer edges of the first block 2008A and the second block 2008B. The blank package 2000B includes a first barrier ring 2004A positioned between the first block 2008A and the second block 2008B and a second barrier ring 2004B positioned between the second block 2008B and the third block 2008C. The outer edges of each of the barrier rings 2004 in the blank package 2000B are aligned with the outer edges of the first block 2008A, the second block 2008B, and the third block 2008C.

Each lead 2006 is formed from electrically conductive material such as metals and/or metal alloys including copper, tin, and the like, which may be plated with nickel and/or palladium. In the exemplary embodiment of the blank package 2000A, the leads 2006 are spaced apart from one another and attached to the ring solder layer of the barrier ring 2004. Each lead 2006 includes a first end attached to the ring solder layer and a second end that extends outward and downward from the body 2002.

In the exemplary embodiment of the blank package 2000B, a first portion of the leads 2006 are spaced apart from one another and attached to the ring solder layer the first barrier ring 2004A. A second portion of the leads 2006 are spaced apart from one another and attached to the ring solder layer of the second barrier ring 2004B. In addition, the second portion of the leads 2006 is staggered laterally from the first portion of leads 2006. Each lead 2006 of the first portion of the leads 2006 includes a first end attached to the ring solder layer of the first barrier ring 2004A and a second end that extends outward and downward from the body 2002. Each lead 2006 of the second portion of the leads 2006 includes a first end attached to the ring solder layer of the second barrier ring 2004B and a second end that extends outward and downward from the body 2002.

Utilizing two or more blocks of glass material stacked one on another with leads positioned therebetween more accurately mimics or imitates an encapsulated electronic component package. Utilizing two layers of leads that staggered or offset reduces the risk of internal solder bridging between adjacent leads. Including a seal layer reduces the possibility of foreign matter entering between the blocks and obscuring visibility. In addition, utilizing a high temperature solder to attach the leads to the blocks may provide a structure for mimicking or imitating an electronic component package that is very robust and resistant to delamination or becoming disconnected during the printed circuit board soldering and cleaning processes.

FIG. 30D depicts a listing of at least a portion of the steps of an exemplary method 2100 of forming a blank package 2000A, 2000B that mimics an electronic component package that includes a plurality of leads, wherein the leads are attached through side surfaces of the package. The steps may be performed in the order shown in FIG. 30D, or they may be performed in a different order. Furthermore, some steps may be performed concurrently as opposed to sequentially. In addition, some steps may be optional or may not be performed.

Referring to step 2101, functional electronic component package specifications are received, including body dimensions and lead sizes, shapes, and locations. The leads of the functional electronic component package may extend from the side surfaces of the package with one layer of leads or two layers of leads extending from each side surface.

Referring to step 2102, a plurality of blocks 2008 to form a body 2002 of the blank package 2000A, 2000B is formed from transparent electrically insulating material. Typically, the blocks 2008 are stacked one on another to form the body 2002, which may have the same, or similar, dimensions as a body of the functional component package. For blank package 2000A, the body 2002 includes a first block 2008A stacked one on top of a second block 2008B. For the blank package 2000B, the body 2002 includes the first block 2008A stacked one on top of the second block 2008B, which is stacked on top of a third block 2008C.

Each block 2008 may be formed from various types of glass, such as lead glass, aluminosilicate glass, high silica glass, fused silica glass, silicate glass, or borosilicate glass. The blocks 2008 are transmissive to light in the visible spectrum. Preferably, the material of the blocks 2008 is capable of withstanding high temperature. The blocks 2008 are typically solid with a box structure having a top surface, a bottom surface, and four side surfaces.

Step 2102 may further include cleaning and degreasing the blocks 2008. In addition, the blocks 2008 may undergo a plasma desmear process in which oxygen plasma or gas is applied to the surfaces of the blocks 2008 to remove organic material and activate the surfaces so that the surfaces are more susceptible to bonding with other material or objects in subsequent steps.

Referring to step 2103, one or more barrier rings 2004 are formed. Each barrier ring 2004 generally presents a barrier to prevent foreign matter from entering the space between the adjacent blocks 2008. Each barrier ring 2004 includes four side walls connected together to form a quadrilateral shape with an opening in the center. Each side wall of the barrier ring 2004 includes a first ring metal layer, a second metal layer spaced apart from the first ring metal layer, and a ring solder layer positioned therebetween. The first ring metal layer and the second ring metal layer are each formed from electrically conductive material, including metals and/ or metal alloys, such as titanium, copper, nickel, silver, gold, and the like. The ring solder layer is formed from electrically conductive material, including tin-lead alloy solder or other tin-based alloy solder that includes silver, copper, antimony, or the like that melts at higher temperatures than the printed circuit board level solder which attaches the blank package 2000A, 2000B to a printed circuit board, such as the PCB 12.

The blank package 2000A includes one barrier ring 2004 positioned between the first block 2008A and the second block 2008B so that the outer edges of the side walls are aligned with the outer edges of the first block 2008A and the second block 2008B. The blank package 2000B includes a first barrier ring 2004A positioned between the first block 2008A and the second block 2008B and a second barrier ring 2004B positioned between the second block 2008B and the third block 2008C. The outer edges of each of the barrier rings 2004 in the blank package 2000B are aligned with the outer edges of the first block 2008A, the second block 2008B, and the third block 2008C.

Forming the barrier rings 2004 may include performing a plurality of sub steps. The first ring metal layer and the second ring metal layer of each barrier ring 2004 are formed by forming a plurality of seed layers of electrically conductive material. For the blank package 2000A, a first seed layer is positioned in contact with, or formed on, the entire bottom surface of the first block 2008A, and a second seed layer is positioned in contact with, or formed on, the entire top surface of the second block 2008B. For the blank package 2000B, the first seed layer is positioned in contact with, or formed on, the entire bottom surface of the first block 2008A, the second seed layer is positioned in contact with, or formed on, the entire top surface of the second block 2008B, a third seed layer is positioned in contact with, or formed on, the entire bottom surface of the second block 2008B, and a fourth seed layer is positioned in contact with, or formed on, the entire top surface of the third block 2008C.

The seed layers may include metals and/or metal alloys, such as titanium, copper, nickel, silver, gold, and the like. Typically, each seed layer is a thin film. The seed layers may be formed on the listed surfaces of the blocks 2008 by utilizing electroless plating, dipping, or immersion processes. Alternatively, the seed layers are formed on the listed surfaces of the blocks 2008 by utilizing PVD techniques or CVD techniques. The sub steps further include applying a plurality of upper metal layers formed from metals and/or metal alloys, each upper metal layer formed from on top of a successive one of the seed layers to increase the thickness of the metal layers of the barrier rings 2004. The upper metal layers may be applied using electrolytic plating techniques.

The sub steps also include removing portions of the upper metal layers and the seed layers in order to form the first ring metal layer and the second ring metal layer of each barrier ring 2004. The sub steps include applying a layer of photoresist to the surface of each upper metal layer. If PVD techniques or CVD techniques were used to deposit the seed layers, then a layer of hexamethyldisilazane (HMDS) is applied before the photoresist. The photoresist may be embodied by one of several types of photoresist, including photopolymeric, photodecomposing, and photocrosslinking photoresist. The photoresist may be applied using any of several methods, including spin coating. The sub steps further include curing the photoresist, exposing the photoresist to ultraviolet light with a positive or negative patterned mask, developing the photoresist, and optionally performing a hard bake of the photoresist. The mask may be patterned with a positive or negative image of the layout of the barrier rings 2004. The sub steps further include etching the portion of the upper metal layers which was exposed by the patterned mask and the underlying seed layers using a chemical etch, ion milling, or ion beam etching. After etching, the first ring metal layers and the second ring metal layers are formed. That is, for the blank package 2000A, the first ring metal layer is formed on the bottom surface of the first block 2008A and the second ring metal layer is formed on the top surface of the second block 2008B. For the second blank package 2000B, the first ring metal layer of the first barrier ring 2004A is formed on the bottom surface of the first block 2008A and the second ring metal layer of the first barrier ring 2004A is formed on the top surface of the second block 2008B. The first ring metal layer of the second barrier ring 2004B is formed on the bottom surface of the second block 2008B and the second ring metal layer of the second barrier ring 2004B is formed on the top surface of the third block 2008C. However, the first ring metal layers and the second ring metal layers still have photoresist on the upper surface. The remaining photoresist may be removed with a chemical or plasma strip.

In addition, the sub steps include forming the ring solder layers by applying a paste solder to the first ring metal layers and the second ring metal layers. The paste solder may be formed from tin-lead alloy solder or other tin-based alloy solder that includes silver, copper, antimony, or the like that melts at higher temperatures than the printed circuit board level solder which attaches the blank package 2000A, 2000B to a printed circuit board, such as the PCB 12. In various embodiments, the paste solder may melt at temperatures greater than or equal to approximately 700 degrees Fahrenheit, whereas the printed circuit board level solder may melt around approximately 360 degrees Fahrenheit. The paste solder may be applied to each first metal layer and each second metal layer using screen printing, stencil printing, or jet printing techniques, among others. Thus, the paste solder may be applied to the first metal layers on the bottom surfaces of the first block 2008A and the second block 2008B and the second metal layers on the top surfaces of the second block 2008B and the third block 2008C.

Referring to step 2104, a plurality of leads 2006 is attached to the barrier rings 2004. Attaching the leads 2006 may include performing a plurality of sub steps. The sub steps include forming one or more lead frames which include all of the leads 2006 for one blank package 2000. For the blank package 2000A, one lead frame is formed to be positioned between the first block 2008A and the second block 2008B. For the blank package 2000B, a first lead frame is formed to be positioned between the first block 2008A and the second block 2008B, and a second lead frame is formed to be positioned between the second block 2008B and the third block 2008C. The lead frames may be formed frame a sheet of metal and/or metal alloys, such as copper, tin, and the like, which is cut, stamped, or etched to form the individual leads 2006 along with a frame or panel to hold the leads 2006 together.

The sub steps further include placing the leads 2006 of the lead frames on the ring solder layer of their associated block 2008. For the blank package 2000A, the leads 2006 are placed on the ring solder layer on the second block 2008B. For the blank package 2000B, the leads 2006 of the first lead frame are placed on the ring solder layer on the second block 2008B, and the leads 2006 of the second lead frame are placed on the ring solder layer on the third block 2008C.

Referring to step 2105, a stack of the blocks 2008 and the leads 2006 is formed. For the blank package 2000A, the first block 2008A is positioned on the second block 2008B and the leads 2006 so that the leads 2006 extend outward from the edges of the joint of the first block 2008A and the second block 2008B. For the blank package 2000B, the first block 2008A is positioned on the second block 2008B and the first portion of the leads 2006, and the combination of the first block 2008A, the second block 2008B, and the first portion of the leads 2006 is positioned on the third block 2008C and the second portion of the leads 2006, so that the first portion of the leads 2006 extends outward from the joint of the first block 2008A and the second block 2008B, and the second portion of the leads 2006 extends outward from the joint of the second block 2008B and the third block 2008C.

Referring to step 2106, the leads 2006 and the barrier rings 2004 are reflowed. For the blank package 2000A, the leads 2006 and the ring solder layers of the barrier ring 2004 are reflowed. For the blank package 2000B, the first portion of the leads 2006 and the ring solder layers of the first barrier ring 2004A and the second portion of the leads 2006 and the ring solder layers, of the second barrier ring 2004B are all reflowed. The leads 2006 and the barrier rings 2004 may be reflowed in a heating chamber or a heat source may be applied to the leads 2006 and the barrier rings 2004.

After reflow, the frames are removed from the leads 2006, and the leads 2006 are bent in the appropriate direction. In addition, the leads 2006 may optionally be plated with nickel and/or palladium or the leads 2006 may be dipped in solder.

Another embodiment of a blank package 2200A is shown in FIGS. 31A-31C. An embodiment of a blank package 2200B is shown in FIGS. 32A-32C. The blank package 2200A, 2200B may be utilized to mimic or imitate electronic component packages that include a plurality of leads, wherein the leads are attached through side surfaces of the package. The blank package 2200A, 2200B includes a body 2202, one or more seal rings 2204, and a plurality of leads 2206.

The body 2202 includes a plurality of blocks 2208, wherein each block 2208 is generally transparent and may be the same as, or similar to, the body 14, described above. Thus, each block 2208 is typically solid with a box structure having a top surface, a bottom surface, and four side surfaces. In the exemplary embodiment of the blank package 2200A shown in FIGS. 31A, 31B, and 31C, the body 2202 includes a first block 2208A stacked one on top of a second block 2208B. In the exemplary embodiment of the blank package 2200B shown in FIGS. 32A, 32B, and 32C, the body 2202 includes the first block 2208A stacked one on top of the second block 2208B, which is stacked on top of a third block 2208C.

Each seal ring 2204 generally presents a seal to prevent foreign matter from entering the space between the adjacent blocks 2208. Each seal ring 2204 has a quadrilateral shape with an opening in the center and is formed from a resin or epoxy or the like. The blank package 2200A includes one seal ring 2204 positioned along the perimeter between the first block 2208A and the second block 2208B so that the outer edges of the seal ring 2204 are aligned with the outer edges of the first block 2208A and the second block 2208B. The blank package 2200B includes a first seal ring 2204A positioned along the perimeter between the first block 2208A and the second block 2208B and a second seal ring 2204B positioned along the perimeter between the second block 2208B and the third block 2208C. The outer edges of each of the seal rings 2204 are aligned with the outer edges of the first block 2208A, the second block 2208B, and the third block 2208C.

Each lead 2206 is formed from electrically conductive material such as metals and/or metal alloys including copper, tin, and the like, which may be plated with nickel and/or palladium. In the exemplary embodiment of the blank package 2200A, the leads 2206 are spaced apart from one another and attached to the seal ring 2204. Each lead 2206 includes a first end attached to the seal ring 2204 and a second end that extends outward and downward from the body 2202.

In the exemplary embodiment of the blank package 2200B, a first portion of the leads 2206 are spaced apart from one another and attached to the first seal ring 2204A. A second portion of the leads 2206 are spaced apart from one another and attached to the second seal ring 2204B. In addition, the second portion of the leads 2206 is staggered laterally from the first portion of leads 2206. Each lead 2206 of the first portion of the leads 2206 includes a first end attached to the first seal ring 2204A and a second end that extends outward and downward from the body 2202. Each lead 2206 of the second portion of the leads 2206 includes a first end attached to the second seal ring 2204B and a second end that extends outward and downward from the body 2202.

Utilizing two or more blocks of glass material stacked one on another with leads positioned therebetween more accurately mimics or imitates an encapsulated electronic component package. Utilizing two layers of leads that staggered or offset reduces the risk of internal solder bridging between adjacent leads. Including a seal layer reduces the possibility of foreign matter entering between the blocks and obscuring visibility. In addition, utilizing a resin or epoxy adhesive to attach the leads to the blocks may provide a cost-effective structure for mimicking or imitating an electronic component package.

FIG. 32D depicts a listing of at least a portion of the steps of an exemplary method 2300 of forming a blank package 2200A, 2200B that mimics an electronic component package that includes a plurality of leads, wherein the leads are attached through side surfaces of the package. The steps may be performed in the order shown in FIG. 32D, or they may be performed in a different order. Furthermore, some steps may be performed concurrently as opposed to sequentially. In addition, some steps may be optional or may not be performed.

Referring to step 2301, functional electronic component package specifications are received, including body dimensions and lead sizes, shapes, and locations. The leads of the functional electronic component package may extend from the side surfaces of the package with one layer of leads or two layers of leads extending from each side surface.

Referring to step 2302, a plurality of blocks 2208 to form a body 2202 of the blank package 2200A, 2200B is formed from transparent electrically insulating material. Typically, the blocks 2208 are stacked one on another to form the body 2202, which may have the same, or similar, dimensions as a body of the functional component package. For blank package 2200A, the body 2202 includes a first block 2208A stacked one on top of a second block 2208B. For the blank package 2200B, the body 2202 includes the first block 2208A stacked one on top of the second block 2208B, which is stacked on top of a third block 2208C.

Each block 2208 may be formed from various types of glass, such as lead glass, aluminosilicate glass, high silica glass, fused silica glass, silicate glass, or borosilicate glass. The blocks 2208 are transmissive to light in the visible spectrum. Preferably, the material of the blocks 2208 is capable of withstanding high temperature. The blocks 2208 are typically solid with a box structure having a top surface, a bottom surface, and four side surfaces.

Step 2302 may further include cleaning and degreasing the blocks 2208. In addition, the blocks 2208 may undergo a plasma desmear process in which oxygen plasma or gas is applied to the surfaces of the blocks 2208 to remove organic material and activate the surfaces so that the surfaces are more susceptible to bonding with other material or objects in subsequent steps.

Referring to step 2303, one or more seal rings 2204 are formed on the blocks 2208. Each seal ring 2204 has a quadrilateral shape with an opening in the center. The seal rings 2204 may be formed from one or more resins or preimpregnated (prepreg) fibers with an epoxy, phenolic resin, Teflon, or the like. The seal rings 2204 are deposited directly onto the body 2202 along the perimeter in the locations of the conductive pad or electrode on the electronic component package that the blank package 2200 is mimicking or imitating. The seal rings 2204 may be deposited using stencil, screen, or jet printing methods. With the blank package 2200A, the seal ring 2204 is deposited on the bottom surface of the first block 2208A and the top surface of the second block 2208B. With the blank package 2200B, the first seal ring 2204A is deposited on the bottom surface of the first block 2208A and the top surface of the second block 2208B. The second seal ring 2204B is deposited on the bottom surface of the second block 2208B and the top surface of the third block 2208C.

Referring to step 2304, a plurality of leads 2206 is formed from one or more lead frames. The lead frames may be formed from a sheet of metal and/or metal alloys, such as copper, tin, and the like, which is cut, stamped, or etched to form each of the leads 2206 in the proper relative location, along with a frame or panel to hold the leads 2206 together. With the blank package 2200A, a single lead frame is formed. With the blank package 2200B, a first lead frame is formed for the leads 2206 between the first block 2208A and the second block 2208B, and a second lead frame is formed for the leads between the second block 2208B and the third block 2208C.

Referring to step 2305, a laminate stack is formed which includes the blocks 2208 with the seal rings 2204 positioned thereon and the leads 2206 (formed by the lead frame). With the blank package 2200A, the second block 2208B may be positioned. The leads 2206 (with the lead frame) may be placed on the upper surface of the second block 2208B with the leads 2206 in contact with the seal ring 2204. The first block 2208A may be placed on top of the second block 2208B with the seal ring 2204 on the first block 2208A being aligned with the seal ring 2204 on the second block 2208B and in contact with the leads 2206.

With the blank package 2200B, the third block 2208C may be positioned. The leads 2206 of the second lead frame may be placed on the upper surface of the third block 2208C with each lead 2206 in contact with the lower half of the second seal ring 2204B. The second block 2208B may be placed on top of the third block 2208C with the upper half of the second seal ring 2204B on the second block 2208B being aligned with the lower half of the second seal ring 2204B on the third block 2208C and in contact with the leads 2206. The leads 2206 of the first lead frame may be placed on the upper surface of the second block 2208B with each lead 2206 in contact with the lower half of the first seal ring 2204B. The first block 2208A may be placed on top of the second block 2208B with the upper half of the first seal ring 2204A on the first block 2208A being aligned with the lower half of the first seal ring 2204B on the second block 2208B and in contact with the leads 2206.

Pressure and heat may be applied to the upper surface and the lower surface of the body 2202 in order to cure the adhesive pads 2204 and bond the leads 2206 to the body 2202. The seal rings 2204 are cured as well. After curing, the leads 2206 on the lead frame(s) are bent to shape, if necessary, and cut to the proper length.

An embodiment of a windowed printed circuit board, or windowed printed wiring board, includes windowed printed circuit board 2400A shown in FIGS. 33A and 33B, windowed printed circuit board 2400B shown in FIGS. 34A and 34B, and windowed printed circuit board 2400C shown in FIGS. 35A and 35B. The windowed printed circuit board 2400A, 2400B includes a first insulating layer 2402, a second insulating layer 2404, an adhesive layer 2406, a conductive layer 2408, a solder mask layer 2410, a first window pane 2412, and a second window pane 2414. The windowed printed circuit board 2400A, 2400B optionally includes a plurality of conductive pads 2416, a plurality of solder pads 2418, and a plurality of leads 2420. The windowed printed circuit board 2400A, 2400B mimics any functional printed circuit board and may provide the same functionality, but also provides a window (i.e., an opening) in the printed circuit board body in a region of interest so that a lower surface of one or more electronic component packages can be viewed after the packages have been soldered in place on the printed circuit board. The windowed printed circuit board 2400A provides a window that is smaller than a footprint of one of the electronic component packages. The windowed printed circuit board 2400B and the windowed printed circuit board 2400C each provide a window that is larger than one or more electronic package footprints.

The first insulating layer 2402 and the second insulating layer 2404 are each formed from rigidized material that includes various electrically insulating or dielectric materials, such as fiberglass, woven glass, matte glass, cotton paper, phenolic cotton paper, polyester, and the like, or combinations thereof. The first insulating layer 2402 and the second insulating layer 2404 each have a quadrilateral shape with an upper surface, a lower surface, and four side edges and have the same dimensions as one another. The first insulating layer 2402 and the second insulating layer 2404 each have an opening from the top surface to the bottom surface positioned in a region of interest that forms the window of the windowed printed circuit board 2400. The opening is generally quadrilateral shaped, although other shapes are possible. In addition, the opening on the first insulating layer 2402 is the same size as, and aligned with, the opening on the second insulating layer 2404. Furthermore, the first insulating layer 2402 and the second insulating layer 2404 may each include a plurality of smaller generally circular openings that form plated through hole vias, blind vias, buried vias, and the like. In various embodiments, the windowed printed circuit board 2400A, 2400B may include additional insulating layers.

The adhesive layer 2406 generally adheres the first insulating layer 2402 to the second insulating layer 2404 and/or the conductive layer 2408 to the first insulating layer 2402, the second insulating layer 2404, or both. The adhesive layer 2406 may be formed from one or more resins or preimpregnated (prepreg) fibers with an epoxy, phenolic resin, Teflon, or the like. The adhesive layer 2406 has a quadrilateral shape with an upper surface, a lower surface, and four side edges and is generally very thin compared to its area, or length and width dimensions. The adhesive layer 2406 also includes an opening from the top surface to the bottom surface positioned in the region of interest. The opening has the same, or similar, aspect ratio compared to the openings of the first insulating layer 2402 and the second insulating layer 2404, but has a smaller size. Furthermore, the adhesive layer 2406 may include a plurality of smaller generally circular openings to accommodate vias. In various embodiments, the windowed printed circuit board 2400A, 2400B may include additional adhesive layers.

The conductive layer 2408 may include one or more conductive electronic signal traces, electric power or ground traces, one or more signal, power, or ground lands that form one of a plurality of package footprints, full or partial power planes, or full or partial ground planes. The conductive layer 2408 is formed from metals and/or metal alloys typically including copper, but also including nickel, aluminum, gold, silver, palladium, zinc, tin, lead, and the like. In various embodiments, the windowed printed circuit board 2400A, 2400B may include additional conductive layers.

The solder mask layer 2410 generally protects the conductive layer 2408 from oxidation and prevents solder from flowing on portions of the conductive layer 2408 cover by the solder mask layer 2410. The solder mask layer 2410 is formed from one or more polymers that create a thin layer or film. The solder mask layer 2410 generally covers the entire surface of the first insulating layer 2402. If the windowed printed circuit board 2400A, 2400B includes a second conductive layer, then the windowed printed circuit board 2400A, 2400B may also include a second solder mask layer 2410 covering the surface of the second insulating layer 2404. The solder mask layer 2410 also includes a plurality of openings, with one opening being aligned with the openings of the first insulating layer 2402 and the second insulating layer 2404 and the other openings being located where solder is to be applied or reflowed such as conductive pads for electronic component footprints.

The first window pane 2412 and the second window pane 2414 in combination provide a transparent cover for the openings in the first insulating layer 2402 and the second insulating layer 2404 that form the window. The first window pane 2412 and the second window pane 2414 are each formed from generally transparent, or translucent, electrically insulating material including various types of glass, such as lead glass, aluminosilicate glass, high silica glass, fused silica glass, silicate glass, or borosilicate glass. The first window pane 2412 and the second window pane 2414 each have a quadrilateral shape with an upper surface, a lower surface, and four side edges and have roughly the same dimensions as the openings in the first insulating layer 2402 and the second insulating layer 2404.

With the windowed printed circuit board 2400B and the windowed printed circuit board 2400C, the first window pane 2412 and/or the second window pane 2414 may have a plurality of conductive pads 2416 on one surface. The conductive pads 2416 may be the same as, or similar to, the conductive pads 404, for example. The conductive pads 2416 may be positioned in the same locations as the conductive lands (or pads) that form an electronic package footprint, implemented on the functional printed circuit board.

Each solder pad 2418 electrically connects and/or mechanically connects one conductive pad 2416 on the first window pane 2412 or the second window pane 2414 to the conductive layer 2408. The solder pads 2418 may be formed from tin-lead alloy solder or other tin-based alloy solder that includes silver, copper, antimony, or the like. In various embodiments, the solder pads 2418 may be formed from solder that melts at temperatures greater than or equal to approximately 700 degrees Fahrenheit. The solder pads 2418 are utilized with the windowed printed circuit board 2400B and the windowed printed circuit board 2400C. With the windowed printed circuit board 2400B, the solder pads 2418 are typically positioned on the first window pane 2412 or the second window pane 2414 between at least a portion of the conductive pads 2416 and the conductive layer 2408. With the windowed printed circuit board 2400C, the solder pads 2418 are typically positioned on at least a portion of the conductive pads 2416, the conductive layer 2408, or both.

Each lead 2420 electrically connects and/or mechanically connects one conductive pad 2416 on the first window pane 2412 or the second window pane 2414 to the conductive layer 2408. The leads 2420 are utilized with the windowed printed circuit board 2400C. Typically, each lead 2420 connects to the conductive pad 2416 and the conductive layer 2408 through the solder pads 2418. That is, each lead 2420 is attached to a first solder pad 2418 that is connected to the conductive pad 2416 and to a second solder pad 2418 that is connected to the conductive layer 2408.

Referring to FIGS. 33A and 33B, the windowed printed circuit board 2400A has a structure as follows. The first insulating layer 2402 and the second insulating layer 2404 are each attached to the adhesive layer 2406, with the lower surface of the first insulating layer 2402 in contact with the upper surface of the adhesive layer 2406 and the upper surface of the second insulating layer 2404 in contact with the lower surface of the adhesive layer 2406. The openings of the first insulating layer 2402 and the second insulating layer 2404 are aligned with one another and with the opening of the adhesive layer 2406, wherein material from the adhesive layer 2406 extends inward into the openings of the first insulating layer 2402 and the second insulating layer 2404. The first window pane 2412 is positioned in the opening of the first insulating layer 2402 and in planar alignment with the first insulating layer 2402. A portion of the lower surface of the first window pane 2412 is in contact with, and adhered to, the extending material of the adhesive layer 2406. The second window pane 2414 is positioned in the opening of the second insulating layer 2404 and in planar alignment with the second insulating layer 2404. A portion of the upper surface of the second window pane 2414 is in contact with, and adhered to, the extending material of the adhesive layer 2406.

The conductive layer 2408 is positioned on top of the first insulating layer 2402 and may be attached thereto with an additional adhesive layer. In addition, the windowed printed circuit board 2400A may include a second conductive layer, which provides traces, footprints, and the like, positioned on the lower surface of the second insulating layer 2404. The second conductive layer may also be attached with an adhesive layer. The solder mask layer 2410 is positioned on the first insulating layer 2402 and the conductive layer 2408 and includes a first opening which aligns with the openings of the first insulating layer 2402 and the second insulating layer 2404. The solder mask layer 2410 includes additional openings that are located in alignment with the lands (or pads) of electronic component footprints where solder is to be applied or reflowed. In some embodiments, the windowed printed circuit board 2400A may include a solder mask layer positioned on the second insulating layer 2404.

Referring to FIGS. 34A and 34B, the windowed printed circuit board 2400B has a structure as follows. The first insulating layer 2402 and the second insulating layer 2404 are each attached to the adhesive layer 2406, with the lower surface of the first insulating layer 2402 in contact with the upper surface of the adhesive layer 2406 and the upper surface of the second insulating layer 2404 in contact with the lower surface of the adhesive layer 2406. The openings of the first insulating layer 2402 and the second insulating layer 2404 are aligned with one another and with the opening of the adhesive layer 2406, wherein material from the adhesive layer 2406 extends inward into the openings of the first insulating layer 2402 and the second insulating layer 2404. The first window pane 2412 is positioned in the opening of the first insulating layer 2402 and in planar alignment with the first insulating layer 2402. A portion of the lower surface of the first window pane 2412 is in contact with, and adhered to, the extending material of the adhesive layer 2406. The second window pane 2414 is positioned in the opening of the second insulating layer 2404 and in planar alignment with the second insulating layer 2404. A portion of the upper surface of the second window pane 2414 is in contact with, and adhered to, the extending material of the adhesive layer 2406. The first window pane 2412, the second window pane 2414, or both, include conductive pads 2416 positioned to mimic one or more electronic component packages. In addition, the first window pane 2412, the second window pane 2414, or both, include solder pads 2418 positioned adjacent to at least a portion of the conductive pads 2416.

The conductive layer 2408 is positioned on top of the first insulating layer 2402 and may be attached thereto with an additional adhesive layer. The conductive layer 2408 may include a plurality of conductive traces that electrically and/or mechanically connected to the solder pads 2418 on the first window pane 2412. In addition, the windowed printed circuit board 2400B may include a second conductive layer, which provides traces, footprints, and the like, positioned on the lower surface of the second insulating layer 2404. The second conductive layer may also be attached with an adhesive layer. The second conductive layer may also include a plurality of conductive traces that electrically and/or mechanically connected to the solder pads 2418 on the second window pane 2414. The solder mask layer 2410 is positioned on the first insulating layer 2402 and the conductive layer 2408 and includes a first opening which aligns with the openings of the first insulating layer 2402 and the second insulating layer 2404. The solder mask layer 2410 includes additional openings that are located in alignment with the lands (or pads) of electronic component footprints where solder is to be applied or reflowed. In some embodiments, the windowed printed circuit board 2400B may include a solder mask layer positioned on the second insulating layer 2404.

Referring to FIGS. 35A and 35B, the windowed printed circuit board 2400C has a structure as follows. The first insulating layer 2402 and the second insulating layer 2404 are each attached to the adhesive layer 2406, with the lower surface of the first insulating layer 2402 in contact with the upper surface of the adhesive layer 2406 and the upper surface of the second insulating layer 2404 in contact with the lower surface of the adhesive layer 2406. The openings of the first insulating layer 2402 and the second insulating layer 2404 are aligned with one another and with the opening of the adhesive layer 2406, wherein material from the adhesive layer 2406 extends inward into the openings of the first insulating layer 2402 and the second insulating layer 2404. The first window pane 2412 is positioned in the opening of the first insulating layer 2402 and in planar alignment with the first insulating layer 2402. A portion of the lower surface of the first window pane 2412 is in contact with, and adhered to, the extending material of the adhesive layer 2406. The second window pane 2414 is positioned in the opening of the second insulating layer 2404 and in planar alignment with the second insulating layer 2404. A portion of the upper surface of the second window pane 2414 is in contact with, and adhered to, the extending material of the adhesive layer 2406. The first window pane 2412, the second window pane 2414, or both, include conductive pads 2416 positioned to mimic one or more electronic component packages. In addition, the first window pane 2412, the second window pane 2414, or both, include solder pads 2418 positioned on at least a portion of the conductive pads 2416.

The conductive layer 2408 is positioned on top of the first insulating layer 2402 and may be attached thereto with an additional adhesive layer. The conductive layer 2408 may include a plurality of conductive traces, at least a portion of which have one solder pad 2418 positioned thereon. In addition, the windowed printed circuit board 2400C may include a second conductive layer, which provides traces, footprints, and the like, positioned on the lower surface of the second insulating layer 2404. The second conductive layer may also be attached with an adhesive layer. The second conductive layer may also include a plurality of conductive traces, at least a portion of which have one solder pad 2418 positioned thereon. Each lead 2420 electrically and/or mechanically connects one solder pad 2418 on a conductive pad 2416 to one solder pad 2418 on a conductive trace. The solder mask layer 2410 is positioned on the first insulating layer 2402 and the conductive layer 2408 and includes a first opening which aligns with the openings of the first insulating layer 2402 and the second insulating layer 2404. The solder mask layer 2410 includes additional openings that are located in alignment with the lands (or pads) of electronic component footprints where solder is to be applied or reflowed. In some embodiments, the windowed printed circuit board 2400C may include a solder mask layer positioned on the second insulating layer 2404.

FIG. 35C depicts a listing of at least a portion of the steps of an exemplary method 2500 of forming a windowed printed circuit board 2400A, 2400B that mimics a functional printed circuit board. The steps may be performed in the order shown in FIG. 35C, or they may be performed in a different order. Furthermore, some steps may be performed concurrently as opposed to sequentially. In addition, some steps may be optional or may not be performed.

Referring to step 2501, data is received regarding functional printed circuit board specifications. The data may include dimensions of the printed circuit board and its components along with locations of package footprints and conductive traces. In some embodiments, the entire actual printed circuit board may be replicated. In other embodiments, only a portion of the printed circuit board may be replicated for inspecting the results of the solder and cleaning processes. In addition, the region of interest including the location of the window may also be received or determined.

Referring to step 2502, a first window pane 2412 and a second window pane 2414 are formed. The first window pane 2412 and the second window pane 2414 each are formed from generally transparent, or translucent, electrically insulating material including various types of glass, such as lead glass, aluminosilicate glass, high silica glass, fused silica glass, silicate glass, or borosilicate glass. The first window pane 2412 and the second window pane 2414 each have a quadrilateral shape with an upper surface, a lower surface, and four side edges.

In some embodiments, such as with the windowed printed circuit board 2400B and the windowed printed circuit board 2400C, the first window pane 2412 and optionally the second window pane 2414 each include a plurality of conductive pads 2416. The conductive pads 2416 may be formed by performing a plurality of sub steps including forming a seed layer of electrically conductive material. The seed layer is positioned in contact with, or formed on, the entire upper surface of the first window pane 2412. The seed layer may include metals and/or metal alloys, such as titanium, copper, nickel, silver, gold, and the like. Typically, the seed layer is a thin film. The seed layer may be formed on the upper surface of the first window pane 2412 by utilizing electroless plating, dipping, or immersion processes. Alternatively, the seed layer is formed on the upper surface of the first window pane 2412 by utilizing PVD techniques or CVD techniques. The sub steps further include applying an upper metal layer formed from metals and/or metal alloys on top of the seed layer to increase the thickness of the conductive pads 2416. The upper metal layer may be applied using electrolytic plating techniques.

The sub steps also include removing portions of the upper metal layer and the seed layer in order to form the conductive pads 2416. The sub steps include applying a layer of photoresist to the surface of the upper metal layer. If PVD techniques or CVD techniques were used to deposit the seed layer, then a layer of hexamethyldisilazane (HMDS) is applied before the photoresist. The photoresist may be embodied by one of several types of photoresist, including photopolymeric, photodecomposing, and photocrosslinking photoresist. The photoresist may be applied using any of several methods, including spin coating. The sub steps further include curing the photoresist, exposing the photoresist to ultraviolet light with a positive or negative patterned mask, developing the photoresist, and optionally performing a hard bake of the photoresist. The mask may be patterned with a positive or negative image of the layout of the conductive pads 2416. The sub steps further include etching the portion of the upper metal layer which was exposed by the patterned mask and the underlying seed layer using a chemical etch, ion milling, or ion beam etching. After etching, the conductive pads 2416 are formed. However, the conductive pads 2416 each still have photoresist on the upper surface. The remaining photoresist may be removed with a chemical or plasma strip.

The windowed printed circuit board 2400C may also include leads 2420 connected to the conductive pads 2416. The leads 2420 may be attached when the first window pane 2412 is first formed or later in the method 2500, as indicated below. Attaching the leads 2420 to the conductive pads 2416 includes performing a plurality of sub steps including applying a plurality of solder pads 2418 to the conductive pads 2416, wherein each solder pad 2418 is applied to a successive one of the conductive pads 2416. The solder pad 2418 may be formed from tin-lead alloy solder paste or other tin-based alloy solder paste that includes silver, copper, antimony, or the like that melts at high temperatures. In various embodiments, the solder pad 2418 may melt at temperatures greater than or equal to approximately 700 degrees Fahrenheit. The solder pad 2418 may be applied to each conductive pad 2416 using screen printing, stencil printing, or jet printing techniques, among others, wherein the solder may be in a paste form.

The sub steps further include forming a lead frame which includes all of the leads 2420 for the first window pane 2412. The lead frame may be formed frame a sheet of metal and/or metal alloys, such as copper, tin, and the like, which is cut, stamped, or etched to form the individual leads 2420 along with a frame or panel to hold the leads 2420 together. The sub steps further include aligning the leads 2420 of the lead frame with their associated conductive pads 2416. The leads 2420 are positioned such that each lead 2420 contacts a successive one of the solder pads 2418 (positioned on each conductive pad 2416). The sub steps further include reflowing the lead frame and the solder pads 2418 to form a mechanical and electrical connection between each lead 2420 and its associated conductive pad 2416. The reflow may be performed by heating the first window pane 2412, the conductive pads 2416, the solder pads 2418, and the lead frame in a heating chamber or by applying a heat source to the lead frame. The sub steps further include removing the frame from the leads 2420. The sub steps may optionally include plating the leads 2420 with nickel and/or palladium or dipping the leads 2420 in solder.

Referring to step 2503, a first insulating layer 2402 and a second insulating layer 2404 are formed. The first insulating layer 2402 and the second insulating layer 2404 are each formed from rigidized material that includes various electrically insulating or dielectric materials, such as fiberglass, woven glass, matte glass, cotton paper, phenolic cotton paper, polyester, and the like, or combinations thereof. The first insulating layer 2402 and the second insulating layer 2404 each have a quadrilateral shape with an upper surface, a lower surface, and four side edges and have the same dimensions as one another. The first insulating layer 2402 and the second insulating layer 2404 each have an opening from the top surface to the bottom surface positioned in a region of interest that forms the window of the windowed printed circuit board 2400. The opening is generally quadrilateral shaped, although other shapes are possible. In addition, the opening on the first insulating layer 2402 is the same size as, and aligned with, the opening on the second insulating layer 2404. Furthermore, the openings each have dimensions approximately equal to the dimensions of the first window pane 2412 or the second window pane 2414.

Referring to step 2504, an adhesive layer 2406 is formed. The adhesive layer 2406 may be formed from one or more resins or preimpregnated (prepreg) fibers with an epoxy, phenolic resin, Teflon, or the like. The adhesive layer 2406 has a quadrilateral shape with an upper surface, a lower surface, and four side edges and is generally very thin compared to its area, or length and width dimensions. The adhesive layer 2406 also includes an opening from the top surface to the bottom surface positioned in the region of interest. The opening has the same, or similar, aspect ratio compared to the openings of the first insulating layer 2402 and the second insulating layer 2404, but has a smaller size.

Referring to step 2505, a stack is formed. The stack includes the second insulating layer 2404 positioned beneath the adhesive layer 2406 which is positioned beneath the first insulating layer 2402. The openings of the layers are aligned with one another.

Referring to step 2506, the second window pane 2414 is positioned in the opening of the second insulating layer 2404.

Referring to step 2507, the first window pane 2412 is positioned in the opening of the first insulating layer 2402.

Referring to step 2508, a plurality of conductive features are formed on at least the first insulating layer 2402. The conductive features are formed from a conductive layer 2408 and may include one or more conductive electronic signal traces, electric power or ground traces, one or more signal, power, or ground lands that form one of a plurality of electronic component package footprints, full or partial power planes, or full or partial ground planes. The conductive layer 2408 is formed from metals and/or metal alloys typically including copper, but also including nickel, aluminum, gold, silver, palladium, zinc, tin, lead, and the like. In various embodiments, the windowed printed circuit board 2400A, 2400B may include additional conductive layers.

Forming the conductive features includes performing a plurality of sub steps including adding additional layers to the stack formed in step 2505. A second, or additional, adhesive layer, of the same or similar composition to the adhesive layer 2406, is applied or positioned to cover and contact the upper surface of the first insulating layer 2402 and the upper surface of the first window pane 2412. A metal layer, including a metal film or foil formed from metals or metal alloys such as copper, is positioned to cover and contact the second adhesive layer. The sub steps further include applying a laminate press to the stack of metal layer, the second adhesive layer, the first insulating layer 2402, the first window pane 2412, the adhesive layer 2406, the second insulating layer 2404, and the second window pane 2414.

The sub steps also include removing a portion of the second adhesive layer and a portion of the metal layer to form the conductive features in the conductive layer 2408 positioned on the first insulating layer 2402. The portions of the layers may be removed by performing a plurality of additional sub steps including applying a layer of photoresist to the surface of the metal layer. The photoresist may be embodied by one of several types of photoresist, including photopolymeric, photodecomposing, and photocrosslinking photoresist. The photoresist may be applied using any of several methods, including spin coating. The sub steps further include curing the photoresist, exposing the photoresist to ultraviolet light with a positive or negative patterned mask, developing the photoresist, and optionally performing a hard bake of the photoresist. The mask may be patterned with a positive or negative image of the layout of the conductive features, i.e., the electronic component package footprints, the conductive traces, and the like, on the conductive layer 2408. The sub steps may further include etching the portion of the metal layer which was exposed by the patterned mask and the underlying adhesive layer using a chemical etch, ion milling, or ion beam etching. After etching, the conductive features are formed. However, the conductive features still have photoresist on the upper surface. The remaining photoresist may be removed with a chemical or plasma strip.

In some embodiments, the windowed printed circuit board 2400A, 2400B may include conductive features formed on a second conductive layer 2408 that is positioned on the second insulating layer 2404. The sub steps of step 2508 may be repeated with layers of adhesive and metal positioned on the second insulating layer 2404.

Referring to step 2509, each conductive feature on the first window pane 2412 is attached to a successive one of the conductive features on the first insulating layer 2402. The attachment process includes performing a plurality of sub steps applying a plurality of solder pads 2418 adjacent to the conductive pads 2416 or on conductive features on the first insulating layer 2402. For the windowed printed circuit board 2400B, each solder pad 2418 is positioned adjacent to a successive one of the conductive pads 2416. For the windowed printed circuit board 2400C, each solder pad 2418 is positioned on a successive one of the conductive features on the first insulating layer 2402, such as a conductive trace or a conductive pad. The solder pad 2418 may be formed from tin-lead alloy solder paste or other tin-based alloy solder paste that includes silver, copper, antimony, or the like that melts at high temperatures. In various embodiments, the solder pad 2418 may melt at temperatures greater than or equal to approximately 700 degrees Fahrenheit. The solder pad 2418 may be applied to the appropriate location using screen printing, stencil printing, or jet printing techniques, among others, wherein the solder may be in a paste form.

For the windowed printed circuit board 2400B, the sub steps further include reflowing the solder pads 2418 adjacent to each conductive pad 2416 on the first window pane 2412. The reflow may be executed in a heating chamber or a heat source may be applied to the windowed printed circuit board 2400B. After reflow, each conductive pad 2416 on the first window pane 2412 is electrically and/or mechanically connected to a successive one of the conductive features on the first insulating layer 2402, such as a conductive trace or a conductive pad through the solder pad 2418.

For the windowed printed circuit board 2400C, the sub steps further include attaching the leads 2420, if they were not already attached in step 2502. Attaching the leads 2420 includes forming a lead frame which includes all of the leads 2420 for the first window pane 2412. The lead frame may be formed frame a sheet of metal and/or metal alloys, such as copper, tin, and the like, which is cut, stamped, or etched to form the individual leads 2420 along with a frame or panel to hold the leads 2420 together. The sub steps further include aligning the leads 2420 of the lead frame with their associated conductive pads 2416 and the conductive features on the first insulating layer 2402. The leads 2420 are positioned such that each lead 2420 contacts a successive one of the solder pads 2418 (positioned on each conductive pad 2416) and the solder pad 2418 on its associated conductive feature on the first insulating layer 2402. The sub steps further include reflowing the lead frame and the solder pads 2418 to form a mechanical and electrical connection between each lead 2420 and its associated conductive pad 2416. The reflow may be performed by heating the first window pane 2412, the conductive pads 2416, the solder pads 2418, and the lead frame in a heating chamber or by applying a heat source to the lead frame. The sub steps further include removing the frame from the leads 2420. The sub steps may optionally include plating the leads 2420 with nickel and/or palladium or dipping the leads 2420 in solder.

Referring to step 2510, a solder mask layer 2410 is applied. The solder mask layer 2410 is formed from one or more polymers that create a thin layer or film. The solder mask layer 2410 generally covers the entire surface of the first insulating layer 2402. If the windowed printed circuit board 2400A, 2400B includes a second conductive layer, then the windowed printed circuit board 2400A, 2400B may also include a second solder mask layer 2410 covering the surface of the second insulating layer 2404. The solder mask layer 2410 also includes a plurality of openings, with one opening being aligned with the openings of the first insulating layer 2402 and the second insulating layer 2404 and the other openings being located where solder is to be applied or reflowed such as conductive pads for electronic component footprints. The solder mask layer 2410 may be applied using silkscreen or other screen printing processes.

Another embodiment of a windowed printed circuit board, or windowed printed wiring board, includes windowed printed circuit board 2600A shown in FIGS. 36A-36C, and windowed printed circuit board 2600B shown in FIGS. 37A and 37B. The windowed printed circuit board 2600A, 2600B includes a first insulating layer 2602, a second insulating layer 2604, an adhesive layer 2606, a conductive layer 2608, a solder mask layer 2610, a first window pane 2612, a second window pane 2614, a plurality of vias 2616, a plurality of seals 2618, and a plurality of fasteners 2620. The windowed printed circuit board 2600A, 2600B optionally includes a plurality of conductive pads 2622, a plurality of solder pads 2624, and a plurality of leads 2626. The windowed printed circuit board 2600A, 2600B mimics any functional printed circuit board and may provide the same functionality, but also provides a window (i.e., an opening) in the printed circuit board body in a region of interest so that a lower surface of one or more electronic component packages can be viewed after the packages have been soldered in place on the printed circuit board. The windowed printed circuit board 2600A provides a window that is larger than one or more electronic package footprints. The windowed printed circuit board 2600B provides a window that is smaller than a footprint of one of the electronic component packages.

The first insulating layer 2602, the second insulating layer 2604, the adhesive layer 2606, the conductive layer 2608, the solder mask layer 2610, the first window pane 2612, and the second window pane 2614 are the same as, or substantially similar to, the first insulating layer 2402, the second insulating layer 2404, the adhesive layer 2406, the conductive layer 2408, the solder mask layer 2410, the first window pane 2412, and the second window pane 2414, respectively. With the windowed printed circuit board 26006, the first window pane 2612 and the second window pane 2614 each may include a plurality of through hole openings to accommodate the fasteners 2620.

Each via 2616 provides a through hole opening in which a successive one of the fasteners 2620 is positioned. The vias 2616 each extend through the first insulating layer 2602, the second insulating layer 2604, the adhesive layer 2606, the conductive layer 2608, the solder mask layer 2610, and any other traditional printed circuit board layers. Each via 2616 is plated with metals and/or metal alloys, including nickel, among others to form a sleeve within the opening.

Each seal 2618 generally provides a fluid tight barrier between the outside world and the space between the first window pane 2612 and the second window pane 2614 in order to prevent flux cleaning solution or other materials from contaminating the window. The seals 2618 are each formed from elastic or resilient polymers. The shape of each seal 2618 may vary according to the embodiment of the windowed printed circuit board 2600. For the windowed printed circuit board 2600A, each seal 2618 may have a roughly quadrilateral shape. The windowed printed circuit board 2600A may include a first seal 2618A and a second seal 2618B. The first seal 2618A is positioned between, and in contact with, a portion of a lower surface of the first window pane 2612 and a portion of an upper surface of the adhesive layer 2606. The second seal 2618B is positioned between, and in contact with, a portion of an upper surface of the adhesive layer 2606 and a portion of a lower surface of the second window pane 2614.

For the windowed printed circuit board 2600B, each seal 2618 may have a roughly circular shape. The windowed printed circuit board 2600B may include a first seal 2618 and a second seal 2618 for each fastener 2620. The first seal 2618 is positioned around the plated metal of one end of the via 2616 associated with the fastener 2620 and in contact with a portion of the lower surface of the first window pane 2612. The second seal 2618 is positioned around the plated metal of the other end of the via 2616 associated with the fastener 2620 and in contact with a portion of the upper surface of the second window pane 2614.

Each fastener 2620 generally fastens the first window pane 2612 and the second window pane 2614 in the window, i.e., the openings in the first insulating layer 2602 and the second insulating layer 2604. Each fastener 2620 is formed from a bolt and a nut, a swaged rivet, or similar through hole components. The fasteners 2620 are each positioned in a successive one of the vias 2616.

Each conductive pad 2622 generally provides a mechanical contact which can be pressed to hold the first window pane 2612 and the second window pane 2614 in place for the windowed printed circuit board 2600A. Each conductive pad 2622 may be the same as, or similar to, the conductive pad 404, for example. Each conductive pad 2622 may be positioned on the upper surface of the first window pane 2612 and/or the lower surface of the second window pane 2614. The first window pane 2612 and the second window pane 2614 each may also have conductive pads on their surfaces which form electronic component package footprints.

Each solder pad 2624 electrically connects and/or mechanically connects one conductive pad 2622 on the first window pane 2612 or the second window pane 2614 to a successive one of the leads 2626 for the windowed printed circuit board 2600A. The solder pads 2624 may be formed from tin-lead alloy solder or other tin-based alloy solder that includes silver, copper, antimony, or the like. In various embodiments, the solder pads 2624 may be formed from solder that melts at temperatures greater than or equal to approximately 700 degrees Fahrenheit. The solder pads 2624 are typically positioned on the conductive pads 2622.

Each lead 2626 mechanically connects the solder pad 2624 on one conductive pad 2622 on the first window pane 2612 or the second window pane 2614 to one fastener 2620 for the windowed printed circuit board 2600A. Each lead 2626 is generally rigid and may include a ring opening at one end which couples to the fastener 2620.

Referring to FIGS. 36A, 36B, and 36C, the windowed printed circuit board 2600A has a structure as follows. The first insulating layer 2602 and the second insulating layer 2604 are each attached to the adhesive layer 2606, with the lower surface of the first insulating layer 2602 in contact with the upper surface of the adhesive layer 2606 and the upper surface of the second insulating layer 2604 in contact with the lower surface of the adhesive layer 2606. The openings of the first insulating layer 2602 and the second insulating layer 2604 are aligned with one another and with the opening of the adhesive layer 2606, wherein material from the adhesive layer 2606 extends inward into the openings of the first insulating layer 2602 and the second insulating layer 2604. The first seal 2618A is positioned in the opening of the first insulating layer 2602 so that the first seal 2618A is in contact with the extending material of the adhesive layer 2606. The first window pane 2612 is positioned in the opening of the first insulating layer 2602 with the conductive pads 2622 facing upward so that a portion of the lower surface of the first window pane 2612 is in contact with the first seal 2618A. The second seal 2618B is positioned in the opening of the second insulating layer 2604 so that the second seal 2618B is in contact with the extending material of the adhesive layer 2606. The second window pane 2614 is positioned in the opening of the second insulating layer 2604 with the conductive pads 2622 facing downward so that a portion of the upper surface of the second window pane 2614 is in contact with the second seal 2618B.

The conductive layer 2608 is positioned on top of the first insulating layer 2602 and may be attached thereto with an additional adhesive layer. In addition, the windowed printed circuit board 2600A may include a second conductive layer, which provides traces, footprints, and the like, positioned on the lower surface of the second insulating layer 2604. The second conductive layer may also be attached with an adhesive layer. The solder mask layer 2610 is positioned on the first insulating layer 2602 and the conductive layer 2608 and includes a first opening which aligns with the openings of the first insulating layer 2602 and the second insulating layer 2604. The solder mask layer 2610 includes additional openings that are located in alignment with the lands (or pads) of electronic component footprints where solder is to be applied or reflowed. In some embodiments, the windowed printed circuit board 2600A may include a solder mask layer positioned on the second insulating layer 2604.

The vias 2616 are positioned to extend through the first insulating layer 2602, the second insulating layer 2604, the adhesive layer 2606, the conductive layer 2608, the solder mask layer 2610, and any other traditional printed circuit board layers. Each fastener 2620 is positioned in a successive one of the vias 2616. The windowed printed circuit board 2600A includes four fasteners 2620, each fastener 2620 positioned adjacent to a successive corner of the window, although other configurations are possible. For each fastener 2620, a first lead 2626 is coupled to a first end of the fastener 2620 and is electrically and mechanically connected to one conductive pad 2622 through the solder pad 2624 on the first window pane 2612. A second lead 2626 is coupled to a second end of the fastener 2620 and is electrically and mechanically connected to one conductive pad 2622 through the solder pad 2624 on the second window pane 2614.

In some instances as shown in FIG. 36B, the fasteners 2620 provide a mechanical connection only between the windowed printed circuit board 2600A and the window panes 2612, 2614. In other instances as shown in FIG. 36C, the fasteners 2620 provide a mechanical connection and an electrical connection between the windowed printed circuit board 2600A and the window panes 2612, 2614. In such instances, a signal, power, or ground trace in the conductive layer 2608 is electrically connected to one fastener 2620.

Referring to FIGS. 37A and 37B, the windowed printed circuit board 2600B has a structure as follows. The first insulating layer 2602 and the second insulating layer 2604 are each attached to the adhesive layer 2606, with the lower surface of the first insulating layer 2602 in contact with the upper surface of the adhesive layer 2606 and the upper surface of the second insulating layer 2604 in contact with the lower surface of the adhesive layer 2606. The openings of the first insulating layer 2602 and the second insulating layer 2604 are aligned with one another and with the opening of the adhesive layer 2606, wherein material from the adhesive layer 2606 extends inward into the openings of the first insulating layer 2602 and the second insulating layer 2604. The first insulating layer 2602 and the second insulating layer 2604 may each include a recess adjacent to the openings, wherein a thickness of each layer is less than in other areas of the windowed printed circuit board 2600B.

The conductive layer 2608 is positioned on top of the first insulating layer 2602 and may be attached thereto with an additional adhesive layer. In addition, the windowed printed circuit board 2600B may include a second conductive layer, which provides traces, footprints, and the like, positioned on the lower surface of the second insulating layer 2604. The second conductive layer may also be attached with an adhesive layer. The solder mask layer 2610 is positioned on the first insulating layer 2602 and the conductive layer 2608 and includes a first opening which aligns with the openings of the first insulating layer 2602 and the second insulating layer 2604. The solder mask layer 2610 includes additional openings that are located in alignment with the lands (or pads) of electronic component footprints where solder is to be applied or reflowed. In some embodiments, the windowed printed circuit board 2600B may include a solder mask layer positioned on the second insulating layer 2604.

The vias 2616, in which the fasteners 2620 are positioned, are located in the recesses of the first insulating layer 2602 and the second insulating layer 2604. The windowed printed circuit board 2600B may include other vias positioned elsewhere. Each via 2616 is positioned adjacent to a successive one of the sides of the openings of the first insulating layer 2602 and the second insulating layer 2604, although other configurations are possible. For each via 2616, a first seal 2618 is positioned around a first end of the via 2616, and a second seal 2618 is positioned around a second end of the via 2616.

The first window pane 2612 is positioned in the recess of the first insulating layer 2602 so that a portion of the lower surface of the first window pane 2612 contacts a first portion of the seals 2618 and the first end of the vias 2616. The second window pane 2614 is positioned in the recess of the first insulating layer 2602 so that a portion of the upper surface of the second window pane 2614 contacts a second portion of the seals 2618 and the second end of the vias 2616. Each fastener 2620 is positioned in a successive one of the vias 2616 and associated openings in the first window pane 2612 and the second window pane 2614.

FIGS. 38A and 38B depict a listing of at least a portion of the steps of an exemplary method 2700 of forming a windowed printed circuit board 2600A that mimics a functional printed circuit board. The steps may be performed in the order shown in FIGS. 38A and 38B, or they may be performed in a different order. Furthermore, some steps may be performed concurrently as opposed to sequentially. In addition, some steps may be optional or may not be performed.

Referring to step 2701, data is received regarding functional printed circuit board specifications. The data may include dimensions of the printed circuit board and its components along with locations of package footprints and conductive traces. In some embodiments, the entire actual printed circuit board may be replicated. In other embodiments, only a portion of the printed circuit board may be replicated for inspecting the results of the solder and cleaning processes. In addition, the region of interest including the location of the window may also be received or determined.

Referring to step 2702, a first window pane 2612 and a second window pane 2614 are formed. The first window pane 2612 and the second window pane 2614 each are formed from generally transparent, or translucent, electrically insulating material including various types of glass, such as lead glass, aluminosilicate glass, high silica glass, fused silica glass, silicate glass, or borosilicate glass. The first window pane 2612 and the second window pane 2614 each have a quadrilateral shape with an upper surface, a lower surface, and four side edges.

The first window pane 2612 and the second window pane 2614 each include a plurality of conductive pads 2622 and a plurality of leads 2626. The conductive pads 2622 may be formed by performing a plurality of sub steps including forming a seed layer of electrically conductive material. The seed layer is positioned in contact with, or formed on, the entire upper surface of the first window pane 2612 and the entire lower surface of the second window pane 2614. The seed layer may include metals and/or metal alloys, such as titanium, copper, nickel, silver, gold, and the like. Typically, the seed layer is a thin film. The seed layer may be formed on the upper surface of the first window pane 2612 and the lower surface of the second window pane 2614 by utilizing electroless plating, dipping, or immersion processes. Alternatively, the seed layer is formed on the upper surface of the first window pane 2612 and the lower surface of the second window pane 2614 by utilizing PVD techniques or CVD techniques. The sub steps further include applying an upper metal layer formed from metals and/or metal alloys on top of the seed layer to increase the thickness of the conductive pads 2622. The upper metal layer may be applied using electrolytic plating techniques.

The sub steps also include removing portions of the upper metal layer and the seed layer in order to form the conductive pads 2622. The sub steps include applying a layer of photoresist to the surface of the upper metal layer. If PVD techniques or CVD techniques were used to deposit the seed layer, then a layer of hexamethyldisilazane (HMDS) is applied before the photoresist. The photoresist may be embodied by one of several types of photoresist, including photopolymeric, photodecomposing, and photocrosslinking photoresist. The photoresist may be applied using any of several methods, including spin coating. The sub steps further include curing the photoresist, exposing the photoresist to ultraviolet light with a positive or negative patterned mask, developing the photoresist, and optionally performing a hard bake of the photoresist. The mask may be patterned with a positive or negative image of the layout of the conductive pads 2622. The sub steps further include etching the portion of the upper metal layer which was exposed by the patterned mask and the underlying seed layer using a chemical etch, ion milling, or ion beam etching. After etching, the conductive pads 2622 are formed. However, the conductive pads 2622 each still have photoresist on the upper surface. The remaining photoresist may be removed with a chemical or plasma strip.

The leads 2626 are connected to the conductive pads 2622 through solder pads. Attaching the leads 2626 to the conductive pads 2622 includes performing a plurality of sub steps including applying a plurality of solder pads 2624 to the conductive pads 2622, wherein each solder pad 2624 is applied to a successive one of the conductive pads 2622. The solder pad 2624 may be formed from tin-lead alloy solder paste or other tin-based alloy solder paste that includes silver, copper, antimony, or the like that melts at high temperatures. In various embodiments, the solder pad 2624 may melt at temperatures greater than or equal to approximately 700 degrees Fahrenheit. The solder pad 2624 may be applied to each conductive pad 2622 using screen printing, stencil printing, or jet printing techniques, among others, wherein the solder may be in a paste form.

The sub steps further include forming a lead frame which includes all of the leads 2626 for the first window pane 2612. The lead frame may be formed frame a sheet of metal and/or metal alloys, such as copper, tin, and the like, which is cut, stamped, or etched to form the individual leads 2626 along with a frame or panel to hold the leads 2626 together. Each lead 2626 is generally rigid and may include a ring opening at one end. The sub steps further include aligning the leads 2626 of the lead frame with their associated conductive pads 2622. The leads 2626 are positioned such that each lead 2626 contacts a successive one of the solder pads 2624 (positioned on each conductive pad 2622). The sub steps further include reflowing the lead frame and the solder pads 2624 to form a mechanical and electrical connection between each lead 2626 and its associated conductive pad 2622. The reflow may be performed by heating the first window pane 2612, the conductive pads 2622, the solder pads 2624, and the lead frame in a heating chamber or by applying a heat source to the lead frame. The sub steps further include removing the frame from the leads 2626. The sub steps may optionally include plating the leads 2626 with nickel and/or palladium or dipping the leads 2626 in solder.

Referring to step 2703, a first insulating layer 2602 and a second insulating layer 2604 are formed. The first insulating layer 2602 and the second insulating layer 2604 are each formed from rigidized material that includes various electrically insulating or dielectric materials, such as fiberglass, woven glass, matte glass, cotton paper, phenolic cotton paper, polyester, and the like, or combinations thereof. The first insulating layer 2602 and the second insulating layer 2604 each have a quadrilateral shape with an upper surface, a lower surface, and four side edges and have the same dimensions as one another. The first insulating layer 2602 and the second insulating layer 2604 each have an opening from the top surface to the bottom surface positioned in a region of interest that forms the window of the windowed printed circuit board 2600. The opening is generally quadrilateral shaped, although other shapes are possible. In addition, the opening on the first insulating layer 2602 is the same size as, and aligned with, the opening on the second insulating layer 2604. Furthermore, the openings each have dimensions approximately equal to the dimensions of the first window pane 2612 or the second window pane 2614.

Referring to step 2704, an adhesive layer 2606 is formed. The adhesive layer 2606 may be formed from one or more resins or preimpregnated (prepreg) fibers with an epoxy, phenolic resin, Teflon, or the like. The adhesive layer 2606 has a quadrilateral shape with an upper surface, a lower surface, and four side edges and is generally very thin compared to its area, or length and width dimensions. The adhesive layer 2606 also includes an opening from the top surface to the bottom surface positioned in the region of interest. The opening has the same, or similar, aspect ratio compared to the openings of the first insulating layer 2602 and the second insulating layer 2604, but has a smaller size.

Referring to step 2705, a stack is formed. The stack includes the second insulating layer 2604 positioned beneath the adhesive layer 2606 which is positioned beneath the first insulating layer 2602. The openings of the layers are aligned with one another.

Referring to step 2706, a solder mask layer 2610 is applied. The solder mask layer 2610 is formed from one or more polymers that create a thin layer or film. The solder mask layer 2610 generally covers the entire surface of the first insulating layer 2602. If the windowed printed circuit board 2600A, 2600B includes a second conductive layer, then the windowed printed circuit board 2600A, 2600B may also include a second solder mask layer 2610 covering the surface of the second insulating layer 2604. The solder mask layer 2610 also includes a plurality of openings, with one opening being aligned with the openings of the first insulating layer 2602 and the second insulating layer 2604 and the other openings being located where solder is to be applied or reflowed such as conductive pads for electronic component footprints. The solder mask layer 2610 may be applied using silkscreen or other screen printing processes.

Referring to step 2707, a plurality of vias 2616 are formed adjacent to the window formed by the openings of the first insulating layer 2602, the second insulating layer 2604, and the adhesive layer 2606. Each via 2616 provides a through hole opening in which a successive one of the fasteners 2620 is positioned. The vias 2616 each extend through the first insulating layer 2602, the second insulating layer 2604, the adhesive layer 2606, the conductive layer 2608, the solder mask layer 2610, and any other traditional printed circuit board layers. Each via 2616 may be formed by performing a plurality of sub steps including drilling a hole through the listed layers. The sub steps further include applying a seed layer of metal to the layers of material in and around the hole. The sub steps further include applying an upper metal layer formed from metals and/or metal alloys on top of the seed layer. The upper metal layer may be applied using electrolytic plating techniques.

Referring to step 2708, a first seal 2618A is positioned in the opening of the first insulating layer 2602. The first seal

2618A is formed from elastic or resilient polymers. The first seal 2618A may have a roughly quadrilateral shape. The first seal 2618A is positioned in contact with a portion of the adhesive layer 2606.

Referring to step 2709, the first window pane 2612 is positioned in the opening of the first insulating layer 2602 on the first seal 2618A.

Referring to step 2710, a second seal 2618B is positioned in the opening of the second insulating layer 2604. The second seal 2618B is formed from elastic or resilient polymers. The second seal 2618B may have a roughly quadrilateral shape. The second seal 2618B is positioned in contact with a portion of the adhesive layer 2606.

Referring to step 2711, the second window pane 2614 is positioned in the opening of the second insulating layer 2604 on the second seal 2618B.

Referring to step 2712, each lead 2626 is positioned over a successive one of the vias 2616 so that the ring opening of the lead 12 aligns with the opening of the via 2616.

Referring to step 2713, a successive one of a plurality of fasteners 2620 is positioned in each via 2616. Each fastener 2620 is formed from a bolt and a nut, a swaged rivet, or similar through hole components. Each fastener 2620 is positioned in one of the vias 2616 and contacts the lead 2626 aligned thereto. Each fastener 2620 is secured to the lead 2626 to prevent movement of the lead 2626.

FIGS. 39A and 39B depict a listing of at least a portion of the steps of an exemplary method 2800 of forming a windowed printed circuit board 2600B that mimics a functional printed circuit board. The steps may be performed in the order shown in FIGS. 39A and 39B, or they may be performed in a different order. Furthermore, some steps may be performed concurrently as opposed to sequentially. In addition, some steps may be optional or may not be performed.

Referring to step 2801, data is received regarding functional printed circuit board specifications. The data may include dimensions of the printed circuit board and its components along with locations of package footprints and conductive traces. In some embodiments, the entire actual printed circuit board may be replicated. In other embodiments, only a portion of the printed circuit board may be replicated for inspecting the results of the solder and cleaning processes. In addition, the region of interest including the location of the window may also be received or determined.

Referring to step 2802, a first window pane 2612 and a second window pane 2614 are formed. The first window pane 2612 and the second window pane 2614 each are formed from generally transparent, or translucent, electrically insulating material including various types of glass, such as lead glass, aluminosilicate glass, high silica glass, fused silica glass, silicate glass, or borosilicate glass. The first window pane 2612 and the second window pane 2614 each have a quadrilateral shape with an upper surface, a lower surface, and four side edges.

The first window pane 2612 and the second window pane 2614 each include a plurality of through holes. The through holes may be created by drilling through a plurality of locations in each of the first window pane 2612 and the second window pane 2614.

Referring to step 2803, a first insulating layer 2602 and a second insulating layer 2604 are formed. The first insulating layer 2602 and the second insulating layer 2604 are each formed from rigidized material that includes various electrically insulating or dielectric materials, such as fiberglass, woven glass, matte glass, cotton paper, phenolic cotton paper, polyester, and the like, or combinations thereof. The first insulating layer 2602 and the second insulating layer 2604 each have a quadrilateral shape with an upper surface, a lower surface, and four side edges and have the same dimensions as one another. The first insulating layer 2602 and the second insulating layer 2604 each have an opening from the top surface to the bottom surface positioned in a region of interest that forms the window of the windowed printed circuit board 2600. The opening is generally quadrilateral shaped, although other shapes are possible. In addition, the opening on the first insulating layer 2602 is the same size as, and aligned with, the opening on the second insulating layer 2604. Furthermore, the openings each have dimensions that are smaller than the dimensions of the first window pane 2612 or the second window pane 2614. Also, each opening may be recessed such that a thickness of the first insulating layer 2602 and the second insulating layer 2604 adjacent to the openings is less than a thickness of the first insulating layer 2602 and the second insulating layer 2604 in other areas.

Referring to step 2804, an adhesive layer 2606 is formed. The adhesive layer 2606 may be formed from one or more resins or preimpregnated (prepreg) fibers with an epoxy, phenolic resin, Teflon, or the like. The adhesive layer 2606 has a quadrilateral shape with an upper surface, a lower surface, and four side edges and is generally very thin compared to its area, or length and width dimensions. The adhesive layer 2606 also includes an opening from the top surface to the bottom surface positioned in the region of interest. The opening has the same, or similar, aspect ratio compared to the openings of the first insulating layer 2602 and the second insulating layer 2604, and has approximately the same dimensions.

Referring to step 2805, a stack is formed. The stack includes the second insulating layer 2604 positioned beneath the adhesive layer 2606 which is positioned beneath the first insulating layer 2602. The openings of the layers are aligned with one another.

Referring to step 2806, a solder mask layer 2610 is applied. The solder mask layer 2610 is formed from one or more polymers that create a thin layer or film. The solder mask layer 2610 generally covers the entire surface of the first insulating layer 2602. If the windowed printed circuit board 2600A, 2600B includes a second conductive layer, then the windowed printed circuit board 2600A, 2600B may also include a second solder mask layer 2610 covering the surface of the second insulating layer 2604. The solder mask layer 2610 also includes a plurality of openings, with one opening being aligned with the openings of the first insulating layer 2602 and the second insulating layer 2604 and the other openings being located where solder is to be applied or reflowed such as conductive pads for electronic component footprints. The solder mask layer 2610 may be applied using silkscreen or other screen printing processes.

Referring to step 2807, a plurality of vias 2616 are formed adjacent to the window formed by the openings of the first insulating layer 2602, the second insulating layer 2604, and the adhesive layer 2606. Each via 2616 provides a through hole opening in which a successive one of the fasteners 2620 is positioned. The vias 2616 each extend through the first insulating layer 2602, the second insulating layer 2604, the adhesive layer 2606, the conductive layer 2608, the solder mask layer 2610, and any other traditional printed circuit board layers. Each via 2616 may be formed by performing a plurality of sub steps including drilling a hole through the listed layers. The sub steps further include applying a seed layer of metal to the layers of material in and around the hole. The sub steps further include applying an upper metal layer formed from metals and/or metal alloys on top of the seed layer. The upper metal layer may be applied using electrolytic plating techniques. Each via 2616 may further include a metal ring at each end thereof.

Referring to step 2808, one of a plurality of seals 2618 is positioned around each opposing end of each via 2616. Each seal 2618 is each formed from elastic or resilient polymers and has a roughly circular shape. The windowed printed circuit board 2600B may include a first seal 2618 and a second seal 2618 for each via 2616. The first seal 2618 is positioned around the metal ring of one end of the via 2616, and the second seal 2618 is positioned around the metal ring of the other end of the via 2616.

Referring to step 2809, the first window pane 2612 is positioned over the opening of the first insulating layer 2602. The first window pane 2612 is positioned such that each through hole is aligned with a successive one of the vias 2616. And a portion of the lower surface of the first window pane 2612 contacts the first seal 2618 associated with each via 2616.

Referring to step 2810, the second window pane 2614 is positioned over the opening of the second insulating layer 2604. The second window pane 2614 is positioned such that each through hole is aligned with a successive one of the vias 2616. And a portion of the lower surface of the second window pane 2614 contacts the second seal 2618 associated with each via 2616.

Referring to step 2811, a successive one of a plurality of fasteners 2620 is positioned in each via 2616 to retain each of the first window pane 2612 and the second window pane 2614 over its associated opening. Each fastener 2620 is formed from a bolt and a nut, a swaged rivet, or similar through hole components. Each fastener 2620 is positioned in one of the vias 2616 as well as one of the through holes in the first window pane 2612 and one of the through holes in the second window pane 2614. The fasteners 2620 each apply pressure to the first window pane 2612 to retain it over the opening of the first insulating layer 2602 and to the second window pane 2614 to retain it over the opening of the second insulating layer 2604.

Another embodiment of a windowed printed circuit board, or windowed printed wiring board, includes windowed printed circuit board 2900 shown in FIGS. 40A and 40B. The windowed printed circuit board 2900 includes a first insulating layer 2902, a second insulating layer 2904, a third insulating layer 2906, a first adhesive layer 2908, a second adhesive layer 2910, a plurality of conductive layers 2912, a plurality of solder mask layers 2914, a first window pane 2916, a second window pane 2918, and a plurality of vias 2616. The windowed printed circuit board 2900 optionally includes a plurality of conductive pads 2922, and a plurality of solder pads 2924. The windowed printed circuit board 2900 mimics any functional printed circuit board and may provide the same functionality, but also provides a window (i.e., an opening) in the printed circuit board body in a region of interest so that a lower surface of one or more electronic component packages can be viewed after the packages have been soldered in place on the printed circuit board. The windowed printed circuit board 2900 provides a window that is larger than one or more electronic package footprints.

The insulating layers 2902, 2904, 2906, the adhesive layers 2908, 2910, the conductive layers 2912, the solder mask layers 2914, the window panes 2916, 2918, the vias 2920, the conductive pads 2922, and the solder pads 2924 are each the same as, or substantially similar to, the likenamed components described above. In addition, the windowed printed circuit board 2900 may include additional insulating layers, adhesive layers, and/or window panes.

Referring to FIG. 40B, the insulating layers 2902, 2904, 2906 are positioned one on top of another to form a stack with the third insulating layer 2906 being one the bottom, the second insulating layer 2904 being in the middle, and the first insulating layer 2902 being on the top. The second adhesive layer 2910 is positioned between the second and third insulating layers 2904, 2906 to bond them together, and the first adhesive layer 2908 is positioned between the first and second insulating layers 2902, 2904 to bond them together. Each insulating layer 2902, 2904, 2906 may have one of the conductive layers 2912 positioned on one or more of its surfaces. Furthermore, the first insulating layer has a first solder mask layer 2914 positioned on its upper surface, and the third insulating layer 2906 has a second solder mask layer 2914 positioned on its lower surface. A portion of the first solder mask layer 2914 overlaps a portion of the first window pane 2916, and a portion of the second solder mask layer 2914 overlaps a portion of the second window pane 2918.

Each insulating layer 2902, 2904, 2906 has a window opening. The first insulating layer 2902 has a window opening sized to accommodate and retain the first window pane 2916, and the third insulating layer 2906 has a window opening sized to accommodate and retain the second window pane 2918. The second insulating layer 2904 has a window opening that is smaller than the window panes 2916, 2918. In effect, the second insulating layer 2904 extends inward from the first and third insulating layers 2902, 2906. In addition, the first and second adhesive layers 2908, 2910 each include a window opening that is smaller than the window panes 2916, 2918. Thus, the first window pane 2916 is positioned in the window opening of the first insulating layer 2902 in contact with the first adhesive layer 2908, which itself contacts the upper surface of the second insulating layer 2904. And, the second window pane 2918 is positioned in the window opening of the third insulating layer 2906 in contact with the second adhesive layer 2910, which itself contacts the lower surface of the second insulating layer 2904. The inward extension of the second insulating layer 2904 provides a solid structure to which the first and second window panes 2916, 2918 are attached.

As is shown in FIG. 40B, a first via 2920 extends through a portion of the first solder mask layer 2914, the first and second window panes 2916, 2918, and the second insulating layer 2904 (as well as the adhesive layers 2908, 2910) and connects to one solder pad 2924, which in turn connects to one conductive pad 2922 on the upper surface of the first window pane 2916. A second via 2920 extends through the first and second window panes 2916, 2918, the second insulating layer 2904 (as well as the adhesive layers 2908, 2910), and a portion of the second solder mask layer 2914. As illustrated in FIG. 40B, some vias 2920 may electrically connect to one or more signal, power, or ground traces or planes and/or one or more solder pads 2924 and conductive pads 2922, while other vias 2920 may not have any electrical connection. However, each via 2920 provides mechanical stabilization for the window panes 2916, 2918 and helps to retain the window panes 2916, 2918 in the window openings.

FIG. 41 depicts a listing of at least a portion of the steps of an exemplary method 3000 of forming a windowed printed circuit board 2900 that mimics a functional printed circuit board. The steps may be performed in the order shown in FIG. 41, or they may be performed in a different order. Furthermore, some steps may be performed concurrently as opposed to sequentially. In addition, some steps may be optional or may not be performed.

Referring to step 3001, data is received regarding functional printed circuit board specifications. The data may include dimensions of the printed circuit board and its components along with locations of package footprints and conductive traces. In some embodiments, the entire actual printed circuit board may be replicated. In other embodiments, only a portion of the printed circuit board may be replicated for inspecting the results of the solder and cleaning processes. In addition, the region of interest including the location of the window may also be received or determined.

Referring to step 3002, a first window pane 2916 and a second window pane 2918 are formed. The first window pane 2916 and the second window pane 2918 each are formed from generally transparent, or translucent, electrically insulating material including various types of glass, such as lead glass, aluminosilicate glass, high silica glass, fused silica glass, silicate glass, or borosilicate glass. The first window pane 2916 and the second window pane 2918 each have a quadrilateral shape with an upper surface, a lower surface, and four side edges.

The first window pane 2916 and the second window pane 2918 may each include a plurality of conductive pads 2922. The conductive pads 2922 may be formed on the window panes 2916, 2918 by processes described above in at least method 2700.

Furthermore, a plurality of holes are formed in the first and second window panes 2916, 2918, with each hole creating an opening for a successive one of the vias 2920. The holes may be formed by drilling or similar techniques.

Referring to step 3003, a first insulating layer 2902, a second insulating layer 2904, and a third insulating layer 2906 are formed. The insulating layers 2902, 2904, 2906 are each formed from rigidized material that includes various electrically insulating or dielectric materials, such as fiberglass, woven glass, matte glass, cotton paper, phenolic cotton paper, polyester, and the like, or combinations thereof. The insulating layers 2902, 2904, 2906 each have a quadrilateral shape with an upper surface, a lower surface, and four side edges and have the same dimensions as one another.

The insulating layers 2902, 2904, 2906 each have a window opening from the top surface to the bottom surface positioned in a region of interest that forms the window of the windowed printed circuit board 2900. The window opening is generally quadrilateral shaped, although other shapes are possible. In addition, the window opening on the first insulating layer 2902 is the same size as, and aligned with, the window opening on the third insulating layer 2906. Furthermore, the window openings of the first insulating layer 2902 and the third insulating layer 2906 each have dimensions approximately equal to the dimensions of the first window pane 2916 and the second window pane 2918. The window opening of the second insulating layer 2904 is smaller than the other window openings and smaller than the first window pane 2916 and the second window pane 2918. The window openings may be formed by machining, laser ablation, patterning and etching, or similar techniques.

Furthermore, a plurality of holes are formed in the second insulating layer 2904, with each hole creating an opening for a successive one of the vias 2920. The holes may be formed by drilling or similar techniques.

Referring to step 3004, a first adhesive layer 2908 and a second adhesive layer 2910 are formed. The adhesive layers 2908, 2910 may be formed from one or more resins or preimpregnated (prepreg) fibers with an epoxy, phenolic resin, Teflon, or the like. The adhesive layers 2908, 2910 each have a quadrilateral shape with an upper surface, a lower surface, and four side edges and is generally very thin compared to its area, or length and width dimensions. The adhesive layers 2908, 2910 each also include a window opening from the top surface to the bottom surface positioned in the region of interest. The window opening has the same dimensions as the dimensions of the window opening of the second insulating layer 2904.

Furthermore, a plurality of holes are formed in the adhesive layers 2908, 2910, with each hole creating an opening for a successive one of the vias 2920. The holes may be formed by drilling or similar techniques.

Referring to step 3005, one or more conductive layers 2912 are formed on the insulating layers 2902, 2904, 2906. Electrically conductive features, such as electronic signal traces, electric power or ground traces, one or more signal, power, or ground pads, integrated circuit package footprints, full or partial power planes, or full or partial ground planes may be formed from the conductive layers 2912. The conductive layers 2912 may be formed using deposition techniques, plating techniques, or foil or film placement followed by removal techniques such as patterning and etching to create the electrically conductive features.

Referring to step 3006, a stack is formed. The stack includes the components in the following order from bottom to top: the third insulating layer 2906, the second adhesive layer 2910, the second insulating layer 2904, the first adhesive layer 2908, and the first insulating layer 2902. Any conductive layers 2912 are positioned on their associated insulating layers. The layers are placed such that their perimeter edges align with one another. In addition, a portion of the first adhesive layer 2908, a portion of the second insulating layer 2904, and a portion of the second adhesive layer 2910 each extend inward into the window openings of the first insulating layer 2902 and the third insulating layer 2906.

Referring to step 3007, the window panes 2916, 2918 are placed in the window openings. The first window pane 2916 is placed in the window opening in the first insulating layer 2902 such that a perimeter on the lower surface of the first window pane 2916 contacts a portion of the first adhesive layer 2908. The second window pane 2918 is placed in the window opening in the third insulating layer 2906 such that a perimeter on the upper surface of the second window pane 2918 contacts a portion of the second adhesive layer 2910. In addition, the window panes 2916, 2918 are placed such that the holes for the vias 2920 in the first window pane 2916, the first adhesive layer 2908, the second insulating layer 2904, the second adhesive layer 2910, and the second window pane 2918 are aligned with one another.

Referring to step 3008, a plurality of vias 2920 is formed. The vias 2920 may be formed by filling the holes for the vias 2920 with electrically conductive material. The holes may be filled with conductive thick film paste or by using electroplating or electroless plating techniques.

Referring to step 3009, a plurality of solder mask layers 2914 is applied. A first solder mask layer 2914 is applied to the upper surface of the first insulating layer 2902 along with any electrically conductive features formed in the conductive layer 2912 positioned thereon. A portion of the first solder mask layer 2914 overlaps a portion of the first window pane 2916. A second solder mask layer 2914 is applied to the lower surface of the third insulating layer 2906 along with any electrically conductive features formed in the conductive layer 2912 positioned thereon. A portion of the second solder mask layer 2914 overlaps a portion of the second window pane 2918.

Referring to FIGS. 42A-42D, a portion of a first substrate 3100 undergoing a metallization process to form a plurality of conductive pads 3102 is shown. The first substrate 3100 may be formed from generally transparent, or translucent, electrically insulating material including various types of glass, such as lead glass, aluminosilicate glass, high silica glass, fused silica glass, silicate glass, or borosilicate glass, the same as, or similar to, the bodies, the blocks, or the window panes described above. Or, the first substrate 3100 may be formed from rigidized material that includes various electrically insulating or dielectric materials, such as fiberglass, woven glass, matte glass, cotton paper, phenolic cotton paper, polyester, and the like, or combinations thereof. The conductive pads 3102 may be the same as, or similar to, the conductive pads or the barrier rings on the blank packages or the windowed printed circuit boards described above. The metallization process may be the same as, or similar to, the steps or sub steps in which conductive pads are formed in the methods of forming blank packages or windowed printed circuit boards described above.

In FIG. 42A, the first substrate 3100 is shown with a seed layer 3104 positioned on top of, and in contact with, an upper surface of the first substrate 3100. An upper metal layer 3106 is positioned on top of, and in contact with, an upper surface of the seed layer 3104. And, a photoresist layer 3108 is positioned on top of, and in contact with, an upper surface of the upper metal layer 3106. The seed layer 3104 may include metals and/or metal alloys, such as titanium, copper, nickel, silver, gold, and the like. Typically, the seed layer 3104 is a thin film and may be formed on the first substrate 3100 by utilizing PVD techniques or CVD techniques. Alternatively, the seed layer 3104 may be formed by utilizing electroless plating, dipping, or immersion processes. The upper metal layer 3106 may be formed from metals and/or metal alloys that are applied on the seed layer 3104 using electrolytic plating techniques. The photoresist layer 3108 may be embodied by one of several types of photoresist, including photopolymeric, photodecomposing, and photocrosslinking photoresist. The photoresist layer 3108 may be applied using any of several methods, including spin coating.

In FIG. 42B, at least some of the following steps have been performed—curing the photoresist layer 3108, exposing the photoresist layer 3108 to ultraviolet light with a positive or negative patterned mask, developing the photoresist layer 3108, and optionally performing a hard bake of the photoresist layer 3108. The mask may be patterned with a positive or negative image of the layout of the conductive pads 3102. The portion of the photoresist layer 3108 weakened by the process steps is removed.

In FIG. 42C, the portions of the seed layer 3104 and the upper metal layer 3106 not covered by the photoresist layer 3108 are removed using a chemical etch, ion milling, or ion beam etching.

In FIG. 42D, the remaining photoresist layer 3108 that was covering the conductive pads 3102 is removed using a chemical or plasma strip—leaving the conductive pads 3102 ready for further processing or for usage.

Referring to FIG. 43, a lead frame is shown. The lead frame includes a plurality of leads that are attached to a surrounding frame. The lead frame may be formed from a sheet of metal and/or metal alloys, such as copper, tin, and the like, which is cut, stamped, or etched to form each of the leads in the proper relative location for the electronic component package that the blank package is intending to mimic. The lead frame is used in any of the methods 1100, 1500, 1900, and 2300. As described in method 500, the lead frame may also be utilized to form a plurality of pads.

Additional Considerations

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

1. A package for mimicking an electronic component package that includes a plurality of leads, the package comprising:

a body formed from electrically insulating material that is transparent to visible light, the body having a top surface, a bottom surface, and a plurality of side surfaces;

a plurality of conductive pads formed from electrically conductive material and positioned on one or more of the surface(s);

a plurality of solder pads formed from solder, each solder pad positioned on and connected to a respective one of the conductive pads; and a plurality of leads formed from electrically conductive material, each lead corresponding to a respective one of the leads of the electronic component package, being positioned in a location corresponding to a location of a corresponding one of the leads of the electronic component package, and attached only to a respective one of the solder pads.

2. The package of claim 1, wherein the conductive pads and the solder pads are formed on the top surface of the body.

3. The package of claim 1, wherein the conductive pads and the solder pads are formed on the bottom surface of the body.

4. The package of claim 1, wherein a first portion of the conductive pads and the solder pads is formed on a first side surface of the body, a second portion of the conductive pads and the solder pads is formed on a second side surface of the body, a third portion of the conductive pads and the solder pads is formed on a third side surface of the body, and a fourth portion of the conductive pads and the solder pads is formed on a fourth side surface of the body.

5. The package of claim 1, wherein the body is formed from borosilicate glass.

6. The package of claim 1, wherein each conductive pad is formed from a plurality of layers of metal.

7. The package of claim 3, wherein the layers of metal include a layer of titanium in contact with the body, a layer of nickel on top of the layer of titanium, and a layer of gold on top of the layer of nickel.

8. The package of claim 1, wherein the leads are formed from a lead frame.

9. A method of forming a package for mimicking an electronic component package that includes a plurality of leads, the method comprising:

forming a body of the package, the body formed from electrically insulating material that is transparent to visible light, the body having a top surface, a bottom surface, and a plurality of side surfaces;

forming a plurality of conductive pads on one or more surface(s) of the body, each conductive pad formed from electrically conductive material;

forming a respective one of a plurality of solder pads on each of the conductive pads, each solder pad formed from solder; and attaching a respective one of a plurality of leads to each of the solder pads, each lead corresponding to a respective one of the leads of the electronic component package, being positioned in a location corresponding to a location of a corresponding one of the leads of the electronic component package, and attached only to a respective one of the solder pads.

10. The method of claim 9, wherein the leads are formed from a lead frame.

11. The method of claim 9, further comprising forming a lead frame that includes the leads held together by a frame;

aligning the lead frame with the body such that each lead is aligned with a respective one of the solder pads; and removing the frame from the leads.

12. The method of claim 11, wherein attaching the leads to the solder pads includes heating the solder pads and the lead frame.

13. The method of claim 9, wherein the solder that forms the solder pads melts at a temperature greater than or equal to approximately 700 degrees Fahrenheit.

\* \* \* \* \*